US007496865B2

(12) United States Patent
Chang et al.

(10) Patent No.: US 7,496,865 B2
(45) Date of Patent: Feb. 24, 2009

(54) OTA-BASED HIGH-ORDER FILTERS

(75) Inventors: Chun-Ming Chang, Chung-Li (TW); Shu-Hui Tu, Chung-Li (TW)

(73) Assignee: Chung Yuan Christian University, Taoyuan (TW)

( * ) Notice: Subject to any disclaimer, the term of this patent is extended or adjusted under 35 U.S.C. 154(b) by 159 days.

(21) Appl. No.: 11/419,313

(22) Filed: May 19, 2006

(65) Prior Publication Data

US 2007/0057732 A1    Mar. 15, 2007

Related U.S. Application Data

(60) Provisional application No. 60/683,295, filed on May 23, 2005.

(51) Int. Cl.
*G06F 17/50* (2006.01)
(52) U.S. Cl. .................................. 716/2; 716/5; 716/18
(58) Field of Classification Search ...................... 716/2, 716/5, 18
See application file for complete search history.

(56) References Cited

U.S. PATENT DOCUMENTS

| | | | | | |
|---|---|---|---|---|---|
| 4,543,534 | A | * | 9/1985 | Temes et al. | 330/9 |
| 5,384,502 | A | * | 1/1995 | Volk | 327/157 |
| 5,475,338 | A | * | 12/1995 | Yamaguchi | 327/552 |
| 5,736,895 | A | * | 4/1998 | Yu et al. | 327/554 |
| 5,767,724 | A | * | 6/1998 | Steglich | 327/323 |
| 6,002,299 | A | * | 12/1999 | Thomsen | 330/9 |
| 6,144,234 | A | * | 11/2000 | Nakamura | 327/94 |
| 6,556,072 | B1 | * | 4/2003 | Nicollini et al. | 327/554 |
| 6,559,786 | B2 | * | 5/2003 | Groiss et al. | 341/158 |
| 6,901,091 | B2 | * | 5/2005 | Schrodinger | 372/26 |
| 7,325,210 | B2 | * | 1/2008 | Rao et al. | 716/6 |
| 7,330,279 | B2 | * | 2/2008 | Vuong et al. | 356/625 |
| 2001/0032508 | A1 | * | 10/2001 | Lemkin et al. | 73/514.32 |
| 2002/0035462 | A1 | * | 3/2002 | Kidera et al. | 703/14 |
| 2002/0070888 | A1 | * | 6/2002 | Groiss et al. | 341/161 |

(Continued)

FOREIGN PATENT DOCUMENTS

JP        02202720 A    *    8/1990

OTHER PUBLICATIONS

Abuelma'Atti et al., "Digitally Programmable Active-C OTA-Based Oscillator", IEEE Transactions on Instrumentation and Measurement, vol. 37, No. 2, Jun. 1988, pp. 320-322.*

(Continued)

*Primary Examiner*—Phallaka Kik

(57) ABSTRACT

Nth-order OTA-C (Operational Transconductance Amplifiers and Capacitors) filter structures are realized by using the analytical synthesis method to achieve the following three important criteria simultaneously:

filters use just n grounded capacitors, each of which is located at each of just n nodes in the realized circuit, because they use smaller area in the IC, and they can absorb equivalent shunt capacitive parasites;

filters employ only single-ended-input OTAs to overcome the feed-through effects due to finite input parasitic capacitances associated with double-input OTAs to replace the same positions of the n given capacitors; and filters have the least number-of components (passive and active) for a given order to reduce power consumption, chip areas, and noise.

Both the first and the second criteria lead to the minimum parasitic distortion and make the most precise output signals. And the third criterion produces the cheapest chip.

26 Claims, 112 Drawing Sheets

U.S. PATENT DOCUMENTS

| | | | |
|---|---|---|---|
| 2002/0114365 A1* | 8/2002 | Gilliland et al. | 372/38.02 |
| 2002/0140440 A1* | 10/2002 | Haase | 324/678 |
| 2004/0017574 A1* | 1/2004 | Vuong et al. | 356/625 |
| 2004/0081212 A1* | 4/2004 | Schrodinger | 372/38.02 |
| 2005/0168274 A1* | 8/2005 | Kimura | 327/552 |
| 2006/0206845 A1* | 9/2006 | Rao et al. | 716/6 |
| 2007/0101310 A1* | 5/2007 | Stirniman et al. | 716/21 |
| 2008/0151269 A1* | 6/2008 | Vuong et al. | 356/625 |

OTHER PUBLICATIONS

Hasler et al., "Elimination of Parasitic Capacitances in Swithced-Capacitor Circuits by Circuit Transformations", IEEE Transactions on Circuits and Systems, vol. CAS-32, No. 5, May 1985, pp. 467-475.*

Horn et al., "Active RC Single-Opamp Design of Driving-Point Impedances", IEEE Transactions on Circuits and Systems, vol. CAS-26, No. 1, Feb. 1979, pp. 22-30.*

Hwang et al., "High-Frequency Linear Transformation Elliptic Filters Employing Minimum Number of OTAs", Electronics Letters, vol. 31, No. 18, Aug. 31, 1995, pp. 1562-1564.*

Malvar, "Active-RC Variable Equalizers with Minimum Number of Operational Amplifiers", IEEE Transactions on Circuits and Systems, vol. CAS-30, No. 7, Jul. 1983, pp. 496-500.*

Rathore, "Minimal Realization of RC Voltage Transfer Functions by Unsymmetrical Lattice Networks," IEEE Transactions on Circuits and Systems, vol. CAS-22, No. 4, Apr. 1975, pp. 313-316.*

Shah et al., "Design of KHN Biquad Using Operational Transconductance Amplifier", 2002 45th Midwest Symposium on Circuits and Systems, vol. 1, Aug. 4-7, 2002, pp. 48-51.*

Silva-Martinez et al., "Analogue OTA Multiplier Without Input Voltage Swing Restrictions, and Temperature-Compensated", Electronics Letters, vol. 22, No. 11, May 1986, pp. 599-600.*

M. A. Tan and R. Schaumann, "Simulating general-parameter LC-ladder filters for monolithic realizations with only transconductance elements and grounded capacitors", IEEE Trans. Circuits Syst., vol. 36, No. 2, pp. 299-3-7, Feb. 1989.

P.V. Ananda Mohan, "Novel OTA-C filter structures using grounded capacitors", Proc. ISCAS, pp. 1347-1350, 1991.

Y. Sun, and J.K. Fidler, "OTA-C realization of general high-order transfer functions", Electron. Lett., vol. 29, No. 12, pp. 1057-1058, 1993.

Y. S. Hwang, S.I. Liu, D.S. Wu, and Y. P. Wu, "Table-based linear transformation filters using OTA-C techniques", Electron. Lett., vol. 30, No. 24, pp. 2021-2022, 1994.

J. Ramirez-Angulo, and E. Sanchez-Sinencio, High frequency compensated current-mode ladder filters suing multiple output OTAs', IEEE Trans Circuits Syst. II, vol. 41, No. 9, pp. 581-586, 1994.

T. Tsukutani, M. Higashimura, M. Ishiada, S. Tsuiki, and Y. Fukui, "A general class of current-mode high-order OTA-C filters", Int. J. Electron., vol. 81, No. 6, pp. 663-669, Jun. 1996.

Y. Sun, and J. K. Fidler, "Synthesis and performance analysis of universal minimum component integrator-based IFLF OTA-grounded capacitor filter", IEE Proc.-Circuits Devices Syst., vol. 14, No. 2, pp. 107-114, 1996.

M. Moniri, and B. Al-Hashimi, "Systematic generation of current-mode dual-output OTA filters using a building block approach", Int. J. Electron., vol. 83, No. 1, pp. 37-48, 1997.

Y. Sun, and J. K. Fidler, "Structure generation and design of multiple loop feedback OTA-grounded capacitor filters", IEEE Trans. Circuits Syst.-I, vol. 44, No. 1, pp. 1-11, 1997.

J. Wu, and E. I. El-Masry, "Design of current-mode ladder filters using coupled-biquads", IEEE Trans. Circuits Syst.-II, vol. 45, No. 11, pp. 1445-1454, 1998.

Y. Sun, "OTA-C filter design using inductor substitution and Bruton transformation methods", Electron. Lett., vol. 34, No. 22, pp. 2082-2083, 1998.

R. Schaumann, "Simulating lossless ladders with transconductance circuits", IEEE Trans. Circuits Syst. II, vol. 45, pp. 407-410, 1998.

C. A. Barbargires, "Explicit design of general high-order FLF OTA-C filters", Electron. Lett., vol. 35, No. 16, pp. 1289-1290 1999.

Y. Sun and J. K. Fidler, "Current-mode OTA-C realization of arbitrary filter characteristics", Electron. Lett., vol. 32, No. 13, pp. 1181-1182, Jun. 1996.

C. M. Chang, B. M. Al-Hashimi, and J. N. Ross, "Unified active filter biquad structures", IEE Proc.-Circuits, Devices, and Systems, vol. 151, No. 4, pp. 273-277, Aug. 2004.

S. Szczepanski, A. Wyszynski, and R. Schaumann, "Highly linear voltage-controlled CMOS transconductors", IEEE Trans. Circuits & Syst.-I, vol. 40, No. 4, pp. 258-262, Apr. 1993.

C. M. Chang, and B. M. Al-Hashimi, "Analytical synthesis of current-mode high-order OTA-C filters", IEEE Trans. Circuits & Syst.-I, vol. 50, No. 9, pp. 1188-1192, Sep. 2003.

C. M. Chang, "Voltage-Mode High-Order OTA-Only-Without-C Low-Pass (from 215M to 705M Hz) and Band-Pass (from 214M to 724M Hz) Filter Structure", Proceedings of IEEE: International Symposium on Circuits and Systems (ISCAS), Kobe, Japan, May 23-26, 2005, accepted for presentation and publication, pp. 5950-5953.

C. M. Chang, B. M. Al-Hashimi, Y. Sun, and J. N. Ross, "New high-order filter structures using single-ended-input OTAs and grounded capacitors", IEEE Trans. Circuits & Syst.-I, vol. 51, No. 9, pp. 458-463, Sep. 2004.

* cited by examiner

OTA-BASED HIGH-ORDER FILTERS

CROSS REFERENCE APPLICATIONS

This application claims priority from U.S. Provisional Patent Application No. 60/683,295, filed on May 23, 2005.

FIELD OF THE INVENTION

References of interest in the disclosure of the invention, the contents of which are incorporated herein by reference, include:

[1] M. A. Tan and R. Schaumann, "Simulating general-parameter LC-ladder filters for monolithic realizations with only transconductance elements and grounded capacitors", IEEE Trans. Circuits Syst., vol. 36, no. 2, pp. 299-3-7, 1989.

[2] P. V. Ananda Mohan, "Novel OTA-C filter structures using grounded capacitors", Proc. ISCAS, pp. 1347-1350, 1991.

[3] Y. Sun, and J. K. Fidler, "OTA-C realization of general high-order transfer functions", Electron. Lett, vol. 29, no. 12, pp. 1057-1058, 1993.

[4] Y. S. Hwang, S. I. Liu, D. S. Wu, and Y. P. Wu, "Table-based linear transformation filters using OTA-C techniques", Electron. Lett, vol. 30, no. 24, pp. 2021-2022, 1994.

[5] J. Ramirez-Angulo, and E. Sanchez-Sinencio, "High frequency compensated current-mode ladder filters suing multiple output OTAs", IEEE Trans Circuits Syst. II, vol. 41, no. 9, pp. 581-586, 1994.

[6] T. Tsukutani, M. Higashimura, M. Ishiada, S. Tsuiki, and Y. Fukui, "A general class of current-mode high-order OTA-C filters", Int. J. Electron., vol. 81, no. 6, pp. 663-669, June 1996.

[7] Y. Sun, and J. K. Fidler, "Synthesis and performance analysis of universal minimum component integrator-based IFLF OTA-grounded capacitor filter", IEE Proc.-Circuits Devices Syst., vol. 14, no. 2, pp. 107-114, 1996.

[8] M. Moniri, and B. Al-Hashimi "Systematic generation of current-mode dual-output OTA filters using a building block approach", Int. J. Electron., vol. 83, no. 1, pp. 37-48, 1997.

[9] Y. Sun, and J. K. Fidler, "Structure generation and design of multiple loop feedback OTA-grounded capacitor filters", IEEE Trans. Circuits Syst.-I, vol. 44, no. 1, pp. 1-11, 1997.

[10] J. Wu, and E. I. El-Masry, "Design of current-mode ladder filters using coupled-biquads", IEEE Trans. Circuits Syst.-II, vol. 45, no. 11, pp. 1445-1454, 1998.

[11] Y. Sun, "OTA-C filter design using inductor substitution and Bruton transformation methods", Electron. Lett., vol. 34, no. 22, pp. 2082-2083, 1998.

[12] R. Schaumann, "Simulating lossless ladders with transconductance circuits", IEEE Trans. Circuits Syst. II, vol. 45, pp. 407-410, 1998.

[13] C. A. Barbargires, "Explicit design of general high-order FLF OTA-C filters", Electron. Lett., vol. 35, no. 16, pp. 1289-1290, 1999.

[14] Y. Sun and J. K. Fidler, "Current-mode OTA-C realization of arbitrary filter characteristics". Electron. Lett., vol 32, no. 13, pp. 1181-1182, June 1996.

[15] C. M. Chang, B. M. Al-Hashimi, and J. N. Ross, "Unified active filter biquad structures", IEE Proc.-Circuits, Devices, and Systems, vol. 151, no. 4, pp. 273-277, August 2004.

[16] S. Szczepanski, A. Wyszynski, and R. Schaumann, "Highly linear voltage-controlled CMOS transconductors", IEEE Trans. Circuits & Syst., vol. 40, no. 4, pp. 258-262, April 1993.

[17] C. M. Chang, and B. M. Al-Hashimi, "Analytical synthesis of current-mode high-order OTA-C filters", IEEE Trans. Circuits & Syst.-I, vol. 50, no. 9, pp. 1188-1192, September 2003.

[18] C. M. Chang, "Voltage-Mode High-Order OTA-Only-Without-C Low-Pass (from 215M to 705 MHz) and Band-Pass (from 214M to 724 MHz) Filter Structure", Proceedings of IEEE: International Symposium on Circuits and Systems (ISCAS), Kobe, Japan, 23-26 May 2005, accepted for presentation and publication.

[19] C. M. Chang, B. M. Al-Hashimi, Y. Sun, and J. N. Ross, "New high-order filter structures using single-ended-input OTAs and grounded capacitors", IEEE Trans. Circuits & Syst.-I, vol. 51, no. 9, pp. 458-463, September 2004.

BACKGROUND OF THE INVENTION

In 1989, a generalized approach based on signal flow graph methods for designing filters with only transconductance elements and grounded capacitors was presented [1]. For generating active simulations of the LC-ladder filters, the methods result in circuits where all transconductors except one are identical, making the approach extremely convenient for monolithic realization with systematic design and dense layout Although derived for single-input transconductance elements, it is shown how the methods can be extended to designs based on differential: input or even fully balanced transconductors. As an example, the method employs 23 single-input OTAs and 10 grounded capacitors to realize an eighth-order elliptic band-pass LC-ladder filter. In 1991, a third-order elliptic low-pass filter was proposed [2] which employed 3 single-input OTAs, 5 double-input OTAs and 4 grounded capacitors. In 1993, an OTA-C realization of general voltage-mode nth-order transfer functions, which is different from simulating passive ladders [1], was presented [3] which used n double-input OTAs, n+2 single-input OTAs and n grounded capacitors. In 1994, a technique employing 3 single-ended-input OTAs, 4 double-input OTAs, and 4 grounded capacitors to realize third-order elliptic filters was presented [4]. In 1994, a methodology to compensate for the non-ideal performance of the OTA, a current-mode filter using single-input multiple-output OTAs and based on RLC ladder filter prototypes was presented [5]. It realized a $5^{th}$-order all-pole RLC ladder filer by using seven single-input OTAs, and 5 grounded capacitors, and a third-order elliptic low-pass filter by using seven single-input OTAs, three grounded capacitors and 2 current buffers.

Employing a current-mode integrator and a proportional block as basic building units to reduce the component count, a current-mode nth-order filter configuration was introduced in 1996 [6]. It employs n+2 single-input OTAs and n grounded capacitors. In the same year, the voltage-mode filter structure proposed in [7] employs n+1 single-input OTAs, n−1 double-input OTAs, and n grounded capacitors in order to realize an nth-order voltage-mode transfer function but without the nth-order term in the numerator. On the other hand, employing 2n+2/2n+3 single-input OTAs and n grounded capacitors to realize an nth-order current-mode general transfer function was also proposed [14]. A systematic generation of current-mode dual-output OTA filters using a building block approach was developed in 1997 [8]. It uses four single-input OTAs and two grounded capacitors to realize a second-order high-pass or notch, namely, band-reject filter under some component matching conditions. In the same year, employing n double-input OTAs, n+2 single-input OTAs, and n grounded capacitors to realize a general nth-order voltage-mode transfer function was proposed [9]. In 1998, a design approach based on simulating RLC ladder networks using coupled-biquad structures was presented [10]. Applying this approach, it needs 7 single-input OTAs, and 7 grounded capacitors to realize a fifth-order all-pole ladder result in the same OTA-C filter circuit [12]. To Size a fourth-order shunt or series ladder arms needs seven single-input OTAs and four grounded capacitors. Recently, in order to minimize the feed-through effects or unexpected signal paths due to the finite parasitic input capacitance of the OTA, a circuit was developed which employed 3n+3 OTAs, and only one of which is double-input OTA, and n grounded capacitors to realize a general voltage-mode nth-order transfer function [13].

TABLE 1

Comparison of recently reported high-Order OTA-C filters

| | | Advantages | | |
|---|---|---|---|---|
| Methods | The lesast number of OTAs | Empolyment of single-input OTAs | Employment of grounded capacitors | The least number of capacitors |
| Tan and Schaumann in 1989 [1] | No (23 for $8^{th}$-order band-pass) | Yes | Yes | No (10 for $8^{th}$-order band-pass) |
| Ananda Mohan in 1991 [2] | No (8 for $3^{rd}$-order low-pass) | No (e.g. 3 single-input but 4 double-input OTAs) | Yes | No (4 for $3^{rd}$-order low-pass) |
| Sun and Fidler in 1993 [3] | No (2n + 2 for nth-order transfer functions) | No (e.g. n + 2 single-input but n double-input OTAs) | Yes | Yes |
| Hwang et al. in 1994 [4] | No (7 for $3^{rd}$-order low-pass) | No (e.g. 3 single-input but 4 double-input OTAs) | Yes | No (4 for $3^{rd}$-order low-pass) |
| Ramirez-Angulo et al. In 1994 [5] | Yes (sometimes) No (sometimes) | No | Yes | Yes |
| Tsukutani et al. in 1996 [6] | No (2n + 2 for nth-order transfer functions) | Yes | Yes | Yes |
| Sun and Fidler in 1996 [7] | No (2n for (n − 1)th-order transfer functions) | No (e.g. n + 1 single-input but n − 1 double-input OTAs) | Yes | No (n for (n − 1)th-order transfer functions) |
| Monir and Al-Hashini in 1997 [8] | Yes (sometimes) No (sometimes) | Yes | Yes | Yes |
| Sun and Fidler in 1997 [9] | No (2n + 2 for nth-order transfer functions) | No (e.g. n + 2 single-input but n double-input OTAs) | Yes | Yes |
| Wu and El-Masry in 1998 [10] | No (7 for $5^{th}$-order low-pass) | Yes (sometimes) No (sometimes) | Yes | Yes (sometimes) No (sometimes) |
| Sun in 1998 [11] | Yes (sometimes) No (sometimes) | No (e.g. 3 single-input but 2 double-input OTAs) | Yes (sometimes) No (sometimes) | Yes |
| Schaumann in 1998 [12] | No (7 for $4^{th}$-order ladder arms) | Yes | Yes | Yes (4 for 4thorder ladder arms) |
| Barbargires in 199 [13] | No (3n + 3 for nth-order transfer functions) | No (e.g. 3n + 2 single-input but 1 double-input OTAs) | Yes | Yes |
| Sun and Fidler (CM) in 1996 [14] | No (2n + 2/2n + 3 for nth-order filters) | Yes | Yes | Yes | low-pass ladder filter, needs 9 single-input OTAs, and 6 grounded capacitors to realize a sixth-order all-pole band-pass ladder filter, and needs five OTAs, one of which is double-input OTA, four grounded capacitors, and a current buffer to realize a third-order elliptic low-pass filter. In the same year, using inductor substitution and Bruton transformation methods to realize an LC ladder filter was proposed [11]. To realize a third-order voltage-mode low-pass ladder filter needs five OTAs, two of which are double-input OTAs, and three grounded capacitors. Then it was demonstrated that the two predominant methods for simulating an active LC In the traditional voltage-mode or current-mode high-order Operational Transconductance Amplifiers and Capacitors (OTA-C) filter field, if other conditions are the same that the smaller the R (resistance) or/and the C (capacitance) are used then the operational frequency is higher for an active-RC circuit. However, to cover the effect of the parasitic capacitance, the capacitor used is much larger in magnitude than the parasitic capacitance has. On the other hand, the limited adjustable range of the transconductance of an operational transconductance amplifier (OTA) leads to the limited range of operational frequency of an OTA-C filter. In other words, the operational frequency of an OTA-C filter is limited by the magnitude of the given capacitor, which cannot be too small to mask the effect of the parasitic capacitance, and the adjustable range of the transconductance of an OTA.

So far no one has resolved the given capacitor with the parasitic capacitance problem to obtain a circuit suitable for high frequency operation. One of the main reasons is that all of the positions of parasitic capacitances are not exactly at the same positions of all of the given capacitors in a realized circuit. The number of the positions of parasitic capacitances is larger than that of the positions of the given capacitors in the circuits due to several different kinds of parasitic capacitances, namely, input and output parasitic capacitances of the OTAs, and the nodal parasitic capacitance at each node in a synthesized circuit Therefore, the replacement of the given capacitors with parasitic capacitances leads to a completely different circuit structure and output response.

However, in the new nth-order OTA-C filter structures proposed in this invention there are just n grounded capacitors and just n nodes in a realized nth-order circuit All of the parasitic capacitances are just located at all of the same positions of the n given capacitors. It leads to the possibility that to replace all the given capacitors with all the parasitic capacitances doesn't change the output response at all. Such nth-order OTA-only-without-R-and-C filter structures are constructed by utilizing this unique characteristic.

Over the last decade or so numerous voltage-mode and current-mode high-order OTA-C filter structures have been reported. Such structures have often been developed with different design criteria in mind, including reduced number of active elements, single-ended-input OTAs, grounded capacitors, and simple design methods. There are three important criteria that need to be considered when generating OTA-C filter structures. The three important criteria ("Three Criteria") are:

filters use grounded capacitors because they have smaller chip area than the floating counterpart, and because they can absorb equivalent shunt capacitive parasitics;
  filters employ only single-ended-input OTAs to overcome the feed-through effects due to finite input parasitic capacitances associated with double-input OTAs; and
  filters have the least number of components (passive and active) for a given order to reduce power consumption, chip areas, and noise.

Based upon the above three important criteria, none of the current OTA filter designs are capable of achieving the three important criteria simultaneously and without trade-offs. Therefore, there is still a need to develop new nth-order filter structures that offer more advantages than existing structures. All of the circuits proposed in this invention are the perfect cases achieving the aforementioned three important criteria simultaneously.

SUMMARY OF THE INVENTION

The object of the present invention is to provide nth-order OTA-C filter structures using the analytical synthesis method to achieve the aforementioned three important criteria simultaneously. Therefore, the proposed nth-order OTA-C filter structures are with the minimum parasitic distortion and have the most precise output responses.

In addition, collateral nth-order OTA-only-without-R-and-C filter structures are realized by utilizing unique characteristic of above nth-order OTA-C filter structures in which there are just n grounded capacitors, each of which is located at each of the total n nodes in a realized circuit. Note that all of the parasitic capacitances are just located at all of the same positions of the n given capacitors. It allows replacing all the given capacitors with all the parasitic capacitances and doesn't change the output response at all. Since the proposed circuits use only the active element, OTA, but without R and C, the produced chip is the cheapest.

Moreover, the error or distortion, due to the total inner parasitics, of the circuit parameter can be reduced and avoided by appropriately tuning the transconductances with fixing or changing, if necessary, the ratio of all given capacitances in integrated circuits. Note that the tuning of transconductances and/or the changing the ratio of all given capacitances are based upon the relationship between the sensitivity simulation result of each transconductance and capacitance and the circuit parameter.

BRIEF DESCRIPTION OF THE DRAWING

Other objects, features, and advantages of the present invention will become apparent from the following detailed description of the preferred but non-limiting embodiment. The description is made with reference to the accompanying drawings in which:

FIG. 1-1(*a*), (*b*), (*c*), (*d*), and (*e*) show the low-pass, band-pass, high-pass, band-reject amplitude-frequency simulated responses, and all-pass phase-frequency simulated response of the above circuit, respectively;

FIG. 1-2 is a circuit diagram of the current-mode OTA-only-without-C biquad filter;

FIG. 1-2(*a*), (*b*), (*c*), (*d*), and (*e*) show the low-pass, band-pass, band-reject, high-pass, and all-pass simulation results of the circuit shown in FIG. 1-2, respectively;

FIG. 2-1 is a circuit diagram of the current-mode nth-order OTA-C biquad filter;

FIG. 2-1(*a*), (*b*) and (*c*) show the high-pass and all-pass amplitude-frequency responses and all-pass phase-frequency response of a current-mode 4th-order OTA-C high-pass and all-pass circuit, respectively;

FIG. 2-2 is a circuit diagram of the collateral current-mode nth-order OTA-only-without-C biquad filter;

FIG. 2-2(*a*) is a circuit diagram of the collateral current-mode 2nd-order OTA-only-without-C biquad filter;

FIG. 2-2(*b*), (*c*), (*d*) to (*e*), (*f*) to (*i*), and (*j*) to (*m*) show the high-pass, low-pass, band-pass, band-reject, and all-pass simulation results of a 2nd-order OTA-only-without-C filter, respectively;

FIG. 3-1 is a circuit diagram of the voltage-mode nth-order OTA-C low-pass and band-pass filter;

FIG. 3-1(*a*) is a circuit diagram of the voltage-mode 3rd-order OTA-C low-pass and band-pass filter;

FIG. 3-2 is a circuit diagram of the voltage-mode nth-order OTA-only-without-C low-pass and band-pass filter;

FIG. 3-2(*a*) shows the amplitude responses with the min. and max. operational frequencies of a voltage-mode 10th-order OTA-only-without-C low-pass and band-pass filter;

FIG. 3-2(*b*) shows variation of parasitic capacitances with frequency (low-pass);

FIG. 3-2(*c*) shows variation of parasitic capacitances with frequency (band-pass);

FIG. 3-2(*d*) and (*e*) show the sensitivity simulations for the 3rd-order OTA-only-without-C low-pass filter;

FIG. 4-1 is a circuit diagram of the voltage-mode nth-order OTA-C low-pass, band-pass, and high-pass filter;

FIG. 4-1(*a*) shows the simulated responses of a 3rd-order low-pass and high-pass OTA-C filter;

FIG. 4-2 is a circuit diagram of the collateral OTA-only-without-C low-pass, band-pass, and high-pass filter;

FIG. 4-2(a) and (b) show amplitude-frequency responses of the voltage-mode 9th-order OTA-only-without-C low-pass and band-pass filter, respectively;

FIG. 5-1 is a circuit diagram of the voltage-mode nth-order OTA-C arbitrary filter;

FIG. 5-2 is a circuit diagram of the voltage-mode nth-order OTA-only-without-C arbitrary filter;

FIG. 6-1 is circuit diagram of the voltage-mode 2nd-order OTA-C universal (including low-pass, band-pass, high-pass, band-reject, and all-pass) filter;

FIG. 6-1(a) is circuit diagram of the voltage-mode nth-order OTA-C universal (including low-pass, band-pass, high-pass, band-reject, and all-pass) filter;

FIG. 6-1(b), (c), (d), (e), (f), and (g) show the amplitude-frequency responses and the all-pass phase-frequency responses of the filter shown in FIG. 6-1, respectively;

FIG. 6-2 is a circuit diagram of the collateral voltage-mode 2nd-order OTA-only-without-C biquad filter;

FIG. 6-2(a) is a circuit diagram of the collateral voltage-mode nth-order OTA-only-without-C biquad filter;

FIG. 6-2(b) and (c) show the amplitude-frequency responses and all-pass phase-frequency response of the filter shown in FIG. 6-2, respectively;

FIG. 7-1 is a circuit diagram of the current-mode odd-nth-order OTA-C arbitrary filter;

FIG. 7-1(a) is a circuit diagram of the current-mode odd-nth-order OTA-C elliptic filter;

FIG. 7-1(b) is a circuit diagram of a current-mode 3rd-order OTA-C elliptic filter derived from FIG. 7-1(a);

FIG. 7-1(c) shows the simulated amplitude-frequency response of the filter shown in FIG. 7-1(b);

FIG. 7-1(d) shows the sensitivity simulation responses of the filter shown in FIG. 7-1(b);

FIG. 7-2 is a circuit diagram of the collateral current-mode odd-nth-order OTA-only-without-C arbitrary and elliptic filter;

FIG. 7-2(a) and (b) are the collateral current-mode odd-nth-order OTA-only-without-C filters shown in FIG. 7-1(a) and (b), respectively;

FIG. 7-2(c) shows the simulated amplitude-frequency response of the current-mode 3rd-order OTA-only-without-C elliptic filter;

FIG. 8-1 is a circuit diagram of the current-mode odd-nth-order OTA-C elliptic filter with the minimum components;

FIG. 8-1(a) is a circuit diagram of the current-mode odd-3rd-order OTA-C elliptic filter with the minimum components;

FIG. 8-1(b) shows the simulated amplitude-frequency response of the filter in FIG. 8-1(a);

FIG. 8-1(c) shows the sensitivity simulations of the filter in FIG. 8-1(a);

FIG. 8-2 is a circuit diagram of the collateral current-mode odd-nth-order OTA-only-without-C elliptic filter;

FIG. 8-2(a) is a circuit diagram of the collateral current-mode odd-3th-order OTA-only-without-C elliptic filter;

FIG. 8-2(b) shows the simulated amplitude-frequency responses of the filter in FIG. 8-2(b);

FIG. 9-1 is a circuit diagram of the voltage-mode odd-nth-order OTA-C arbitrary filter;

FIG. 9-1(a) is a circuit diagram of the voltage-mode odd-nth-order OTA-C elliptic filter;

FIG. 9-1(b) is a circuit diagram of a voltage-mode odd-3rd-order OTA-C elliptic filter;

FIG. 9-1(c) shows the amplitude-frequency response of the voltage-mode 3rd-order OTA-C elliptic filter;

FIG. 9-2 and (a) are the collateral voltage-mode odd-nth-order OTA-only-without-C filters shown in FIG. 9-1 and (a) respectively;

FIG. 9-2(b) is the 3rd-order case of FIG. 9-2(a);

FIG. 9-2(c) and (d) show the amplitude-frequency responses of the voltage-mode 3rd-order OTA-only-without-C elliptic filter with different component values;

FIG. 10-1 is a circuit diagram of the voltage-mode even-nth-order OTA-C arbitrary filter;

FIG. 10-1(a) is a circuit diagram of the voltage-mode even-nth-order OTA-C elliptic filter;

FIG. 10-1(b) is a circuit diagram of the voltage-mode 4th-order OTA-C elliptic filter;

FIG. 10-1(c) is a circuit diagram of the voltage-mode 4th-order OTA-C elliptic filter;

FIG. 10-1(d) shows the amplitude-frequency response of the voltage-mode 4th-order OTA-C elliptic filter;

FIG. 10-2 and (a) are the collateral voltage-mode even-nth-order OTA-only-without-C filter structure shown in FIG. 10-1 and (a);

FIG. 10-2(b) is the 4th-order case of FIG. 10-2(a);

FIG. 10-2(c) and (d) show the amplitude-frequency responses of the voltage-mode 4th-order OTA-only-without-C elliptic filter with different component values;

FIG. 11-1 is a circuit diagram of the current-mode even-nth-order OTA-C arbitrary filter;

FIG. 11-1(a) is a circuit diagram of the current-mode even-nth-order OTA-C elliptic filter;

FIG. 11-1(b) is a circuit diagram of a current-mode 4rth-order OTA-C elliptic filter;

FIG. 11-1(c) shows the simulated amplitude-frequency of the current-mode 4rth-order OTA-C elliptic filter;

FIG. 11-1(d) shows the sensitivity simulations of the current-mode 4rth-order OTA-C elliptic filter;

FIG. 11-2 and 11-2(a) are the collateral current-mode even-nth-order OTA-only-without-C filter structures shown in FIG. 11-1 and 11-1(a);

FIG. 11-2(b) is the 4th-order one of FIG. 11-2(a);

FIG. 11-2(c) shows the amplitude-frequency response comparison between the simulation (×) and the theory (−).

FIG. 11-2(d) and (e) show the simulated amplitude-frequency responses of the current-mode OTA-only-without-C filter with different component values;

FIG. 12-1 is a circuit diagram of the current-mode even-nth-order OTA-C elliptic filter structure with the minimum components;

FIGS. 12-1(a) and (b) is a circuit diagram of the current-mode 4th-order OTA-C elliptic filter structure with the minimum components;

FIGS. 12-1(c) and (d) show the simulated amplitude-frequency responses of the current-mode 4th-order OTA-C high-pass and low-pass elliptic filter, respectively;

FIG. 12-2 is the collateral current-mode even-nth-order OTA-only-without-C filter structure shown in FIG. 12-1;

FIG. 12-2(a) is the 4th-order one of FIG. 12-2;

FIG. 12-2(b) shows the simulated amplitude-frequency response of the current-mode 4th-order OTA-only-without-C filter.

DETAILED DESCRIPTION OF THE INVENTION

Figure 1:
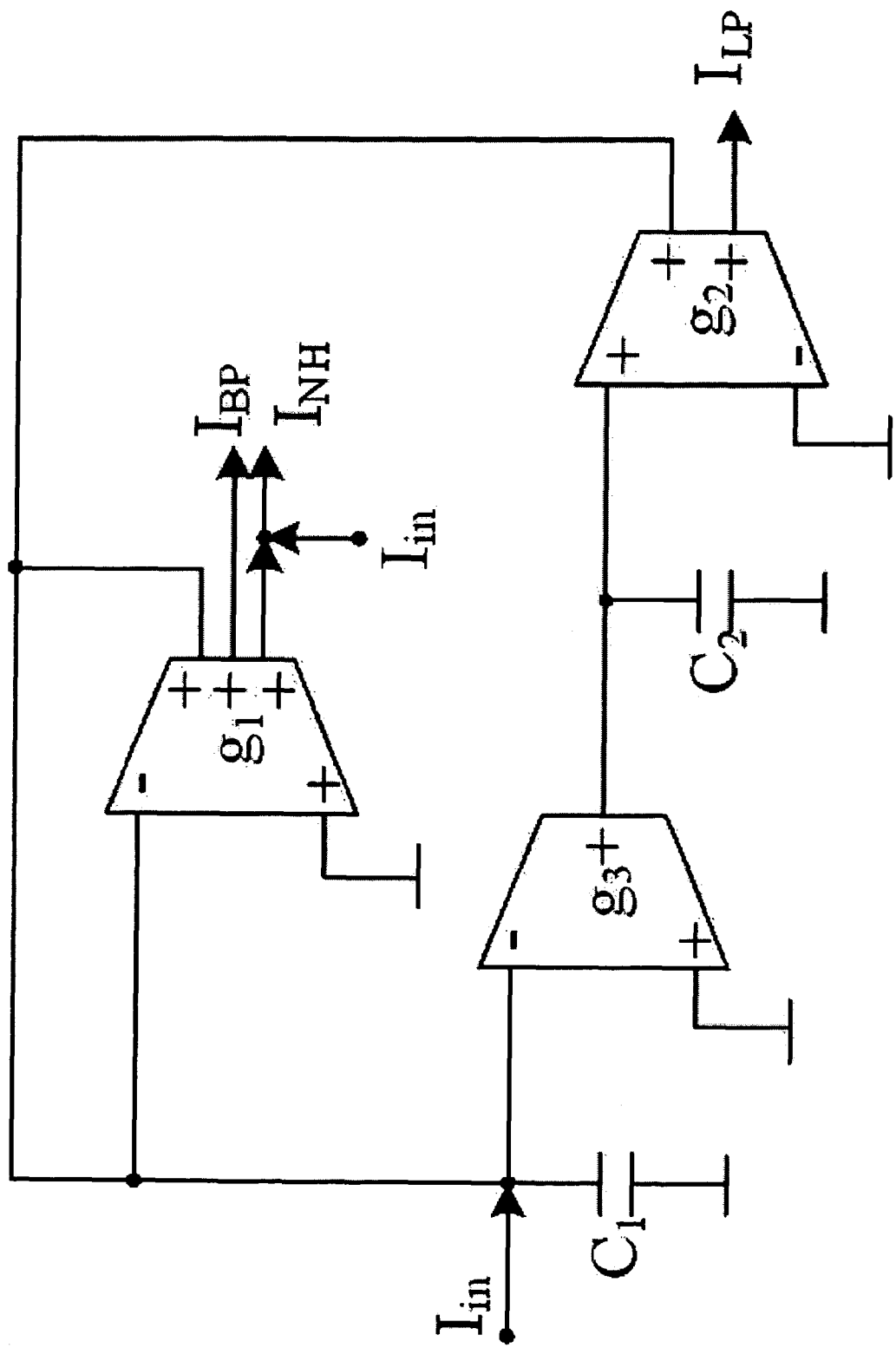
FIG. 1 is a circuit diagram of the current-mode OTA-C biquad filter.

In this invention, the OTA-C filter shall be designed with the aforementioned Three Criteria listed as following:

filters use grounded capacitors because they have smaller chip area than the floating counterpart, and because they can absorb equivalent shunt capacitive parasitics;

filters employ only single-input OTAs to overcome the feed-through effects due to finite input parasitic capacitances associated with double-input OTAs; and filters have the least number of components (passive and active) for a given order to reduce power consumption, chip areas, and noise.

Note that the OTA-C filter with the aforementioned Three Criteria has the minimum non-ideal parasitic capacitance and conductance, which leads to the most precise output signals. In this invention, the OTA-only-without-C filter shall be designed with the following design rules. (i) The number of internal nodes except the input and output nodes is equal to that of the order of the transfer function of the synthesized circuit (ii) Each of all internal nodes except the input and output nodes is-connected by a grounded capacitor and no extra capacitors are used in the synthesized circuit. Then, all grounded capacitors can be removed from the synthesized circuit without any change of the type of the output signal. Note that the active element-without-C circuit can operate at high frequencies about from 5 MHz to 5 GHz since the parasitic capacitance is quite small. Please note that the OTA-only-without-C filter structures in the present invention enjoy (i) all single-ended-input OTAs (overcoming the feed-through effect), (ii) the least/minimum number of OTAs (reducing power consumption, chip area, and noise), and (iii) no use of resistors and capacitors in the design. The above latter two advantages lead to the lowest cost performance for the high-frequency (about from 5 MHz to 5 GHz) circuits. In this invention, a new tuning technique from the simulated nominal value to the theoretical exact value for the circuit parameters, for instance, such as $f_p$, $A_1$, $f_s$, and $A_2$, and the peak $P_k$ at the pass-band corner for the third-order OTA-C elliptic filter shown in FIG. 8-1(*a*), has also been presented and demonstrated using the relationship between sensitivity simulation result of each transconductance and capacitance and the circuit parameter.

The present invention includes 22 OTA-C filter shut (shown in FIGS. 1-1, 3-1, 4-1, 5-1, 6-1, 6-1(*a*), 7-1, 7-1(*a*), 7-1(*b*), 8-1, 8-1(*a*), 9-1, 9-1(*a*), 9-1(*b*), 10-1, 10-1(*a*), 10-1(*b*), 11-1, 11-1(*a*), 11-1(*b*), 12-1, and 12-1(*a*)), and 23 collateral OTA-only-without-C filter structures (shown in FIGS. 1-2, 2-2, 3-2, 4-2, 5-2, 6-2, 6-2(*a*), 7-2, 7-2(*a*), 7-2(*b*), 8-2, 8-2(*a*), 9-2, 9-2(*a*), 9-2(*b*), 10-2, 10-2(*a*), 10-2(*b*), 11-2, 11-2(*a*), 11-2(*b*), 12-2, and 12-2(*a*)), and the replacement of the above 45 OTA-based circuits by the equivalent active elements like the second-generation current controlled conveyors (CCCIIs) [15]. The 45 OTA-based circuits in the present invention are shown as below. Moreover, a new tuning technique from the simulated nominal value to the theoretical exact value is presented using the sensitivity simulation results of each transconductance and capacitance (or each active and passive element parameter for other analog circuits).

1.1 Current-Mode OTA-C Low-Pass, Band-Pass, High-Pass, Band-Reject, and All-Pass Biquad Filter [15]

Circuit analysis for the OTA-C biquad filter shown in FIG. 1-1, which employs the minimum components count (three OTAs and two grounded capacitors) and enjoys the high output impedance good for cascadability, yields $$\frac{I_{BP}}{I_{in}} = \frac{-sC_2g_1}{s^2C_1C_2 + sC_2g_1 + g_2g_3} \quad (1\text{-}1)$$

$$\frac{I_{NH}}{I_{in}} = \frac{s^2C_1C_2 + g_2g_3}{s^2C_1C_2 + sC_2g_1 + g_2g_3} \quad (1\text{-}2)$$

$$\frac{I_{LP}}{I_{in}} = \frac{-g_2g_3}{s^2C_1C_2 + sC_2g_1 + g_2g_3} \quad (1\text{-}3)$$

The above equations show an inverting band-pass signal at current output $I_{BP}$, a notch signal at current output $I_{NH}$, and an inverting low-pass signal at current output $I_{LP}$. An all-pass response can be obtained by summing Eqs. (1-1) and (1-2), i.e., joining the two output terminals, $I_{BP}$ and $I_{NH}$, with the following transfer function:

$$\frac{I_{AP}}{I_{in}} = \frac{I_{BP}}{I_{in}} + \frac{I_{NH}}{I_{in}} = \frac{s^2C_1C_2 - sC_2g_1 + g_2g_3}{s^2C_1C_2 + sC_2g_1 + g_2g_3} \quad (1\text{-}4)$$

Similarly, a high-pass response can be obtained by summing Eqs. (1-2) and (1-3), i.e., joining the two output terminals, $I_{NH}$ and $I_{LP}$, with the following transfer function:

$$\frac{I_{HP}}{I_{in}} = \frac{I_{LP}}{I_{in}} + \frac{I_{NH}}{I_{in}} = \frac{s^2C_1C_2 - sC_2g_1 + g_2g_3}{s^2C_1C_2 + sC_2g_1 + g_2g_3} \quad (1\text{-}5)$$

Note that the OTA-C biquad filter shown in FIG. 1-1 realizes five generic filtering functions, low-pass, band-pass, high-pass, band-reject, and all-pass signals, without the need to impose component choice conditions and still enjoys independent control of $\omega_o$ and $\omega_o/Q$ as shown:

$$\omega_o = \sqrt{\frac{g_2g_3}{C_1C_2}} \quad (1\text{-}6)$$

$$\frac{\omega_o}{Q} = \frac{g_1}{C_1} \quad (1\text{-}7)$$

The parameter $\omega_o$ can be changed either by $g_2$ or $g_3$, without, disturbing Q, which can be independently varied by $g_1$. Note that $\omega_o$ can also be changed by both components ($g_2$, $g_3$) if a wider tuning range of $\omega_o$ is required, without affecting Q.

We also note that the circuit shown in FIG. 1-1 achieves the Three Criteria. Especially, two requirements, (i) only two internal nodes in the second-order filter structure, and (ii) one grounded capacitor at each internal node and no extra capacitors used in the synthesized biquad filter shown in FIG. 1-1 meet the criteria. The main goal of the present invention, to form a high-frequency (about 5 MHz to 5 GHz) circuit when removing all of the capacitors from the synthesized OTA-C biquad filter. The collateral OTA-only-without-C biquad filter is shown in FIG. 1-2.

To verify the theoretical analysis of the implemented OTA-C biquad filter-shown in FIG. 1-1, the TSMC035 level-49 H-Spice simulation using the CMOS implementation of the OTA [16] with $V_{DD}$=1.65V, $V_{SS}$=1.65V, (i) for band-pass, $I_{abc}$=7.4 μA leading to $g_1$=$g_2$=$g_3$=62.8 μS, and $C_1$=$C_2$=10 pF, (ii) for low-pass, high-pass, band-reject, and all-pass, $I_{abc}$=34 μA leading to $g_1$=$g_2$=$g_3$=160 μS, and $C_1$=18 pF, $C_2$=36 pF. The low-pass, band-pass, high-pass, band-reject amplitude-frequency simulated responses, and all-pass phase-frequency simulated response are shown in FIGS. 1-1(*a*), (*b*), (*c*), (*d*), and (*e*), respectively. As it can be seen, there is a close agreement between theory and simulation, for example, the simulated $f_o$=1.01 MHz (low-pass), 1.00 MHz (band-pass), 0.979 MHz (high-pass), 1.00 MHz (band-reject), and 0.977 MHz (all-pass) in comparison with the theoretical $f_o$=1.00 MHz.

1.2 Current-Mode OTA Only-Without-C Low-Pass, Band-Pass, High-Pass, Band-Reject, and All-Pass Biquad Filter The current-mode second-order OTA-C universal filter structure shown in FIG. 1-1 can be replaced by the OTA-only-without-C universal filter structure after removing all grounded capacitors from FIG. 1-1. The collateral OTA-only-without-C biquad filter is shown in FIG. 1-2.

The TSMC035 H-Spice simulation using the CMOS implementation of the OTA [16] with W/L=5μ/1μ and 10μ/1μ for NMOS and PMOS transistors, respectively, under ±1.65V supply voltages was applied to verify the main goal of the present invention. The component values are (i) for the low-pass: $g_1$=77.33 μS ($I_{abc}$=10 μA), $g_2$=161.89 μS ($I_{abc}$=35 μA), and $g_3$=194.26 μS ($I_{abc}$=60 μA); (ii) for the band-pass: $g_1$=188 μS ($I_{abc}$=50 μA), $g_2$=120 μS ($I_{abc}$=20 μA), and $g_3$=172 μS ($I_{abc}$=40 μA); (i) for the band-reject: $g_1$=16.638 μS ($I_{abc}$=251 μA), $g_2$=22.937 μS ($I_{abc}$=200 μA), and $g_3$=22.937 μS ($I_{abc}$=200 μA); (i) for the high-pass: $g_1$=42.3 μS ($I_{abc}$=135 μA), $g_2$=193 μS ($I_{abc}$=65 μA), and $g_3$=192 μS ($I_{abc}$=65 μA); (i) for the all-pass: $g_1$=65.3 μS ($I_{abc}$=110 μA), $g_2$=26.8 μS ($I_{abc}$=179 μA), and $g_3$=42 μS ($I_{abc}$=135 μA). FIGS. 1-2(*a*), (*b*), (*c*), (*d*), and (*e*) show the low-pass, band-pass, band-reject, high-pass, and all-pass simulation results with $f_o$=201 MHz, 200 MHz, 31.7 MHz, 293 MHz, and 64.6 MHz, and the equivalent parasitic capacitances 0.14 pF, 0.114 pF, 0.115 pF, 0.035 pF, and 0.08265 pF, respectively, of the second-order OTA-only-without-C filter structure whose circuit diagram is shown in FIG. 1-2. As it can be seen, there are nearly not any differences from the filtering type point of view between OTA-C and OTA-only-without-C circuits but the operational frequencies.

2.1 Current-Mode Nth-Order OTA-C Low-Pass, Band-Pass, High-Pass, Band-Reject, and All-Pass Filter Structure [17]

Only using n single-ended-input OTAs and n grounded capacitors, the minimum active and passive components, a current-mode nth-order low-pass, band-pass, high-pass, band-reject, and all-pass filter structure is shown in FIG. 2-1 with the following input and output relationship:

$$I_{0v} = \frac{a_n I_n s^n + \sum_{i=0}^{n-1} a_i s^i (I_n - I_i)}{a_n s^n + a_{n-1} s^{n-1} + \ldots + a_1 s + a_0} \quad (2\text{-}1)$$

The different settings of the n+1 input currents, $I_0, I_1, I_2 \ldots, I_{n-1}, I_n$, can produce different low-pass, band-pass, high-pass, band-reject, and all-pass output signals. For example, let n=2, there are three input signals, $I_0$, $I_1$, and $I_2$. The specifications for realizing five different generic filter signals are (i) low-pass: $I_0$=$I_{in}$, but $I_1$=$I_2$=0;
(ii) band-pass: $I_1$=$I_{in}$, but $I_0$=$I_2$=0;
(iii) high-pass: $I_0$=$I_1$=$I_2$=$I_{in}$;
(iv) band-reject: $I_1$=$I_2$=$I_{in}$, but $I_0$=0;
(v) all-pass: $I_2$=$I_{in}$, $I_1$=$2I_{in}$, but $I_0$=0.

The filter structure shown in FIG. 2-1 achieves the Three Criteria. Especially, two requirements, (i) only n internal nodes in the nth-order filter structure, and (ii) one grounded capacitor at each internal node and no extra capacitors used in the synthesized filter structure shown in FIG. 2-1 meet the criteria. The main goal of the present invention, to form a high-frequency (about 5 MHz to 5 GHz) circuit when removing all of the capacitors from the synthesized nth-order circuit.

To verify the theoretical analysis of the synthesized current-mode fourth-order OTA-C high-pass and all-pass filters shown in FIG. 2-1, the UMC05 level-49 H-Spice simulation using the CMOS implementation of the OTA [16] with $V_{DD}$=2.5V, $V_{SS}$=−2.5V, $I_{abc}$=60.73 μA leading to $g_1$=$g_2$=$g_3$=$g_4$=157 μS, and $C_1$=32.5 pF, $C_2$=16.25 pF, $C_3$=9.53 pF, $C_4$=9.75 pF, the high-pass and all-pass amplitude-frequency responses and all-pass phase-frequency response are shown in FIGS. 2-1(*a*), (*b*) and (*c*), respectively. As it can be seen, there is a close agreement between theory and simulation, for example, their simulated $f_o$=1.93 MHz (high-pass) and 2.00 MHz (all-pass) compared to 2.01 MHz in the ideal case.

2.2 Current-Mode Nth-Order OTA-Only-Without-C Low-Pass, Band-Pass, High-Pass, Band-Reject, and All-Pass Filter Structure [17]

The current-mode nth-order OTA-C universal filter structure shown in FIG. 2-1 can be replaced by the OTA-only-without-C universal filter structure after removing all grounded capacitors from FIG. 2-1. The collateral OTA-only-without-C biquad filter is shown in FIG. 2-2.

The TSMC035 H-Spice simulation using the CMOS implementation of the OTA [16] with W/L=5μ/1μ and 10μ/1μ for NMOS and PMOS transistors, respectively, under ±1.65V supply voltages was applied to verify the main goal of the present invention. FIGS. 2-2(*b*), (*c*), (*d*) to (*e*), (*f*) to (*i*), and (*j*) to (*m*) show the high-pass, low-pass, band-pass, band-reject, and all-pass simulation results, respectively, of the second-order filter structure whose circuit diagram is shown in FIG. 2-2(*a*). As it can be seen, there are nearly not any differences from the filtering type point of view between OTA-C and OTA-only-without-C circuits but the operational frequencies. Furthermore, the simulated values of the equivalent parasitic capacitances are in the area from 0.083556 pF to 1.68288 pF.

3.1 Voltage-Mode Nth-Order OTA-C Low-Pass and Band-Pass Filter Structure [18]

Figures 1, 3:
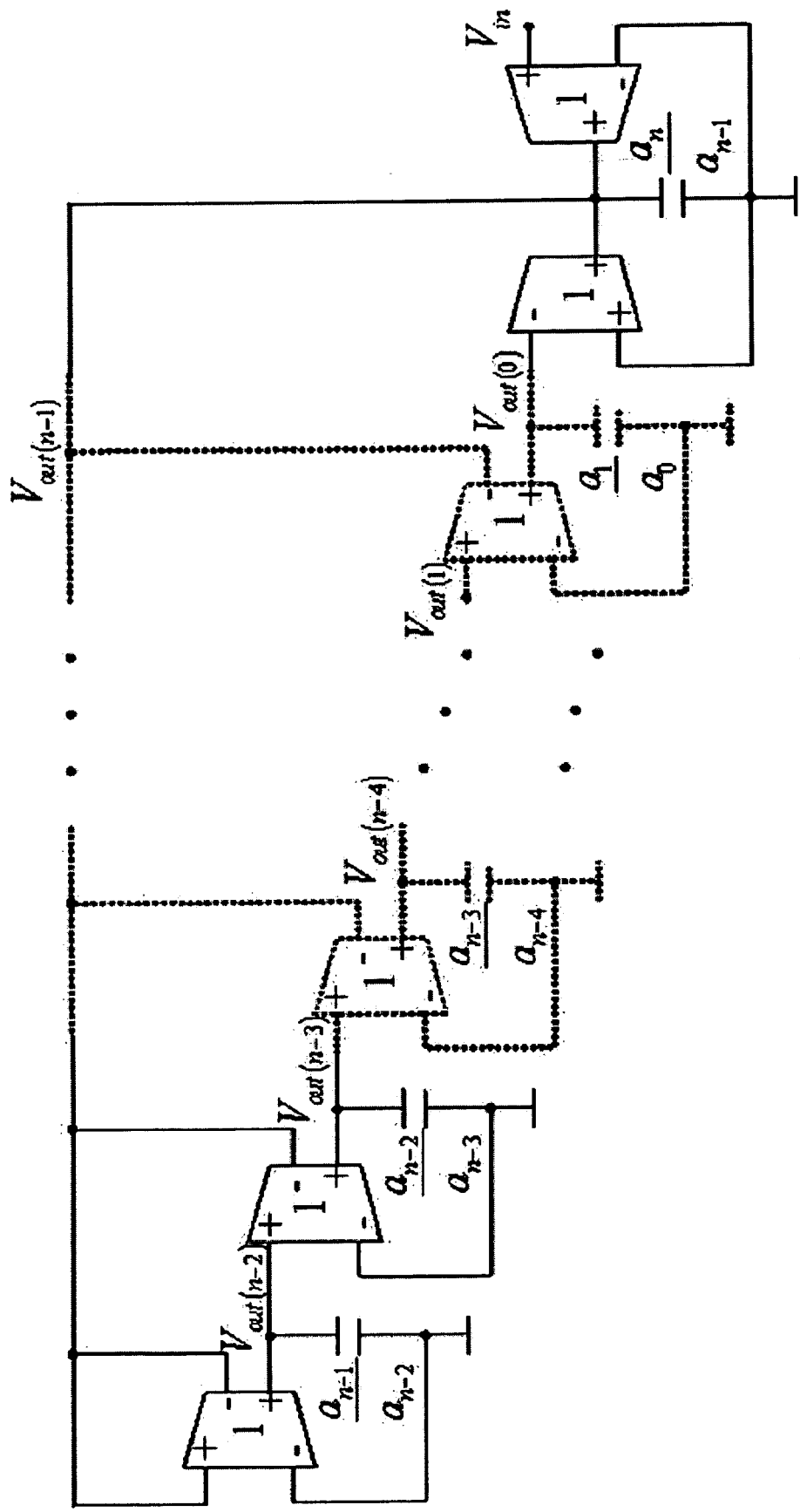
Figures 1A, 3:
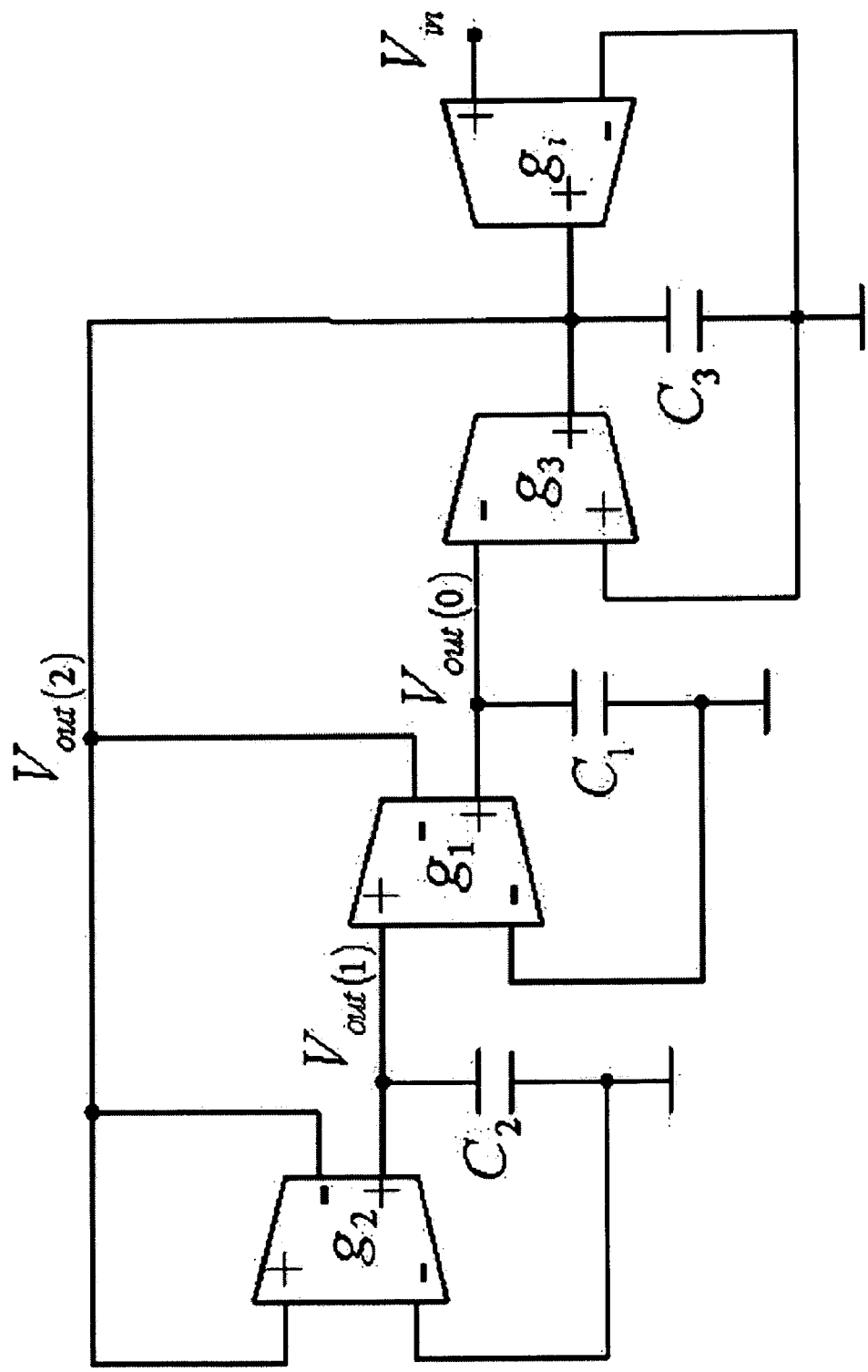
Figures 2, 3:
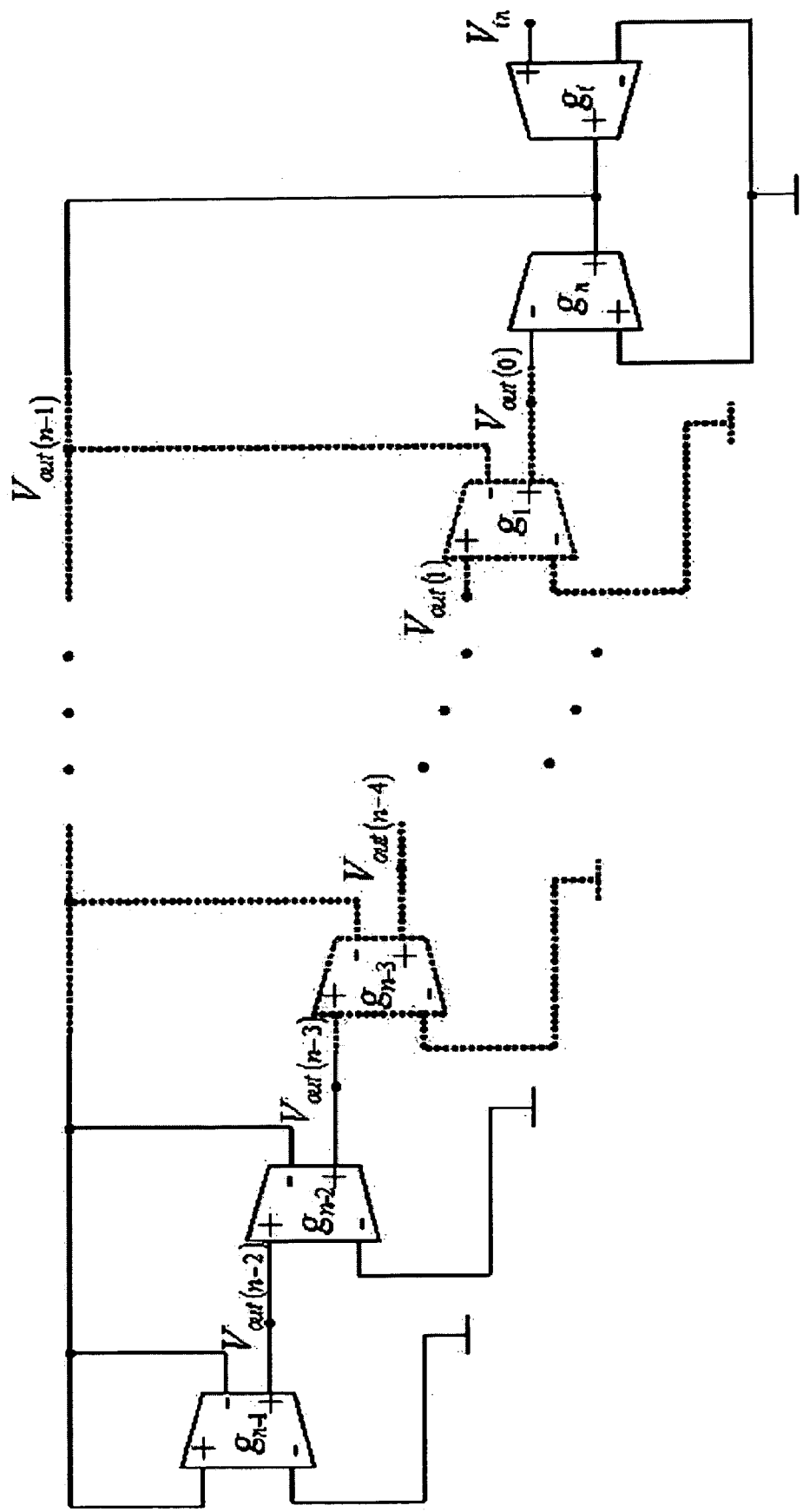
Figures 2A, 3:
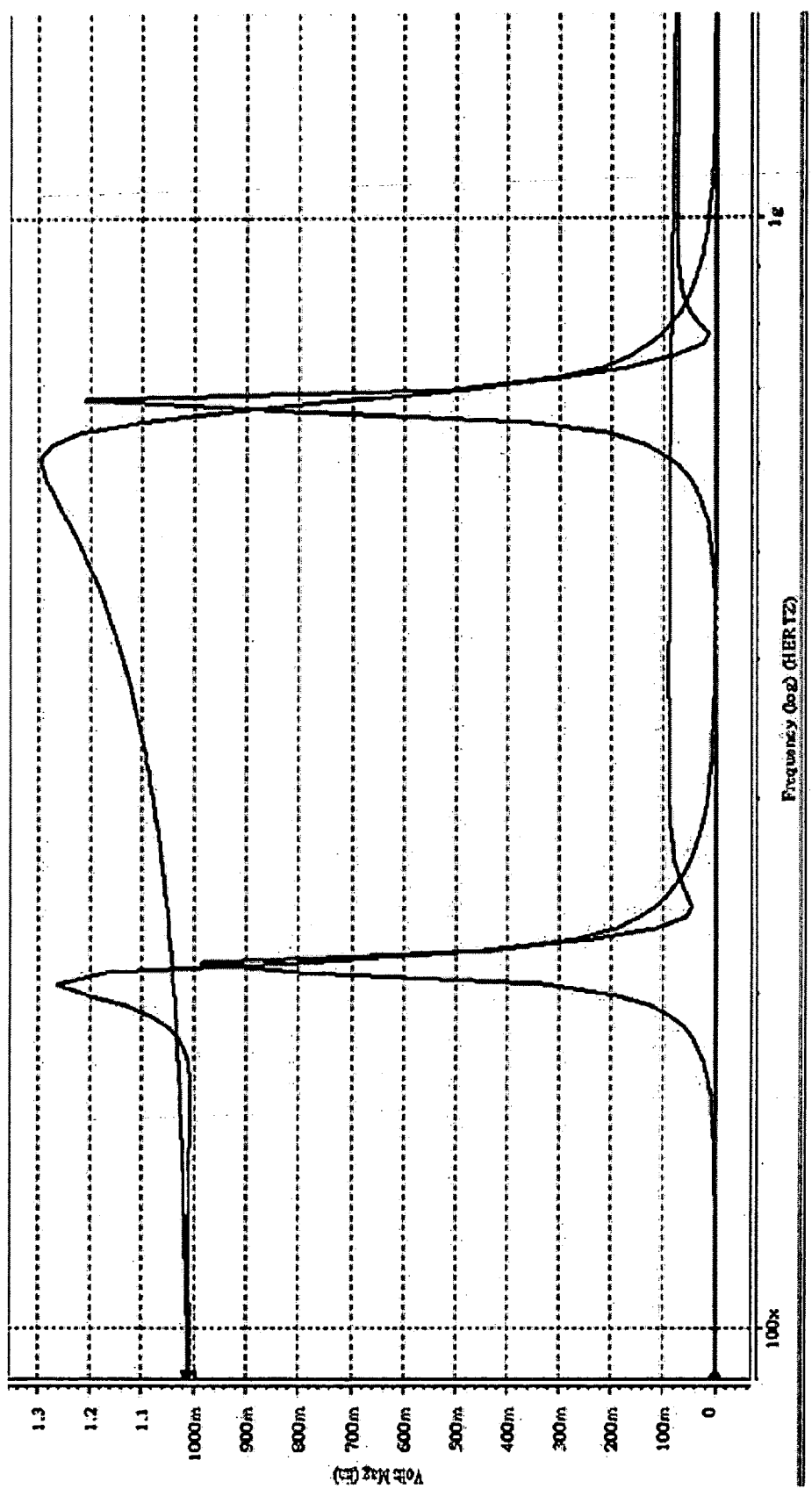
Figures 2B, 3:
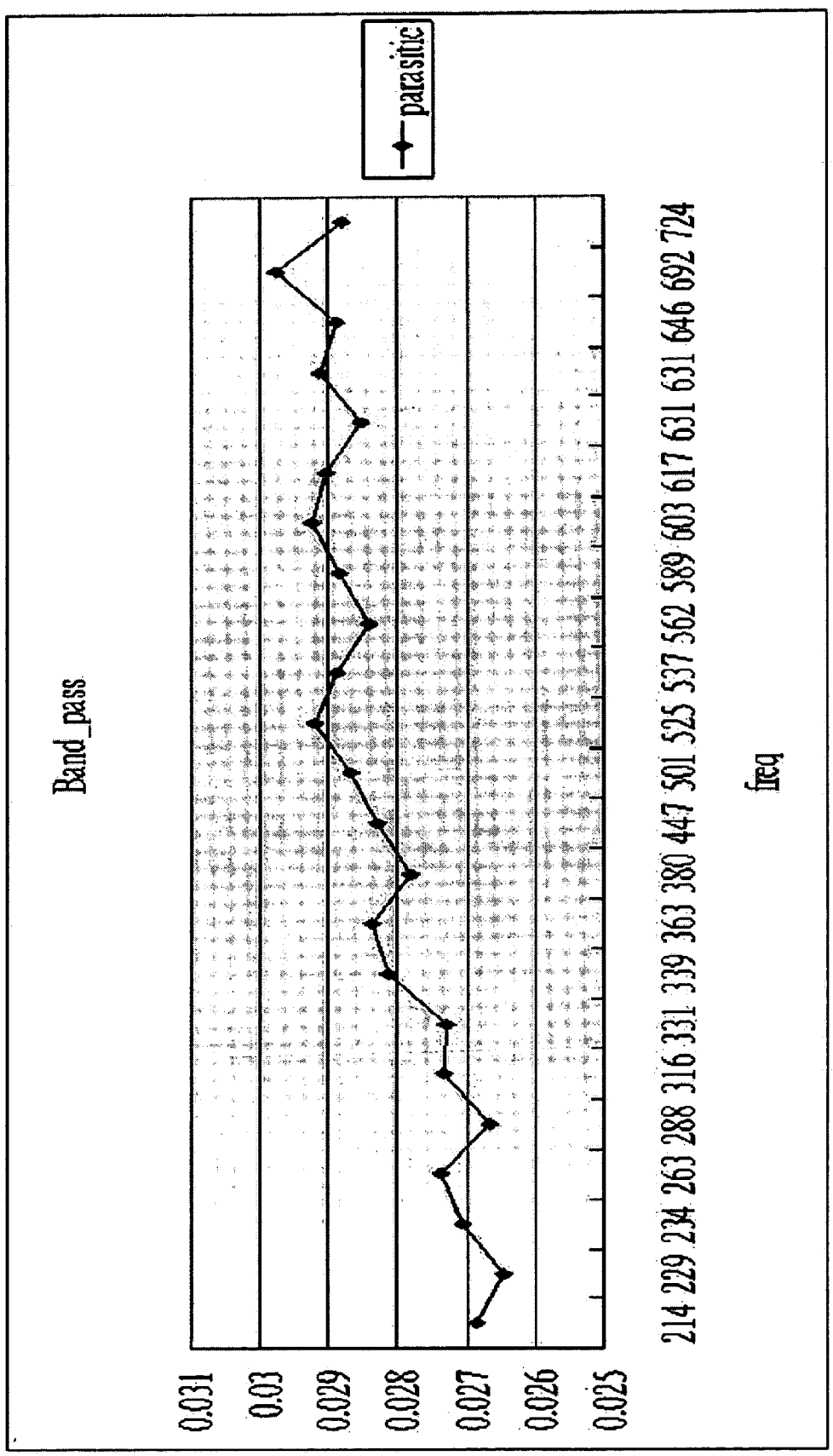
Figures 2C, 3:
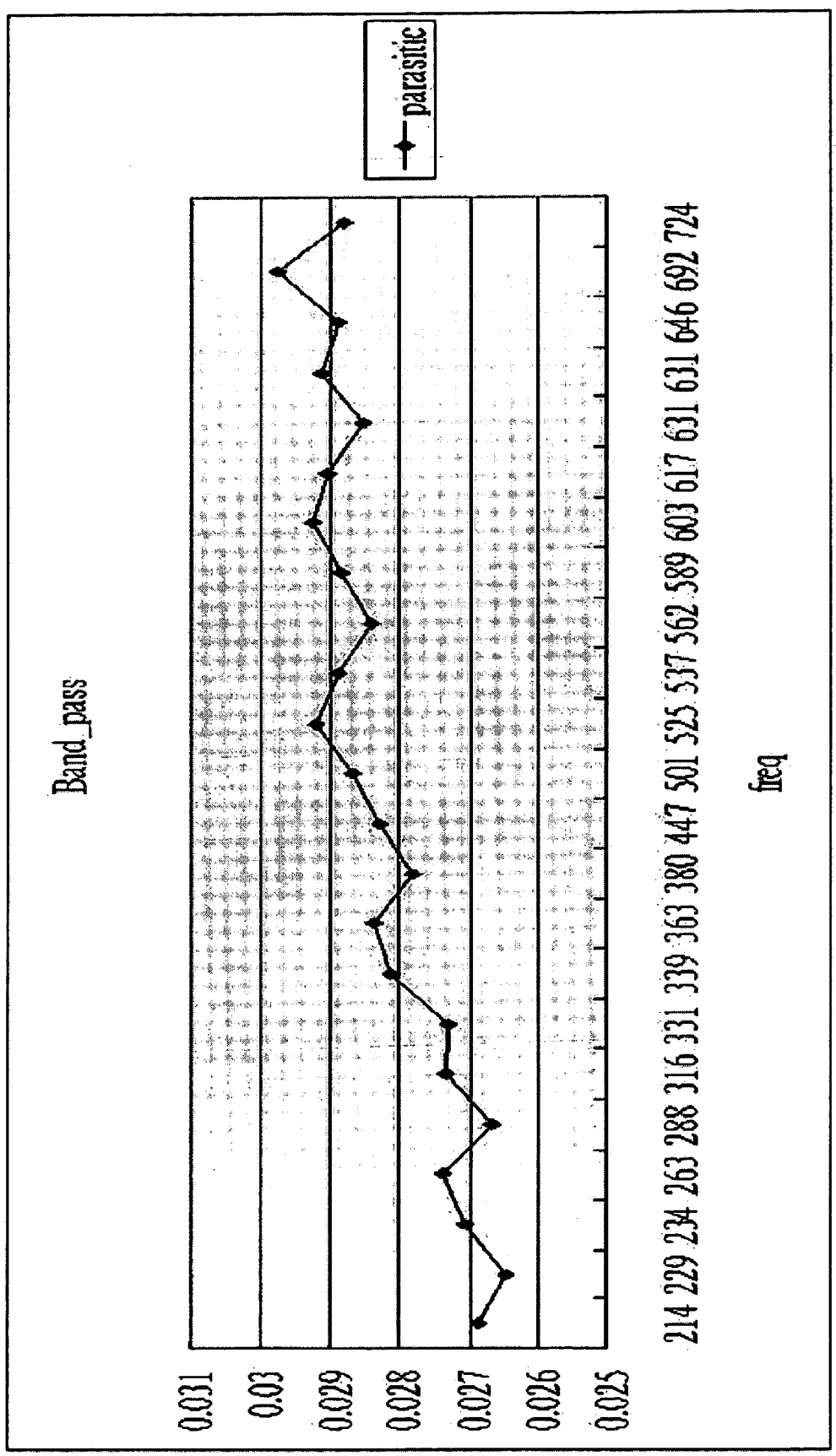
Figures 2D, 3:
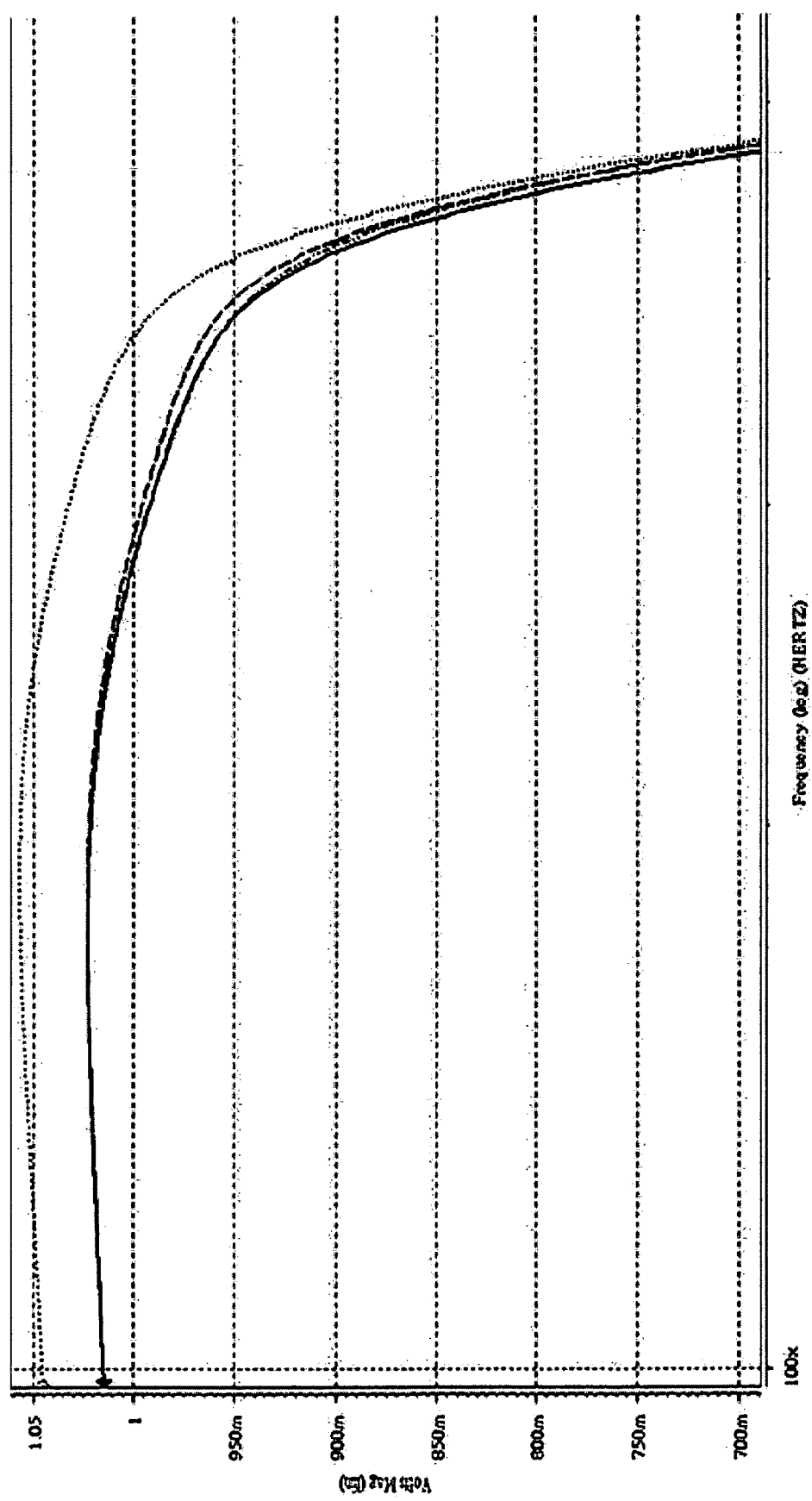
Figures 2E, 3:
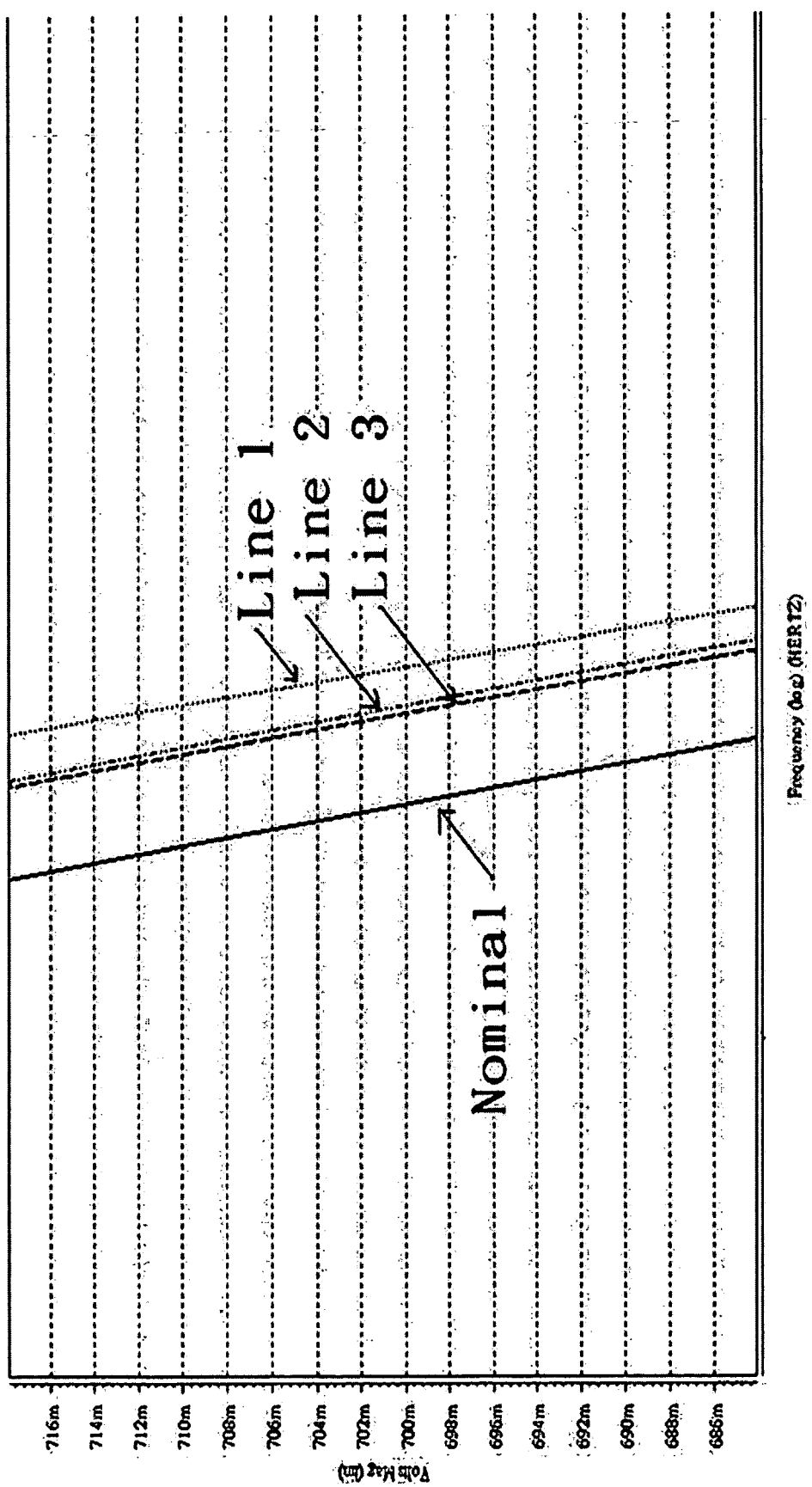

FIG. 3-1 shows the nth-order filter structure where $V_{in}$ is the filter input voltage, and $V_{out(0)}$, $V_{out(1)}$, $V_{out(2)} \ldots$, $V_{out(n-2)}$, and $V_{out(n-1)}$ are the n filter voltage outputs. The settings of the n filter output voltages determine the filter functions (low-pass and band-pass). It can be seen that the structure employs only n+1 single-ended-input OTAs and n grounded capacitors. The transfer functions of the nth-order low-pass and band-pass filter structure, shown in FIG. 3-1, with different outputs can be derived as $$V_{out(i)} = V_{in}\left(\frac{a_i s^i}{\Delta}\right), i = 0, 1, 2 \ldots, n-1, \quad (3\text{-}1)$$

where $$\Delta = a_n s^n + a_{n-1} s^{n-1} + a_{n-2} s^{n-2} + \ldots + a_2 s^2 + a_1 s + a_0$$

Note that the synthesized filter structure achieves the Three Criteria for the design of OTA-C filters including the least active and passive component counts when compared with the previous work.

The sensitivities of the transfer function of the new third-order filter structure shown in FIG. 3-1(*a*) to individual capacitance and transconductance are shown as follows.

Circuit analysis for FIG. 3-1(*a*) yields the following three transfer functions $$H_L \equiv \frac{V_{out(0)}}{V_{in}} \quad (3\text{-}2)$$

$$= \frac{g_i g_1 g_2}{s^3 C_1 C_2 C_3 + s^2 C_1 C_2 g_2 + sC_1 g_1 g_2 + g_1 g_2 g_3}$$

$$= \frac{b_0}{a_3 s^3 + a_2 s^2 + a_1 s + a_0}$$

$$\equiv \frac{b_0}{\Delta}$$

$$H_{B1} \equiv \frac{V_{out(1)}}{V_{in}} \quad (3\text{-}3)$$

$$= \frac{sC_1 g_1 g_2}{s^3 C_1 C_2 C_3 + s^2 C_1 C_2 g_2 + sC_1 g_1 g_2 + g_1 g_2 g_3}$$

$$H_{B2} \equiv \frac{V_{out(2)}}{V_{in}} \quad (3\text{-}4)$$

$$= \frac{s^2 C_1 C_2 g_i}{s^3 C_1 C_2 C_3 + s^2 C_1 C_2 g_2 + sC_1 g_1 g_2 + g_1 g_2 g_3}$$

Then, the sensitivities of $H_L$ to the components are $$S_{g_i}^{H_L}=1,\ S_{g_1}^{H_L}=(a_3 s^3+a_2 s^2)/\Delta,\ S_{g_2}^{H_L}=a_3 s^3/\Delta,\ S_{g_3}^{H_L}=-a_0/\Delta,$$

$$S_{C_1}^{H_L}=-(a_3 s^3+a_2 s^2+a_1 s)/\Delta,\ S_{C_2}^{H_L}=-(a_3 s^3+a_2 s^2)/\Delta,$$
$$S_{C_3}^{H_L}=-a_3 s^3/\Delta. \quad (3\text{-}5)$$

Obviously, all sensitivities are not larger than unity. In other words, it enjoys low sensitivity performance. Moreover, it is very interesting that the sum of some sensitivities in Eq. (3-5) has a null total. They are $$S_{C_3}^{H_L}+S_{g_2}^{H_L}=0,\ S_{C_2}^{H_L}+S_{g_1}^{H_L}=0,\ S_{C_1}^{H_L}+S_{g_3}^{H_L}+S_{g_i}^{H_L}=0,$$

$$S_{C_3}^{H_L}+S_{g_2}^{H_L}+S_{C_2}^{H_L}+S_{g_1}^{H_L}+S_{C_1}^{H_L}+S_{g_3}^{H_L}+S_{g_i}^{H_L}=0. \quad (3\text{-}6)$$

The above null relationships lead to zero sensitivities if the variations of some sensitivities concerned have the same increment. Obviously, the above sensitivity analysis offers the advantage of low sensitivities which has been achieved by the well-known doubly terminated LC ladder monolithic integrated circuit. So do the sensitivities of $H_{B1}$ and $H_{B2}$. And so do the nth-order OTA-C low-pass and band-pass filter structure by using deduction approach.

3.2 Voltage-Mode Nth-Order OTA-Only-Without-C Low-Pass and Band-Pass Filter Structure [18]

The voltage-mode nth-order OTA-C filter structure shown in FIG. 3-1 can be replaced by the OTA-only-without-C filter structure after removing all grounded capacitors from FIG. 3-1. The collateral OTA-only-without-C filter structure is shown in FIG. 3-2.

A tenth-order voltage-mode OTA-only-without-C low-pass and band-pass filter is the example used to verify the feasibility of the filter shown in FIG. 3-2 by using H-Spice simulation with UMC05 level-49 process parameters. The CMOS implementation of an OTA in [16] is employed in the simulation with ±2.5V supply voltages and W/L=5µ/0.5µ and 10µ/0.5µ for NMOS and PMOS transistors, respectively. The feasible case with the minimum operational frequency having the bias currents: $l_{bi}=I_{b10}=250$ µA ($g_i=g_{10}=301$ µS), $I_{b3}=50$ µA ($g_3=144$ µS), and $I_{b2}=I_{b4}=\ldots=I_{b9}=10$ µA ($g_{b2}=g_{b4}=\ldots=g_{b9}=18.9$ µS) leads to 215M Hz ($f_{3dB}$) low-pass, and $I_{bi}=I_{b1}=10.3$ µA ($g_i=g_{10}=29.8$ µS) and $I_{b2}=I_{b3}=\ldots=I_{b9}=15$ µA ($g_{b2}=g_{b3}=\ldots=g_{b9}=36.9$ µS) leads to 214M Hz (central frequency) band-pass filtering signals, shown in FIG. 3-2(*a*), with the parasitic capacitances 0.022607 pF and 0.026863 pF, respectively. The feasible case with the maximum operational frequency having the bias currents: $I_{bi}=I_{b10}=250$ µA ($g_i=g_{10}=190$ µS), $I_{b2}=I_{b4}=50$ µA ($g_2=g_4=60.3$ µS), $I_{b3}=150$ µA ($g_3=154$ µS), and $I_{b1}=I_{b5}=\ldots=I_{b9}=240$ µA ($g_{b1}=g_{b5}=\ldots=g_{b9}=191.3$ µS) leads to 705M Hz ($f_{3dB}$) low-pass, and $I_{bi}=I_{b10}=74.9$ µA ($g_i=g_{10}=58.1$ µS) and $I_{b2}=I_{b3}=\ldots=I_{b9}=136$ µA ($g_{b2}g_{b3}=\ldots=g_{b9}=210$ µS) leads to 724M Hz (central frequency) band-pass filtering signals, shown in FIG. 3-2(*a*), with the parasitic capacitances 0.024790 pF and 0.028797 pF, respectively. The simulation results show that the OTA-only-without-C low-pass and band-pass biquad can be operated well from 215 M to 705 MHz and from 214 M to 724 MHz, respectively. The simulated parasitic capacitances have a straight increment about 0.002904 pF from 0.0022607 pF to 0.025511 pF, varying with frequency from 215M to 515 M Hz, shown in FIG. 3-2(*b*), for the low-pass biquad, and a parabolic increment about 0.003277 pF from 0.026489 pF to 0.029766 pF, varying with frequency from 229M to 692 M Hz, shown in FIG. 3-2(*c*), for the band-pass biquad. In addition to the tenth-order example, the sixth-order, third-order, and second-order simulation results have shown very good low-pass and band-pass amplitude frequency responses.

On the other hand, the sensitivity simulations have also been done for the third-order OTA-only-without-C low-pass filter, i.e., the residue of FIG. 3-1(*a*) after replacing $C_1$, $C_2$, and $C_3$, with parasitic capacitances, denoted by $C_{p1}$, $C_{p2}$, and $C_{p3}$, respectively. The sensitivity simulations with +5% $g_i$, +5% $g_1$, and +5% $g_2$ tolerances have $f_{3db}$=473M Hz with 1.285% error (compared with the nominal $f_{3db}$=467M Hz as $g_i=g_3=236.8$ µS, $g_1=38.8$ µS, and $g_2=98.8$ µS), $f_{3db}$=471M Hz with 0.857% error, and $f_{3db}$=471M Hz with 0.857% error, respectively, all of which are much lower than +5% component tolerance, shown in FIGS. 3-2(*d*) and (*e*), and meet the above theoretical predictions.

4.1 Voltage-mode Nth-Order OTA-C Low-Pass, Band-Pass, and High-Pass Filter Structure [19]

Figures 1, 4:
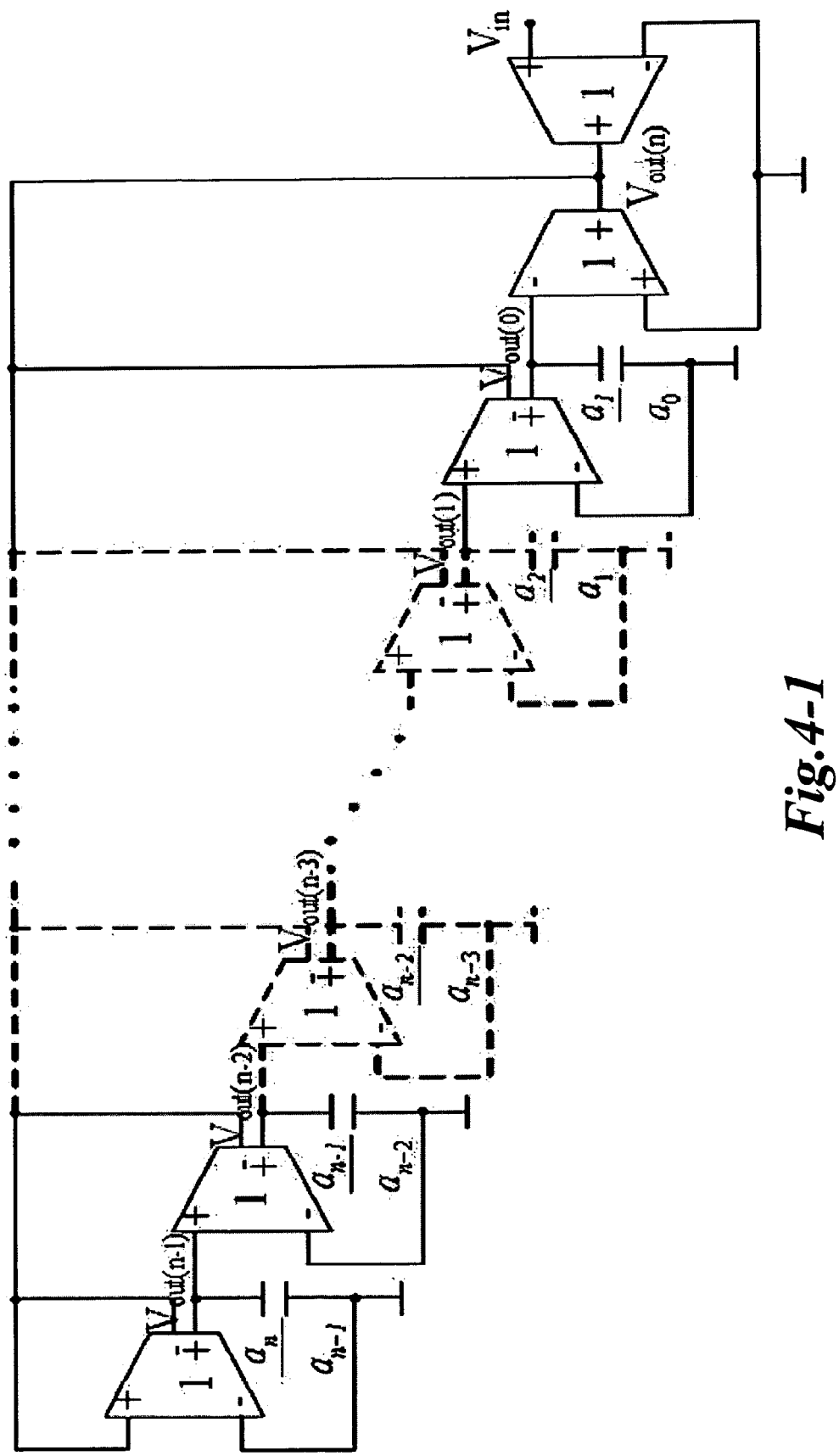
Figures 1A, 4:
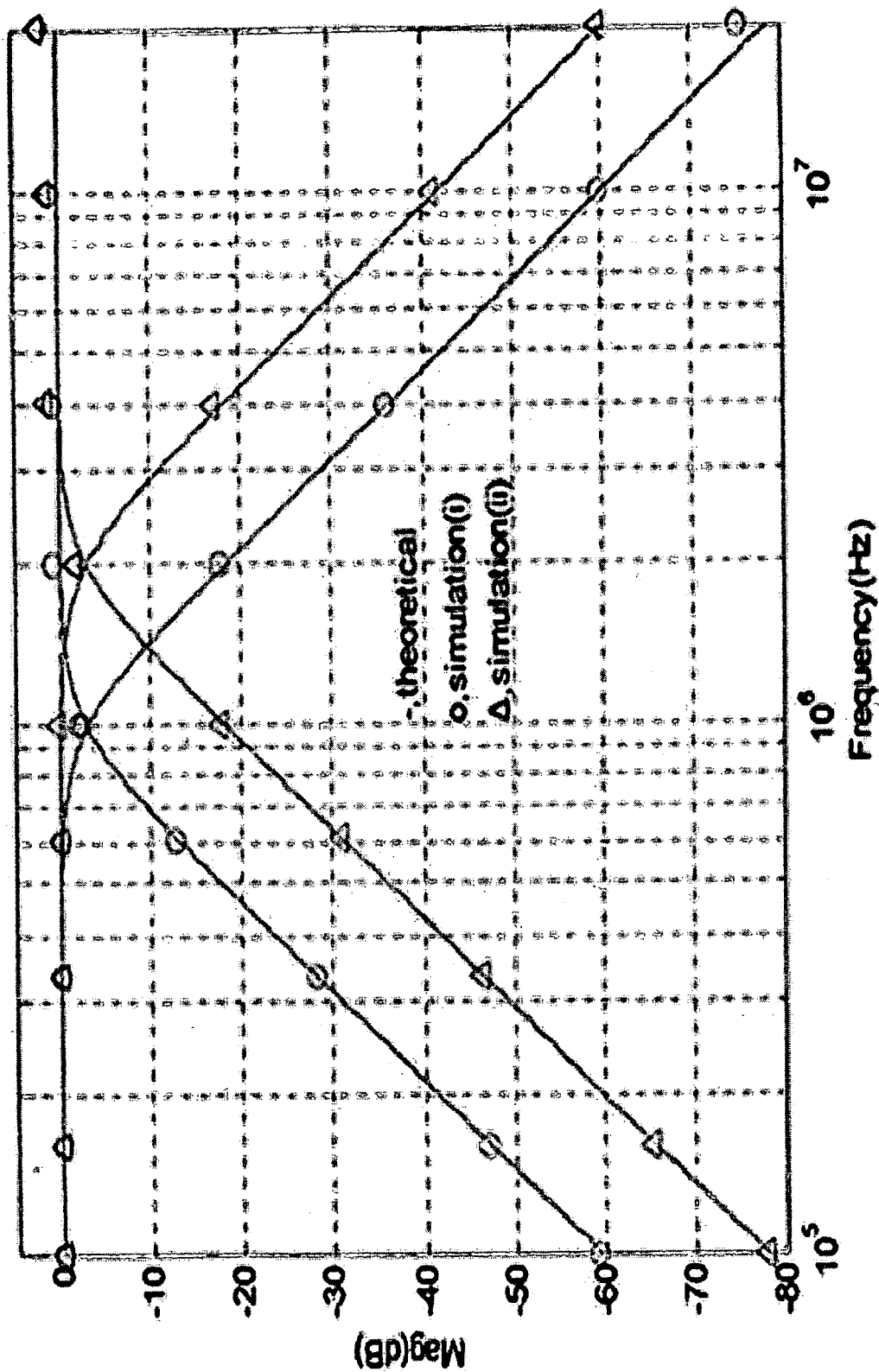
Figures 2, 4:
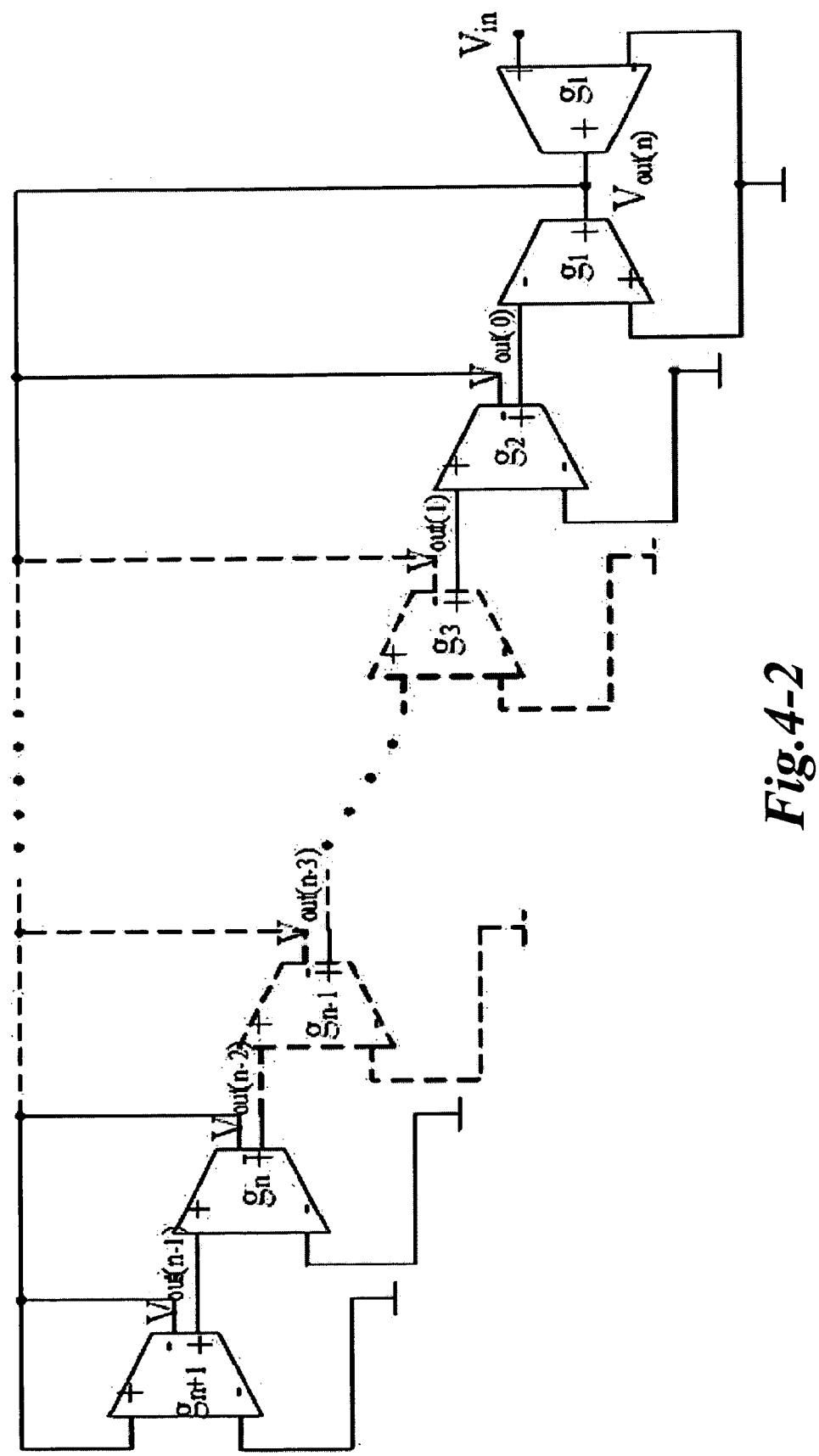
Figures 2A, 4:
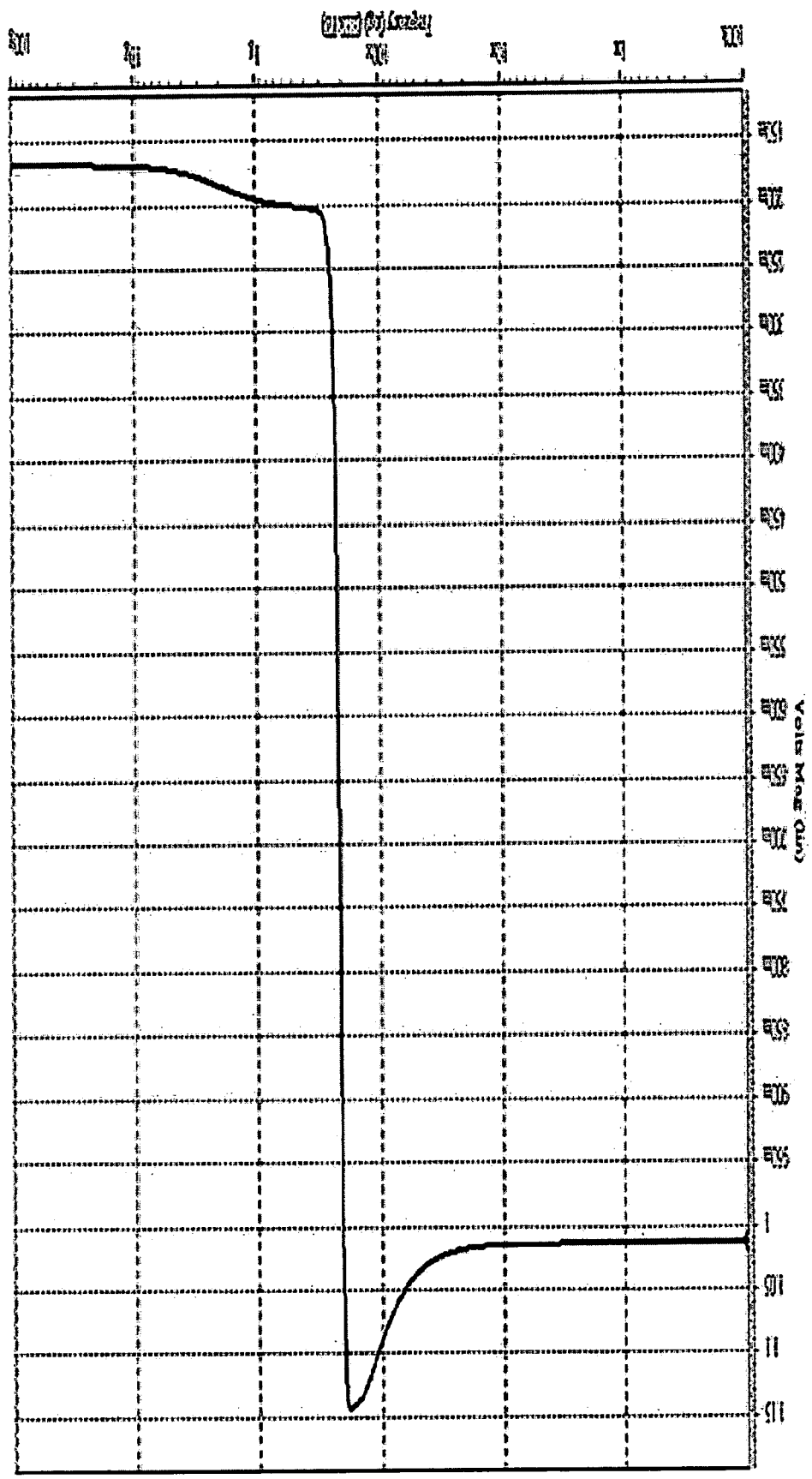
Figures 2B, 4:
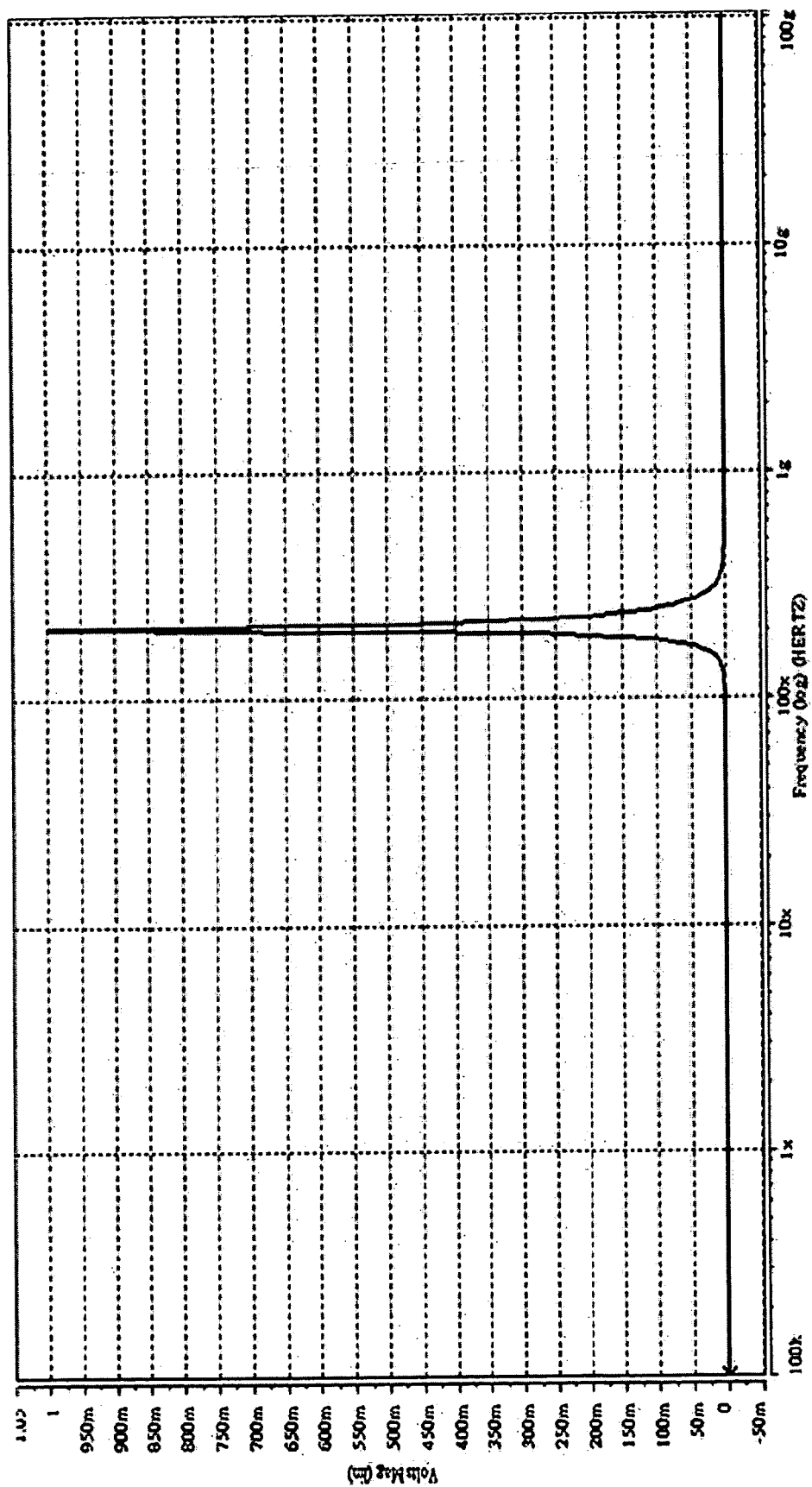

FIG. 4-1 shows the nth-order filter structure where $V_{in}$ is the filter input voltage, and $V_{out(0)}$, $V_{out(1)}$, $V_{out(2)}$ . . . , $V_{out(n-2)}$, $V_{out(n-1)}$, and $V_{out(n)}$ are the n+1 filter voltage outputs. The settings of the n filter output voltages determine the filter functions (low-pass, band-pass, and high-pass). It can be seen that the structure employs only n+2 single-ended-input OTAs and n grounded capacitors. The transfer functions of the nth-order low-pass, band-pass, and high-pass filter structure, shown in FIG. 4-1, with different outputs can be derived as $$V_{out(i)} = V_{in}\left(\frac{a_i s^i}{\Delta}\right), i = 0, 1, 2 \ldots, n-1, n, \quad (4\text{-}1)$$

where $$\Delta = a_n s^n + a_{n-1} s^{n-1} + a_{n-2} s^{n-2} + \ldots + a_2 s^2 + a_1 s + a_0$$

Note that the synthesized filter structure achieves the three important criteria for the design of OTA-C filters including the least active and passive component counts when compared with the previous work.

To verify the theoretical analysis of the filter structure shown in FIG. 4-1, a third-order low-pass and high-pass OTA-C filter has been simulated using H-Spice with the UMC05 level-49 parameters, the CMOS implementation of the OTA [16] with W/L=5μ/1μ and 10μ/1μ for NMOS and PMOS transistors, respectively, under ±2.5V supply voltages, and the component values: (i) each g=56 μS ($I_{abc}$=8.852 μA), $C_1$=18 pF, $C_2$=9 pF, and $C_3$=4.5 pF for the responses with $f_o$=0.990 MHz, and (ii) each g=62.8 μS ($I_{abc}$=10.495 μA), $C_1$=10 pF, $C_2$=5 pF, and $C_3$=2.5 pF for the responses with $f_o$=1.999 MHz. FIG. 4-1(*a*) shows the simulated low-pass and high-pass responses of the filter. As it can be seen, there is a close agreement between theory and simulation, for example, the simulated $f_o$=0.94 MHz (high-pass) and 1.04 MHz (low-pass) compared to 0.990 MHz in the ideal case.

4.2 Voltage-Mode Nth-Order OTA-Only-Without-C Low-Pass, Band-Pass, and High-Pass Filter Structure The voltage-mode nth-order OTA-C low-pass, band-pass, and high-pass filter structure shown in FIG. 4-1 can be replaced by the OTA-only-without-C low-pass, band-pass, and high-pass filter structure after removing all grounded capacitors from FIG. 4-1. The collateral OTA-only-without-C filter structure is shown in FIG. 4-2.

A ninth-order voltage-mode OTA-only-without-C low-pass and band-pass filter is the example used to verify the feasibility of the filter shown in FIG. 4-2 by using H-Spice simulation with UMC05 level-49 process parameters. The CMOS implementation of an OTA in [16] is employed in the simulation with ±2.5V supply voltages and W/L=5μ/0.5μ and 10μ/0.5μ for NMOS and PMOS transistors, respectively. The feasible case with the minimum operational frequency having the bias currents: $I_{b1}$=$I_{b3}$=$I_{b5}$=$I_{b7}$=$I_{b9}$=60 μA ($g_1$=$g_3$$g_5$$g_7$$g_9$=98.3 μS), $I_{b2}$=$I_{b4}$=$I_{b6}$=$I_{b8}$=$I_{b10}$=95 μA ($g_2$=$g_4$=$g_6$=$g_8$=$g_{10}$=56.1 μS), leads to 218M Hz ($f_{3dB}$) low-pass, and $I_{b1}$=106.5 μA ($g_1$=46.9 μS) and $1_{b2}$=$I_{b3}$=... = $I_{b10}$=82.5 μA ($g_{b2}$=$g_{b3}$=...=$g_{b10}$=79 μS) leads to 207M Hz (central frequency) band-pass filtering signals, shown in FIGS. 4-2(*a*) and (*b*), with the parasitic capacitances 0.054745 pF and 0.057096 pF, respectively.

5.1 Voltage-mode Nth Order OTA-C Arbitrary Filter Structure [19]

Figures 1, 5:
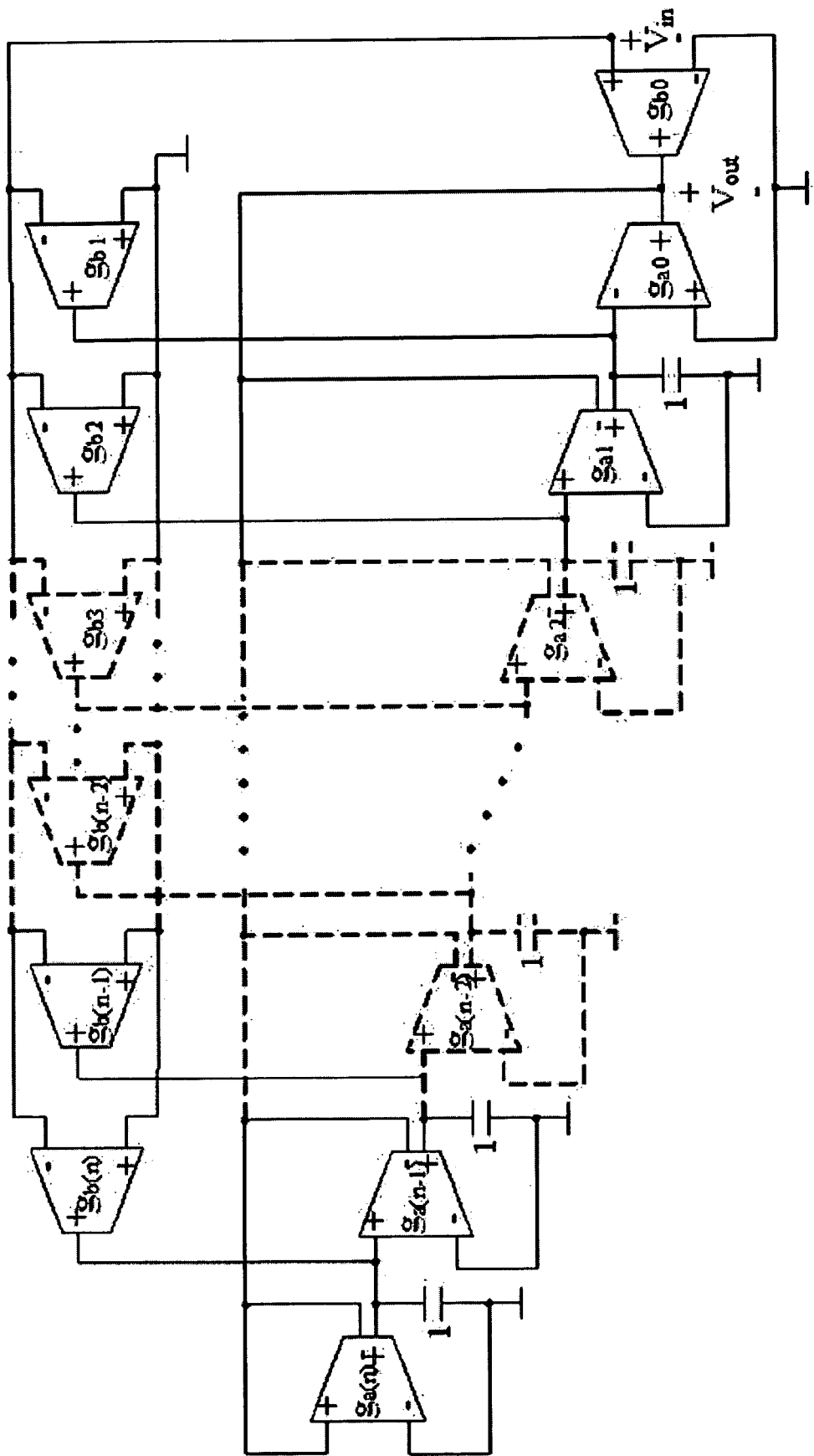
Figures 2, 5:
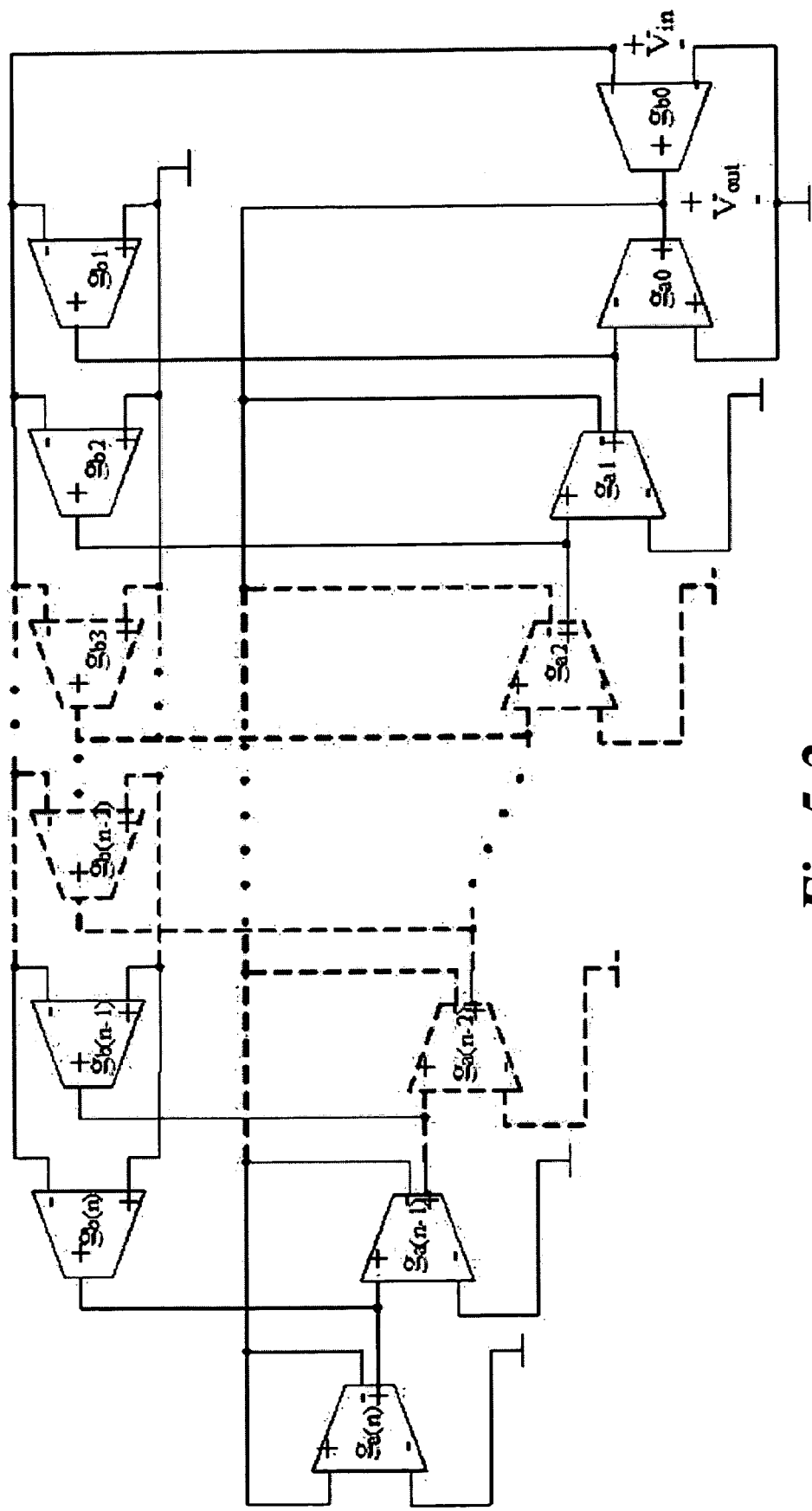

The above nth-order OTA-C filter structure shown in FIG. 4-1 can realize n+1 different order transfer functions shown in Eq. (4-1) at n+1 different internal nodes, respectively. The general nth-order voltage transfer function of FIG. 5-1 is $$\frac{V_{out}}{V_{in}} = \frac{b_n s^n + b_{n-1} s^{n-1} + b_{n-2} s^{n-2} + \ldots + b_1 s + b_0}{a_n s^n + a_{n-1} s^{n-1} + a_{n-2} s^{n-2} + \ldots + a_1 s + a_0} \quad (5\text{-}1)$$

Which is the linear combination of the n+1 different-order transfer functions shown in Eq. (4-1), i.e., $$\frac{V_{out}}{V_{in}} = \frac{b_n s^n + b_{n-1} s^{n-1} + b_{n-2} s^{n-2} + \ldots + b_1 s + b_0}{a_n s^n + a_{n-1} s^{n-1} + a_{n-2} s^{n-2} + \ldots + a_1 s + a_0} \quad (5\text{-}2)$$

$$= \sum_{i=0}^{n} \left[ \left(\frac{b_i}{a_i}\right)\left(\frac{a_i s^i}{\Delta}\right) \right] \text{ where}$$

$$\Delta = a_n s^n + a_{n-1} s^{n-1} + a_{n-2} s^{n-2} + \ldots + a_1 s + a_0.$$

Two synthesis approaches to realize the above relationship are as follows.

(i) Using the linear combination method to perform the synthesis, multiply both sides of Eq. (5-2) by $V_{in}$ and obtain $$V_{out} = (I) \times \sum_{i=0}^{n} \left[ \left(\frac{b_i}{a_i}\right)\left(\frac{a_i s^i}{\Delta} V_{in}\right) \right] \quad (5\text{-}3)$$

Then, we take each nodal voltage in the filter structure of FIG. 4-1, i.e., $$V_{out(i)}\left(=\frac{a_i s^i}{\Delta} V_{in}\right)$$

in which i=0, 1, 2 ..., n−1, and n, as the input voltage of an extra OTA with the transconductance $b_i/a_i$. Join all of the output terminals of the n+1 extra OTAs and connect the summing point with an equivalent grounded resistor realized by a single-ended-input OTA with unity transconductance. The realized filter structure uses 2n+4 single-ended-input OTAs and n grounded capacitors.

(ii) A more effective synthesis approach is explained as follows. Multiply both sides of Eq. (5-2) by $V_{in}$ and obtain the following other form (different from Eq. (5-3))

$$V_{out} = \sum_{i=0}^{n} \left[ \left(V_{in} \frac{b_i}{a_i}\right)\left(\frac{a_i s^i}{\Delta}\right) \right] \quad (5\text{-}4)$$

The physical meaning of the above relationship is "to insert different weights of the input voltage signal, $V_{in}$, into each node in the filter structure shown in FIG. 4-1 and then obtain the output voltage signal". According to this approach, giving a forward signal, with a weight of input voltage signal, from input voltage node to each inner node in the filter structure shown in FIG. 4-1, we obtain the other new OTA-C filter structure, shown in. FIG. 5-1, for realizing the general nth-order voltage transfer function, including elliptic filter functions, shown in Eq. (5-1).

The filter structure shown in FIG. 5-1 achieves the Three Criteria for the design of OTA-C filters.

5.2 Voltage-mode Nth-Order OTA-Only-Without-C Arbitrary Filter Structure

The voltage-mode nth-order OTA-C filter structure shown in FIG. 5-1 can be replaced by the OTA-only-without-C filter structure after removing all grounded capacitors from FIG. 5-1. The collateral OTA-only-without-C filter structure is shown in FIG. 5-2.

The H-Spice simulation example is shown in Section 4-2.

Figures 1, 6:
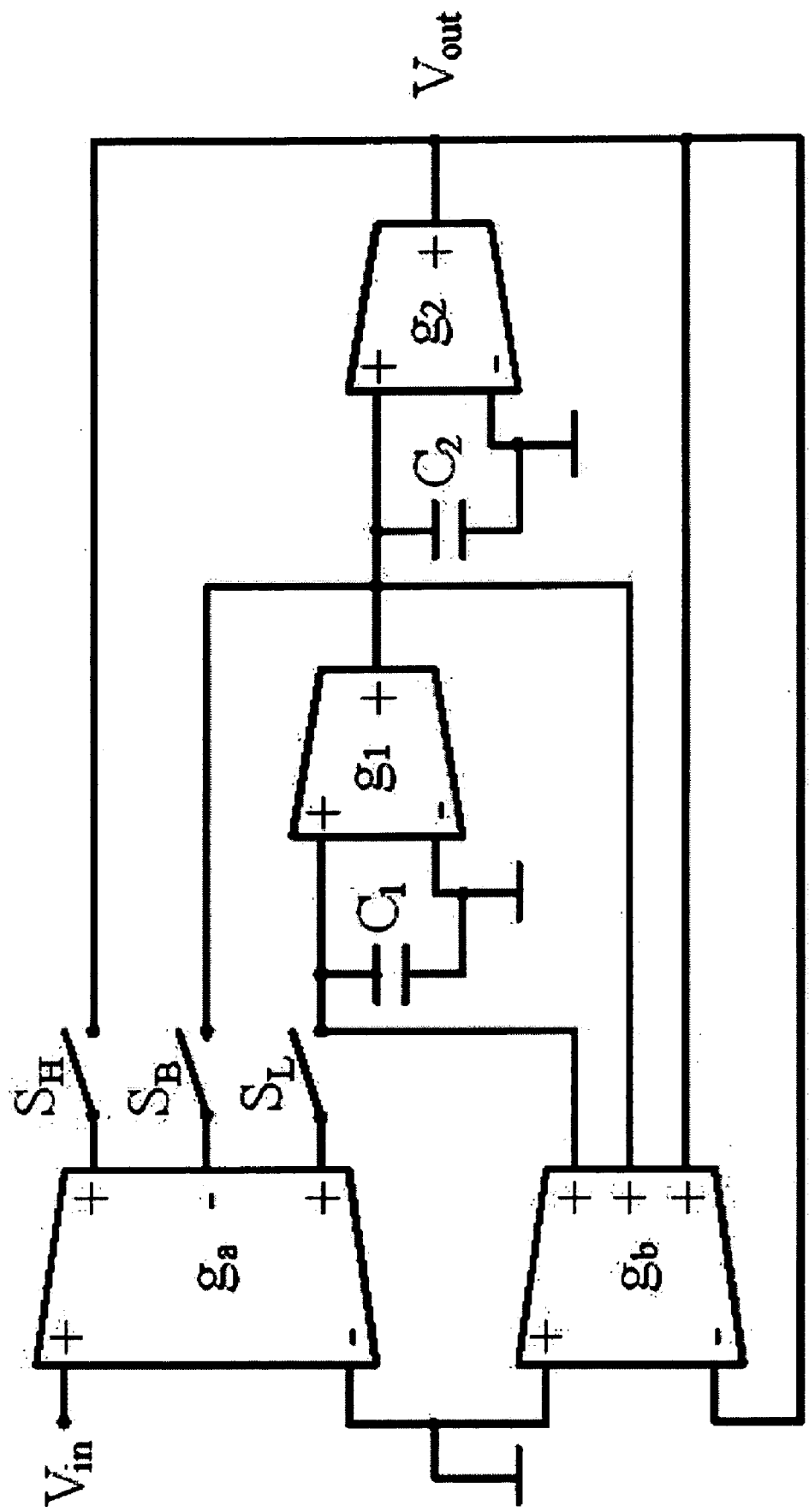
Figures 1A, 6:
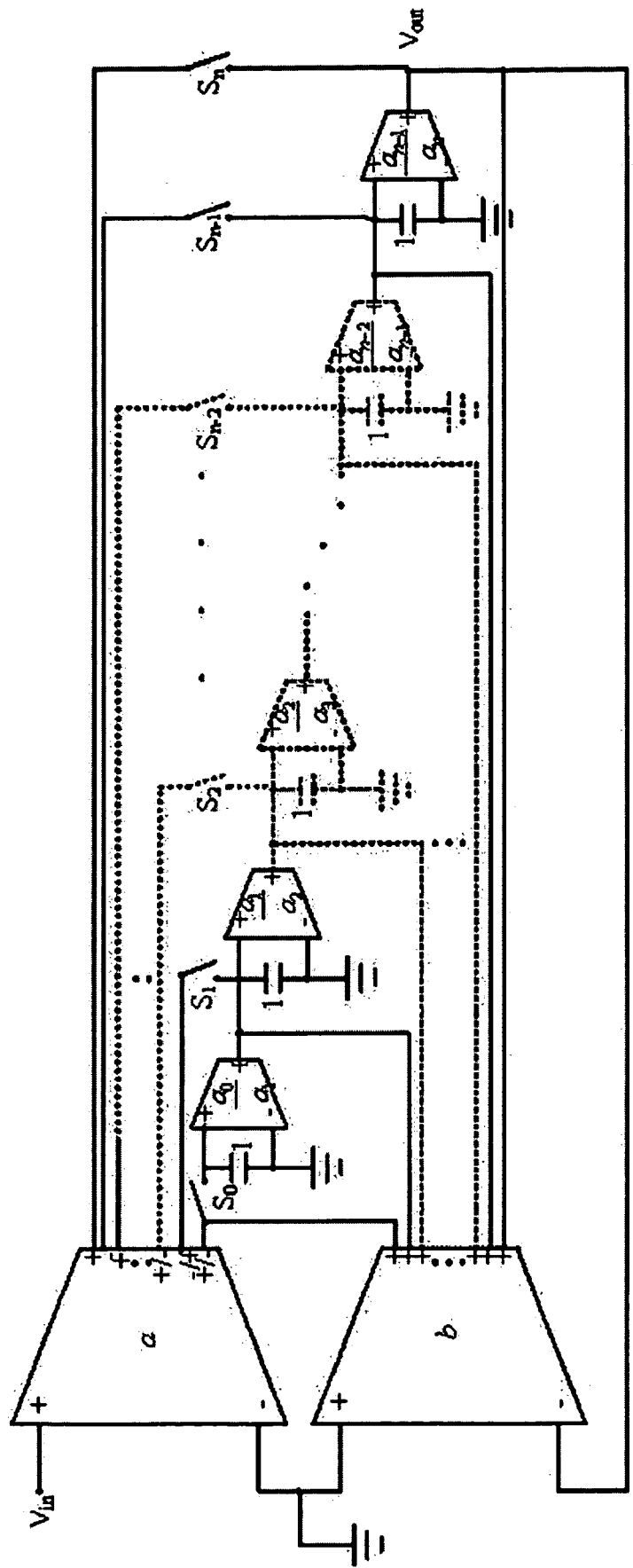
Figures 1B, 6:
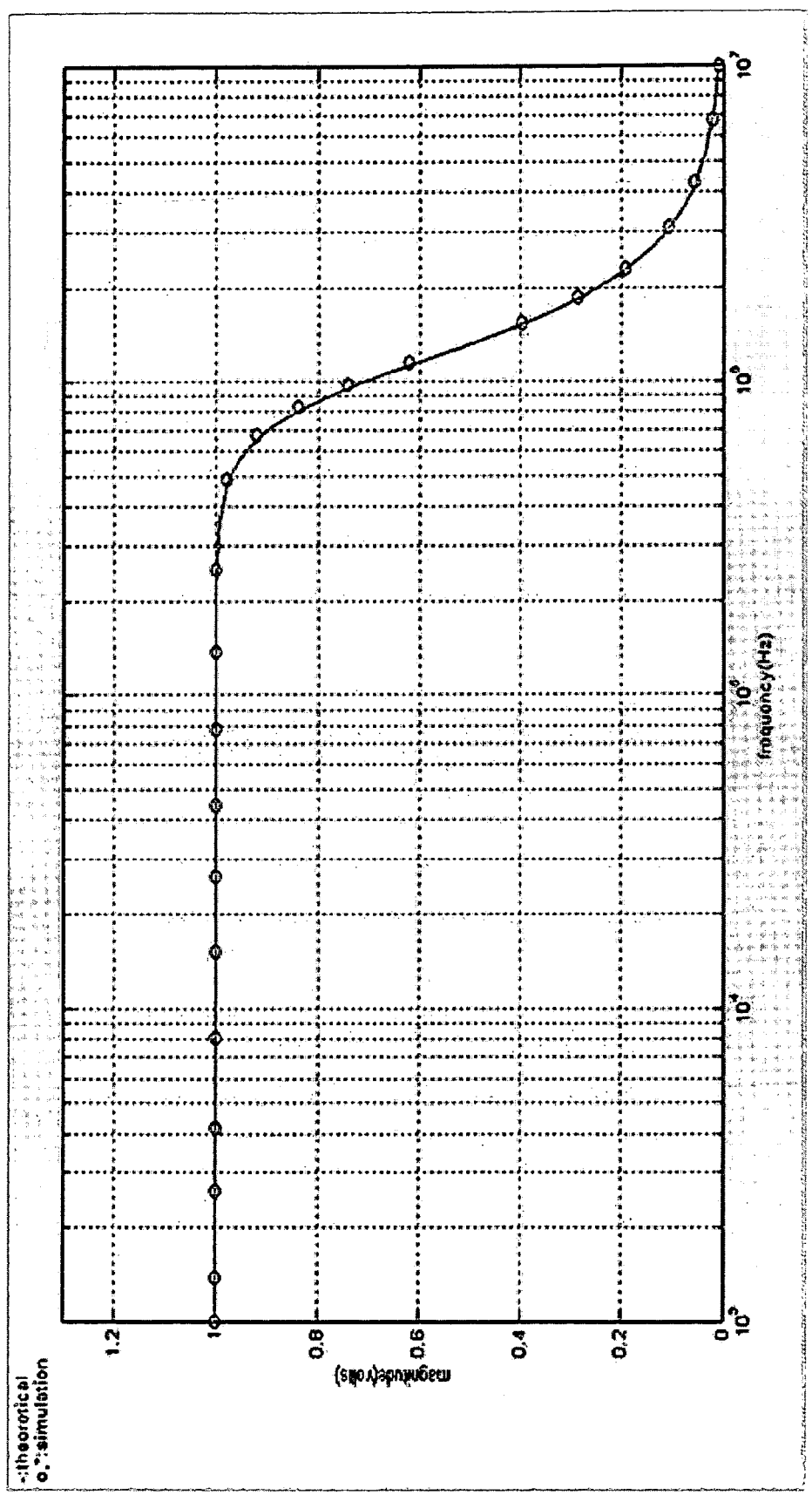
Figures 1C, 6:
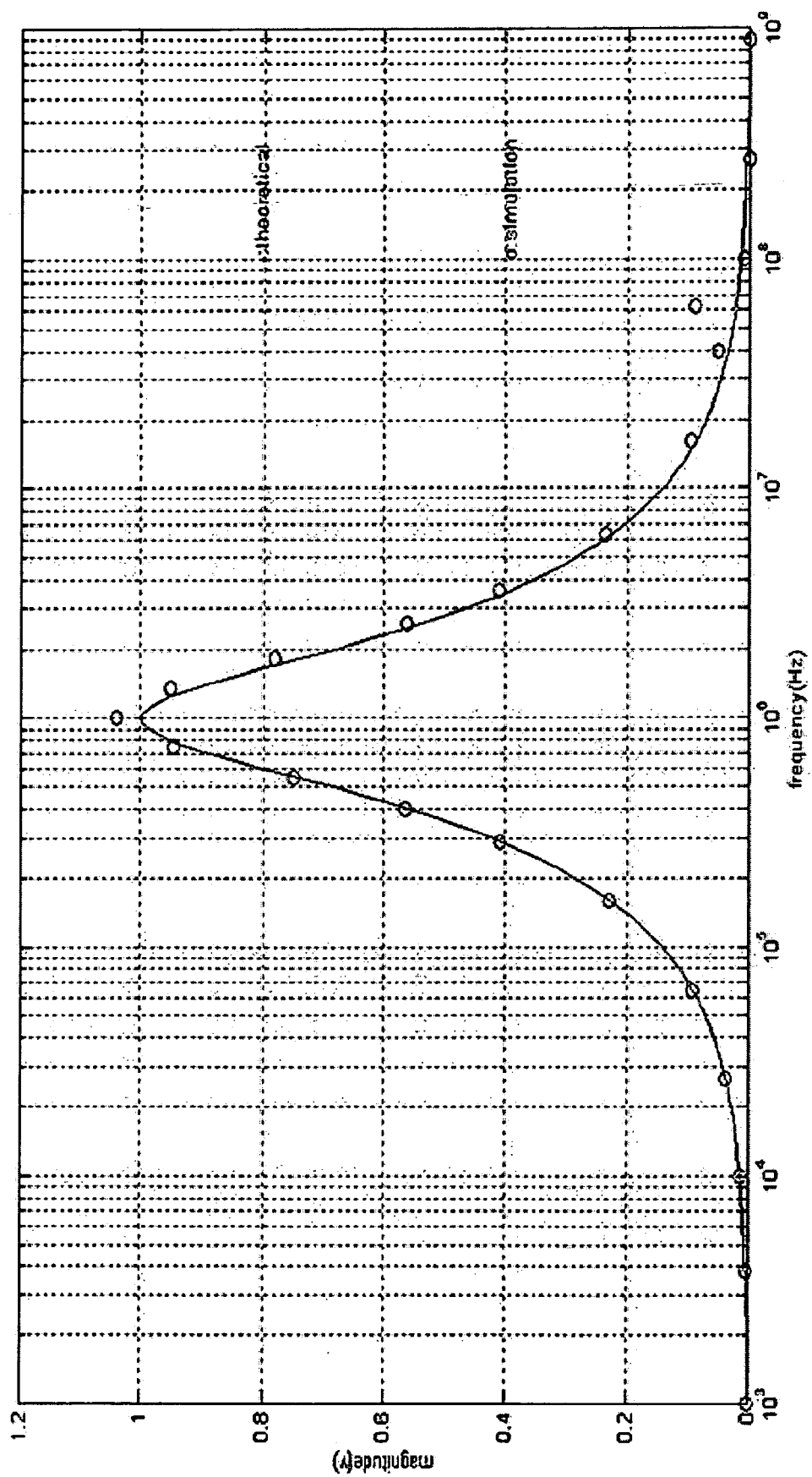
Figures 1D, 6:
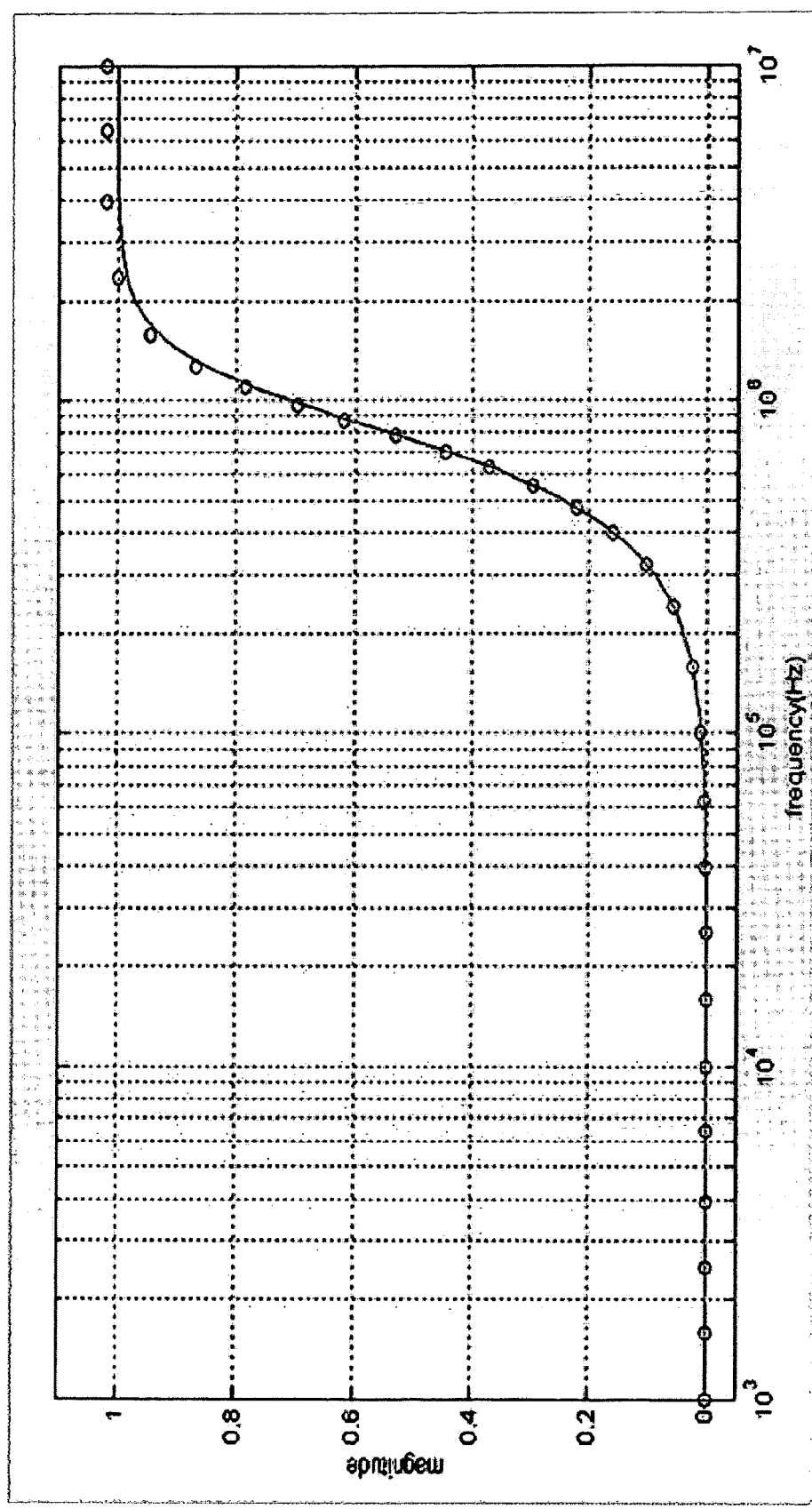
Figures 1E, 6:
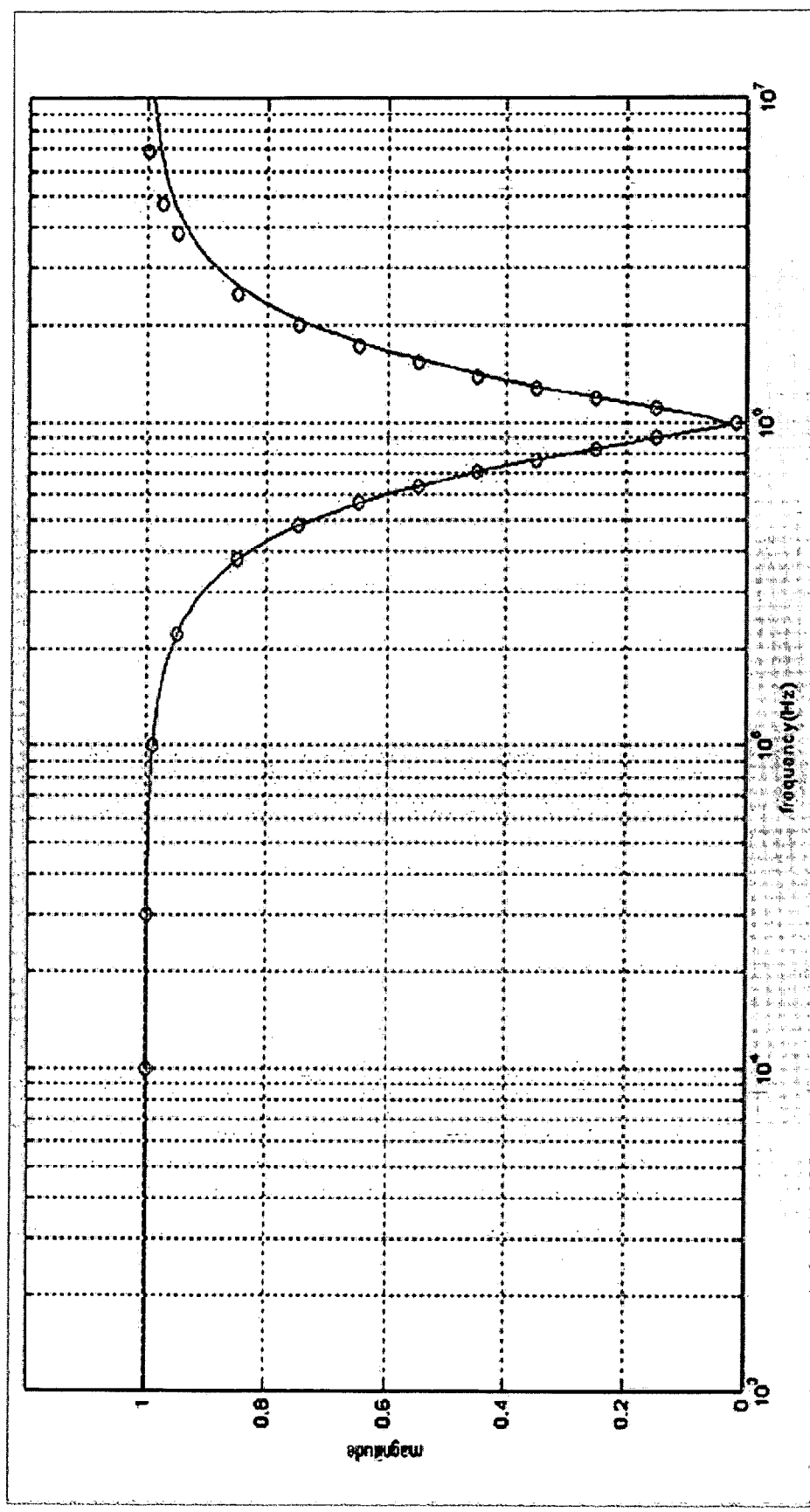
Figures 1F, 6:
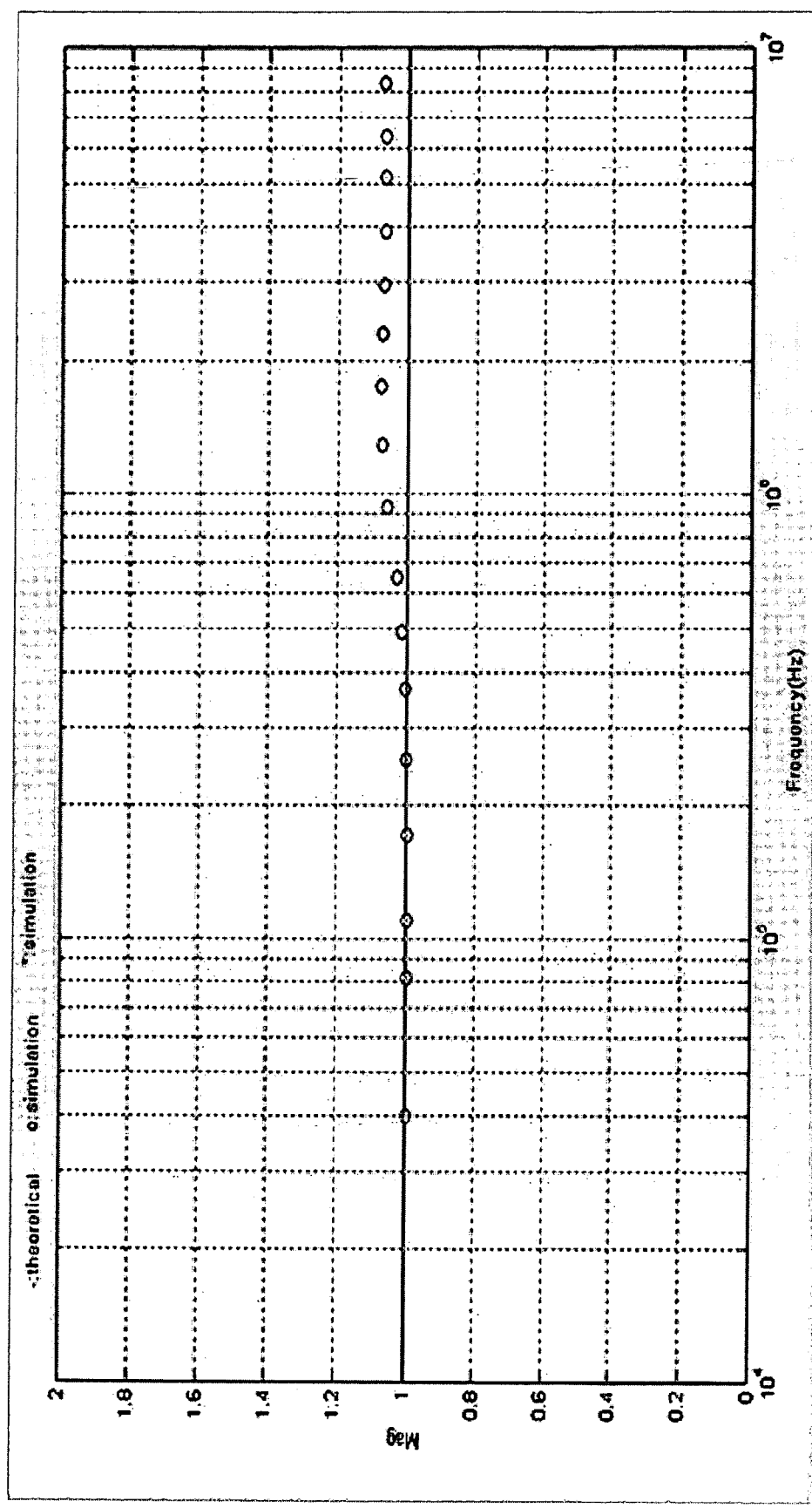
Figures 1G, 6:
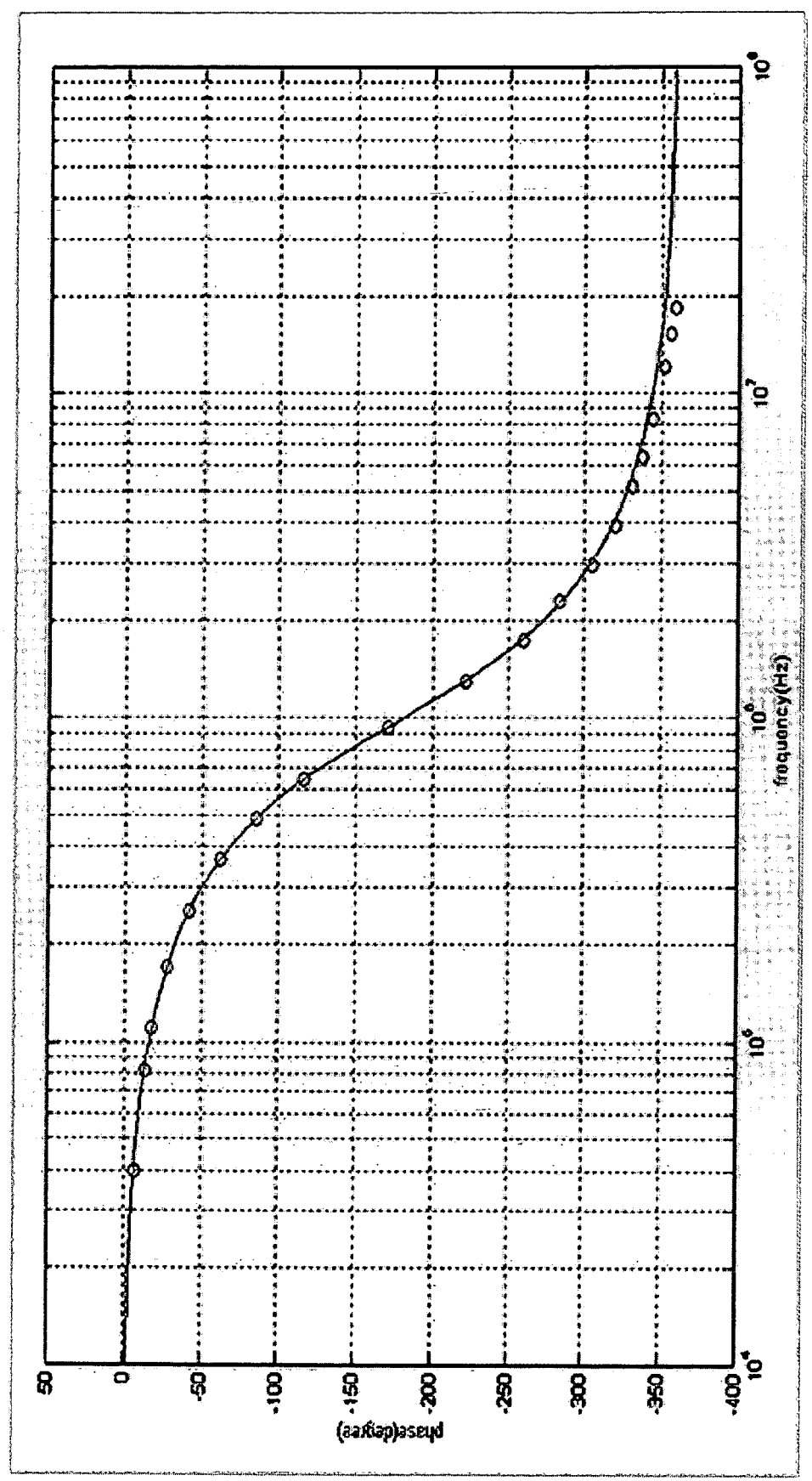
Figures 2, 6:
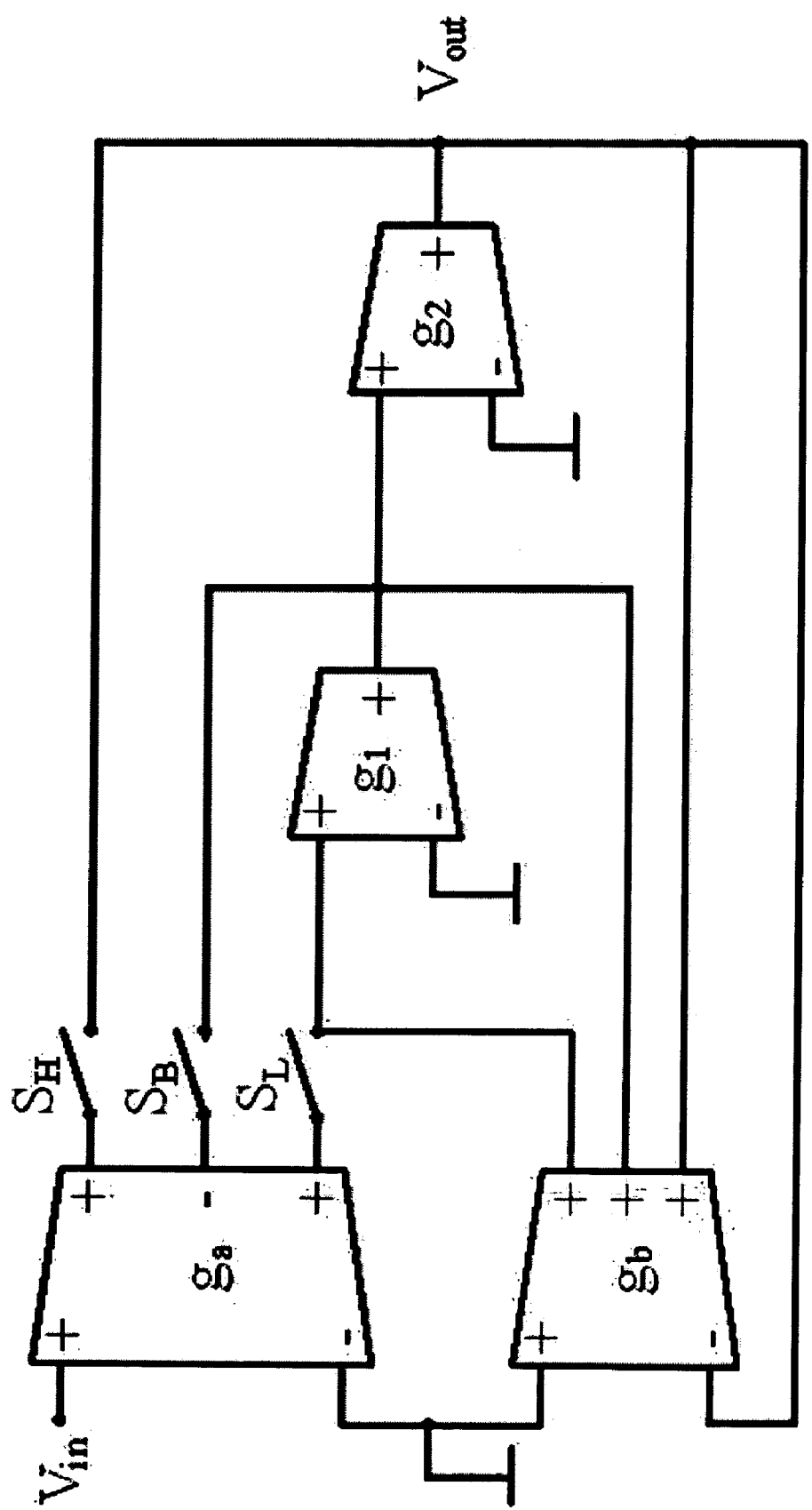
Figures 2A, 6:
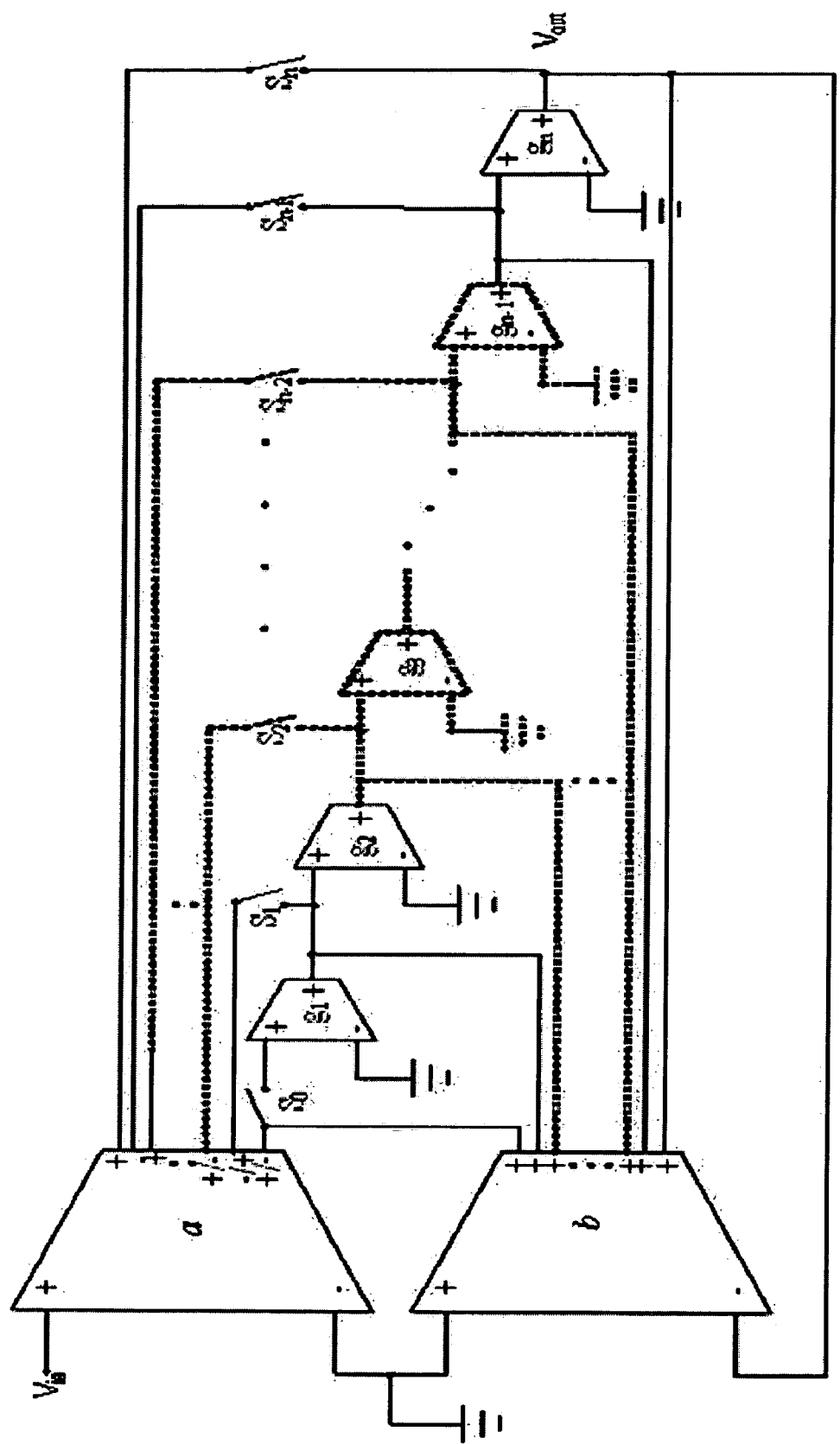
Figures 2B, 6:
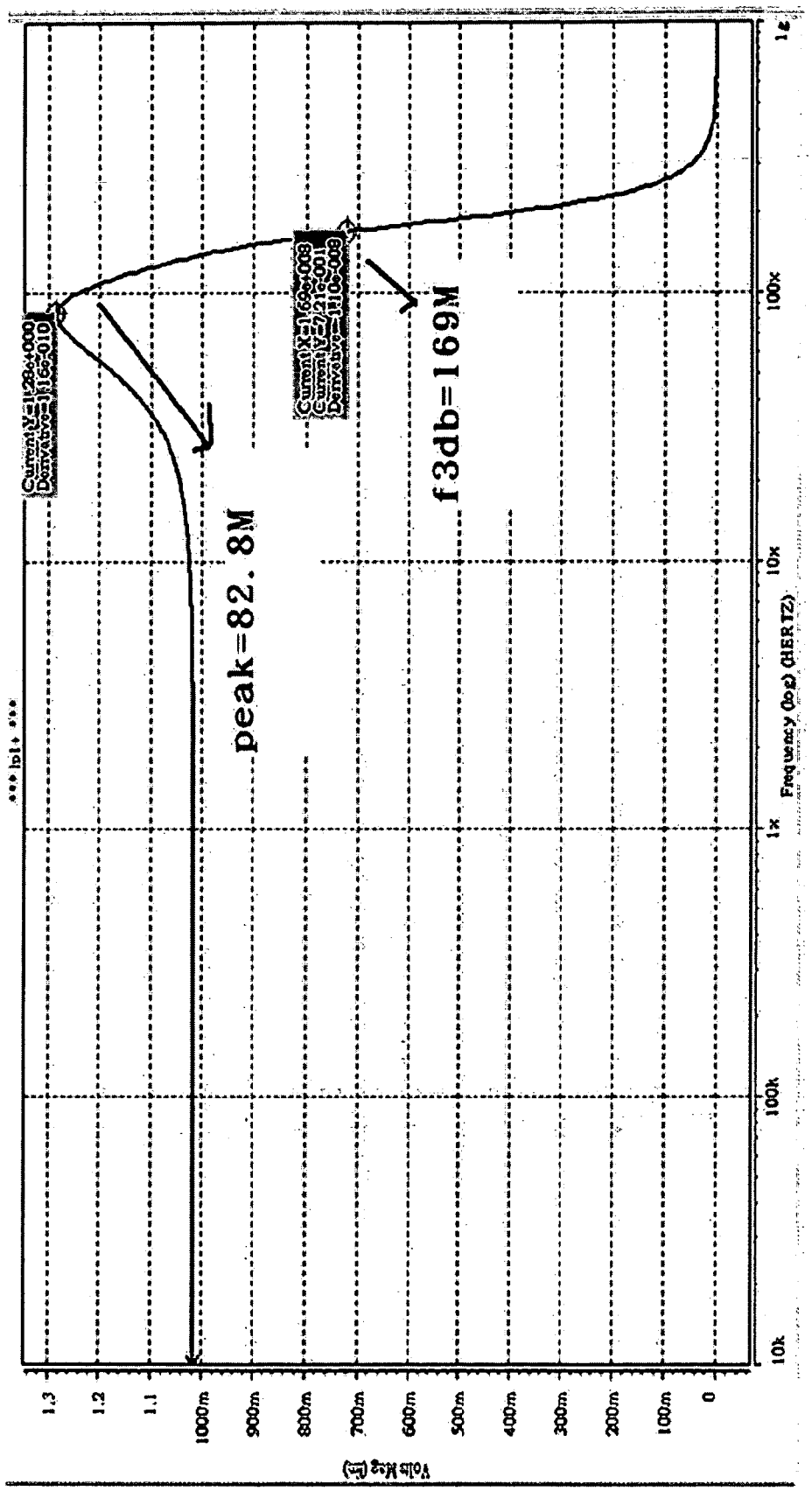
Figures 2C, 6:
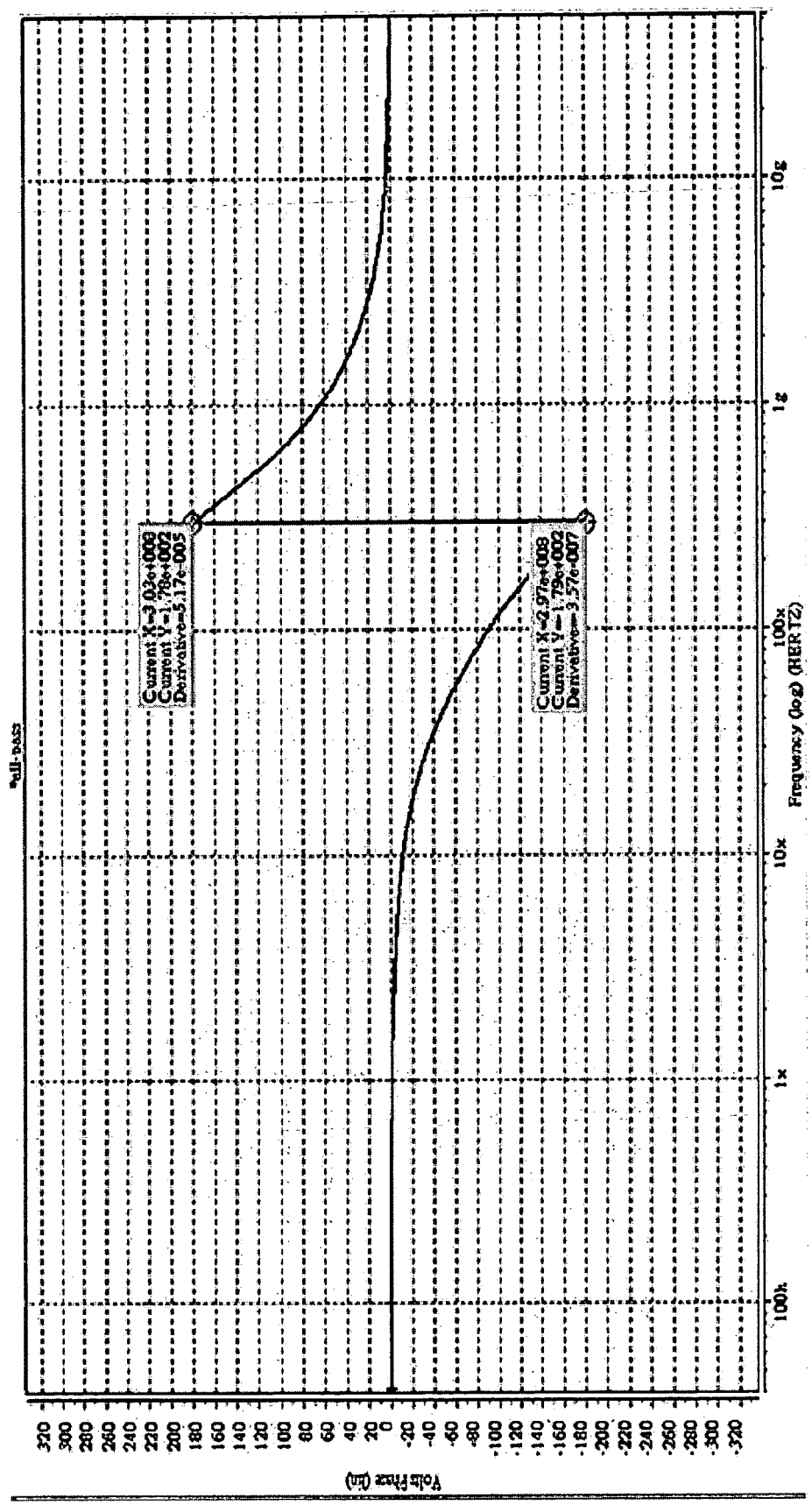

6.1 Voltage-Mode OTA-C Low-Pass, Band-Pass, High-Pass, Band-Reject, and All-Pass Filter Structure Circuit analysis for the biquad filter shown in FIG. 6-1 yields (i) low-pass: $S_L$ is closed but both $S_B$ and $S_H$ are open. The transfer function is $$\frac{V_{out}}{V_{in}} = \left(\frac{g_a}{g_b}\right)\frac{g_1 g_2}{s^2 C_1 C_2 + s C_1 g_2 + g_1 g_2} \quad (6\text{-}1)$$

(ii) bandpass: $S_B$ is closed but both $S_L$ and $S_H$ are open. The transfer function is $$\frac{V_{out}}{V_{in}} = \left(\frac{g_a}{g_b}\right)\frac{-sC_1g_2}{s^2C_1C_2 + sC_1g_2 + g_1g_2} \quad (6\text{-}2)$$

(iii) high-pass: $S_H$ is closed but both $S_L$ and $S_B$ are open. The transfer function is $$\frac{V_{out}}{V_{in}} = \left(\frac{g_a}{g_b}\right)\frac{s^2C_1C_2}{s^2C_1C_2 + sC_1g_2 + g_1g_2} \quad (6\text{-}3)$$

(iv) band-reject: both $S_L$ and $S_H$ are closed but $S_B$ is open. The transfer function is $$\frac{V_{out}}{V_{in}} = \left(\frac{g_a}{g_b}\right)\frac{s^2C_1C_2 + g_1g_2}{s^2C_1C_2 + sC_1g_2 + g_1g_2} \quad (6\text{-}4)$$

(v) all-pass: all $S_L$, $S_B$ and $S_H$ are closed. The transfer function is $$\frac{V_{out}}{V_{in}} = \left(\frac{g_a}{g_b}\right)\frac{s^2C_1C_2 - sC_1g_2 + g_1g_2}{s^2C_1C_2 + sC_1g_2 + g_1g_2} \quad (6\text{-}5)$$

Figures 1, 1A:
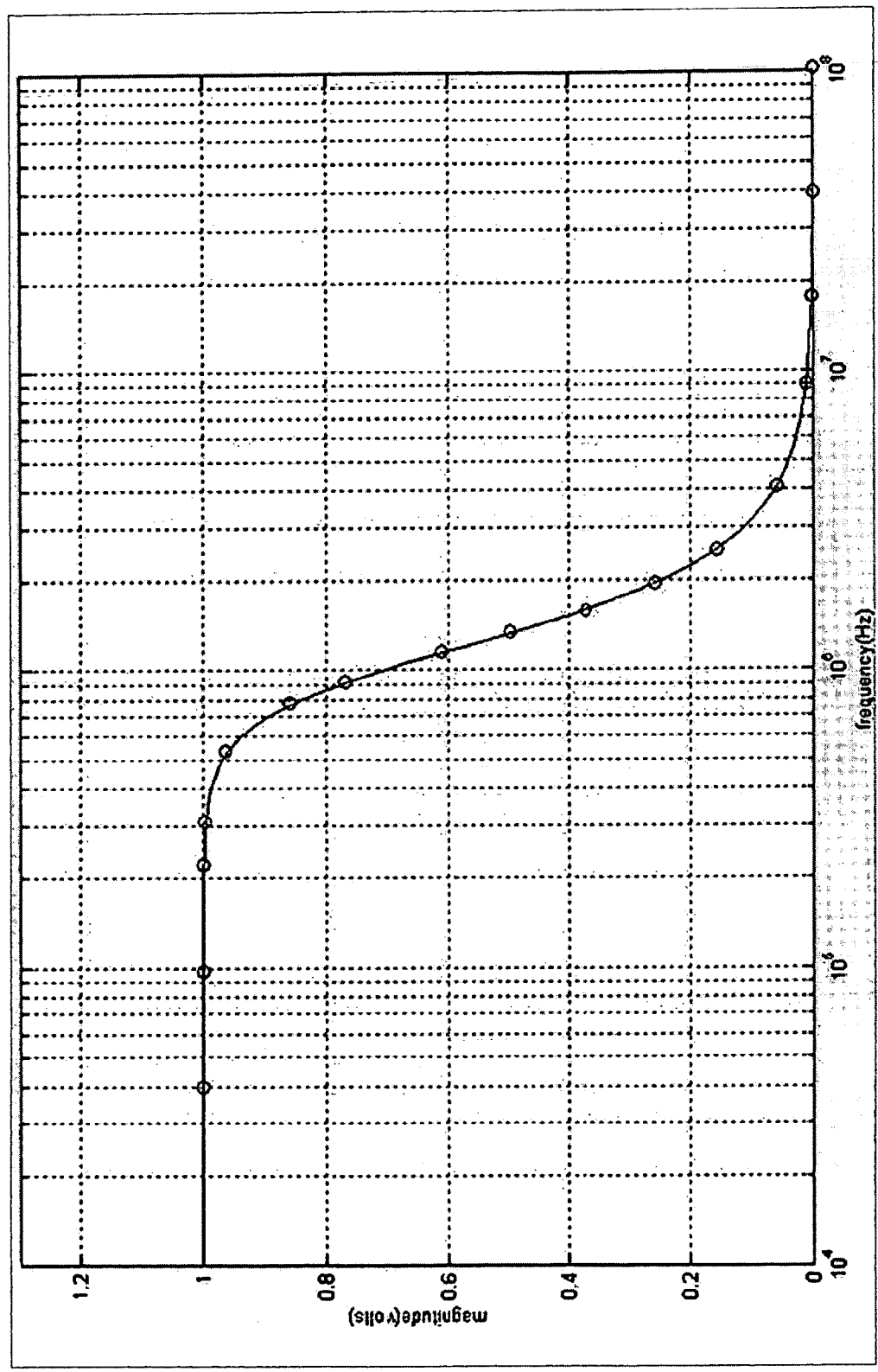

The above second-order OTA-C universal (including low-pass, band-pass, high-pass, band-reject, and all-pass) filter structure shown in FIG. 6-1 can be extended to nth-order OTA-C universal (including low-pass, band-pass, high-pass, band-reject, and all-pass) filter structure shown in FIG. 6-1(a).

The output node of FIG. 6-1(a) can produce nth-order low-pass, band-pass, high-pass, band-reject, and all-pass signals by the different settings of the n+1 switches, $S_0$, $S_1$, $S_2 \ldots, S_{n-2}, S_{n-1}$, and $S_n$, similar to those shown in FIG. 6-1. Note that if we replace the transconductance a shown in FIG. 6-1(a) by n+1 different transconductances such as $c_0$, $c_1$, $c_2 \ldots, c_{n-1}$, and $c_n$, then the circuit structure shown in FIG. 6-1(a) can realize all kinds of analog linear circuits.

Note that the above voltage-mode OTA-C universal biquad filter achieves the three important criteria for the design of filters: (i) use of 2n+2 single-ended-input OTAs, (ii) use of n grounded capacitors, and (iii) the least active and passive component count when compared with the previous work. Especially, two requirements, (i) only two internal nodes except the output node in the second-order filter structure, and (ii) one grounded capacitor at each internal node except the output node and no extra capacitors used in the synthesized biquad filter shown in FIG. 6-1 meet the criteria. The main goal of the present invention, to form a high-frequency (about 5 MHz to 5 GHz) circuit when removing all of the capacitors from the synthesized OTA-C biquad filter.

Figures 1, 1B:
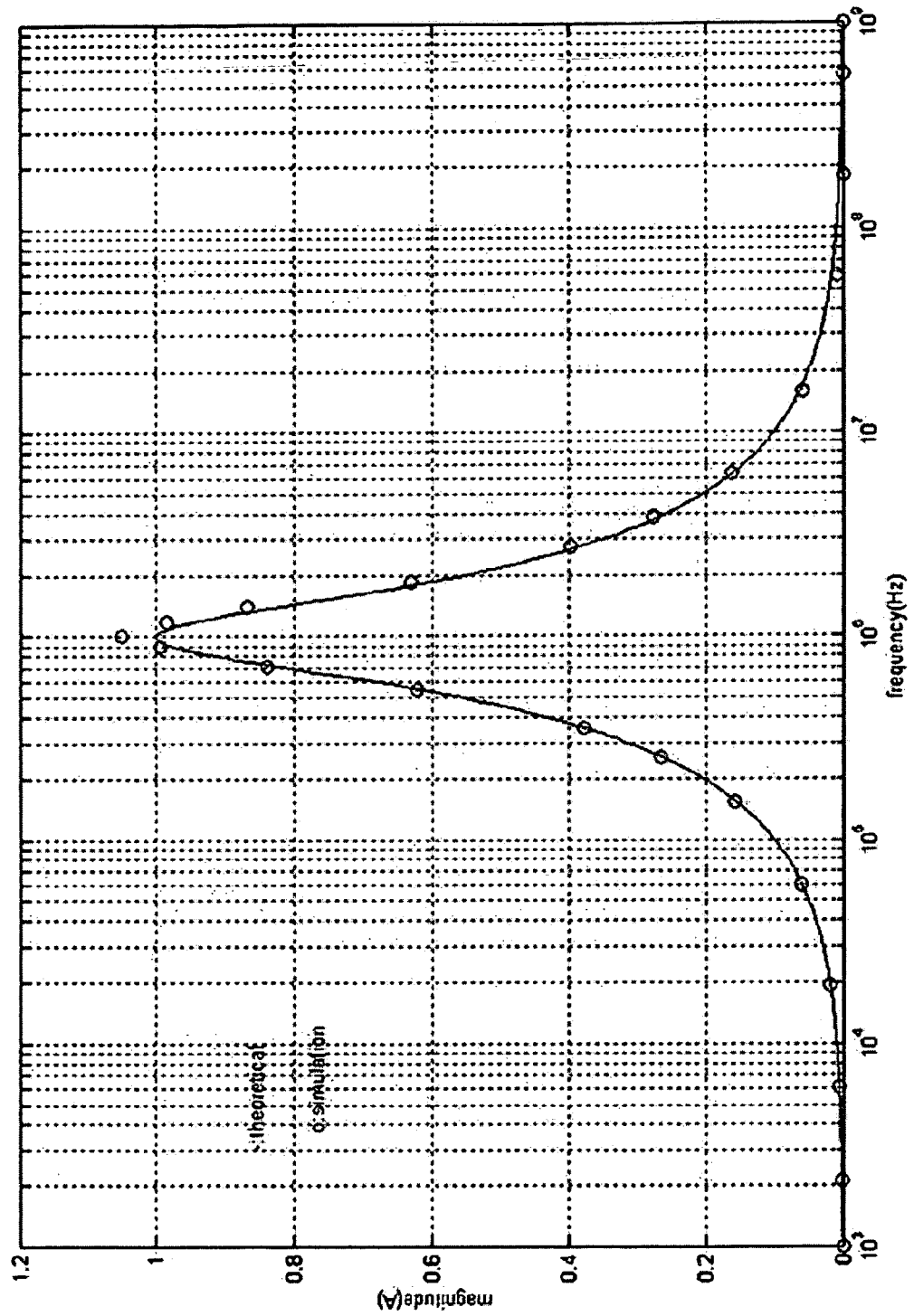

To verify the theoretical analysis of the implemented OTA-C biquad filter shown in FIG. 6-1, the TSMC035 level-49 H-Spice simulation using the CMOS implementation of the OTA [16] with supply voltages $V_{DD}$=1.65V, $V_{SS}$=-1.65V, and W/L=5μ/0.5μ and 10μ/0.5μ for NMOS and PMOS transistors, respectively. Component values are (i) for low-pass, $g_a=g_b=g_1=g_2$=100 μS ($I_{abc}$=15.3 μA), and $C_1$=22.5 pF, $C_2$=1.25 pF; (ii) for band-pass, $g_a=g_b$=62.8 μS ($I_{abc}$=7.4 μA), $g_1$=44.4 μS ($I_{abc}$=4.74 μA), $g_2$=88.8 μS ($I_{abc}$=12.3 μA), and $C_1=C_2$=10 pF; (iii) for high-pass, $g_a=g_b=g_1=g_2$=180 μS ($I_{abc}$=44.6 μA), and $C_1$=40.25 pF, $C_2$=20.24 pF; (iv) for band-reject, $g_a=g_b=g_1=g_2$=160 μS ($I_{abc}$=34 μA), and $C_1$=36 pF, $C_2$=18 pF; and (v) for all-pass, $g_a=g_b=g_1=g_2$=80 μS ($I_{abc}$=10.5 μA), and $C_1$=18 pF, $C_2$=9 pF. The low-pass, band-pass, high-pass, band-reject, and all-pass amplitude-frequency responses and the all-pass phase-frequency response are shown in FIGS. 6-1(b), (c), (d), (e), (f), and (g), respectively. As it can be seen, there is a close agreement between theory and simulation. For example, the simulated $f_o$=1.03 MHz (low-pass), 1.00 MHz (band-pass), 0.985 MHz (high-pass), 1.00 MHz (band-reject), and 1.00 MHz (all-pass) in comparison with the theoretical $f_o$=1.00 MHz.

6.2 Voltage-Mode OTA-Only-Without-C Low-Pass, Band-Pass, High-Pass, Band-Reject, and All-Pass Filter Structure The synthesized filter structures shown in FIGS. 6-1 and 6-1(a) can be replaced by the OTA-only-without-C filter structure after removing all of the capacitors from either of the two synthesized OTA-C filter structures. The collateral OTA-only-without-C filter structures are shown in FIGS. 6-2 and 6-2(a), respectively.

To verify the theoretical analysis of the implemented OTA-only-without-C biquad filter shown in FIG. 6-2, the TSMC035 level-49 H-Spice simulation using the CMOS implementation of the OTA [16] with $V_{DD}$=1.65V, $V_{SS}$=-1.65V, and the component values: (i) for band-pass, $g_a$=30 μS $I_{abc}$=150 μA), $g_b$=50 μS ($I_{abc}$=188 μA), $g_1$=60 μS ($I_{abc}$=194 μA), and $g_2$=30 μS ($I_{abc}$=150 μA); (ii) for low-pass: $g_a$=109.9 μS ($I_{abc}$=90 μA), $g_b$=183.5 μS ($I_{abc}$=70 μA), $g_a$=11.67 μS ($I_{abc}$=309 μA), and $g_2$=109.9 μS ($I_{abc}$=90 μA). The band-pass, and low-pass amplitude-frequency responses and all-pass phase-frequency response are shown in FIGS. 6-2(b) and (c), respectively, with $f_o$=251 MHz, 169 MHz, and 303 MHz, and the equivalent parasitic capacitances 0.1082 pF, 0.0435 pF, and 0.06465 pF.

7.1 Current-Mode Odd-Nth-Order OTA-C Arbitrary and Elliptic Filter Structure

Figures 1, 7:
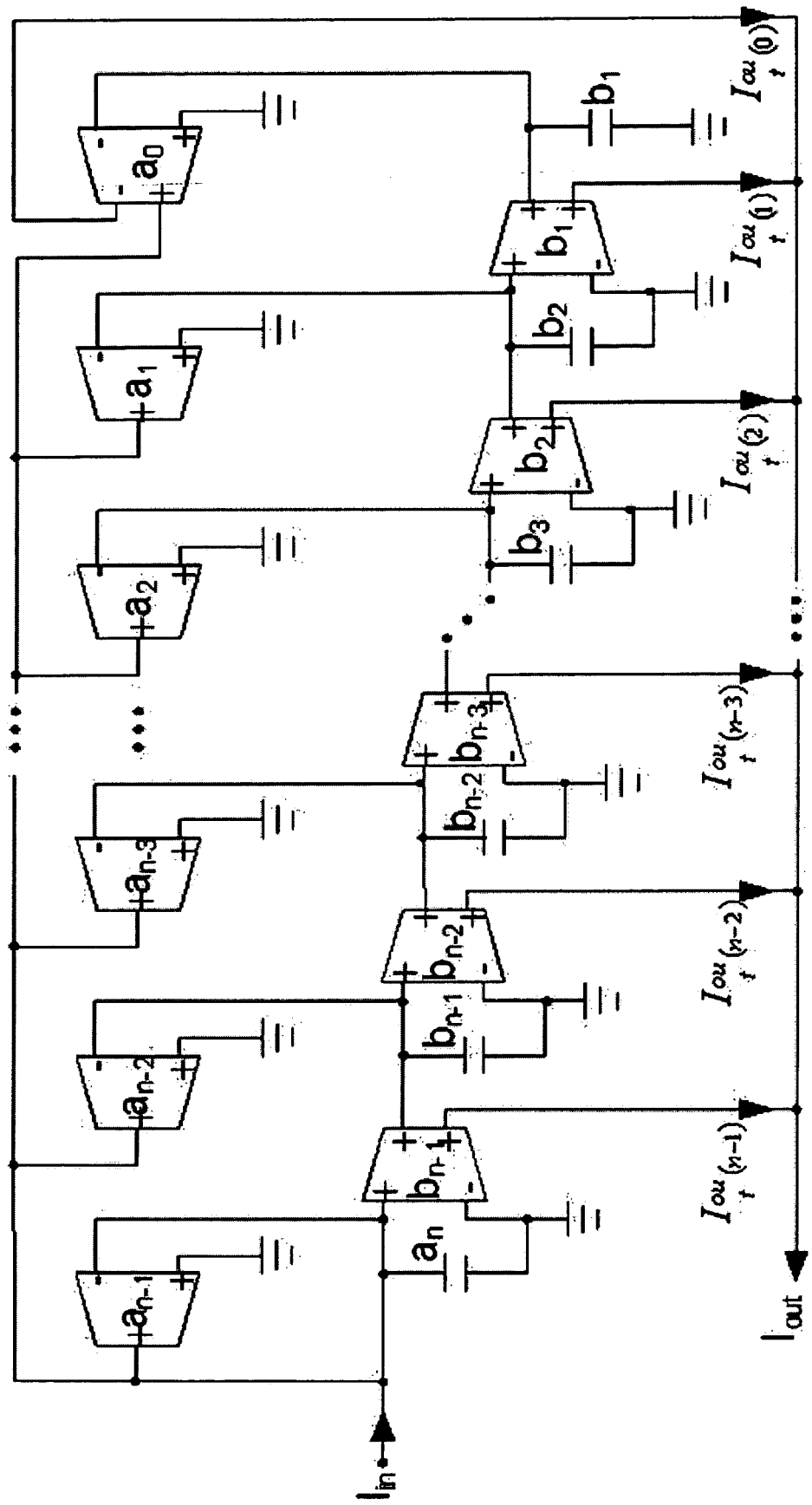
Figures 1A, 7:
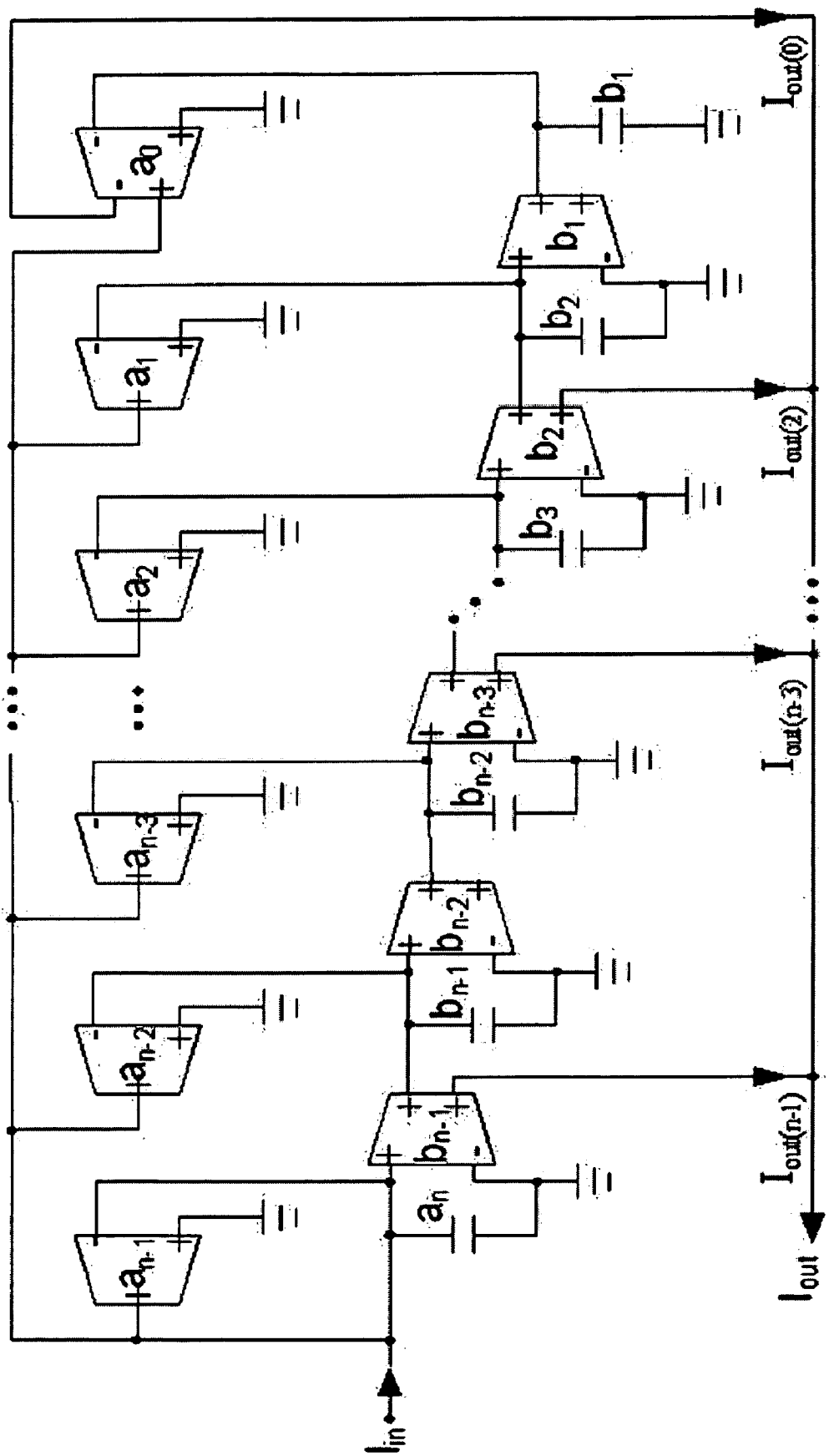
Figures 1B, 7:
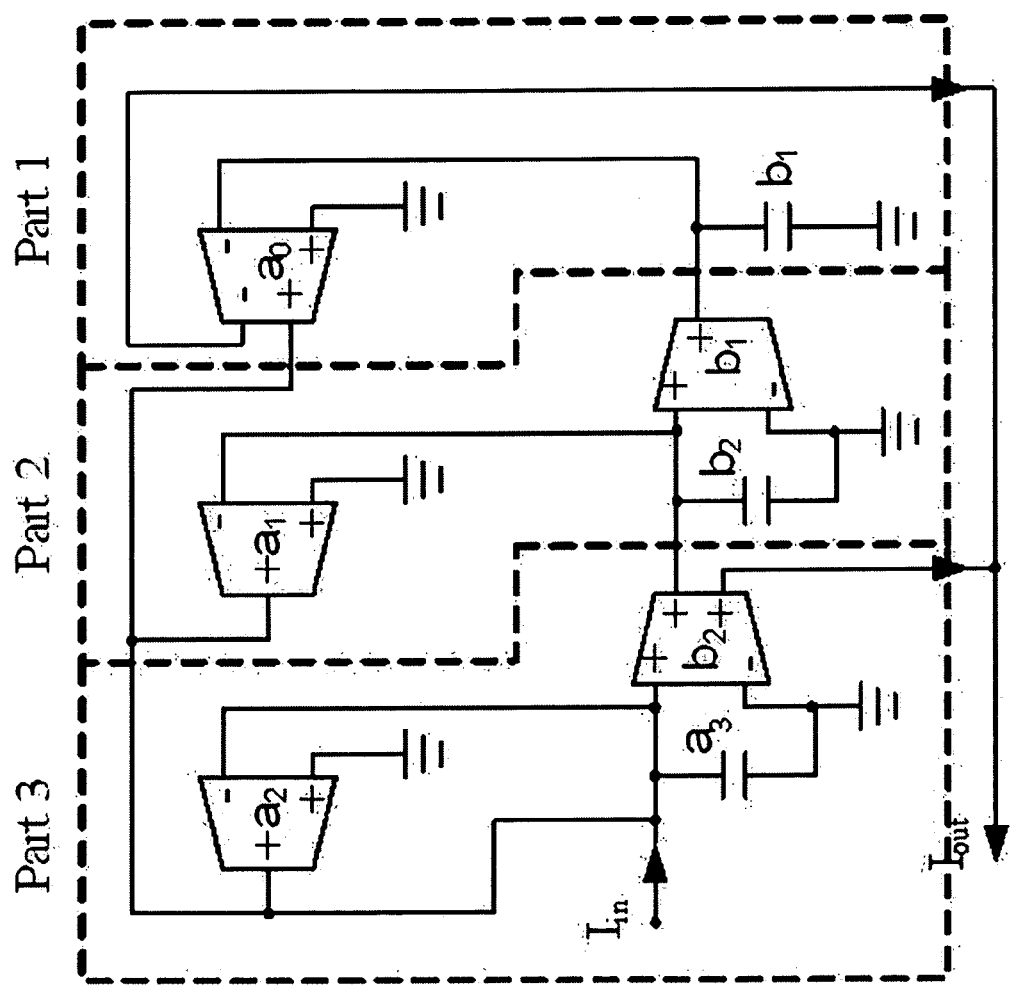
Figures 1C, 7:
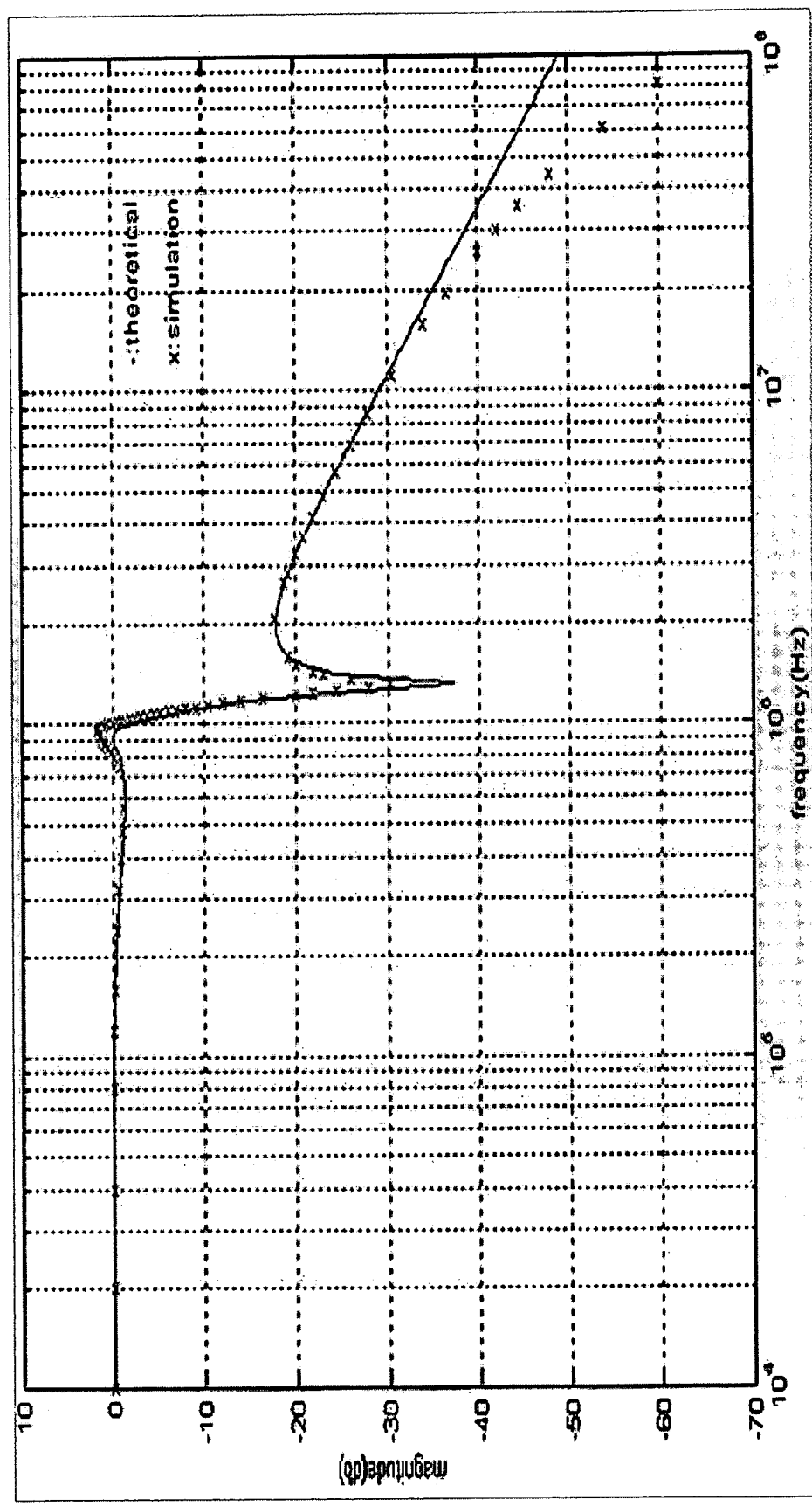
Figures 1D, 7:
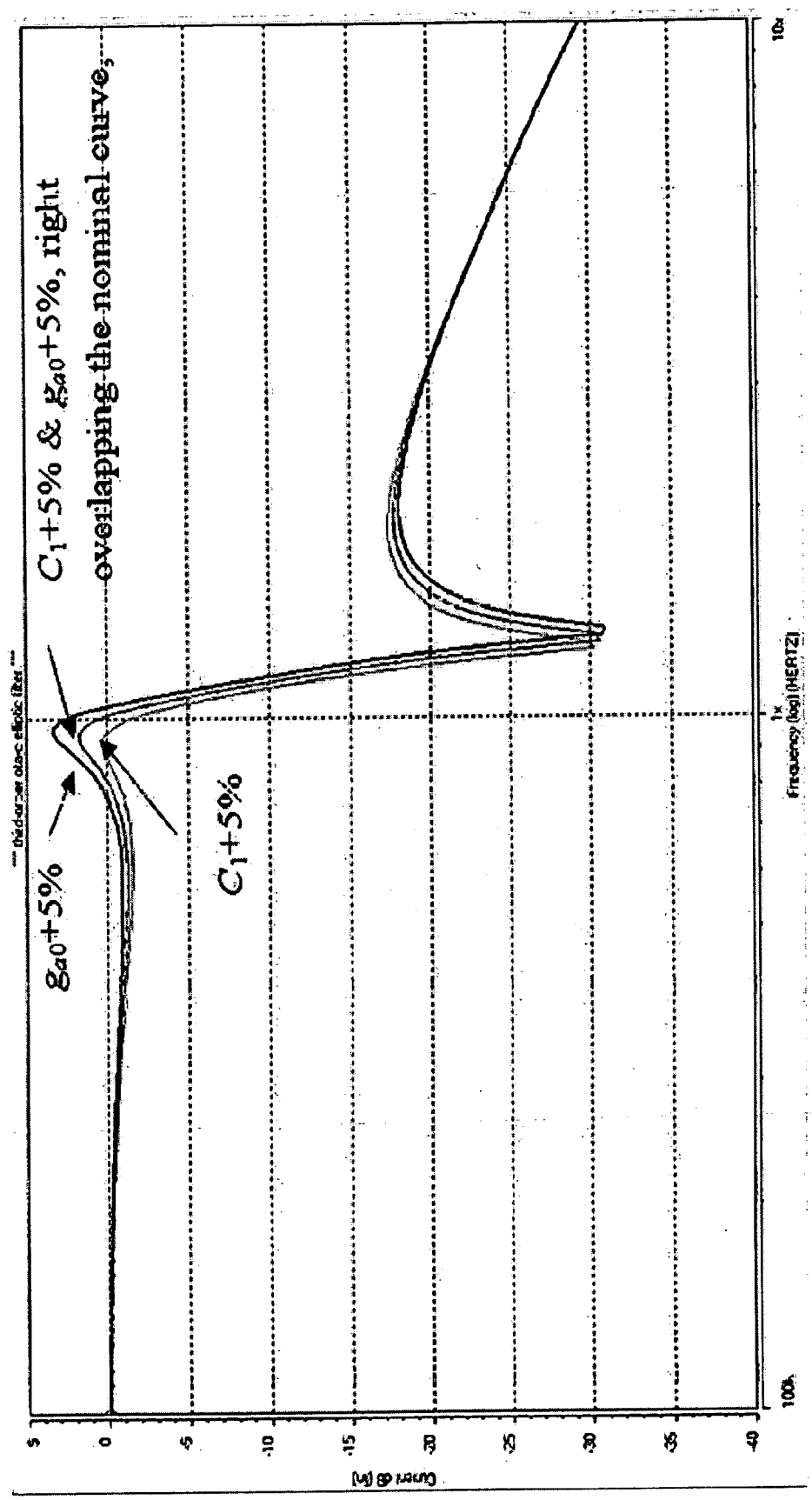
Figures 2, 7:
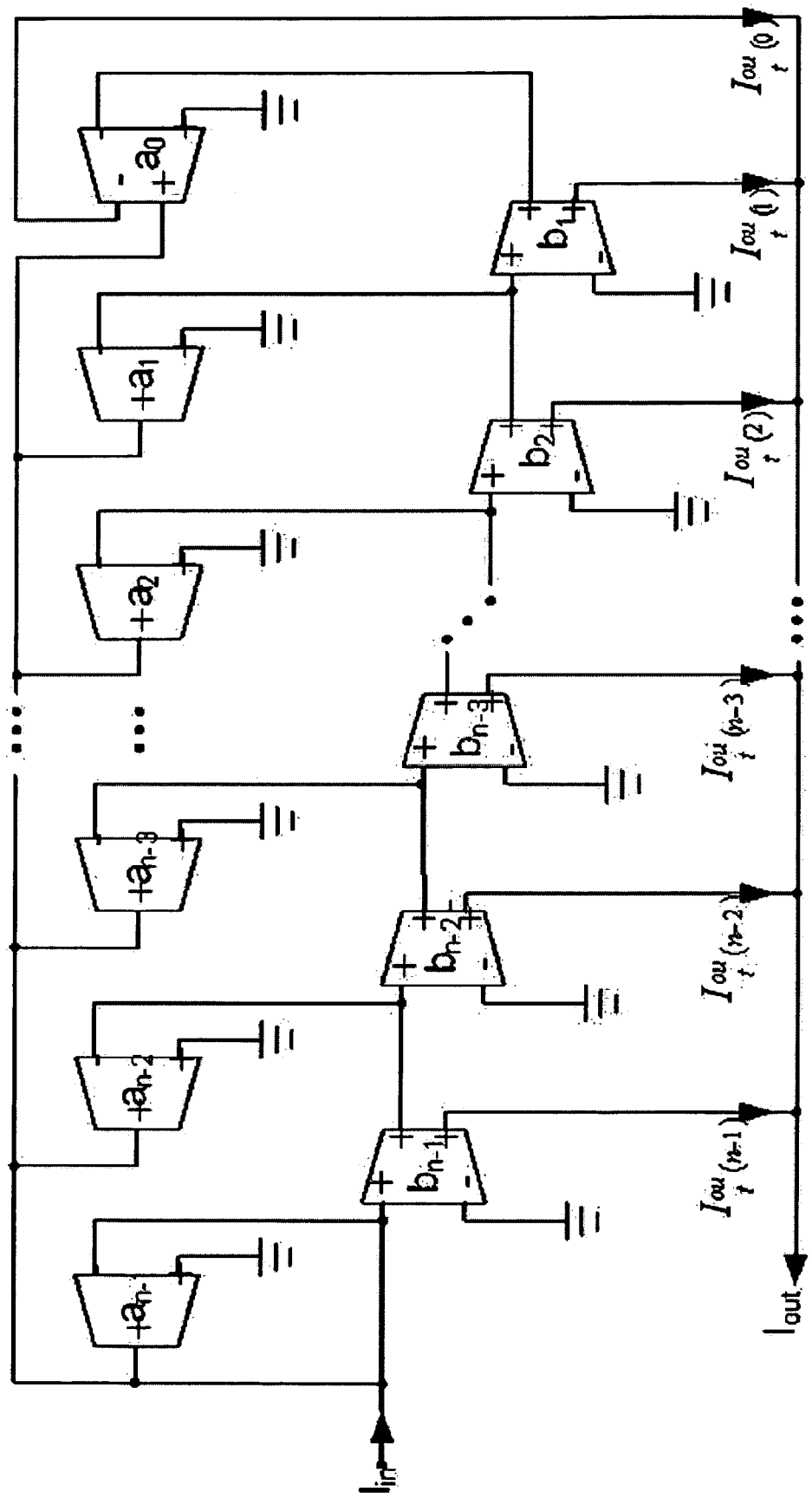
Figures 2A, 7:
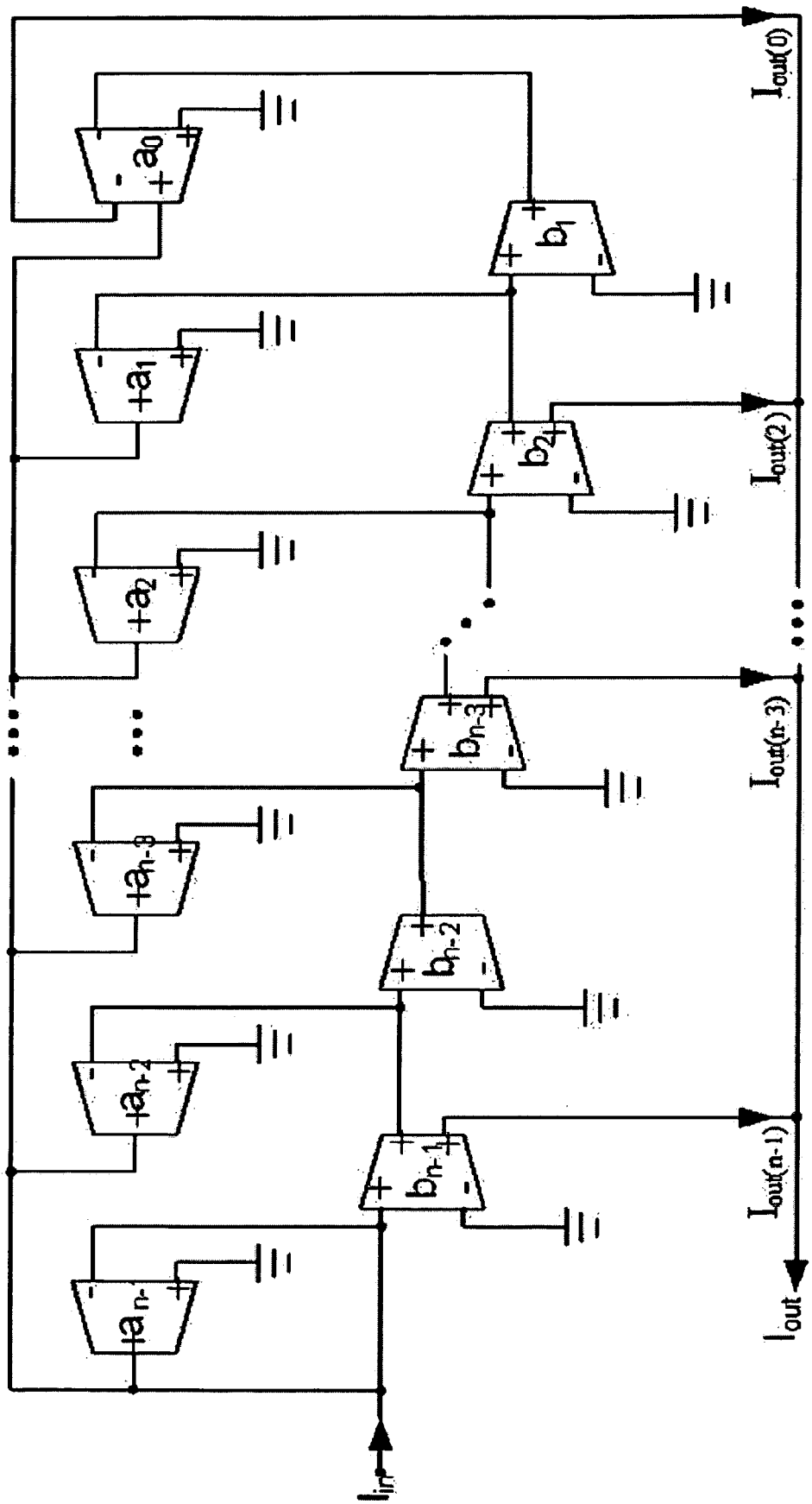
Figures 2B, 7:
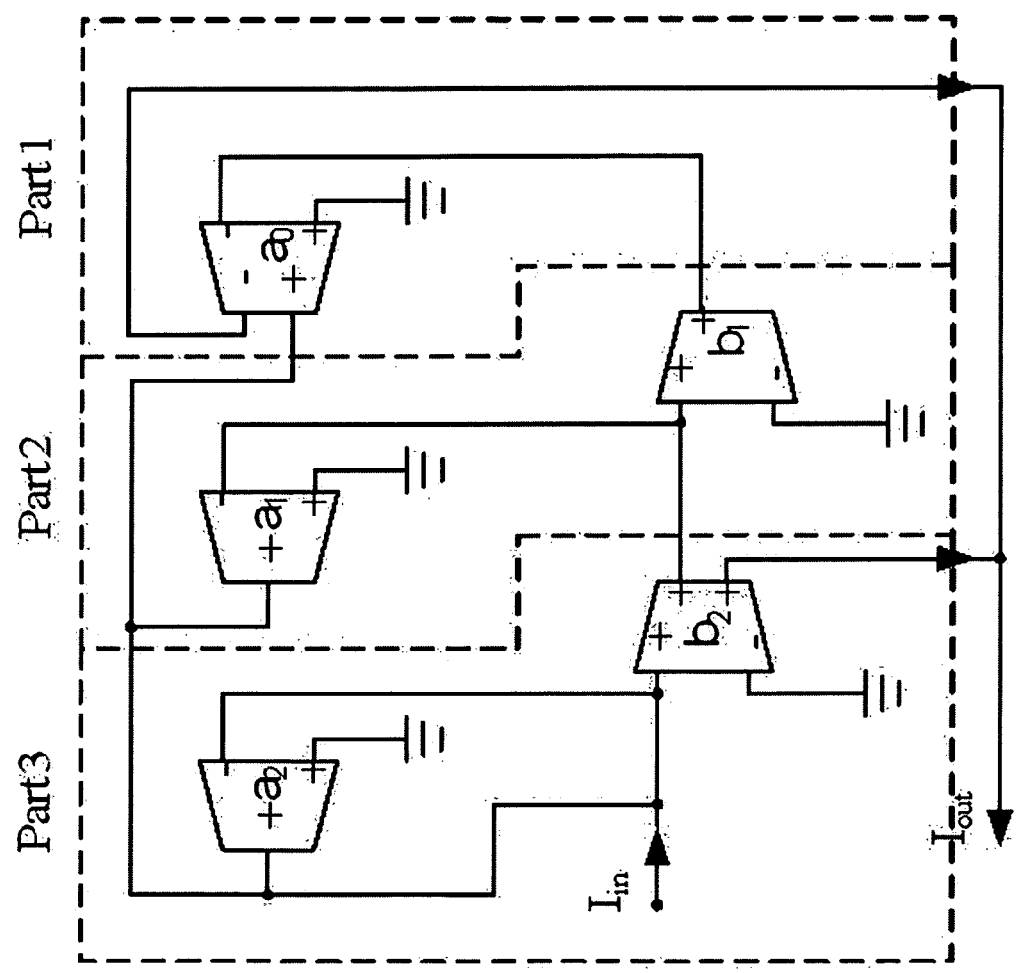
Figures 2C, 7:
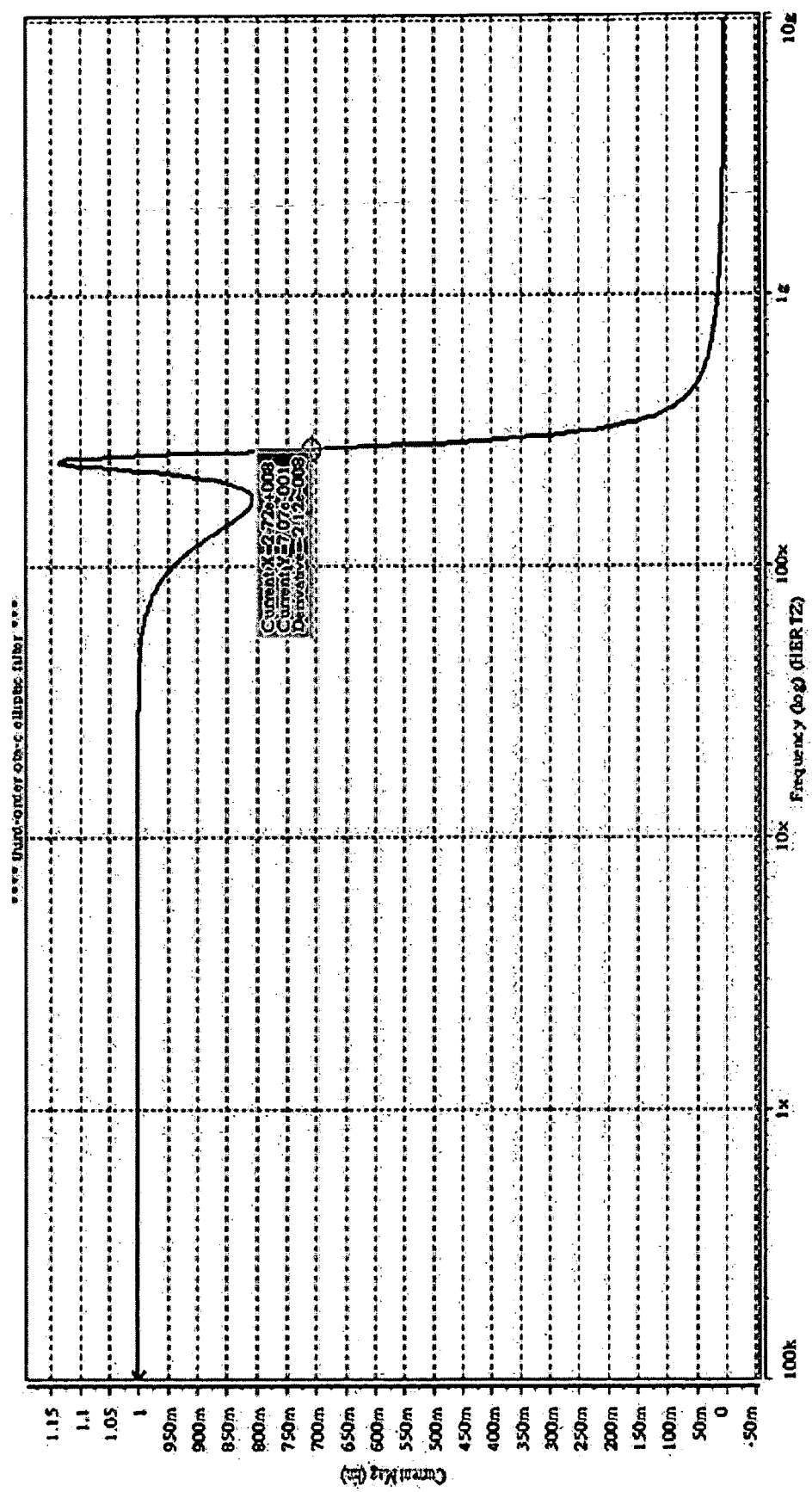

The current-mode OTA-C arbitrary filter structure prepared for the odd-order elliptic filter synthesis is shown in FIG. 7-1. The filter has one input, $I_{in}$, and one output, $I_{out}$, which is the summation of n multiple output currents: $I_{out(n-1)}, I_{out(n-2)}, I_{out(n-3)} \ldots, I_{out(2)}, I_{out(1)}$, and $I_{out(0)}$. The transfer function of the arbitrary filter structure shown in FIG. 7-1 is $$\frac{I_{out}}{I_{in}} = \frac{b_{n-1}s^{n-1} + b_{n-2}s^{n-2} + b_{n-3}s^{n-3} + \ldots + b_2s^2 + b_1s + a_0}{a_ns^n + a_{n-1}s^{n-1} + a_{n-2}s^{n-2} + a_{n-3}s^{n-3} + \ldots + a_2s^2 + a_1s + a_0} \quad (7\text{-}1)$$

Note that the current-mode odd-nth-order OTA-C arbitrary filter structure shown in FIG. 7-1 achieves the Three Criteria for the design of filters. Especially, two requirements, (i) only n internal nodes in the filter structure, and (ii) one grounded capacitor at each internal node and no extra capacitors used in the synthesized filter structure, are part of the criteria. The main goal of the present invention, to form a high-frequency (about 5 MHz to 5 GHz) circuit when removing all of the capacitors from the synthesized OTA-C filter structure. The collateral OTA-only-without-C filter structure is shown in FIG. 7-2.

Since an odd-order elliptic filter has the following transfer function $$\frac{I_{out}}{I_{in}} = \frac{b_{n-1}s^{n-1} + 0s^{n-2} + b_{n-3}s^{n-3} + \ldots + b_2s^2 + 0s + a_0}{a_ns^n + a_{n-1}s^{n-1} + a_{n-2}s^{n-2} + a_{n-3}s^{n-3} + \ldots + a_2s^2 + a_1s + a_0} \quad (n \text{ is odd}) \quad (7\text{-}2)$$

namely, $$I_{out} = I_{out(n-1)} + I_{out(n-3)} + I_{out(n-5)} + \ldots + I_{out(4)} + I_{out(2)} + I_{out(0)} \quad (7\text{-}3)$$

$$= \left(\frac{b_{n-1}s^{n-1}}{\Delta}I_{in}\right) + \left(\frac{b_{n-3}s^{n-3}}{\Delta}I_{in}\right) + \left(\frac{b_{n-5}s^{n-5}}{\Delta}I_{in}\right) + \ldots + \left(\frac{b_4s^4}{\Delta}I_{in}\right) + \left(\frac{b_2s^2}{\Delta}I_{in}\right) + \left(\frac{a_0}{\Delta}I_{in}\right) \text{ where}$$

$$\Delta = a_ns^n + a_{n-1}s^{n-1} + a_{n-2}s^{n-2} + a_{n-3}s^{n-3} + \ldots + a_1s + a_0$$

the output current $I_{out}$ is just the summation of all $I_{out(i)}$, where i is an even number including 0. Therefore, the realized filter structure of Eg. (7-2) is the same as that shown in FIG. 7-1 but cutting all $I_{out(i)}$, where i is an odd number, off from FIG. 7-1 and shows in FIG. 7-1(*a*).

To illustrate the synthesis method, consider the structure generation of a third-order elliptic filter, shown in FIG. 7-1(*b*) whose transfer function is $$\frac{I_{out}}{I_{in}} = \frac{b_2s^2 + a_0}{a_3s^3 + a_2s^2 + a_1s + a_0} \quad (7\text{-}4)$$

The above third-order elliptic filter presented in FIG. 7-1(*b*) employs (i) the least number of components when compared with some recently reported work, (ii) all single-ended-input OTAs, and (iii) all grounded capacitors unlike those reported recently.

In FIG. 7-1(*b*), if we replace the capacitances, $b_1$, $b_2$, and $a_3$, with $C_1$, $C_2$, and $C_3$, and the transconductances, $b_2$, $b_1$, $a_1$, $a_2$, and $a_0$, with $g_{b2}$, $g_{b1}$, $g_{a1}$, $g_{a2}$, and gas the transfer function of FIG. 7-1(*b*) becomes $$H(s) = \frac{I_{out}}{I_{in}} \quad (7\text{-}5)$$

$$= \frac{s^2C_1C_2g_{b2} + g_{b1}g_{b2}g_{a0}}{s^3C_1C_2C_3 + s^2C_1C_2g_{a2} + sC_1g_{b2}g_{a1} + g_{b1}g_{b2}g_{a0}}$$

$$\equiv \frac{b_2s^2 + a_0}{a_3s^3 + a_2s^2 + a_1s + a_0} \text{ Then}$$

$$S_{C_1}^H = \left(\frac{b_2s^2}{b_2s^2 + a_0}\right) - \left(\frac{a_3s^3 + a_2s^2 + a_1s}{a_3s^3 + a_2s^2 + a_1s + a_0}\right) \quad (7\text{-}6)$$

$$S_{C_2}^H = \left(\frac{b_2s^2}{b_2s^2 + a_0}\right) - \left(\frac{a_3s^3 + a_2s^2}{a_3s^3 + a_2s^2 + a_1s + a_0}\right)$$

-continued $$S_{C_3}^H = -\left(\frac{a_3s^3}{a_3s^3 + a_2s^2 + a_1s + a_0}\right)$$

$$S_{g_{b2}}^H = 1 - \left(\frac{a_1s + a_0}{a_3s^3 + a_2s^2 + a_1s + a_0}\right)$$

$$S_{g_{b1}}^H = \left(\frac{a_0}{b_2s^2 + a_0}\right) - \left(\frac{a_0}{a_3s^3 + a_2s^2 + a_1s + a_0}\right)$$

$$S_{g_{a1}}^H = \left(\frac{a_1s}{a_3s^3 + a_2s^2 + a_1s + a_0}\right)$$

$$S_{g_{a2}}^H = \left(\frac{a_2s^2}{a_3s^3 + a_2s^2 + a_1s + a_0}\right)$$

$$S_{g_{a0}}^H = \left(\frac{a_0}{b_2s^2 + a_0}\right) - \left(\frac{a_0}{a_3s^3 + a_2s^2 + a_1s + a_0}\right)$$

Obviously, all sensitivities of the transfer function H(S) to each individual capacitance and transconductance have the absolute value smaller than unity. Moreover, we can find that $$S_{C_1}^H + S_{g_{a0}}^H = 0, S_{C_2}^H + S_{g_{a1}}^H + S_{g_{b1}}^H = 0, S_{g_{b1}}^H = 0, S_{C_3}^H + S_{g_{b2}}^H + S_{g_{a2}}^H = 0,$$

$$S_{C_1}^H + S_{C_2}^H + S_{C_3}^H + S_{g_{b2}}^H + S_{g_{b1}}^H + S_{g_{a2}}^H + S_{g_{a1}}^H + S_{g_{a0}}^H = 0. \quad (7\text{-}7)$$

Eq. (7-7) means that, in addition to the null sum of sensitivities of each individual group such as $C_1$ & $g_{a0}$, $C_2$, $g_{a1}$ & $g_{b1}$ and $C_3$, $g_{b2}$ & $g_{a2}$, shown in Parts 1, 2, and 3, in FIG. 7-1(*b*), respectively, the total of all sensitivities is zero. In other words, if some components have the same variation tendency, the total of those corresponding sensitivities vanishes. This excellent performance leads to the merit of very low sensitivities which has been achieved by the well-known doubly terminated LC ladder networks.

H-spice simulations with TSMC 0.35 µm process are used to validate the theoretical predictions as follows. We use the CMOS implementation of a transconductor [16] with ±1.65 V supply voltages and W/L=5µ/1µ and 10µ/1µ for NMOS and PMOS transistors, respectively. The component values shown in the third-order elliptic filter transfer function of Eq. (7-5) with the coefficients $a_3$=1, $a_2$=0.84929, $a_1$=1.14586, $a_0$=0.59870, and $b_2$=035225 are given by $C_1$=18 pF, $C_2$=9 pF, $C_3$=18 pF, and $g_{b2}$=39.81834 µS, $g_{b1}$=104.20547 µS, $g_{a2}$=96.00374 µS, $g_{a1}$=183.85803 µS, and $g_{a0}$=104.20547 µS. The simulated amplitude-frequency response has an $f_{3db}$=1.06 MHz shown in FIG. 7-1(©) in agreement with theoretical prediction very well. Moreover, the sensitivity simulations with +5% $C_1$, +5% $g_{a0}$, and +5% $C_1$ & +5% $g_{a0}$ tolerances have $f_{3db}$=1.02623 MHz with −2.619% error, $f_{3db}$=1.07799 MHz with 2.292% error, and $f_{3db}$=1.05408 MHz with 0.02277% error, respectively, shown in, FIG. 7-1(*d*), which meet the sensitivity analysis shown in Eq. (7-7) very well.

7.2 Current-Mode Odd-Nth-Order OTA-Only-Without-C Arbitrary and Elliptic Filter Structure The synthesized filter structures shown in FIGS. 7-1, 7-1(*a*) and (*b*) can be replaced by the OTA-only-without-C filter structure after removing all of the capacitors from the synthesized OTA-C filter structure. The collateral OTA-only-without-C filter structures of FIGS. 7-1, 7-1(*a*), and 7-1(*b*) are shown in FIGS. 7-2, 7-2(*a*), and 7-2(*b*), respectively.

0.5 µm process H-spice simulations are used to validate the theoretical predictions as follows. We use the CMOS implementation of a transconductor [16] with ±2.5 V supply voltages and W/L=5µ/1µ and 10µ/1µ for NMOS and PMOS transistors, respectively. The component values are given by $g_{b2}$=30.85 µS, $g_{a2}$=106 µS, $g_{a1}$=0.19766 µS, $g_{b1}$=127.2 µS, $g_{a0}$=114.5 µS for meeting Eq. (8-2) with $a_3$=1, $a_2$=0.84929, $a_1$=1.14586, $a_0$=0.59870, and $b_2$=0.35225. The simulated amplitude-frequency response with $f_{3db}$=272 MHz is shown in FIG. 7-2(*c*).

Figures 1, 8:
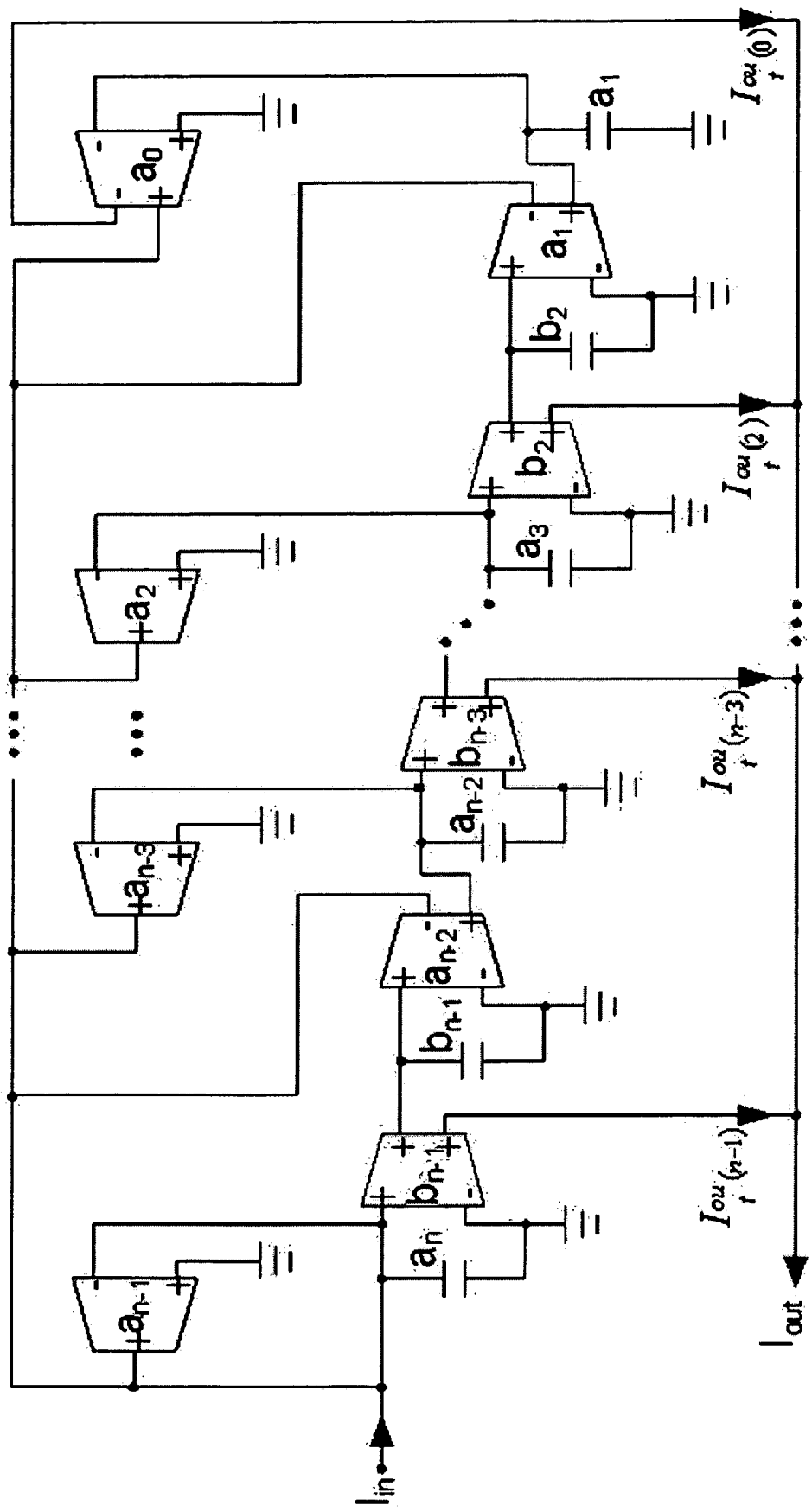
Figures 1A, 8:
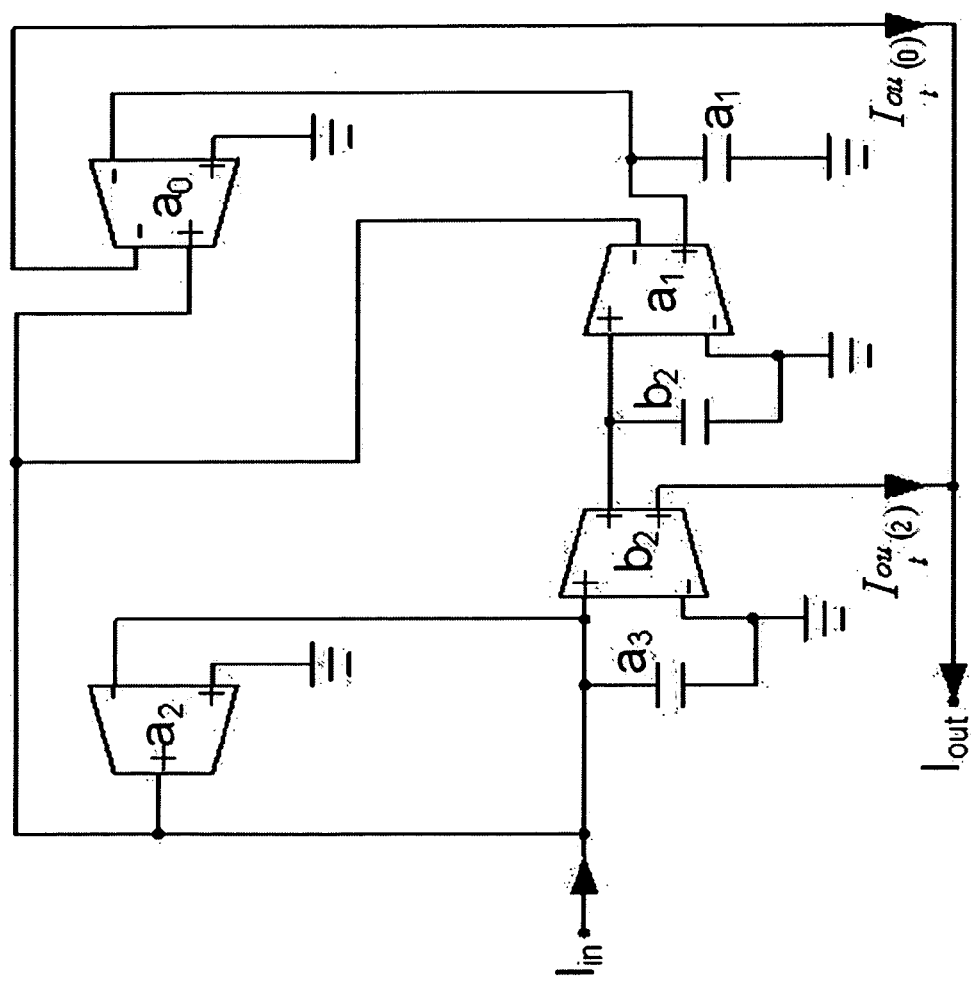
Figures 1B, 8:
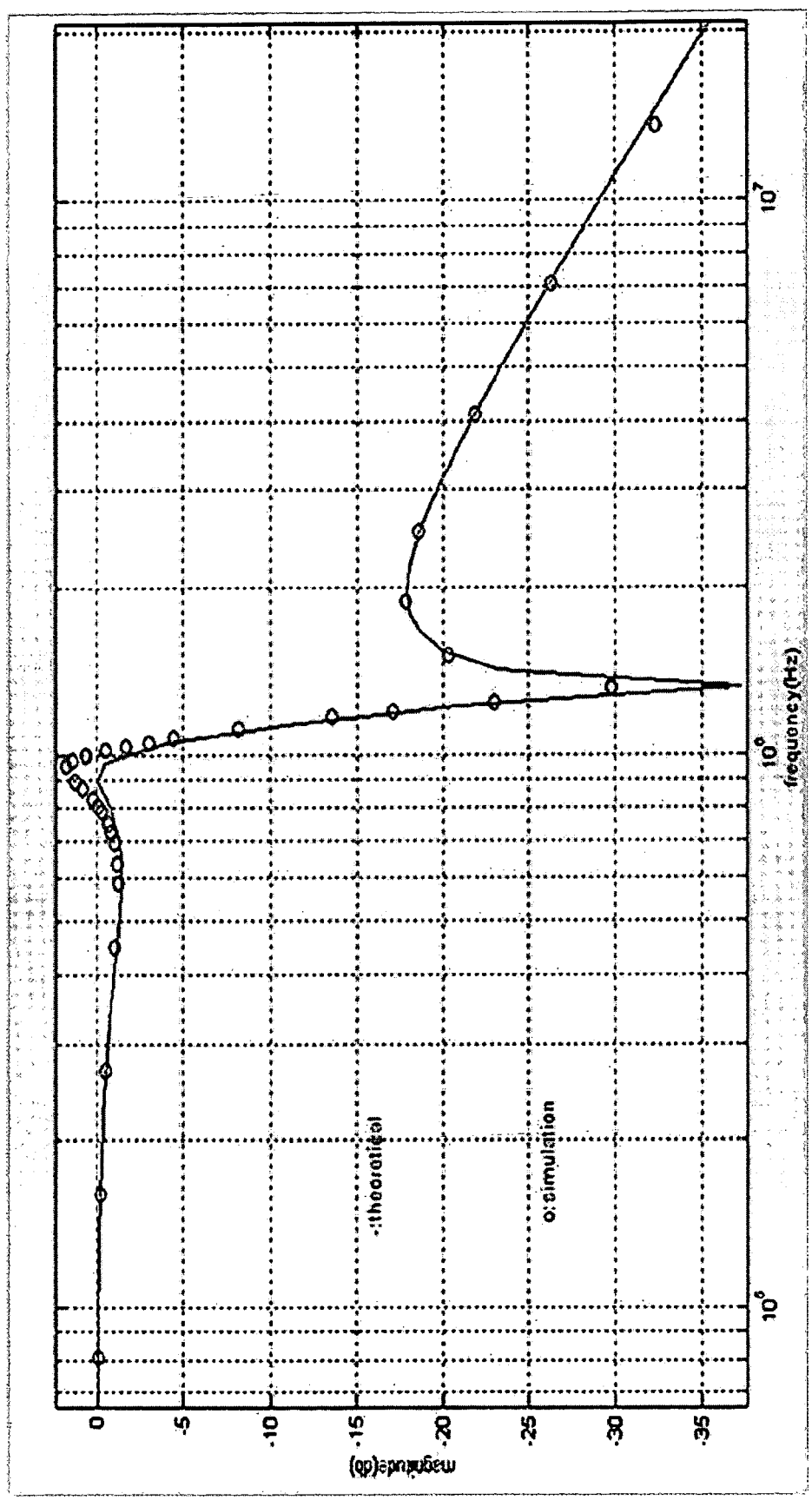
Figures 1C, 8:
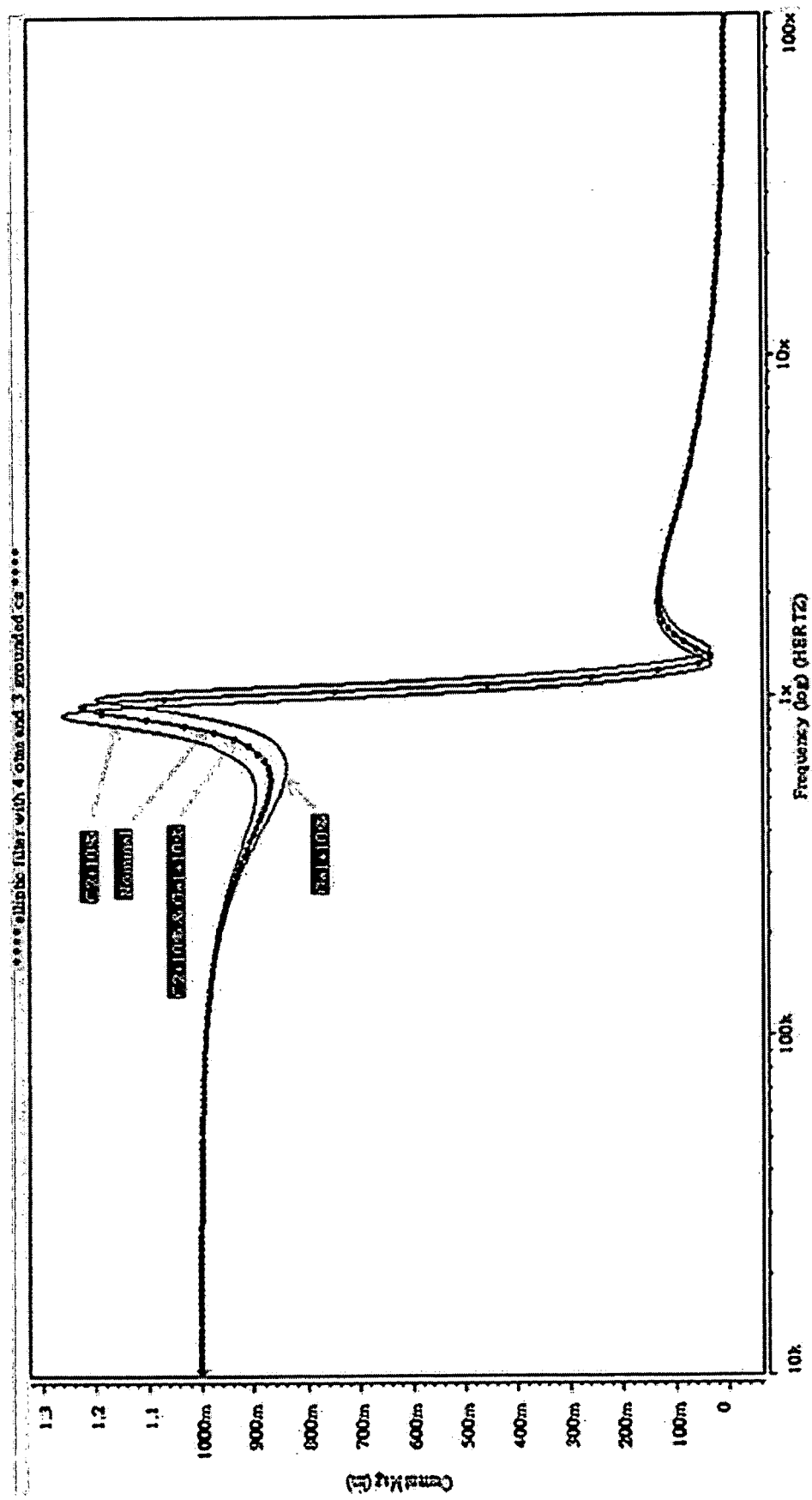
Figures 2, 8:
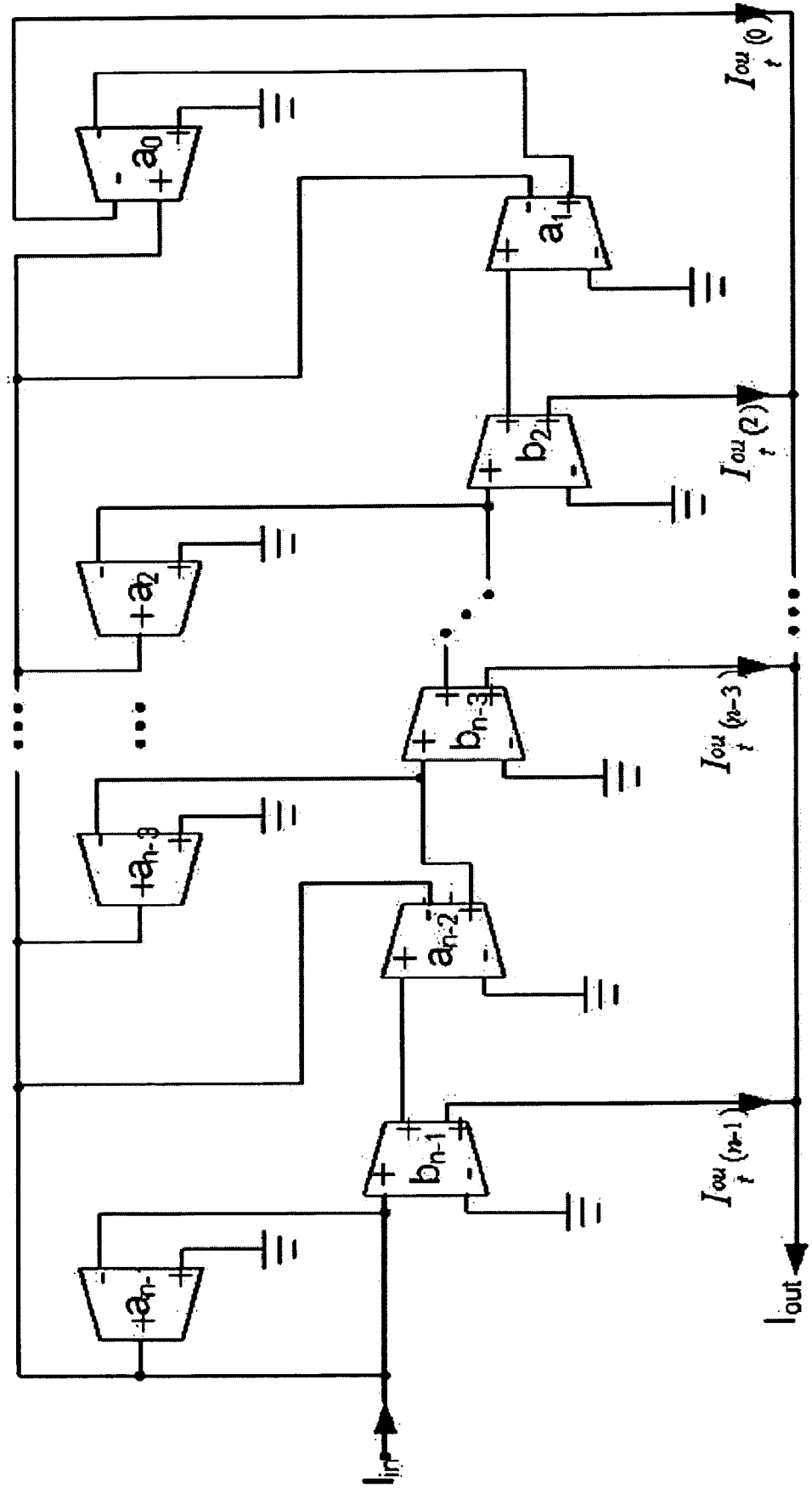
Figures 2A, 8:
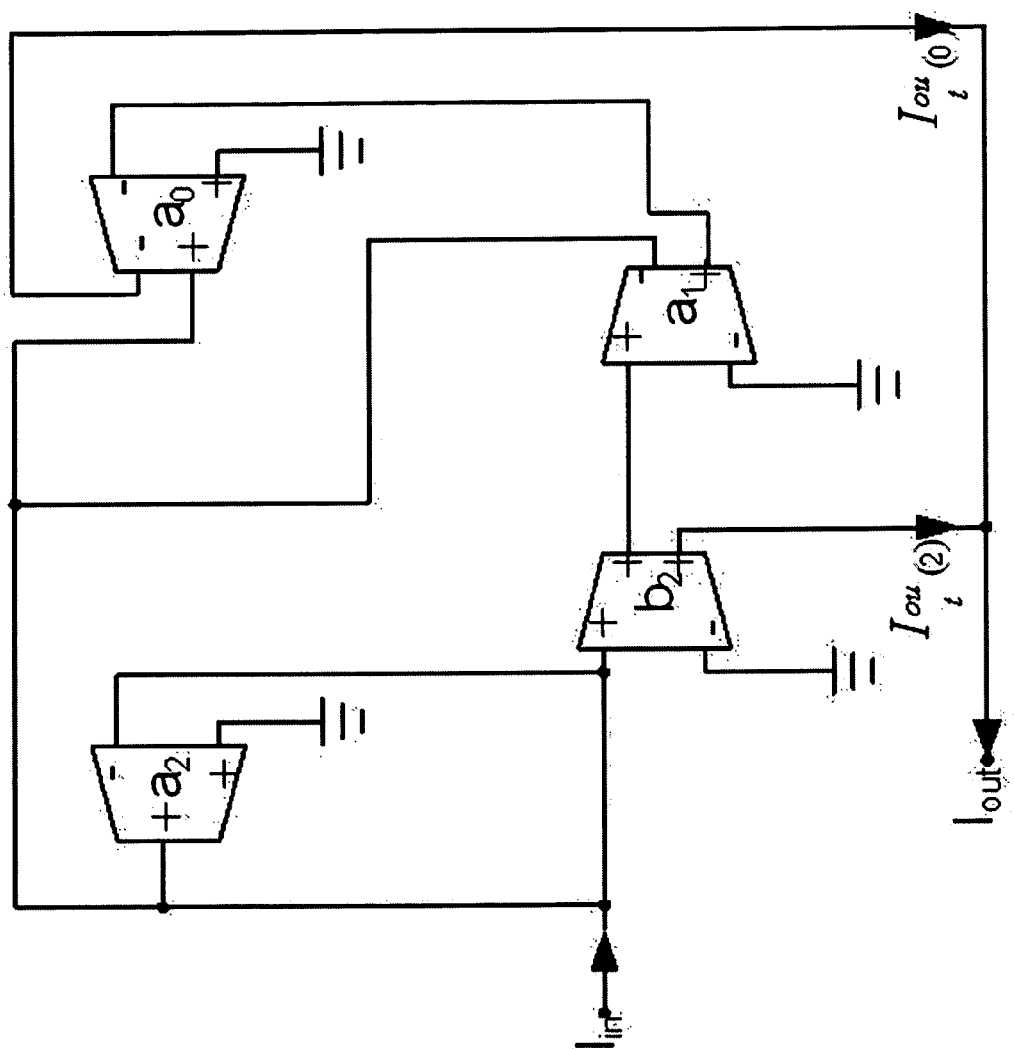
Figures 2B, 8:
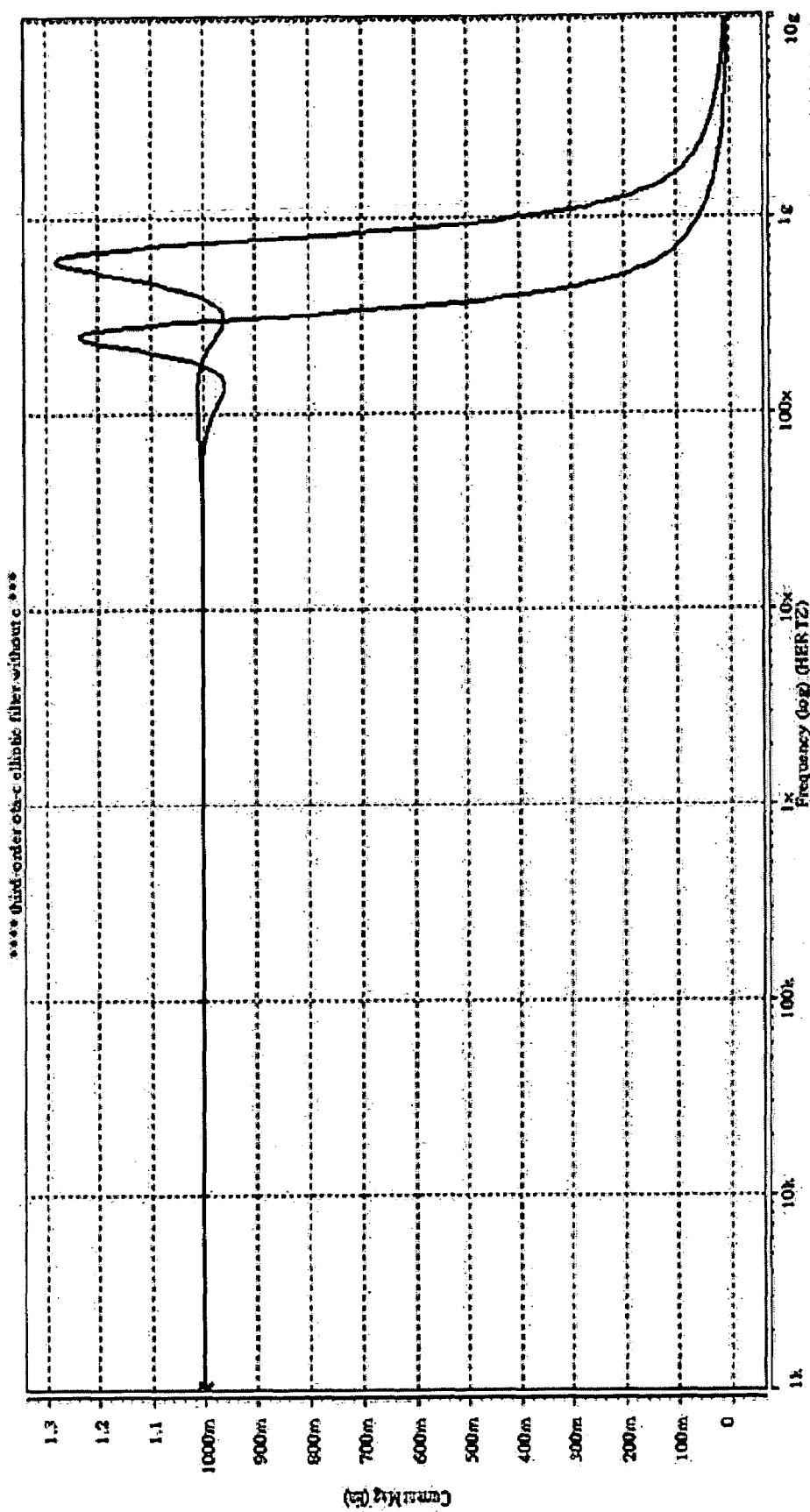

8.1 Current-Mode Odd-Nth-Order OTA-C Elliptic Filter Structure with the Minimum Components The filter structure shown in FIG. 8-1 realizes the current-mode odd-nth-order OTA-C elliptic filter with the following transfer function $$\frac{I_{out}}{I_{in}} = \frac{b_{n-1}s^{n-1} + b_{n-3}s^{n-3} + b_{n-5}s^{n-5} + \ldots + b_4s^4 + b_2s^2 + a_0}{a_n s^n + a_{n-1}s^{n-1} + a_{n-2}s^{n-2} + a_{n-3}s^{n-3} + \ldots + a_3s^3 + a_2s^2 + a_1s + a_0} \quad (8\text{-}1)$$

Note that the current-mode odd-nth-order OTA-C elliptic filter structure shown in FIG. 8-1 achieves the Three Criteria for the design of filters. Especially, two requirements, (i) only n internal nodes in the filter structure, and (ii) one grounded capacitor at each internal node and no extra capacitors used in the synthesized filter structure, are part of the criteria. The main goal of the present invention, to form a high-frequency (about 5 MHz to 5 GHz) circuit when removing all of the capacitors from the synthesized OTA-C filter structure. The collateral OTA-only-without-C filter structure is shown in FIG. 8-2.

The third-order OTA-C elliptic filter derived from FIG. 8-1 is shown in FIG. 8-1(*a*) with the following transfer function $$\frac{I_{out}}{I_{in}} = \frac{b_2 s^2 + a_0}{a_3 s^3 + a_2 s^2 + a_1 s + a_0} \quad (8\text{-}2)$$

Please note that the above third-order elliptic filter presented in FIG. 8-1(*a*) employs the minimum active and passive components. It can be explained as follows. The general third-order elliptic filter has the general transfer function $$\frac{I_{out}}{I_{in}} = \frac{b_2 s^2 + b_0}{a_3 s^3 + a_2 s^2 + a_1 s + a_0} \quad (8\text{-}3)$$

The different coefficients in Eq. (8-3) can be reduced by one if we multiply a factor ($a_n/b_n$) to the numerator, then Eq. (8-3) becomes $$\frac{I_{out}(a_0/b_0)}{I_{in}} = \frac{I'_{out}}{I_{in}} \quad (8\text{-}4)$$

$$= \frac{b_2(a_0/b_0)s^2 + a_0}{a_3 s^3 + a_2 s^2 + a_1 s + a_0}$$

$$= \frac{b'_2 s^2 + a_0}{a_3 s^3 + a_2 s^2 + a_1 s + a_0}$$

The simplest component choice is (i) using three capacitances, $C_1$, $C_2$, and $C_3$ to construct $a_3$, (ii) using two out of the three capacitances in (i) and one transconductance $g_1$ to construct $a_2$, (iii) using one of the three capacitances in (i) and two transconductances, $g_1$ and $g_2$, to construct $a_1$, (iv) using three transconductances, $g_1$, $g_2$, and $g_3$ to construct $a_0$, and (v) using two of the three capacitances and one different transconductance $g_4$ to construct $b_2$. Therefore, four OTAs and three capacitors are the minimum components necessary for realizing such a third-order elliptic filter. This merit can be deduced to the nth-order filter structure shown in FIG. 8-1 using the same approach.

In FIG. 8-1(*a*), if we replace the capacitances, $a_1$, $b_2$, and $a_3$, with $C_1$, $C_2$, and $C_3$, and the transconductances, $b_2$, $a_1$, $a_2$, and $a_0$, with $g_{b2}$, $g_{a1}$, $g_{a2}$, and $g_{a0}$, the transfer function of Eq. (8-2) is $$H(s) = \frac{I_{out}}{I_{in}} \quad (8\text{-}5)$$

$$= \frac{s^2 C_1 C_2 g_{b2} + g_{b2} g_{a1} g_{a0}}{s^3 C_1 C_2 C_3 + s^2 C_1 C_2 g_{a2} + s C_1 g_{b2} g_{a1} + g_{b2} g_{a1} g_{a0}}$$

$$\equiv \frac{b_2 s^2 + a_0}{a_3 s^3 + a_2 s^2 + a_1 s + a_0} \quad \text{Then}$$

$$S_{C_1}^H = \left(\frac{b_2 s^2}{b_2 s^2 + a_0}\right) - \left(\frac{a_3 s^3 + a_2 s^2 + a_1 s}{a_3 s^3 + a_2 s^2 + a_1 s + a_0}\right) \quad (8\text{-}6)$$

$$S_{C_2}^H = \left(\frac{b_2 s^2}{b_2 s^2 + a_0}\right) - \left(\frac{a_3 s^3 + a_2 s^2}{a_3 s^3 + a_2 s^2 + a_1 s + a_0}\right)$$

$$S_{C_3}^H = -\left(\frac{a_3 s^3}{a_3 s^3 + a_2 s^2 + a_1 s + a_0}\right)$$

$$S_{g_{b2}}^H = 1 - \left(\frac{a_1 s + a_0}{a_3 s^3 + a_2 s^2 + a_1 s + a_0}\right)$$

$$S_{g_{a1}}^H = \left(\frac{a_0}{b_2 s^2 + a_0}\right) - \left(\frac{a_1 s + a_0}{a_3 s^3 + a_2 s^2 + a_1 s + a_0}\right)$$

$$S_{g_{a2}}^H = \left(\frac{a_2 s^2}{a_3 s^3 + a_2 s^2 + a_1 s + a_0}\right)$$

$$S_{g_{a0}}^H = \left(\frac{a_0}{b_2 s^2 + a_0}\right) - \left(\frac{a_0}{a_3 s^3 + a_2 s^2 + a_1 s + a_0}\right)$$

Obviously, all sensitivities of the transfer function H(S) to each individual capacitance and transconductance have the absolute value smaller than unity. Moreover, we can find that $$S_{C_1}^H + S_{g_{a0}}^H = 0, \; S_{C_2}^H + S_{g_{a1}}^H = 0 \; S_{C_3}^H + S_{g_{b2}}^H + S_{g_{a2}}^H = 0,$$
and $$S_{C_1}^H + S_{C_2}^H + S_{C_3}^H + S_{g_{b2}}^H + S_{g_{a1}}^H + S_{g_{a0}}^H = 0. \quad (8\text{-}7)$$

Eq. (8-7) means that, in addition to the null sum of sensitivities of each individual group such as $c_1$ & $g_{a0}$, $c_2$ & $g_{a1}$, and $c_3$, $g_{b2}$ & $g_{a2}$, the total of all sensitivities is zero. In other words, if some components have the same variation tendency, the total of those corresponding sensitivities vanishes. This excellent performance leads to the merit of very low sensitivities which has been achieved by the well-known doubly terminated LC ladder networks.

0.35 µm process H-spice simulations are used to validate the theoretical predictions as follows. We use the CMOS implementation of a transconductor [16] with ±1.65 V supply voltages and W/L=5µ/1µ and 10µ/1µ for NMOS and PMOS transistors, respectively. The component values are given by $C_1$=24 pF, $C_2$=8 pF, $C_3$=24 pF, and $g_{b2}$=53.09112 µS, $g_{a2}$=128.0049 µS, $g_{a1}$=163.42936 µS, $g_{a0}$=78.749 µS, which meet Eq. (8-2) with $a_3$=1, $a_2$=0.84929, $a_1$=1.14586, $a_0$=0.59870, and $b_2$=0.35225. The simulated amplitude-frequency response with a nominal $f_{3db}$=1.0535 MHz is shown in FIG. 8-1(*b*) in agreement with theoretical prediction very well. Moreover, the sensitivity simulations with +10% $C_2$, +10% $g_{a1}$, and +10% $C_2 \& g_{a1}$ tolerances have $f_{3db}$=1.0027 MHz with −4.822% error, $f_{3db}$=1.1063 MHz with 5.011% error, and $f_{3db}$=1.0530 MHz with 0.05% error, respectively, shown in FIG. 8-1(c), which meet the sensitivity analysis, $S_{C_2}^H + S_{g_{a1}}^H = 0$, shown in Eq. (8-7) very well.

8.2 Current-Mode Odd-Nth-Order OTA-Only-Without-C Elliptic Filter Structure with the Minimum Components ages and W/L=5μ/0.5μ and 10μ/0.5μ for NMOS and PMOS transistors, respectively. The component values, resonant frequencies, and equivalent parasitic capacitances are shown in Table I and II for meeting Eq. (8-2) with $a_3$=1, $a_2$=0.84929, $a_1$=1.14586, $a_0$=0.59870, and $b_2$=0.35225. The simulated amplitude-frequency responses with the $f_{3db}$=848 MHz and 338 MHz are shown in FIG. 8-2(b) with the equivalent parasitic capacitances 0.011011 pF and 0.015592 pF, respectively.

TABLE I

Component values, resonant frequencies, and parasitic capacitances of the third-order OTA-only-without-C elliptic filter of FIG. 8-2 (a)

| | Ibias μA | Gm μS | Ibias μA | Gm μS | Ibias μA | Gm μS |
|---|---|---|---|---|---|---|
| G0 | 185 | 145.7 | 155 | 136.2 | 135 | 129.2 |
| G1 | 8.3 | 8.614 | 5.3 | 5.49 | 6.3 | 6.68 |
| G2 | 250 | 160.9 | 190 | 154.1 | 250 | 173.6 |
| G3 | 244 | 161.7 | 220 | 165.3 | 180 | 155.6 |
| Frequency MHz | | 848 MHz | | 814 MHz | | 782 MHz |
| G0 * G1 * G2 | | 201939.1 | | 115226.4 | | 149916.2 |
| (G0 * G1 * G2)^1/3 | | 58.66875 | | 48.66134 | | 53.12304 |
| Parasitic C pF | | 0.011011 pF | | 0.009514 pF | | 0.010812 pF |

| | Ibias μA | Gm μS | Ibias μA | Gm μS | Ibias μA | Gm μS |
|---|---|---|---|---|---|---|
| G0 | 105 | 114.2 | 85 | 104.4 | 75 | 99.23 |
| G1 | 6.3 | 6.845 | 6.3 | 7.061 | 5.3 | 6.014 |
| G2 | 250 | 183.4 | 250 | 195.9 | 60 | 80.36 |
| G3 | 180 | 165.1 | 130 | 145.2 | 120 | 144.9 |
| Frequency MHz | | 735 Mhz | | 679 MHz | | 642 MHz |
| G0 * G1 * G2 | | 143363.6 | | 144411.3 | | 47956.37 |
| (G0 * G1 * G2)^1/3 | | 52.3375 | | 52.46468 | | 36.3314 |
| Parasitic C pF | | 0.011333 | | 0.012298 | | 0.009007 |

TABLE II

Component values, resonant frequencies, and parasitic capacitances of the third-order OTA-only-without-C elliptic filter of FIG. 8-2 (a)

| | Ibias μA | Gm μS | Ibias μA | Gm μS | Ibias μA | Gm μS |
|---|---|---|---|---|---|---|
| G0 | 55 | 85.96 | 45 | 77.18 | 45 | 80.2 |
| G1 | 2.3 | 2.538 | 5.3 | 6.604 | 2.3 | 2.672 |
| G2 | 70 | 108.2 | 30 | 48.42 | 150 | 207.8 |
| G3 | 80 | 121.5 | 70 | 118.7 | 50 | 89.51 |
| Frequency MHz | | 557 MHz | | 507 MHz | | 489 MHz |
| (G0 * G1 * G2) | | 23605.61 | | 24679.52 | | 44530.38 |
| (G0 * G1 * G2)^1/3 | | 28.68612 | | 29.11469 | | 35.44477 |
| Parasitic C pF | | 0.008197 pF | | 0.00914 pF | | 0.011536 pF |

| | Ibias μA | Gm μS | Ibias μA | Gm μS | Ibias μA | Gm μS |
|---|---|---|---|---|---|---|
| G0 | 35 | 72.55 | 25 | 55.61 | 25 | 59.77 |
| G1 | 2.3 | 2.867 | 2.3 | 3.032 | 2.3 | 3.12 |
| G2 | 150 | 230.3 | 70 | 157 | 90 | 194.7 |
| G3 | 30 | 60.52 | 30 | 69.48 | 20 | 44.78 |
| Frequency MHz | | 413 MHz | | 362 MHz | | 338 MHz |
| G0 * G1 * G2 | | 47902.6 | | 26471.69 | | 36308.12 |
| (G0 * G1 * G2)^1/3 | | 36.31781 | | 29.80304 | | 33.11321 |
| Parasitic C pF | | 0.013996 pF | | 0.013103 pF | | 0.015592 pF |

The synthesized filter structures shown in FIGS. 8-1 can be replaced by the OTA-only-without-C filter structure y after removing all of the capacitors from the synthesized OTA-C filter structure. The collateral OTA-only-without-C filter structure is shown in FIG. 8-2. FIG. 8-2(a) is the third-order case of FIG. 8-2.

Figures 1, 9:
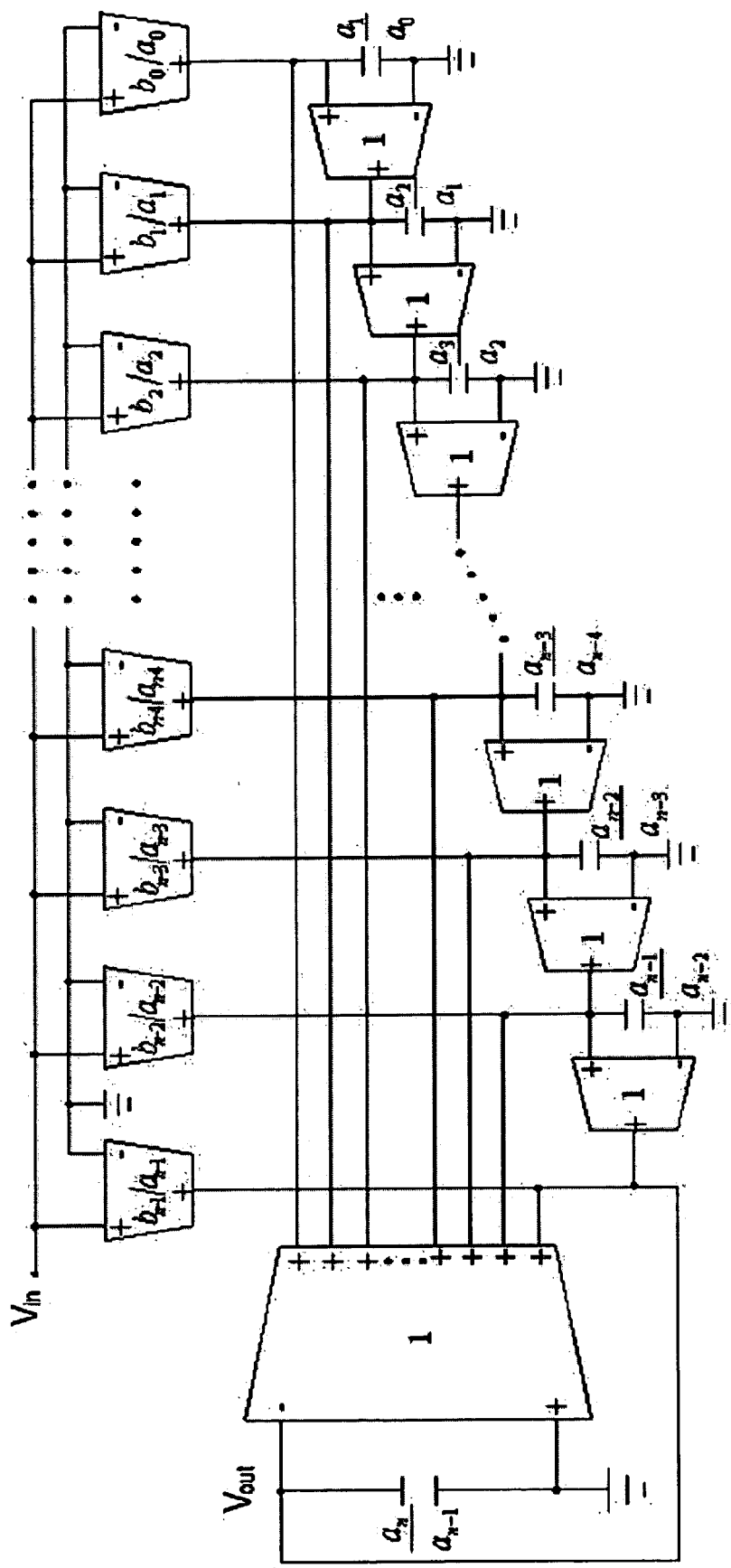
Figures 1A, 9:
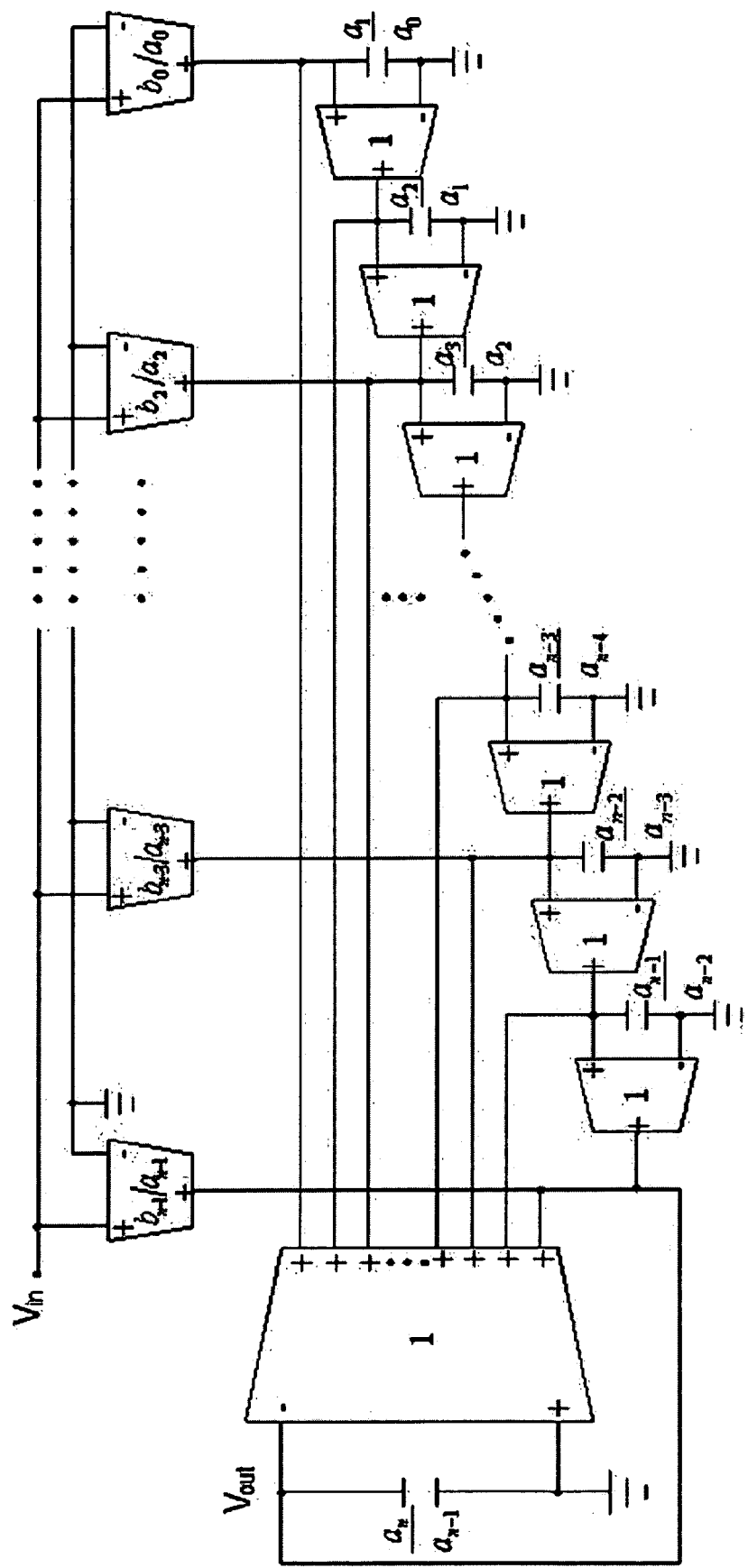
Figures 1B, 9:
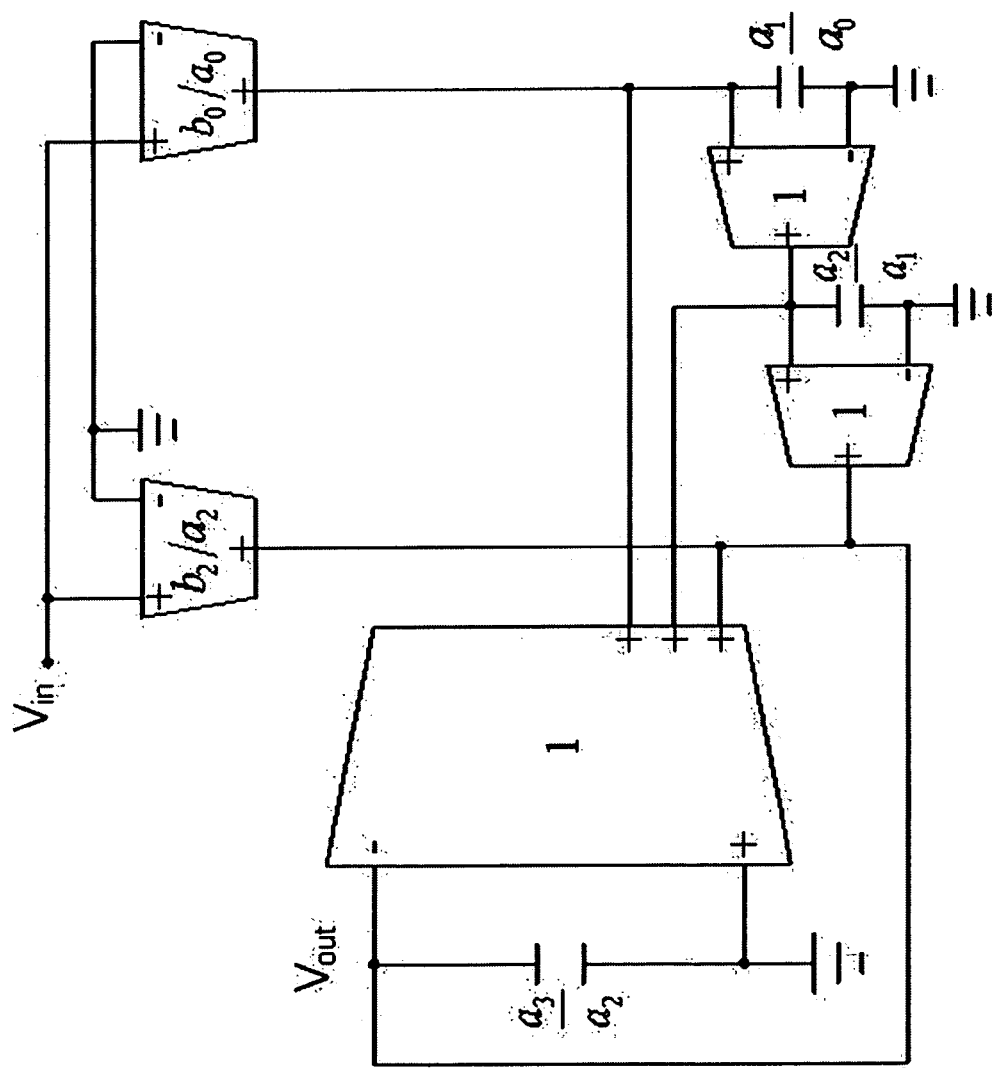
Figures 1C, 9:
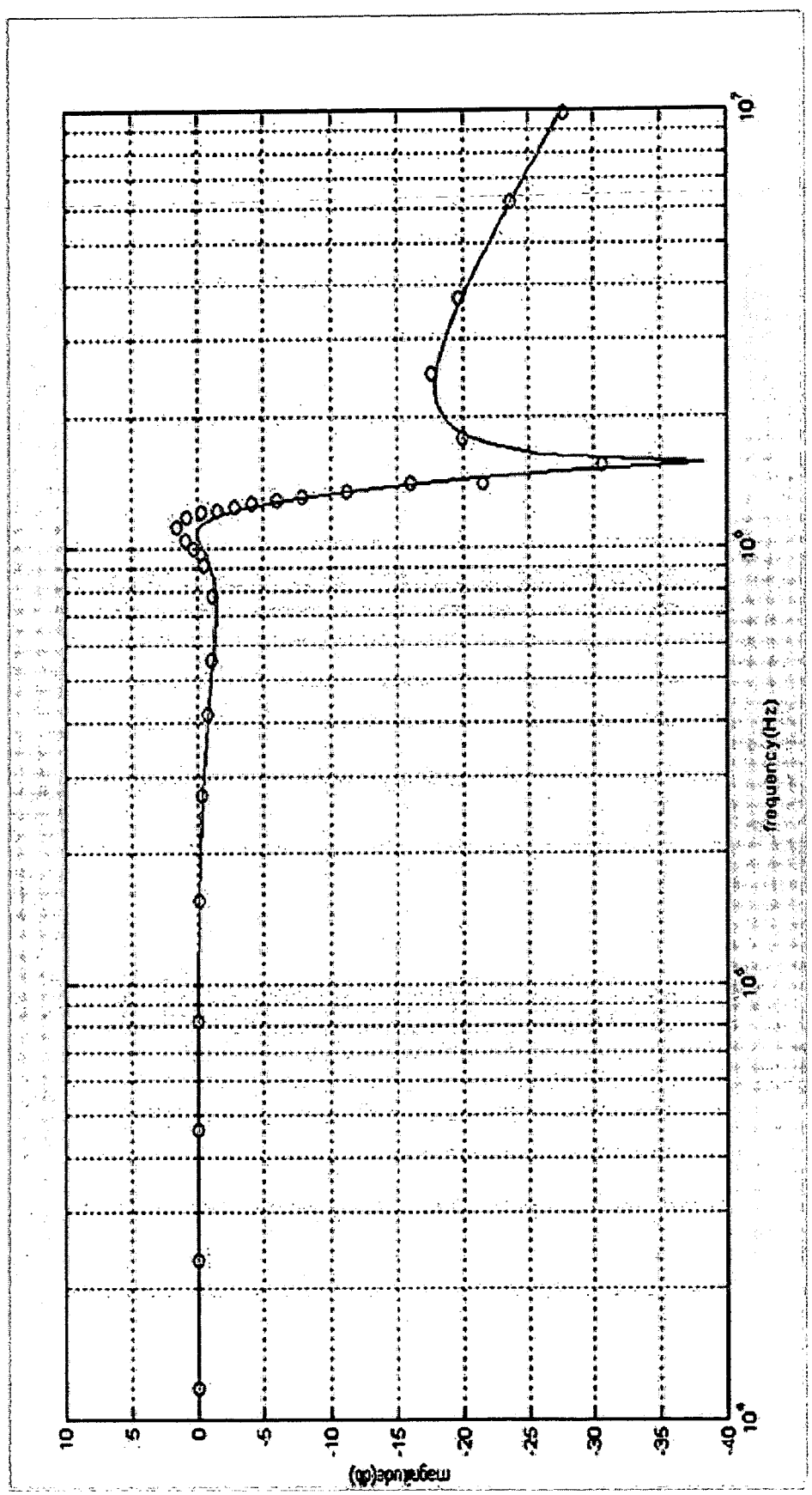
Figures 2, 9:
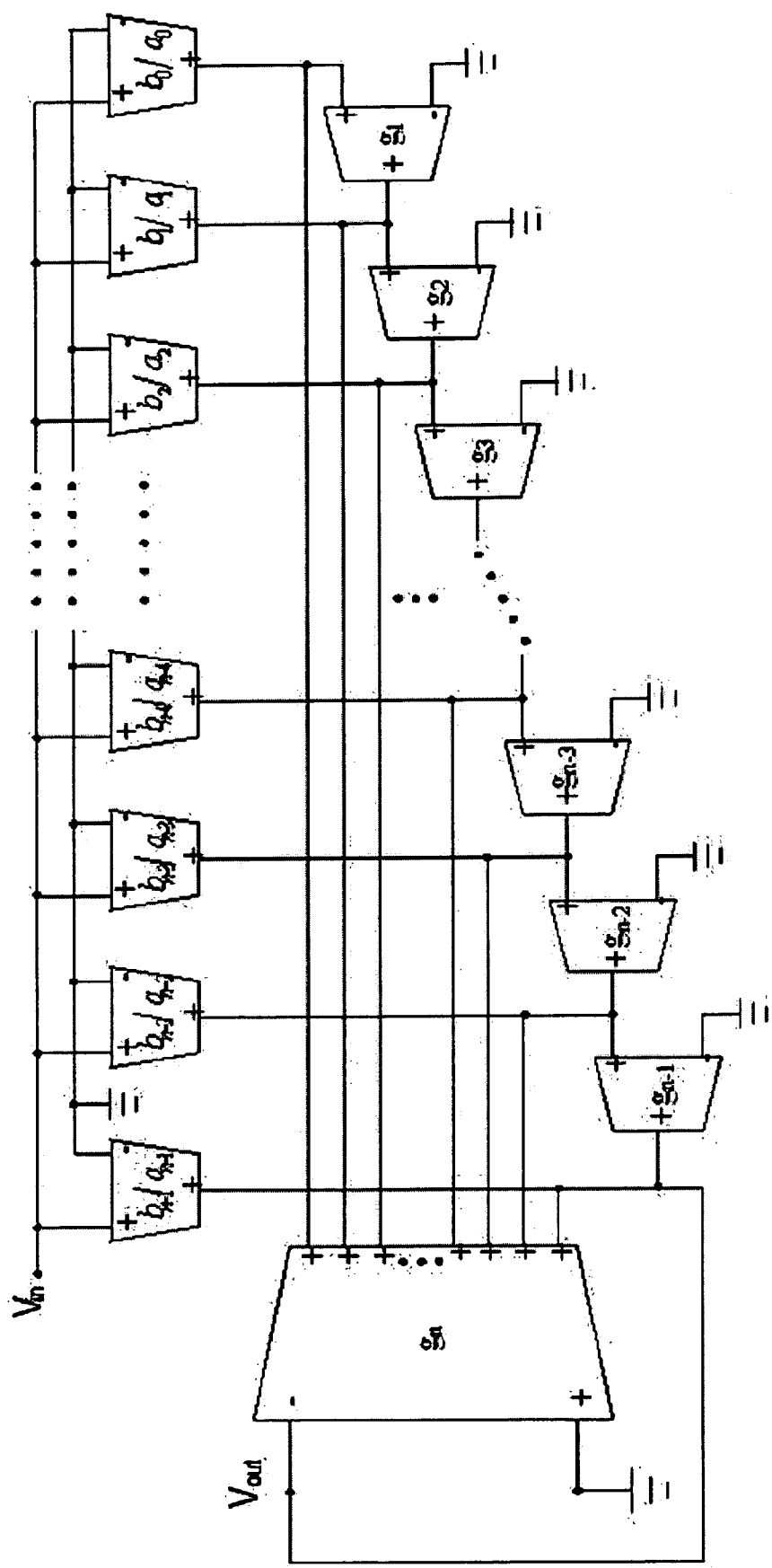
Figures 2A, 9:
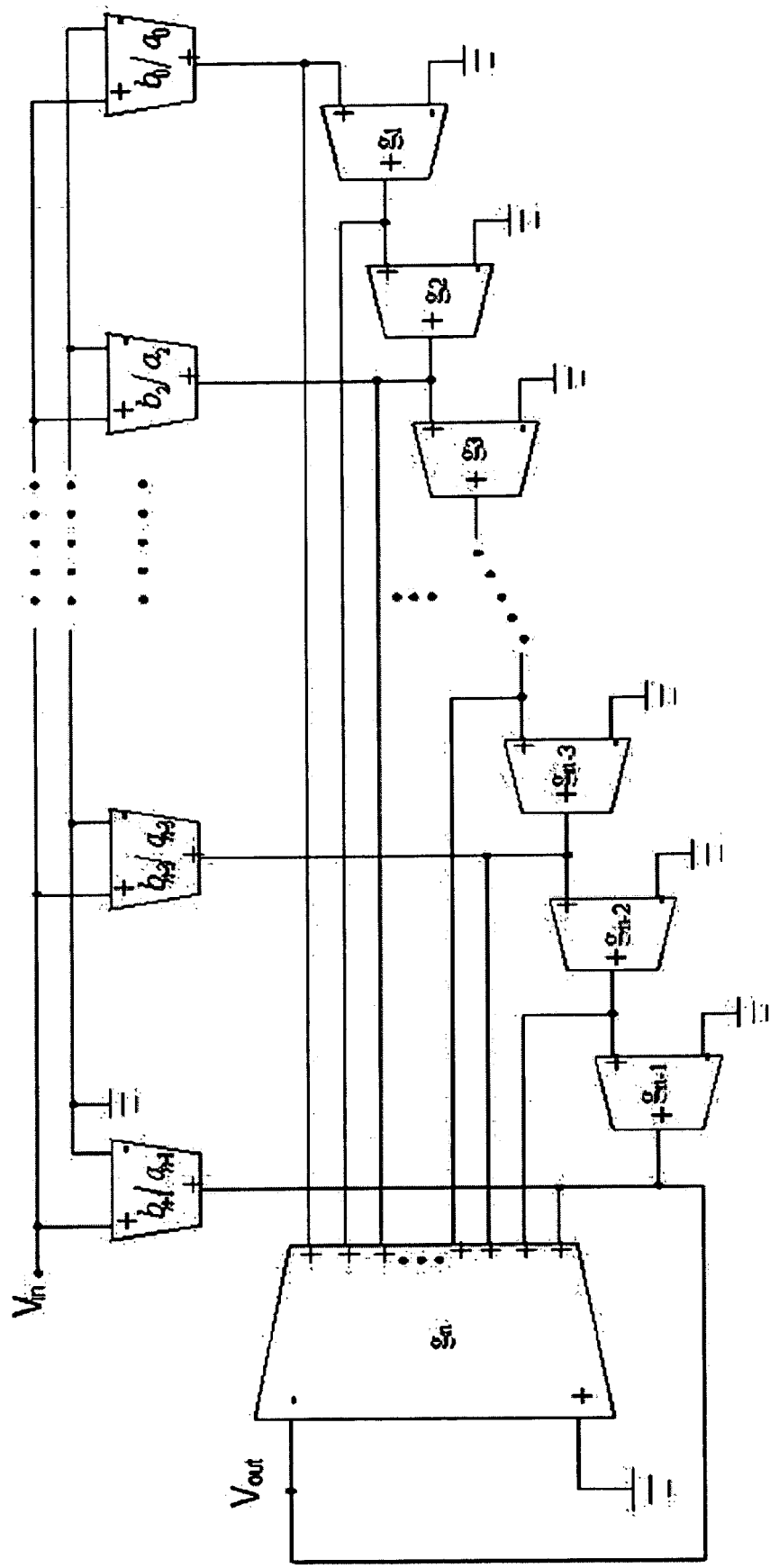
Figures 2B, 9:
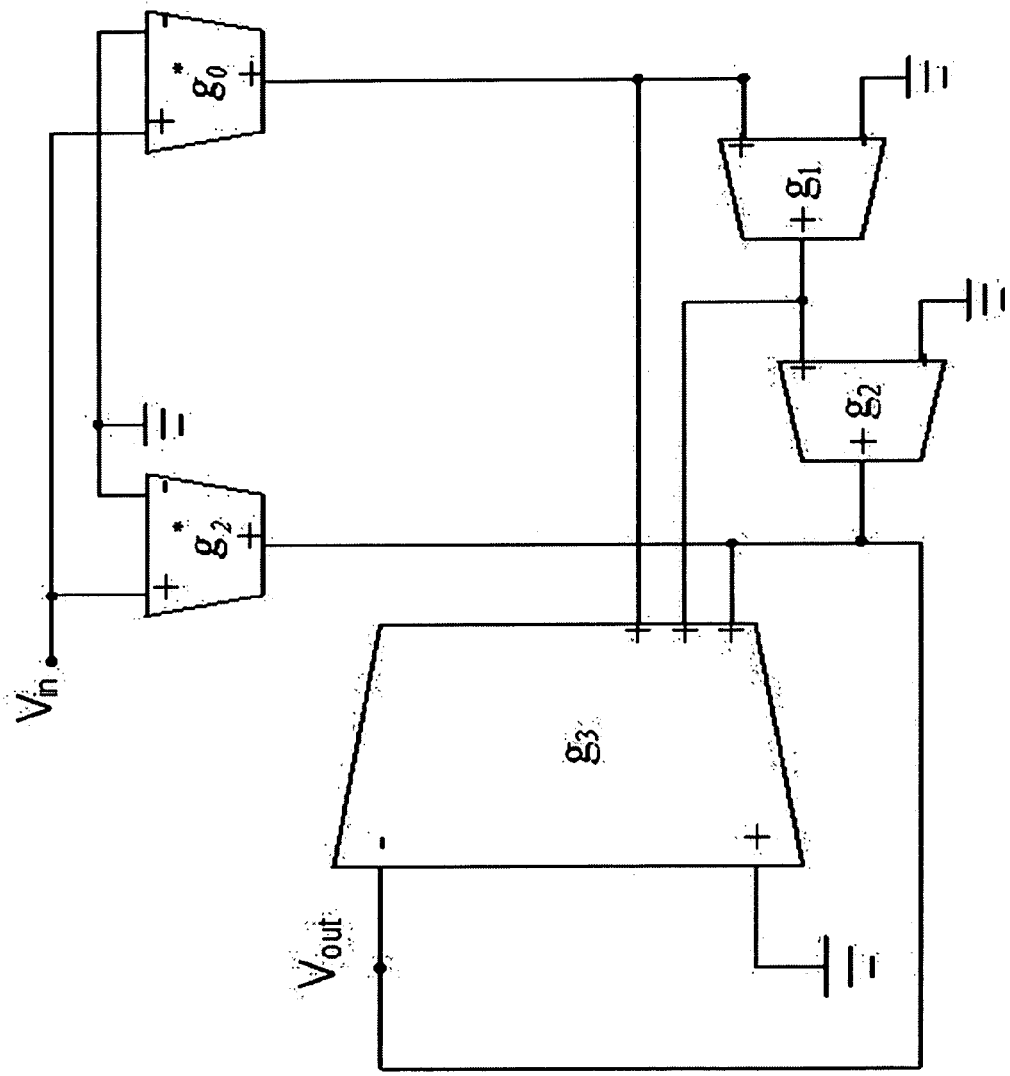
Figures 2C, 9:
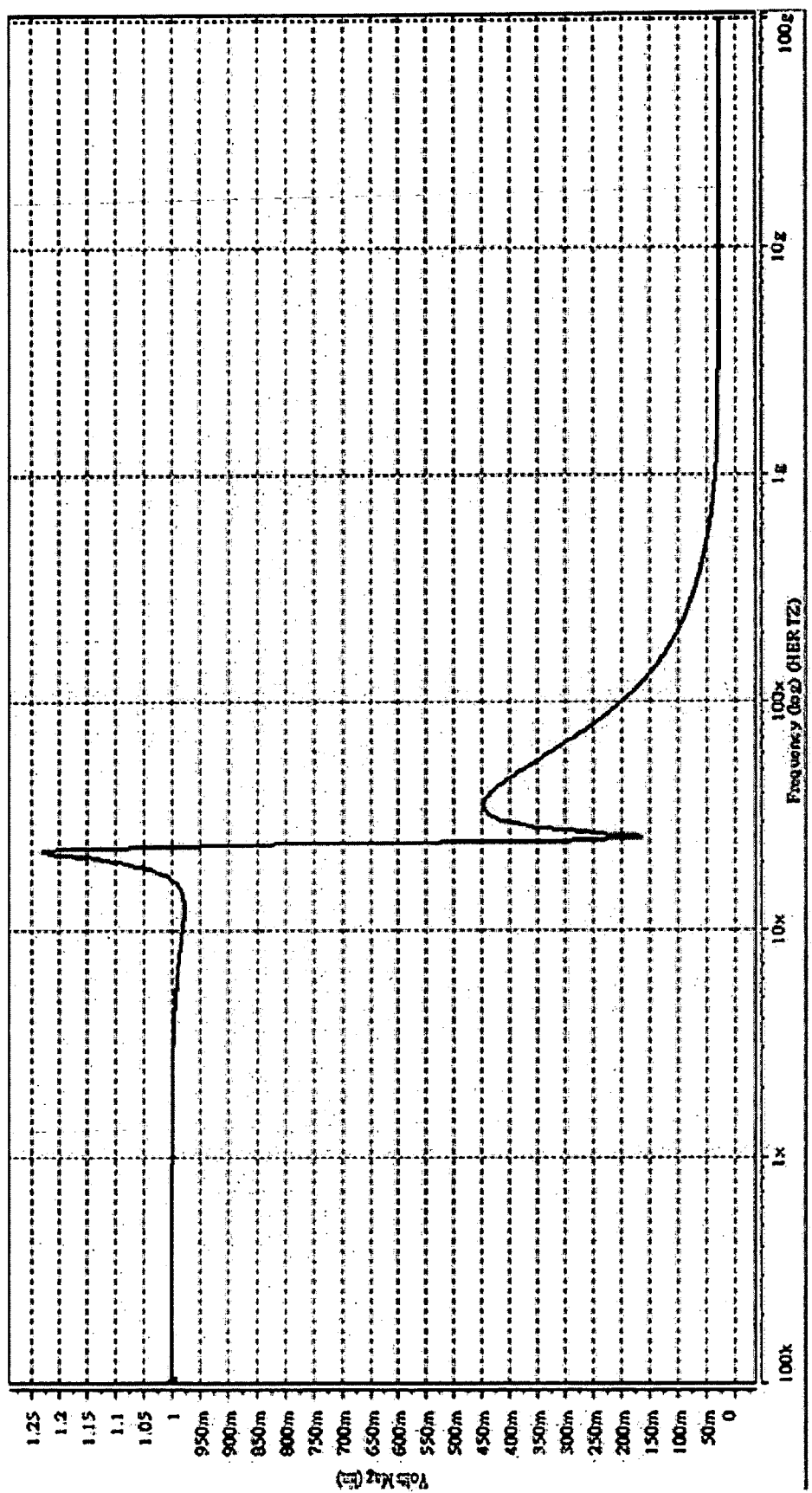
Figures 2D, 9:
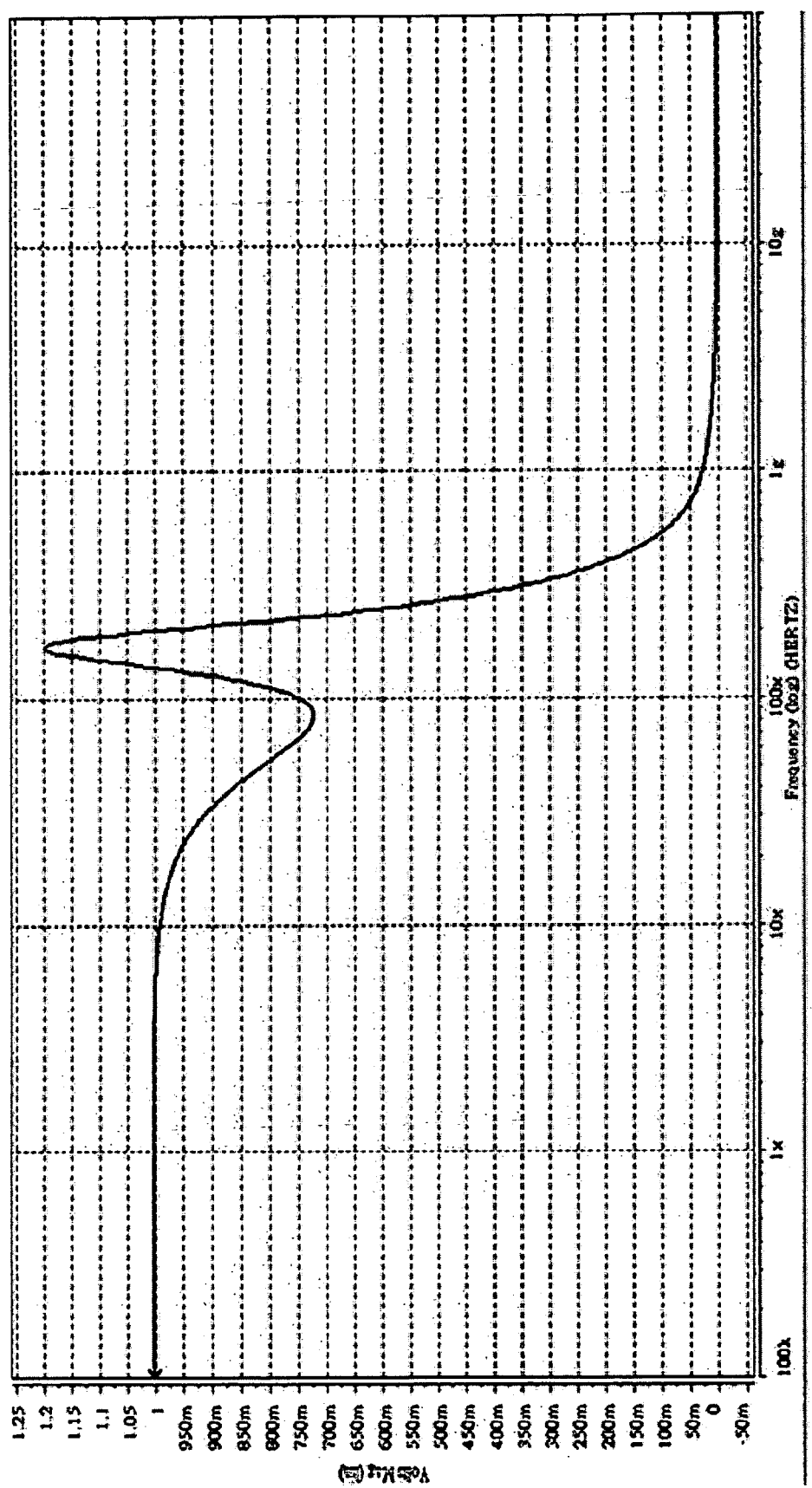

0.5 μm process H-spice simulations are used to validate the theoretical predictions as follows. We use the CMOS implementation of a transconductor [16] with ±2.5 V supply volt- 9.1 Voltage-Mode Odd-Nth-Order OTA-C Arbitrary or Elliptic Filter Structure The voltage-mode odd-nth-order OTA-C arbitrary filter structure which can realize all kind of analog circuits just without the highest order term in the numerator is shown in FIG. 9-1, where n is a positive odd integer. The filter has one input, $V_{in}$, and one output, $V_{out}$. The transfer function of the voltage-mode odd-nth-order OTA-C arbitrary filter structure shown in FIG. 9-1 is $$\frac{V_{out}}{V_{in}} = \frac{b_{n-1}s^{n-1} + b_{n-2}s^{n-2} + b_{n-3}s^{n-3} + \ldots +}{a_n s^n + a_{n-1}s^{n-1} + a_{n-2}s^{n-2} + a_{n-3}s^{n-3} + \ldots +} \quad (9\text{-}1)$$
$$\phantom{\frac{V_{out}}{V_{in}} =} \frac{b_2 s^2 + b_1 s + b_0}{a_2 s^2 + a_1 s + a_0}$$

An odd-nth-order elliptic filter has the following transfer function $$\frac{V_{out}}{V_{in}} = \frac{b_{n-1}s^{n-1} + b_{n-3}s^{n-3} + b_{n-5}s^{n-5} + \ldots +}{a_n s^n + a_{n-1}s^{n-1} + a_{n-2}s^{n-2} + a_{n-3}s^{n-3} + \ldots +} \quad (9\text{-}2)$$
$$\phantom{\frac{V_{out}}{V_{in}} =} \frac{b_4 s^4 + b_2 s^2 + b_0}{a_3 s^3 + a_2 s^2 + a_1 s + a_0}$$

where n is a positive odd integer. Referring to the above voltage-mode odd-nth-order arbitrary filter transfer function shown in Eq. (9-1), the odd-nth-order elliptic filter transfer function shown in Eq. (9-2) can be easily obtained from Eq. (9-1) by letting $b_{n-2}$, $b_{n-4}$, ..., $b_5$, $b_3$, $b_1$, be zero. In other words, we can realize the odd-nth-order elliptic filter structure from the voltage-mode odd-nth-order arbitrary filter structure shown in FIG. 9-1 by letting $b_{n-2}$, $b_{n-4}$, ..., $b_5$, $b_3$, $b_1$, be zero, which is shown in FIG. 9-1(a).

Letting n=3, the third-order OTA-C elliptic filter is shown in FIG. 9-1(b) with the following transfer function $$\frac{V_{out}}{V_{in}} = \frac{b_2 s^2 + b_0}{a_3 s^3 + a_2 s^2 + a_1 s + a_0} \quad (9\text{-}3)$$

Moreover, the synthesized voltage-mode odd-nth-order OTA-C arbitrary or elliptic filter structures have low sensitivity merit like that enjoyed by the synthesized current-mode odd-nth-order OTA-C arbitrary or elliptic filter structures presented in, Sections 7-1 and 8-1.

To verify the theoretical analysis of the third-order OTA-C elliptic filter structure shown in FIG. 9-1(b) with the following transfer function $$\frac{V_{out}}{V_{in}} = \frac{0.35225 s^2 + 0.5987}{s^3 + 0.84929 s^2 + 1.14586 s + 0.5987} \quad (9\text{-}4)$$

0.35 μm process H-spice simulations are used to validate the theoretical predictions as follows. We use the CMOS implementation of a transconductor [16] with ±1.65 V supply voltages and W/L=5μ/1μ and 10μ/1μ for NMOS and PMOS transistors, respectively. The component values are given by $C_1 = C_2 = C_3 = 12.07256$ pF, $g_1 = 42.024$ μS ($I_{abc} = 5.1$ μA), $g_2 = 121.428$ μS ($I_{abc} = 20.3$ μA), $g_3 = 76.436$ μS ($I_{abc} = 9.82$ μA), $g^*_2 = 31.703$ μS ($I_{abc} = 3.15$ μA), $g^*_0 = 76.436$ μS ($I_{abc} = 9.82$ μA) (for the element notation, please refer to FIG. 9-2(b)). FIG. 9-1© shows the amplitude-frequency response of the voltage-mode third-order OTA-C elliptic filter shown in FIG. 9-1(b). As it can be seen, there is a close agreement between theory and simulation.

9.2 Voltage-Mode Odd-Nth-Order OTA-Only-Without-C Arbitrary or Elliptic Filter Structure Note that the voltage-mode odd-nth-order OTA-C arbitrary and elliptic filter structures shown in FIGS. 9-1 and 9-1(a) achieve the Three Criteria for the design of filters. Especially, two requirements, (i) only n internal nodes in the filter structure, and (ii) one grounded capacitor at each internal node and no extra capacitors used in the synthesized filter structure, are part of the criteria The main goal of the present invention, to form a high-frequency (about 5 MHz to 5 GHz) circuit when removing all of the capacitors from the synthesized OTA-C filter structure. The collateral OTA-only-without-C filter structure is shown in FIGS. 9-2 and 9-2(a). FIG. 9-2(b) is the third-order case of FIG. 9-2(a).

0.35 μm process H-spice simulations are used to validate the theoretical predictions as follows. We use the CMOS implementation of a transconductor [16] with ±1.65 V supply voltages and W/L=5μ/1μ and 10μ/1μ for NMOS and PMOS transistors, respectively. The component values are (i) $g_1 = 34.82$ μS ($I_{abc} = 50$ μA), $g_2 = 34.82$ μS ($I_{abc} = 150$ μA), $g_3 = 35.2$ μS ($I_{abc} = 149$ μA), $g^*_2 = 25.51$ μS ($I_{abc} = 185$ μA), $g^*_0 = 34.82$ μS ($I_{abc} = 150$ μA)), and (ii) $g_1 = 106.8$ μS ($I_{abc} = 70$ μA), $g_2 = 51.88$ μS ($I_{abc} = 101.5$ μA), $g_3 = 51.59$ μS ($I_{abc} = 101.8$ μA), $g^*_2 = 73.57$ μS ($I_{abc} = 86$ μA), $g^*_0 = 13.41$ μS ($I_{abc} = 10$ μA). FIGS. 9-2(c) and (d) show the amplitude-frequency responses of the above two sets of component values with $f_o = 23.4$ MHz and 200 MHz, respectively, of the voltage-mode third-order OTA-only-without-C elliptic filter shown in FIG. 9-2(b).

10.1 Voltage-Mode Even-Nth-Order OTA-C Arbitrary or Elliptic Filter Structure

Figures 1, 10:
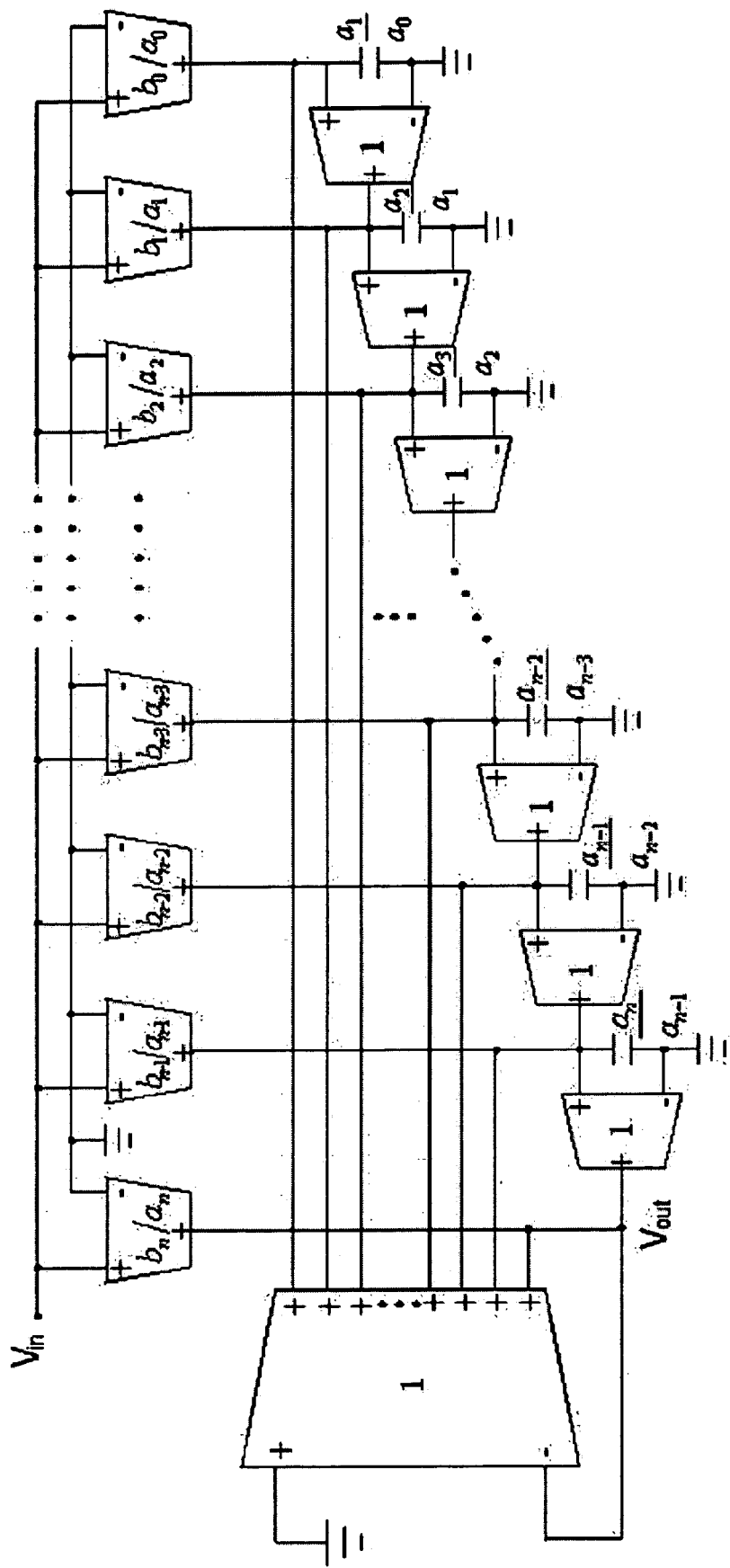
Figures 1A, 10:
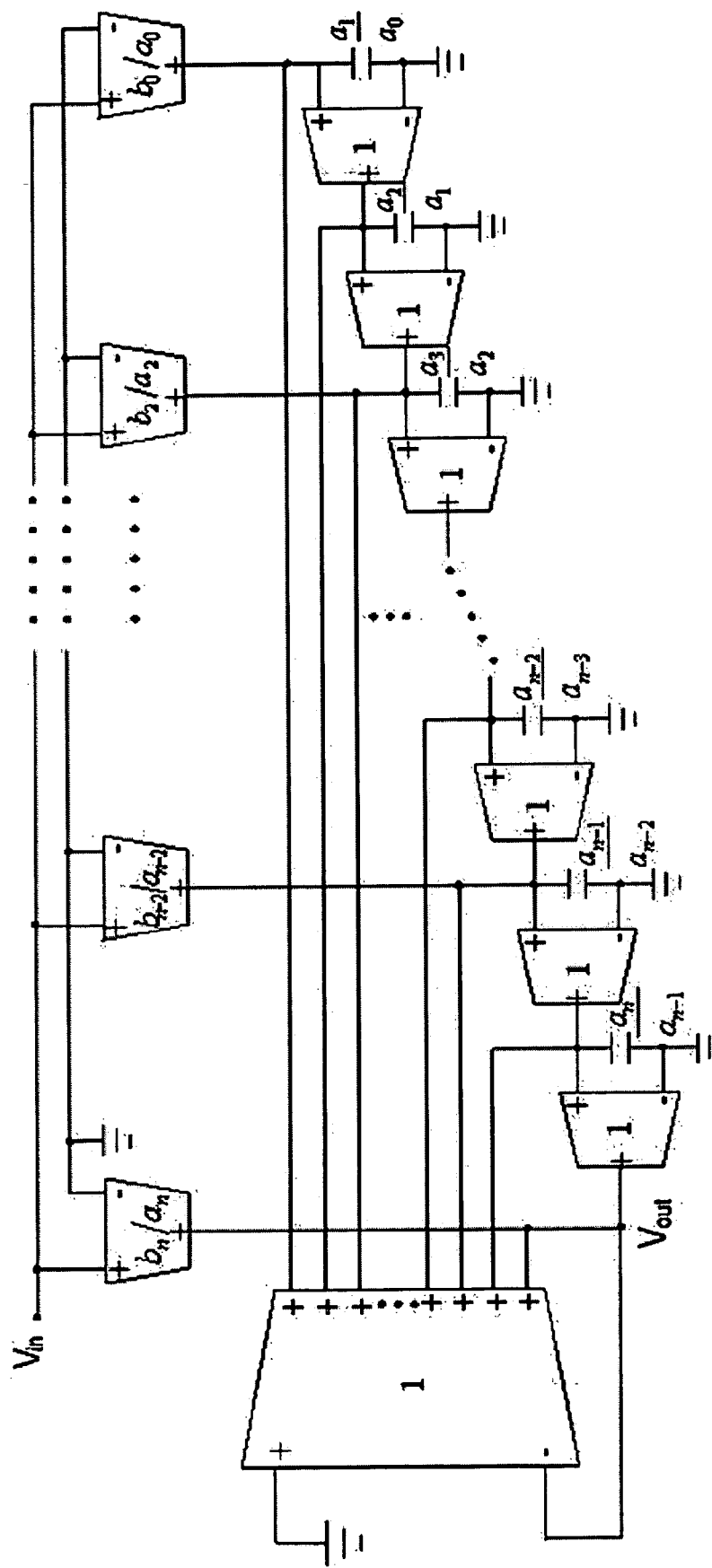
Figures 1B, 10:
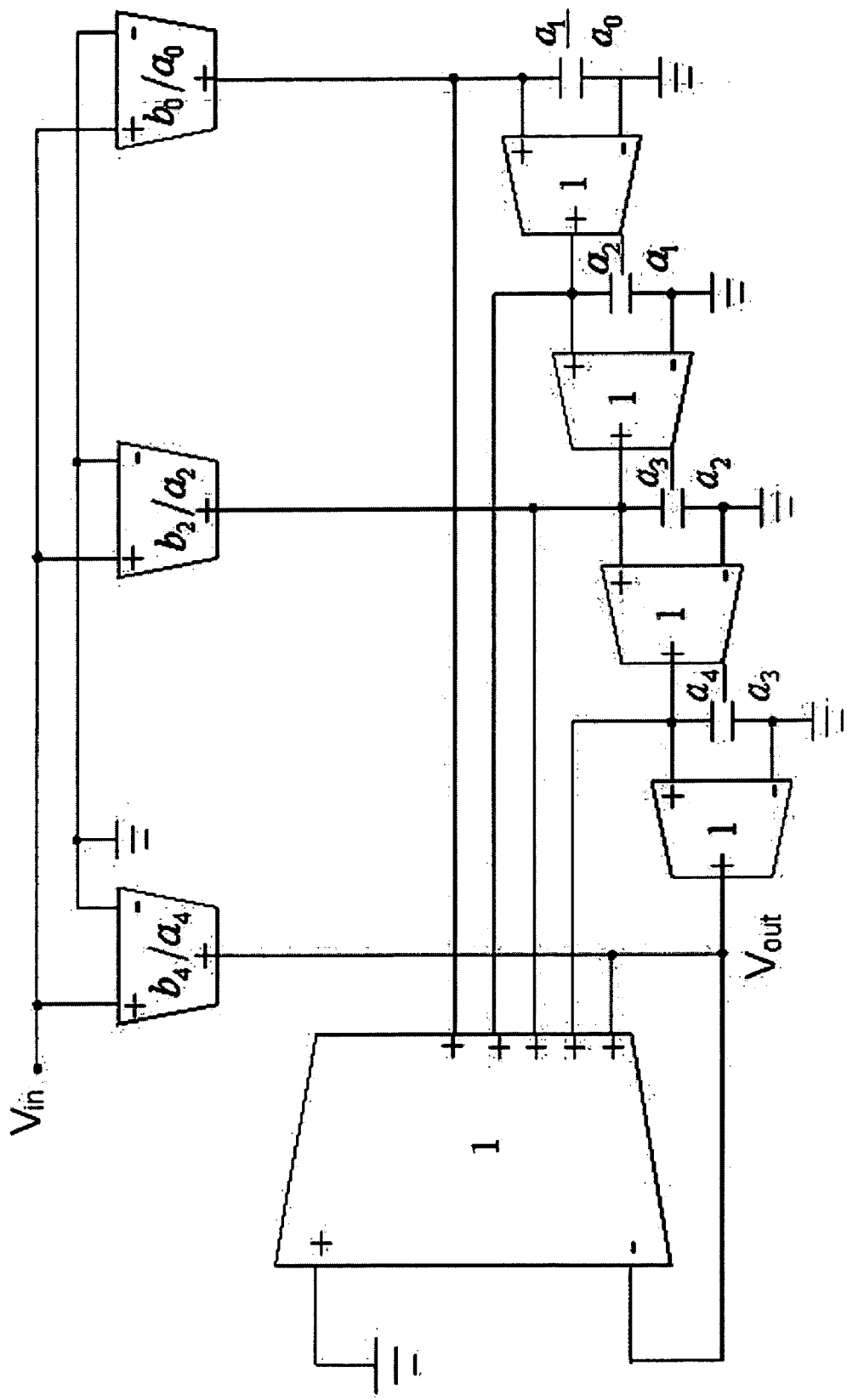
Figures 1C, 10:
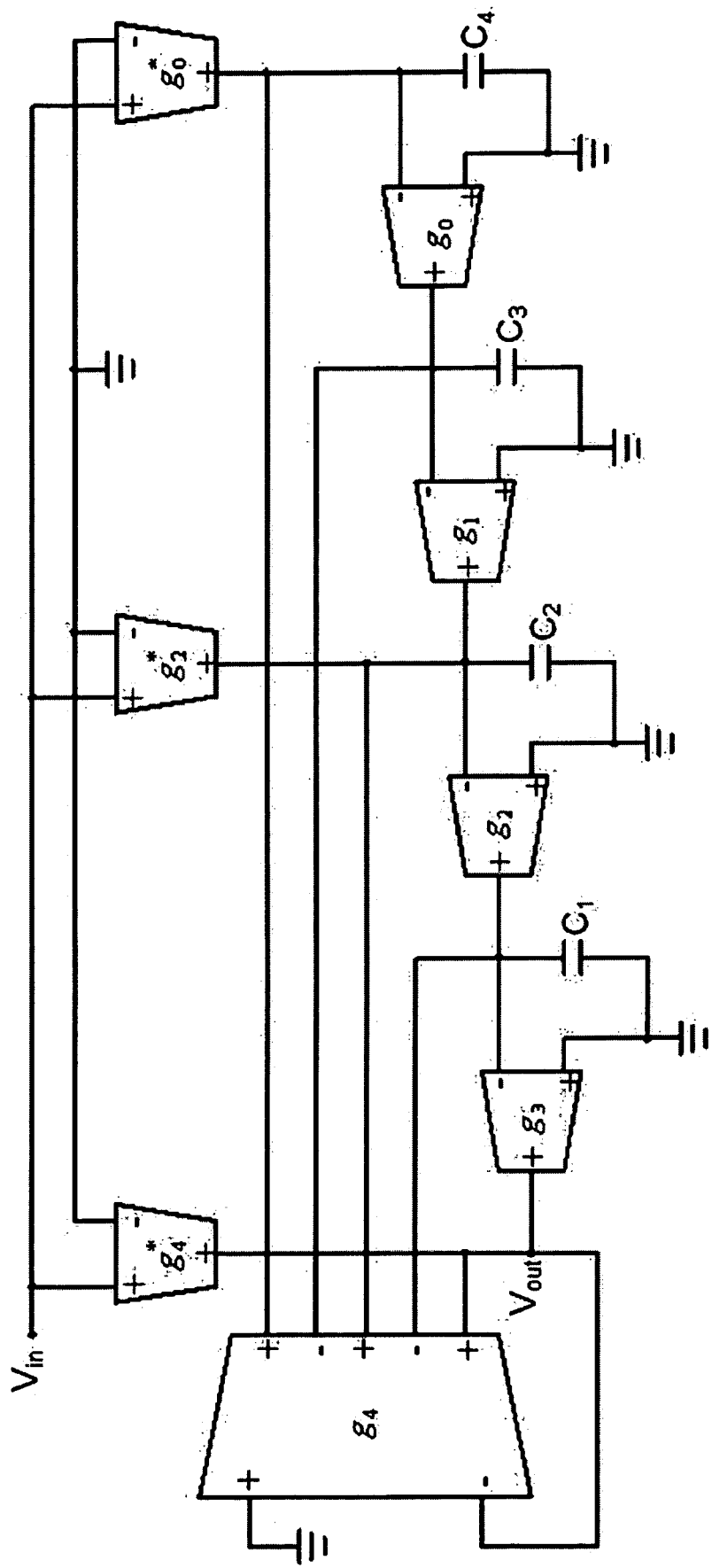
Figures 1D, 10:
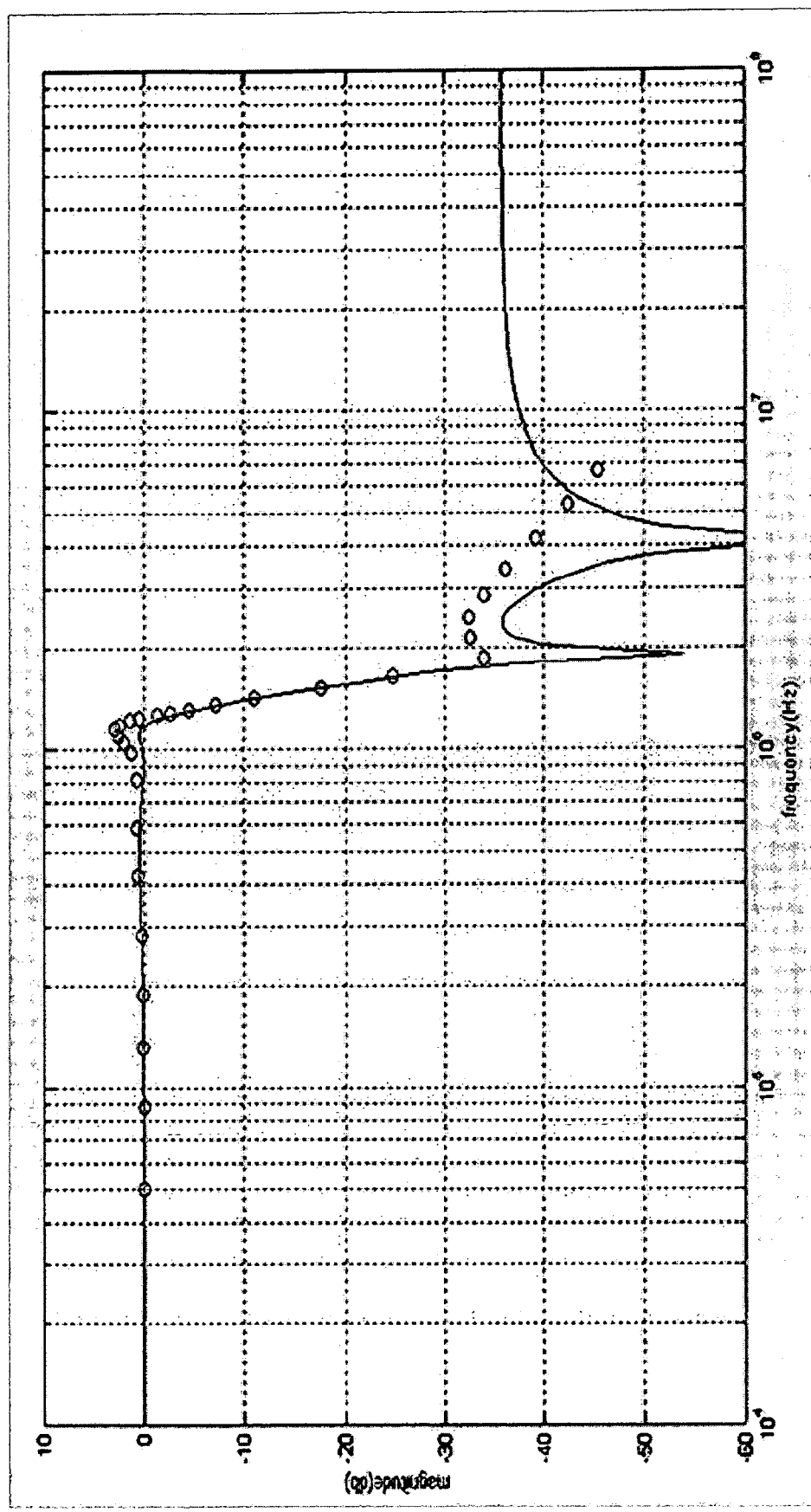
Figures 2, 10:
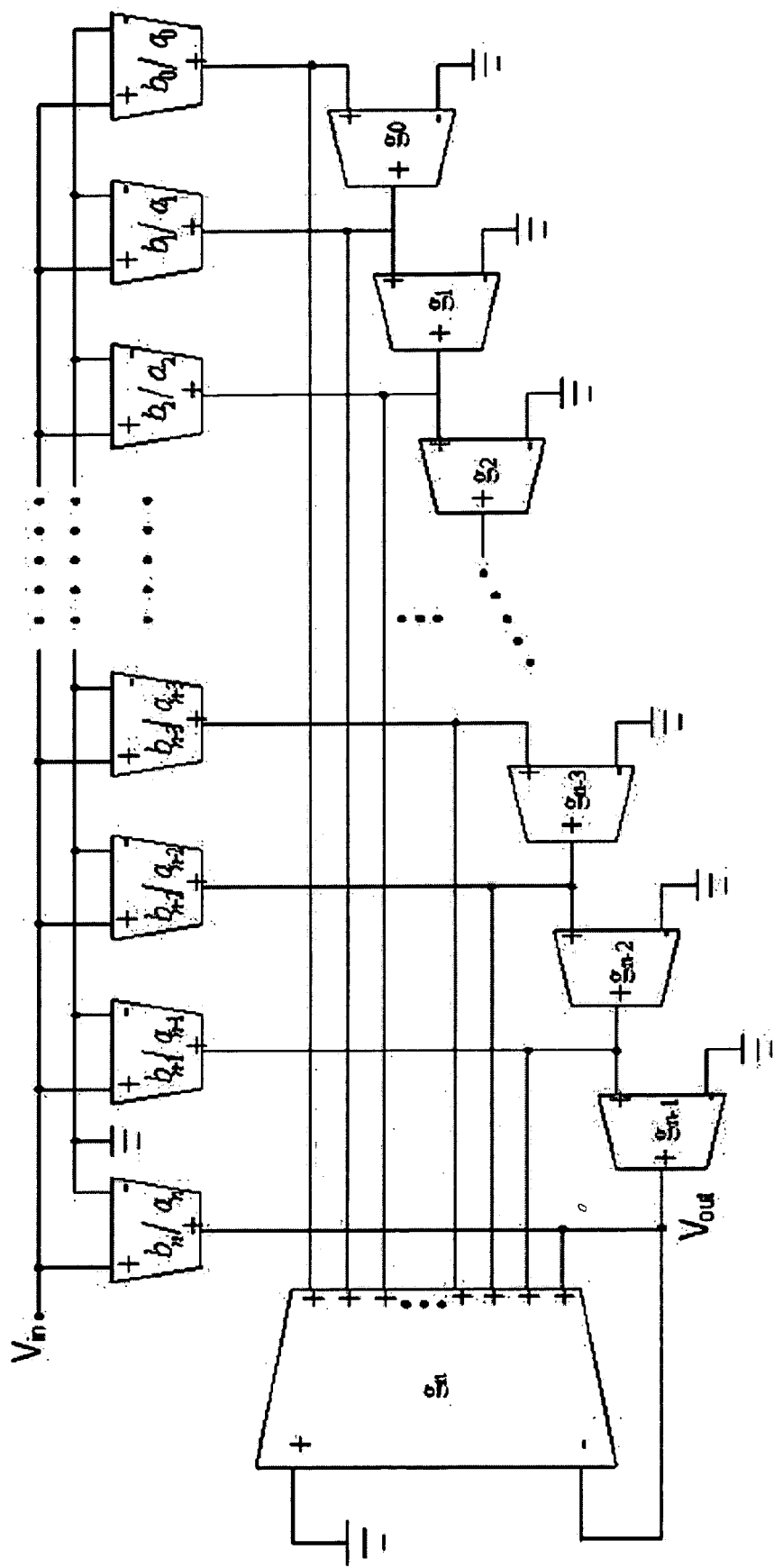
Figures 2A, 10:
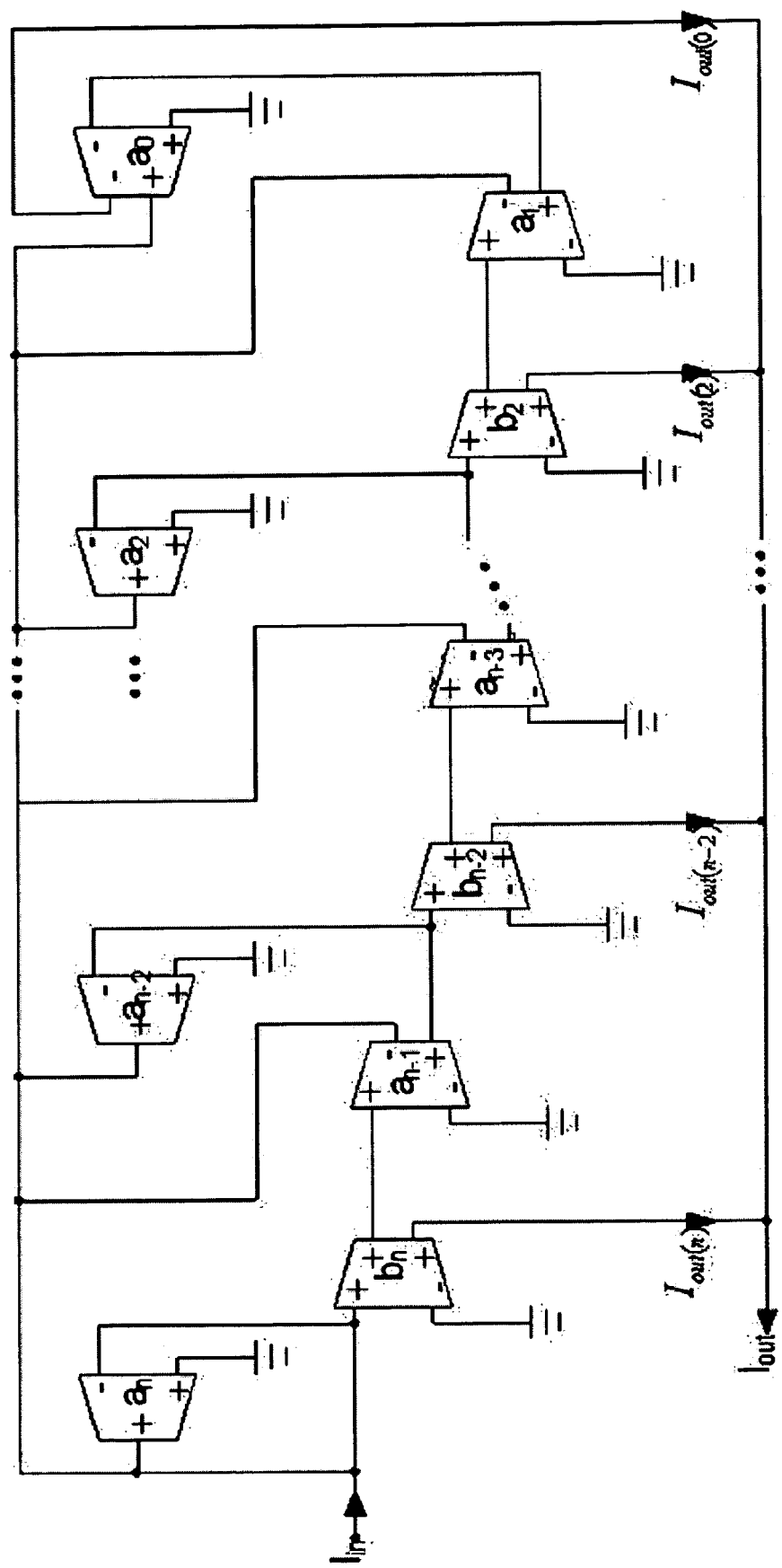
Figures 2B, 10:
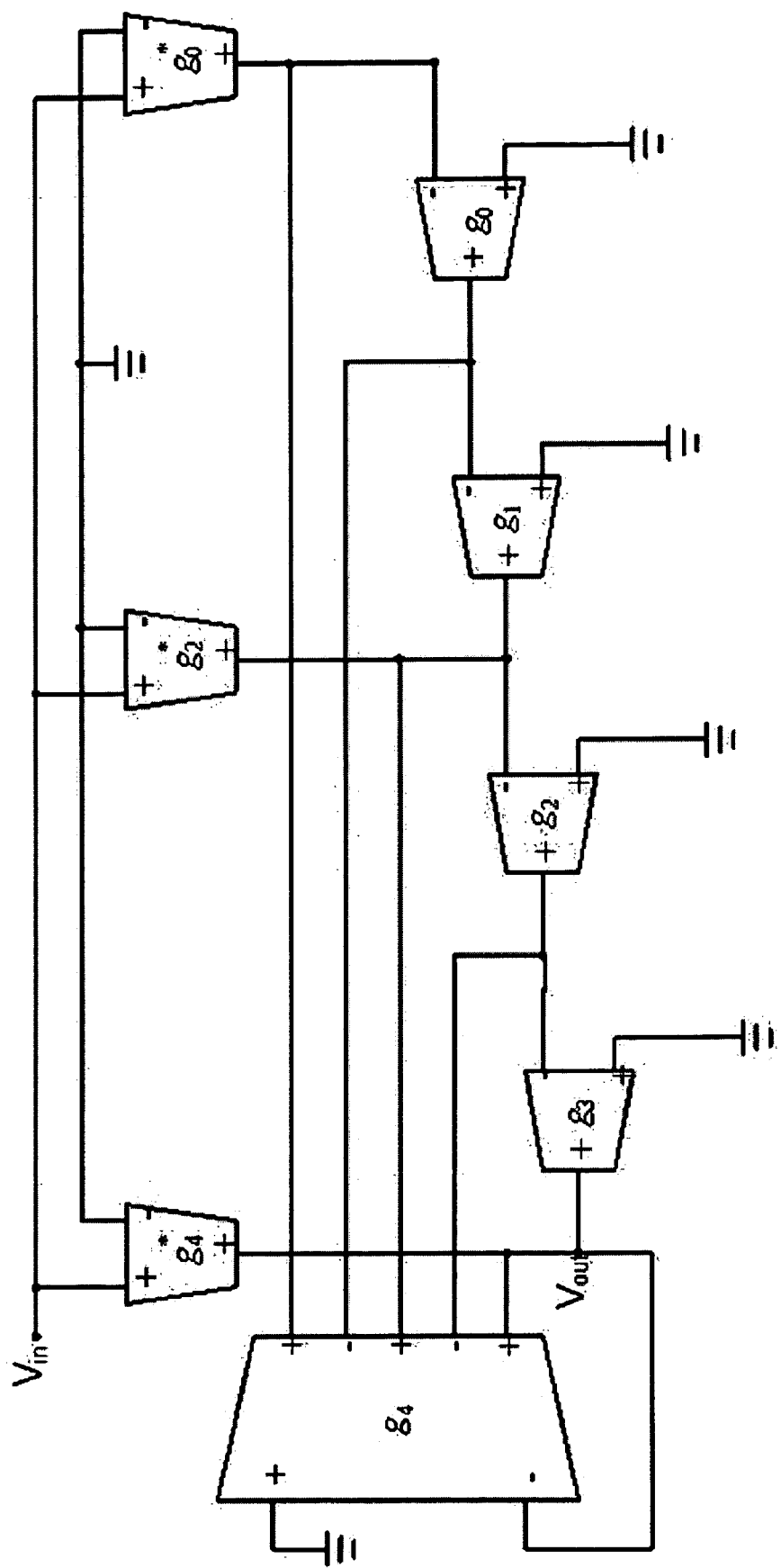
Figures 2C, 10:
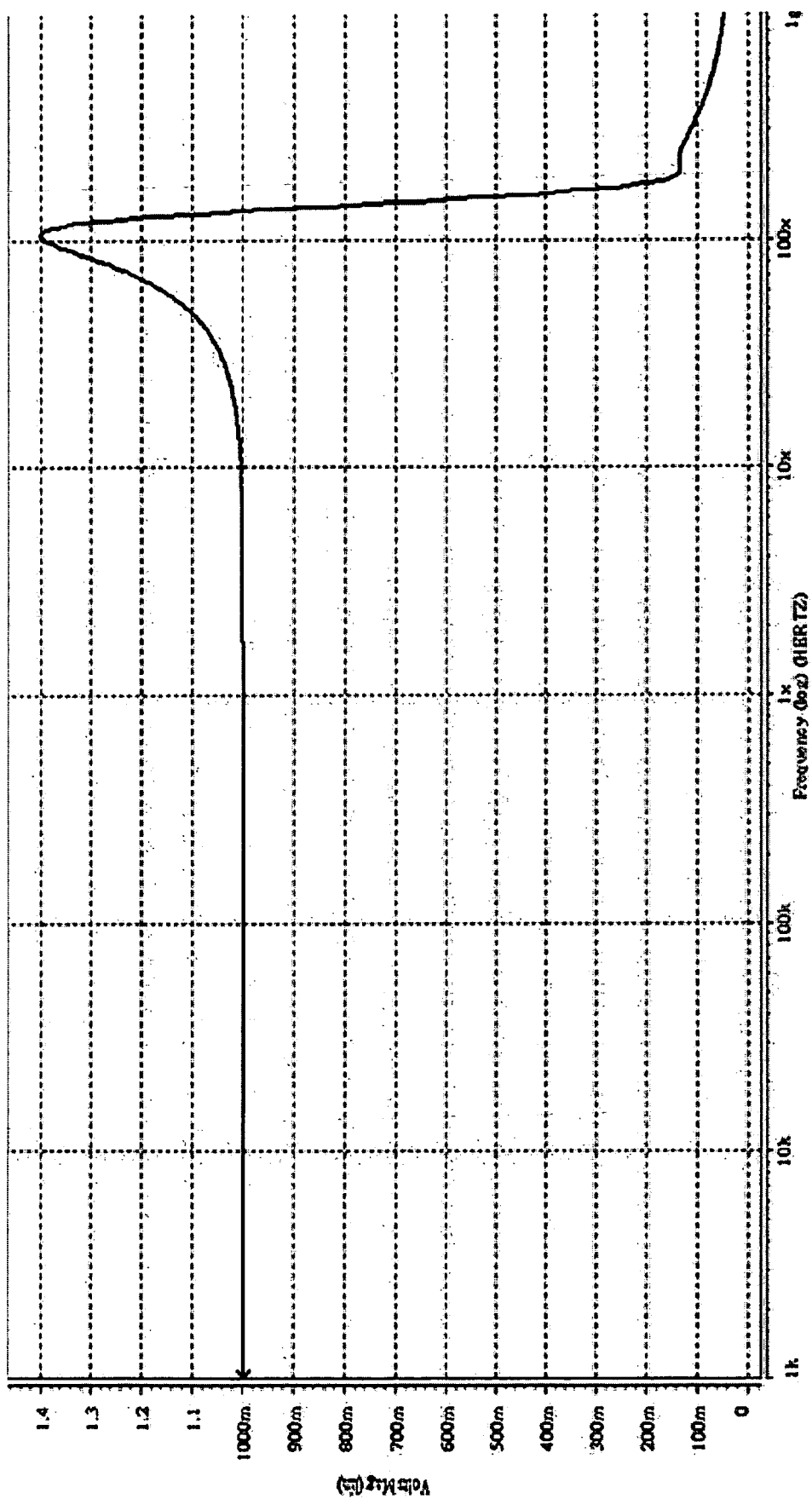
Figures 2D, 10:
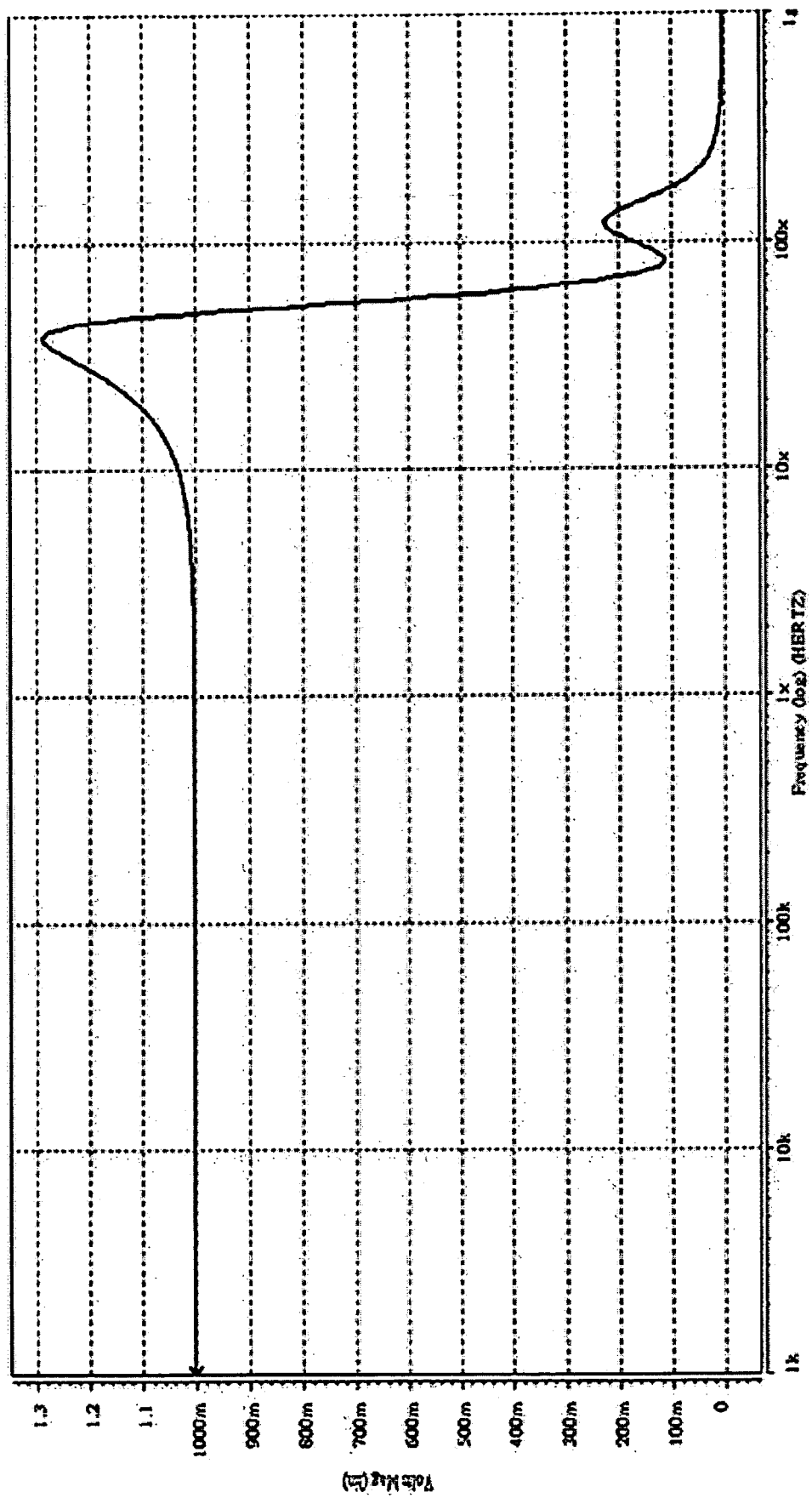

The voltage-mode even-nth-order OTA-C arbitrary filter structure which can realize all kind of analog circuits is shown in FIG. 10-1. The filter has one input, $V_{in}$, and one output, $V_{out}$. The transfer function of the voltage-mode even-nth-order OTA-C arbitrary filter structure shown in FIG. 10-1 is $$\frac{V_{out}}{V_{in}} = \frac{\begin{array}{c} b_n s^n + b_{n-1}s^{n-1} + b_{n-2}s^{n-2} + \\ b_{n-3}s^{n-3} + \ldots + b_2 s^2 + b_1 s + b_0 \end{array}}{\begin{array}{c} a_n s^n + a_{n-1}s^{n-1} + a_{n-2}s^{n-2} + \\ a_{n-3}s^{n-3} + \ldots + a_2 s^2 + a_1 s + a_0 \end{array}} \quad (10\text{-}1)$$

A voltage-mode even-nth-order elliptic filter has the following transfer function $$\frac{V_{out}}{V_{in}} = \frac{\begin{array}{c} b_n s^n + b_{n-2}s^{n-2} + b_{n-4}s^{n-4} + b_{n-6}s^{n-6} + \ldots + \\ b_4 s^4 + b_2 s^2 + b_0 \end{array}}{\begin{array}{c} a_n s^n + a_{n-1}s^{n-1} + a_{n-2}s^{n-2} + \\ a_{n-3}s^{n-3} + \ldots + a_3 s^3 + a_2 s^2 + a_1 s + a_0 \end{array}} \quad (10\text{-}2)$$

where n is a positive even integer. Referring to the above even-nth-order arbitrary filter transfer function shown in Eq. (10-1), the even-nth-order elliptic filter transfer function shown in Eq. (10.2) can be easily obtained from Eq. (10-1) by letting $b_{n-1}$, $b_{n-3}$, ..., $b_5$, $b_3$, $b_1$ be zero. In other words, we can realize the even-nth-order elliptic filter from the even-nth-order arbitrary filter structure shown in FIG. 10-1 by letting $b_{n-1}$, $b_{3n-3}$, ..., $b_5$, $b_3$, $b_1$ be zero, which is shown in FIG. 10-1(a).

Letting n=4, the fourth-order OTA-C elliptic filter is shown in FIG. 10-1(b) with the following transfer function $$\frac{V_{out}}{V_{in}} = \frac{b_4 s^4 + b_2 s^2 + b_0}{a_4 s^4 + a_3 s^3 + a_2 s^2 + a_1 s + a_0} \quad (10\text{-}3)$$

Moreover, the synthesized voltage-mode even-nth-order OTA-C arbitrary or elliptic filter structures have low sensitivity merit like that enjoyed by the synthesized current-mode even-nth-order OTA-C arbitrary or elliptic filter structures presented in Sections 11-1 and 12-1.

Figures 1, 1C:
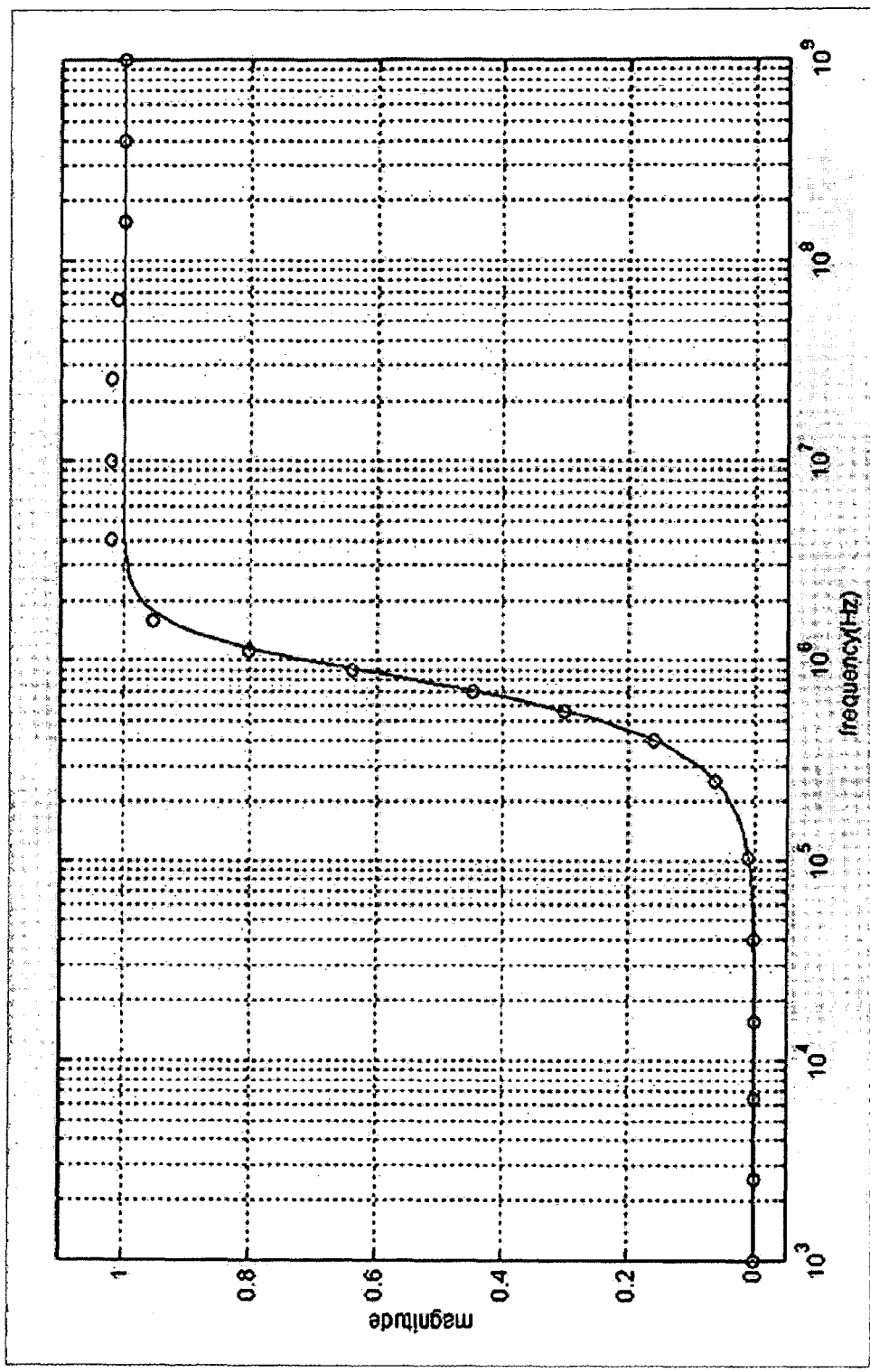
Figures 1, 11:
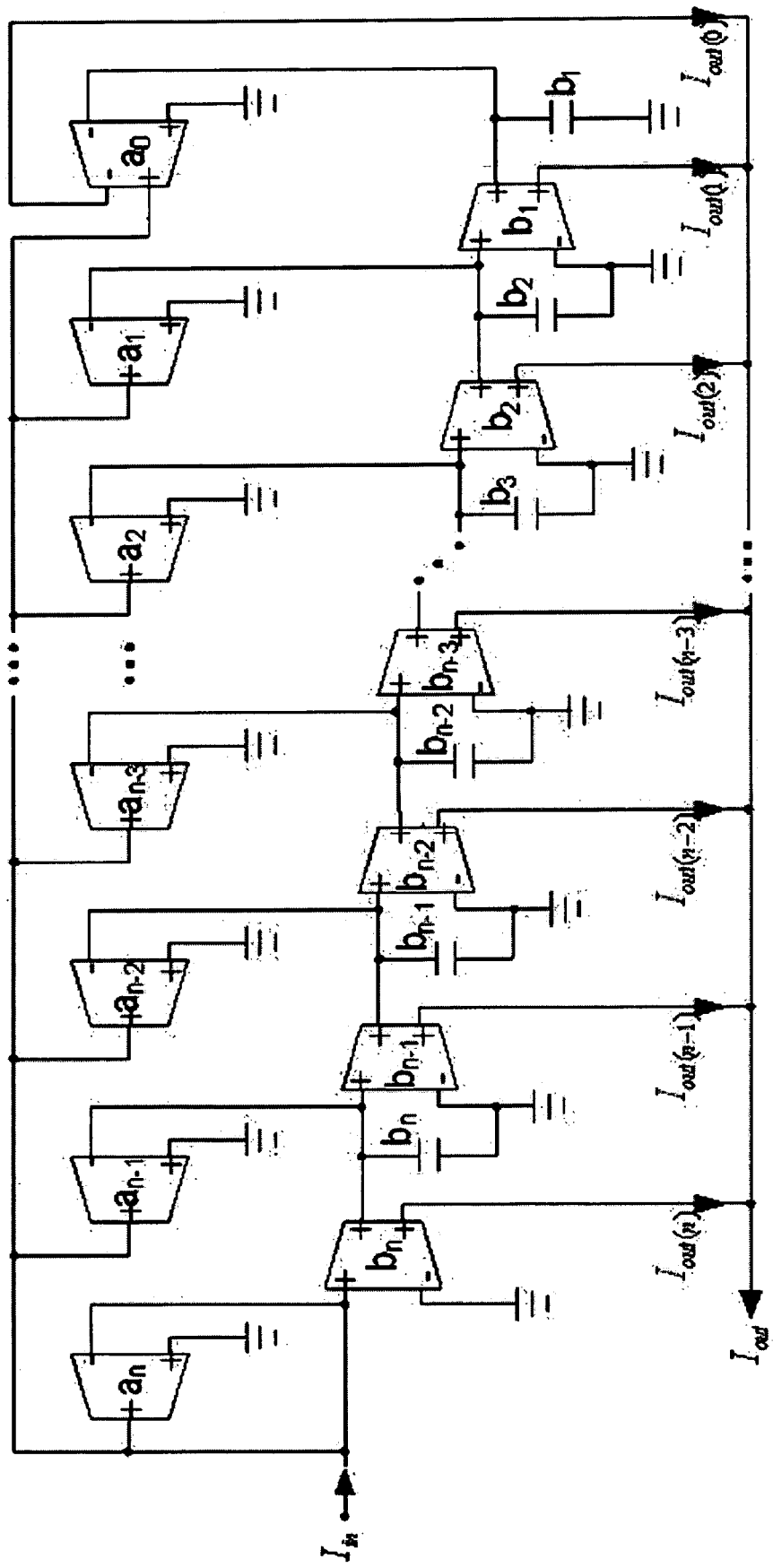
Figures 1A, 11:
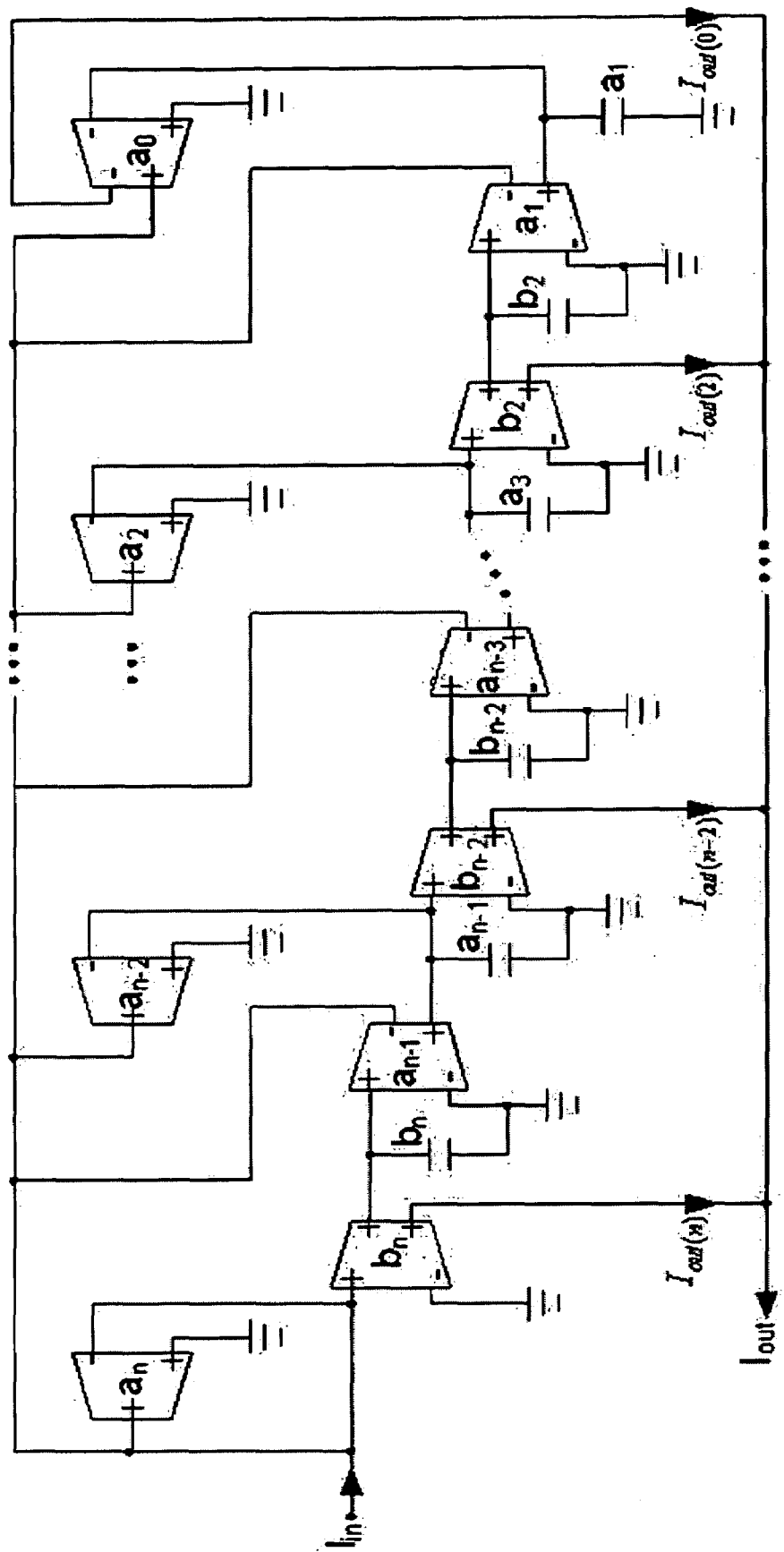
Figures 1B, 11:
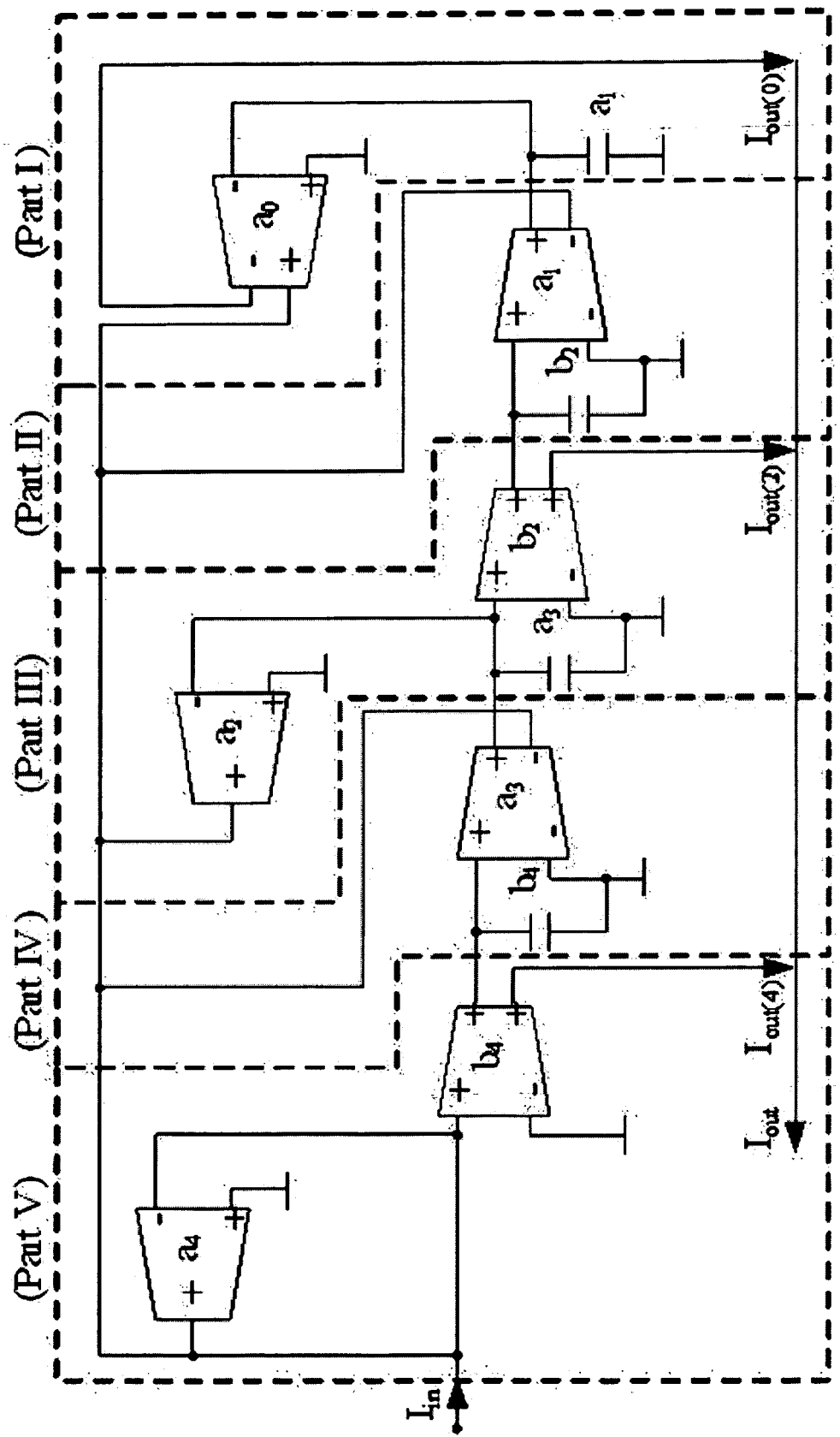
Figures 1C, 11:
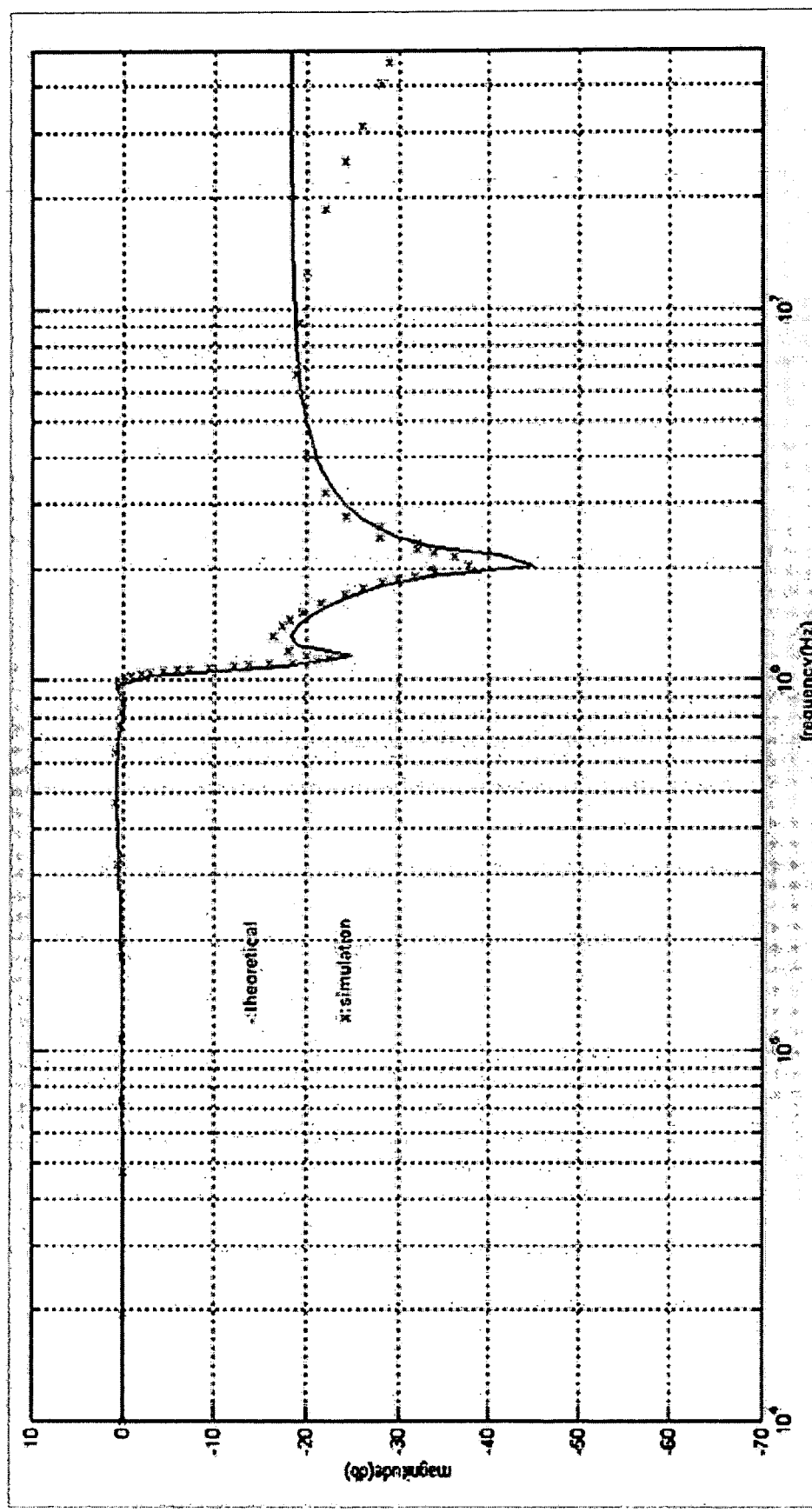
Figures 1D, 11:
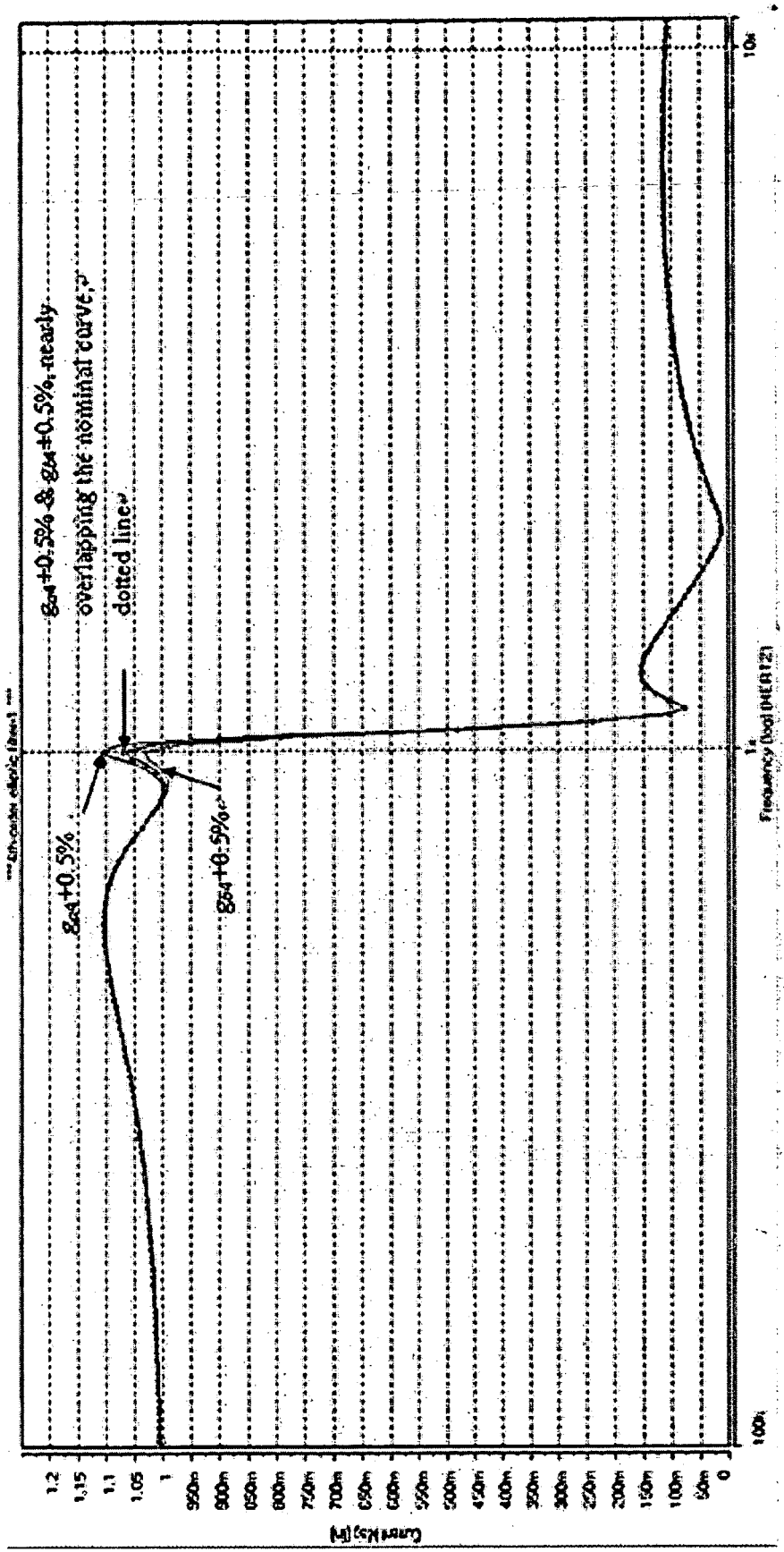
Figures 2, 11:
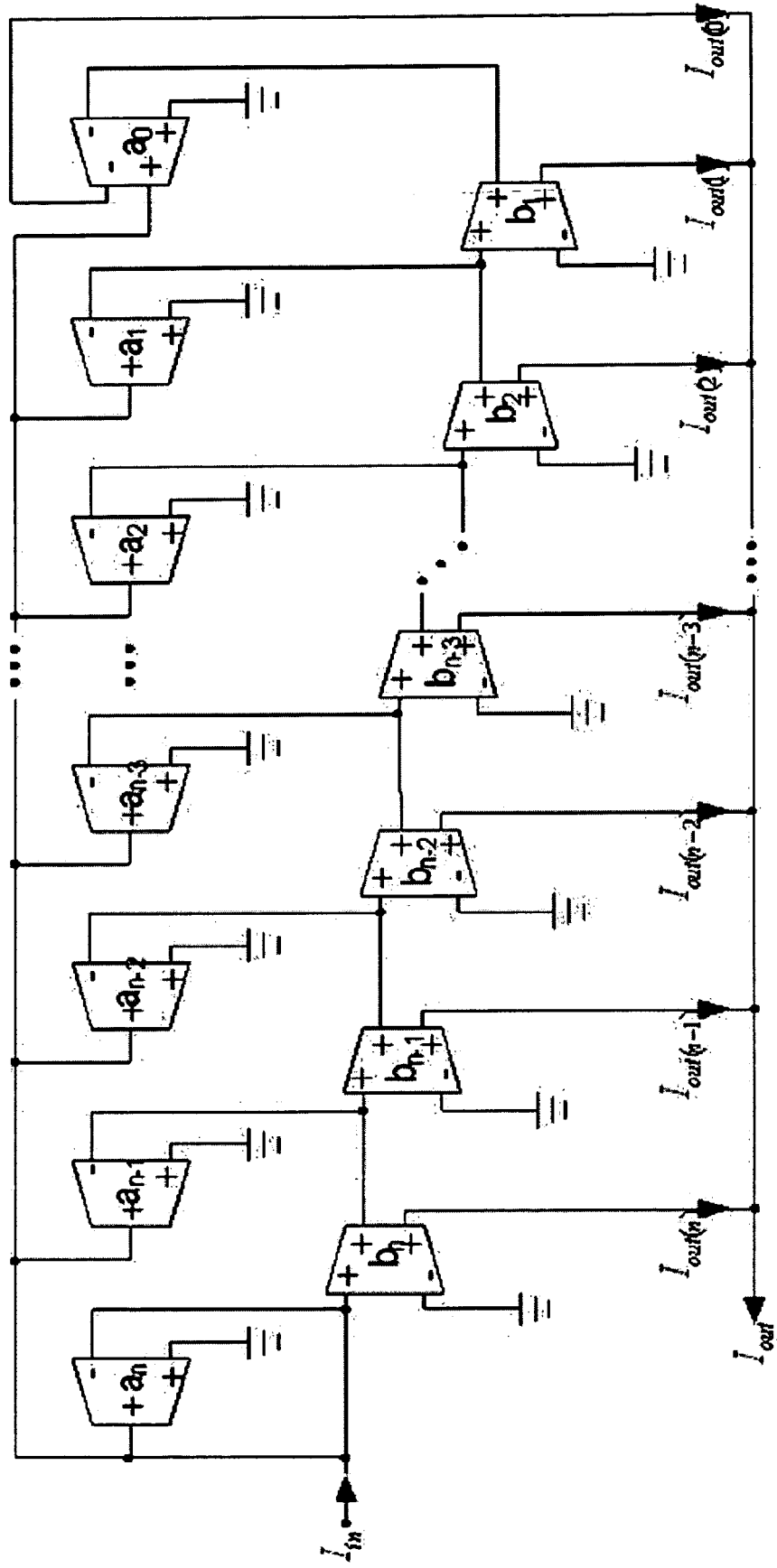
Figures 2A, 11:
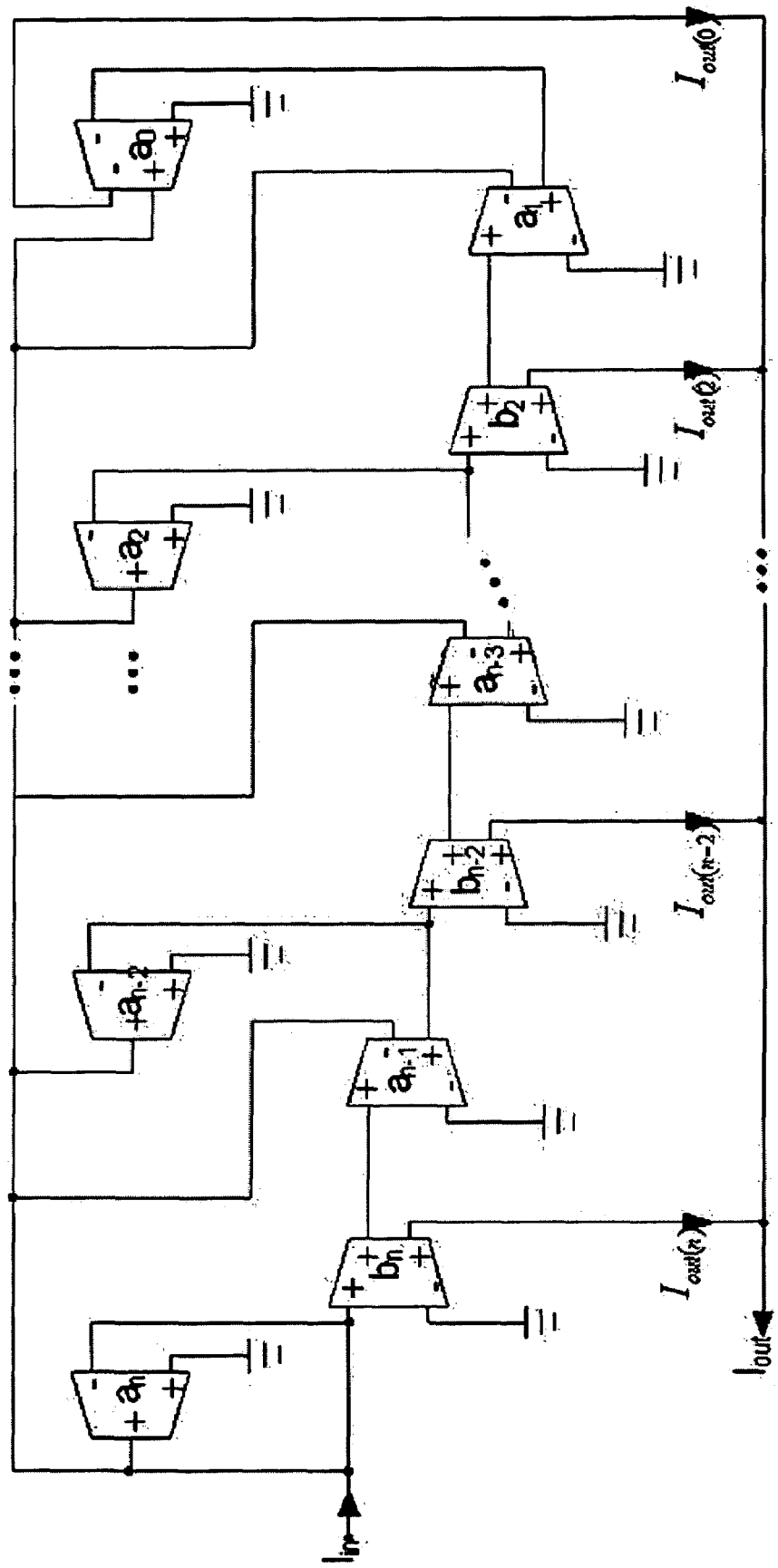
Figures 2B, 11:
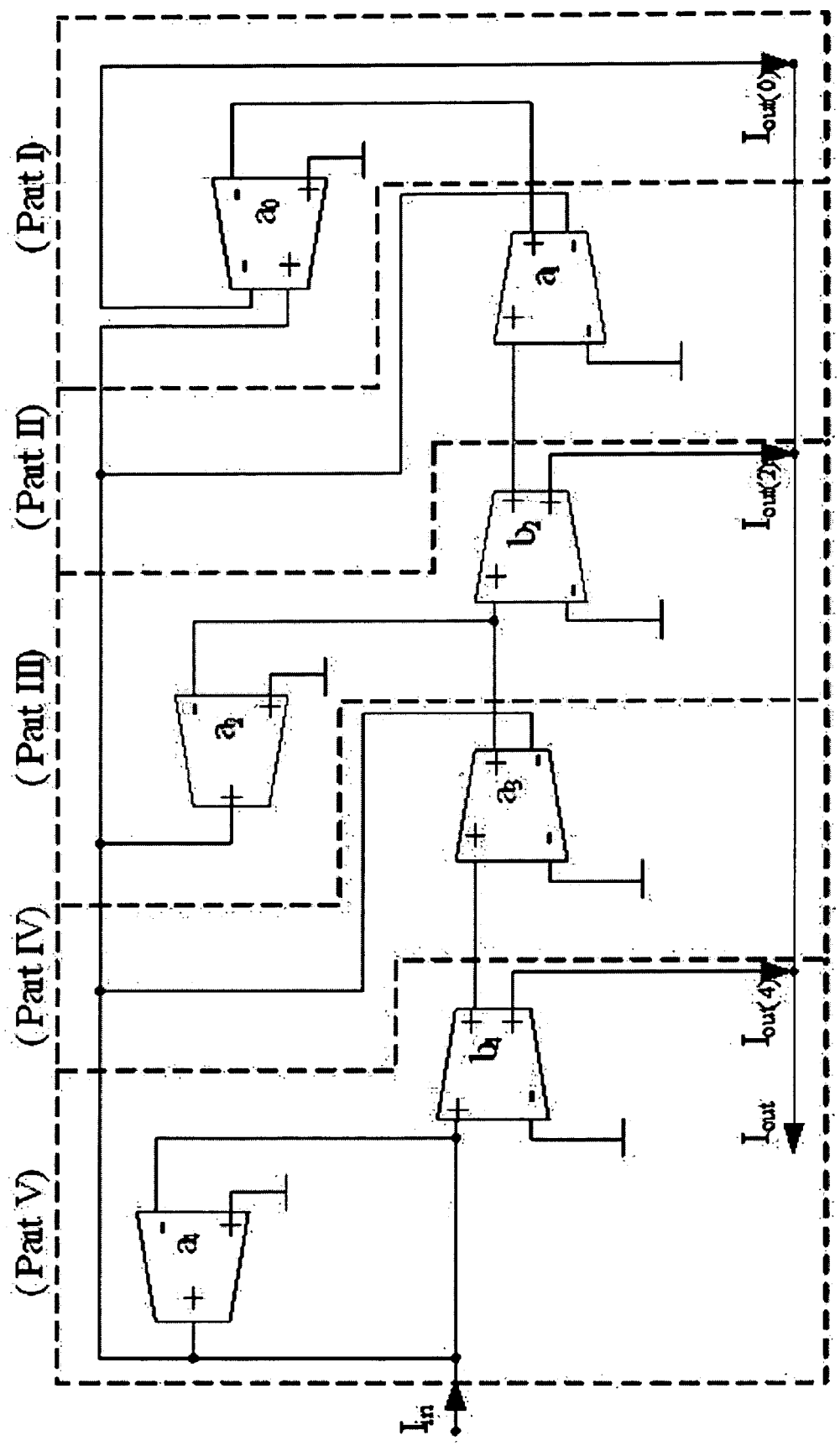
Figures 2C, 11:
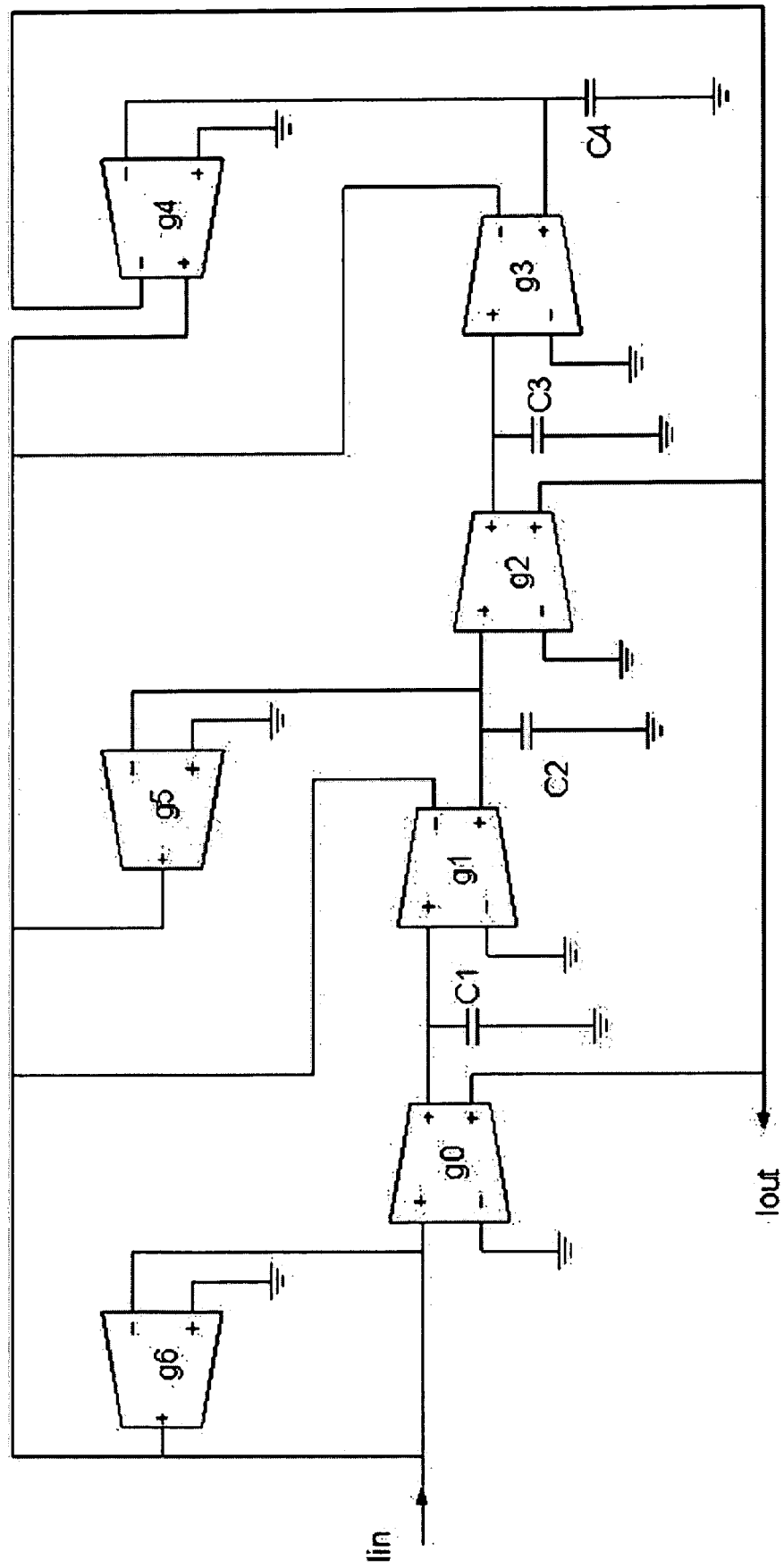
Figures 2D, 11:
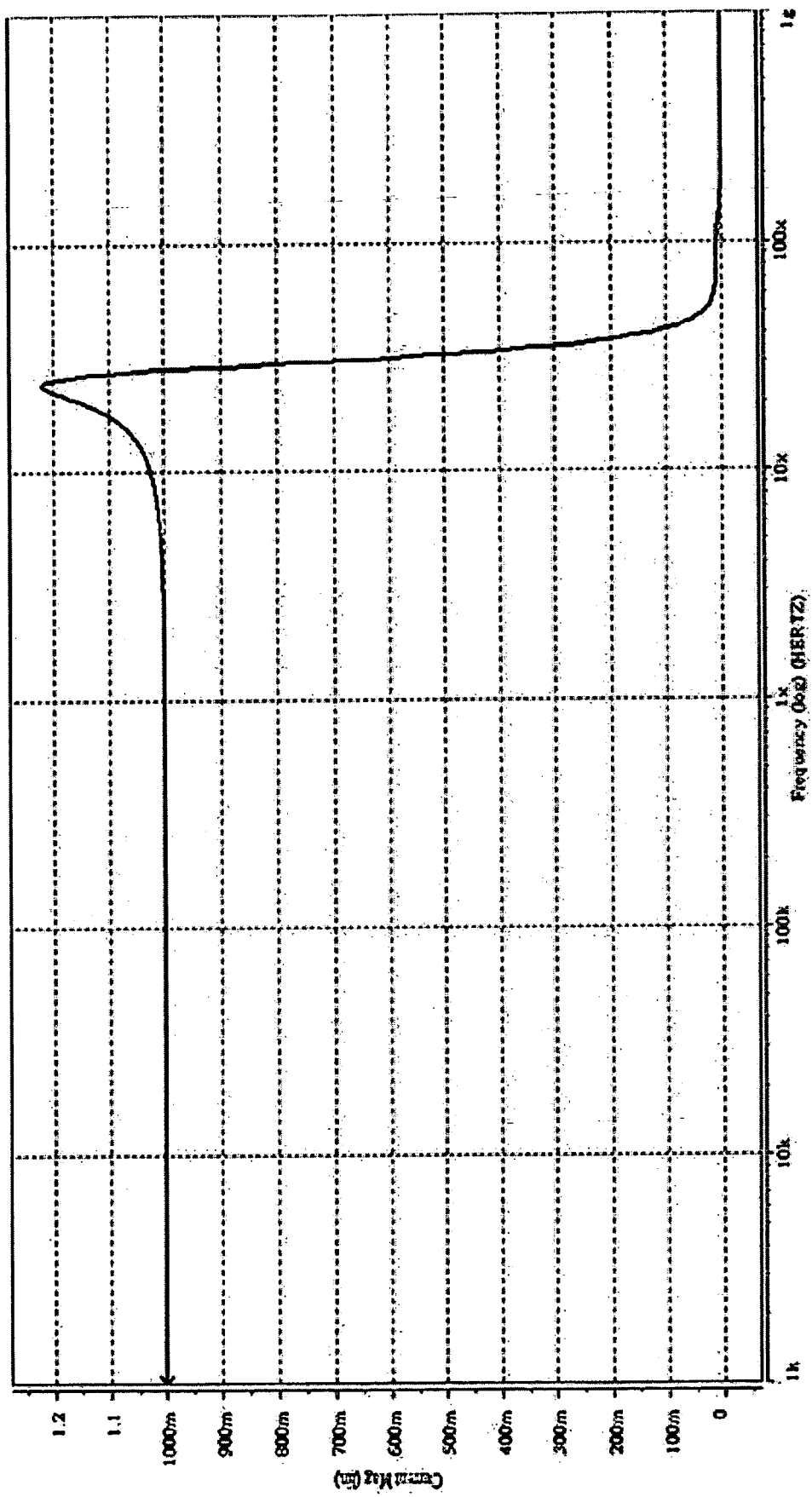
Figures 2E, 11:
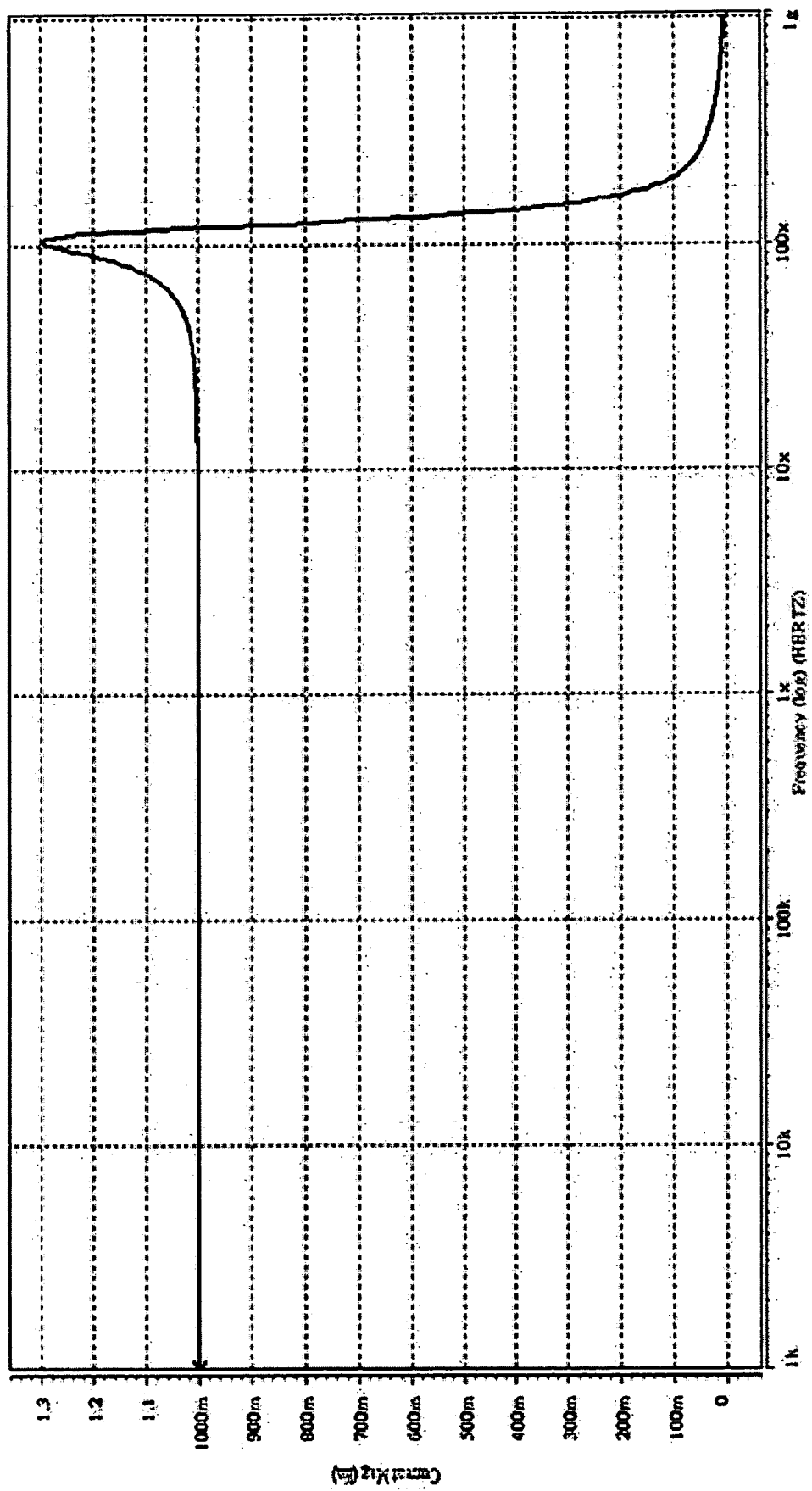

To verify the theoretical analysis of the fourth-order OTA-C elliptic filter structure shown in FIG. 11-1(c) with the following transfer function $$\frac{V_{out}}{V_{in}} = \frac{0.015397 s^4 + 0.225332939 s^2 + 0.472355409}{s^4 + 1.17497 s^3 + 1.76683575 s^2 + 1.09591318 s + 0.500347405} \quad (10\text{-}4)$$

Figures 1, 1D:
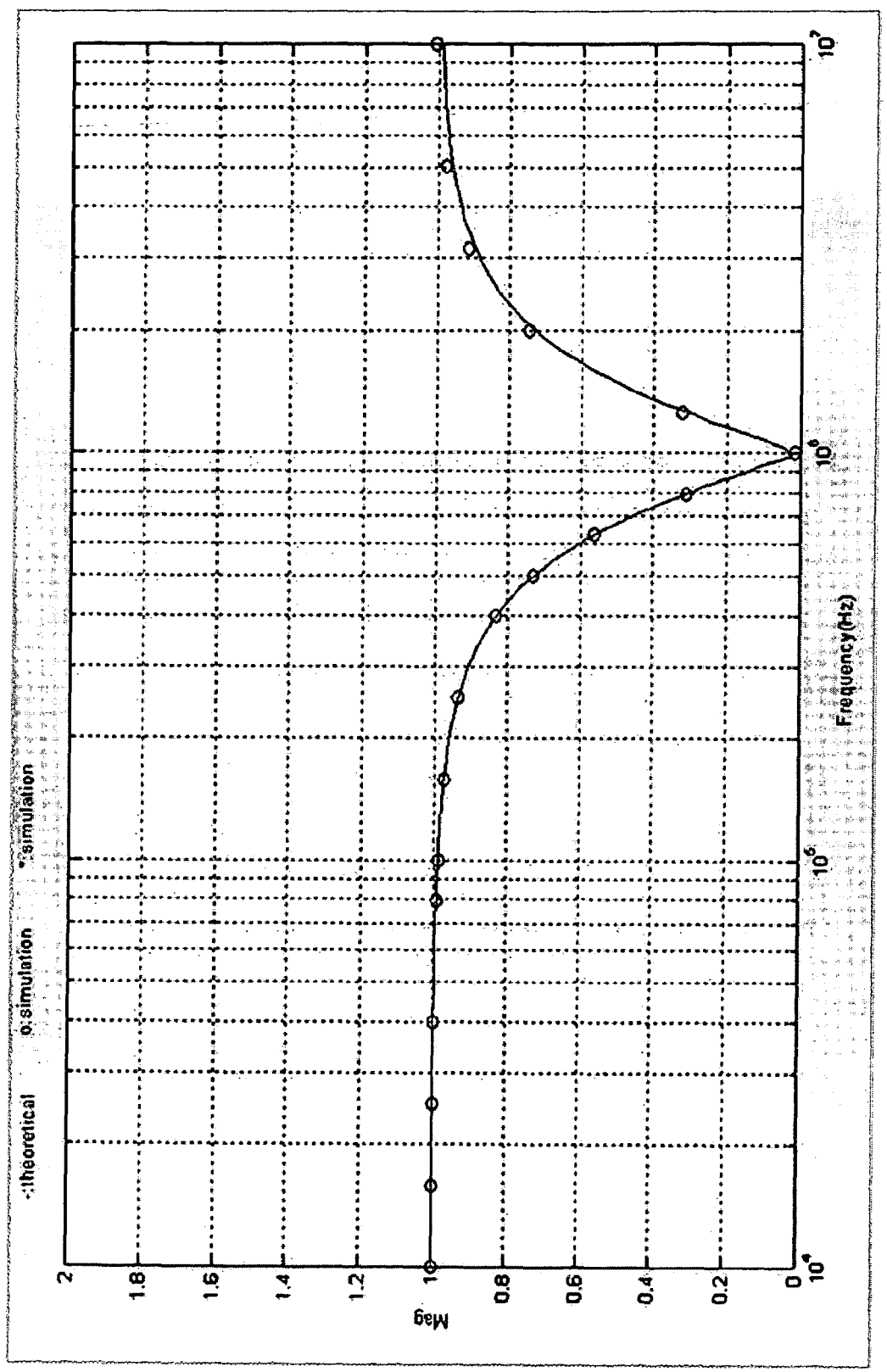
Figures 1, 1E:
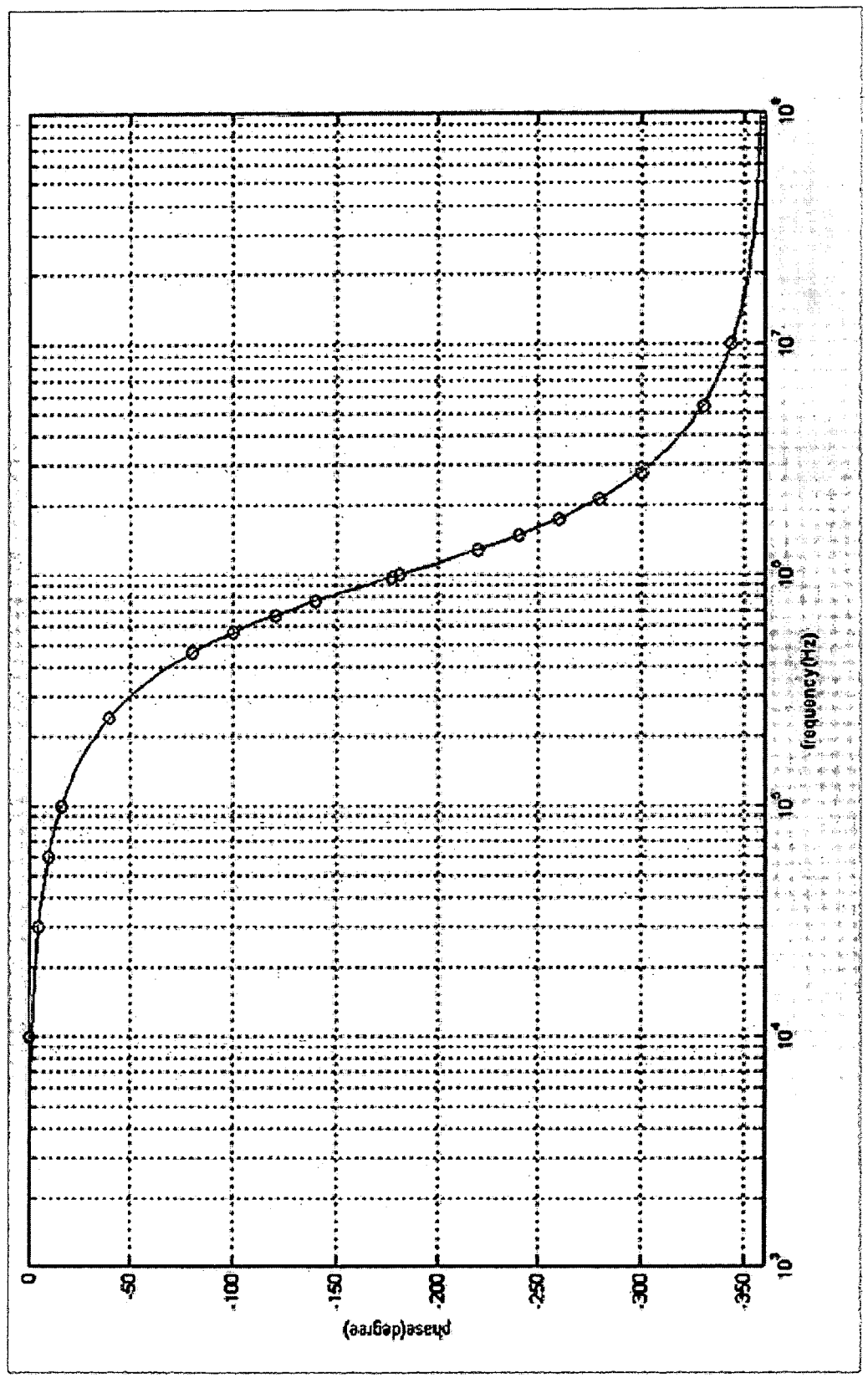
Figures 1, 2:
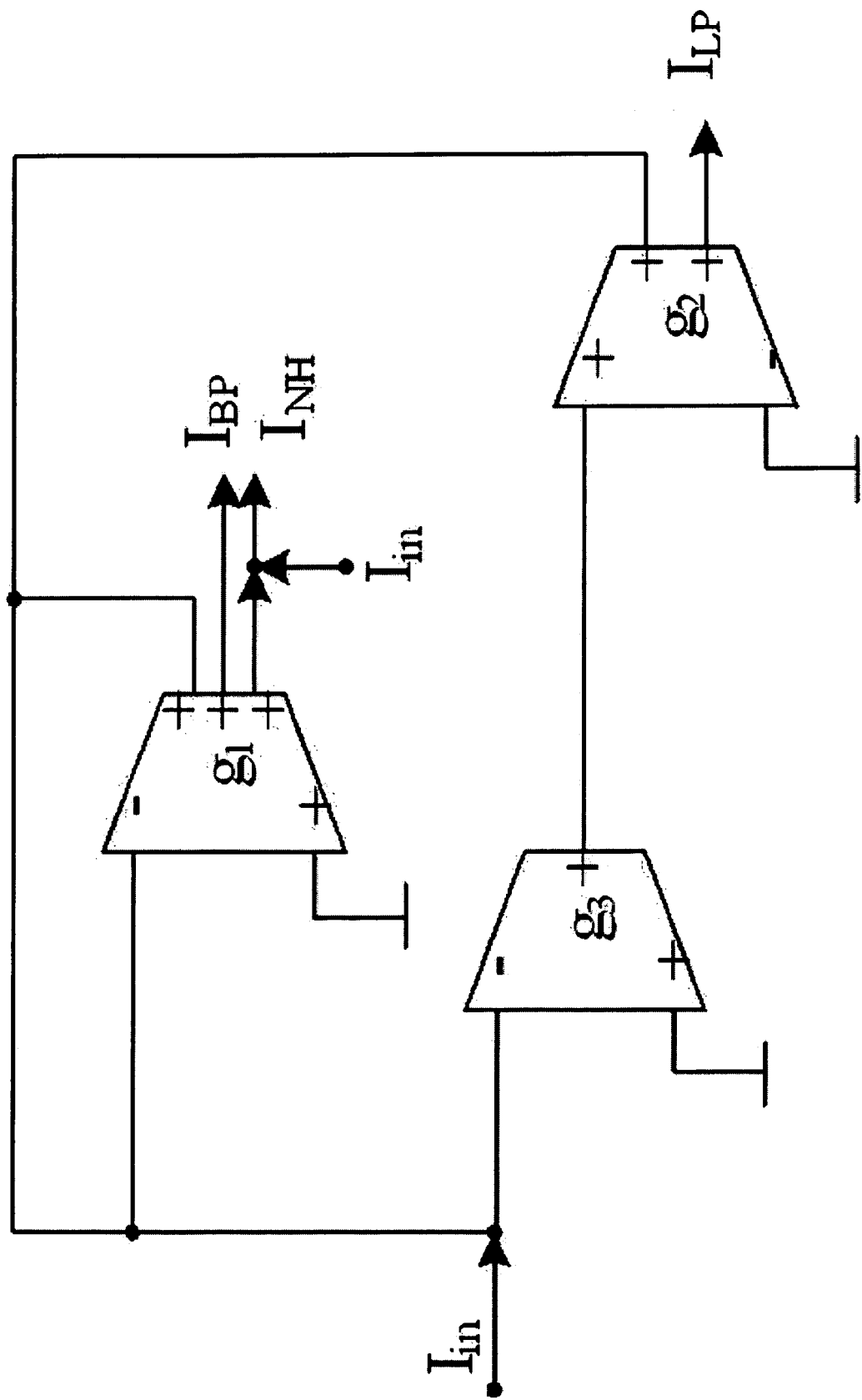
Figures 1, 2, 2A:
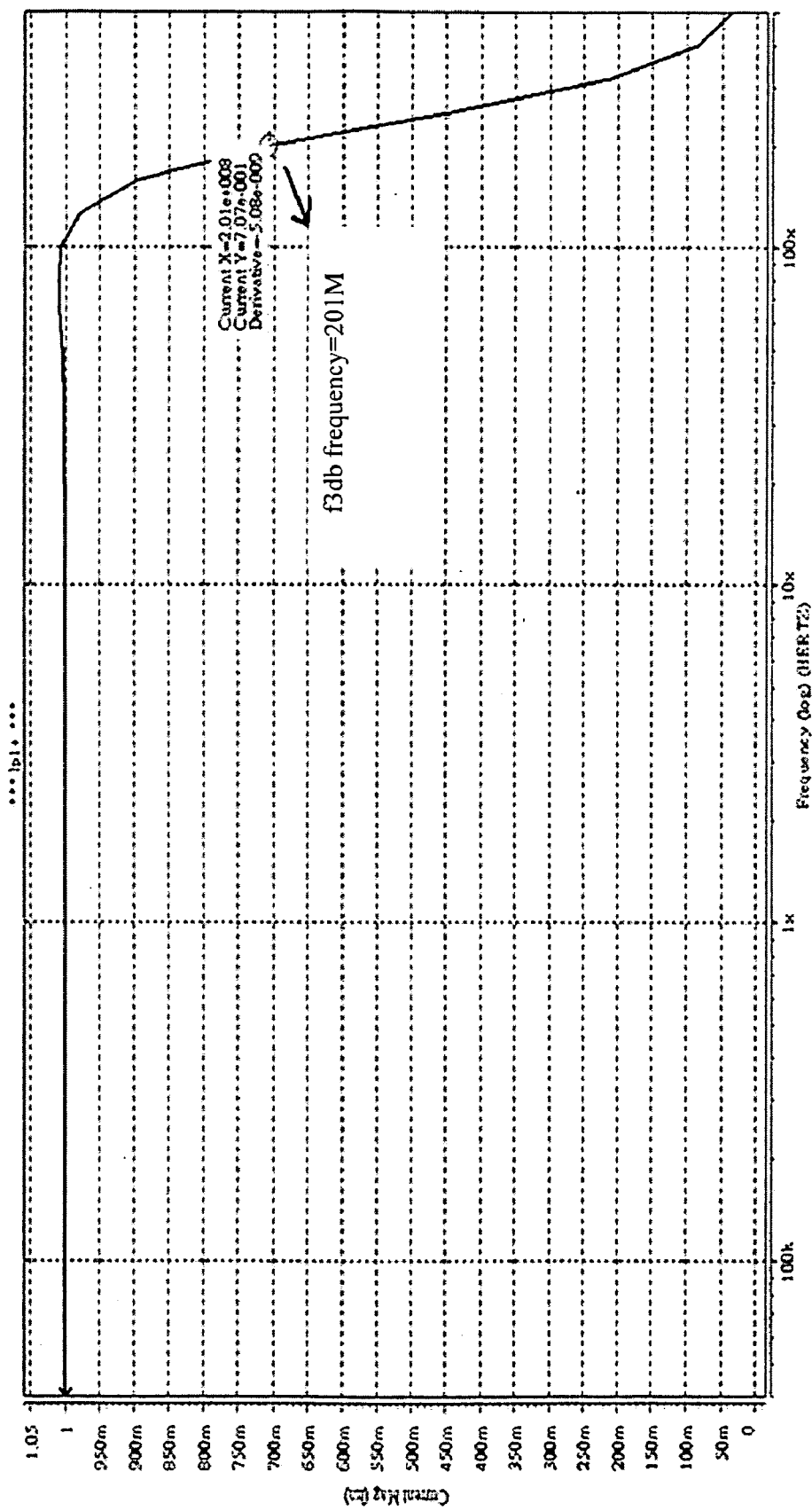
Figures 1, 2, 2B:
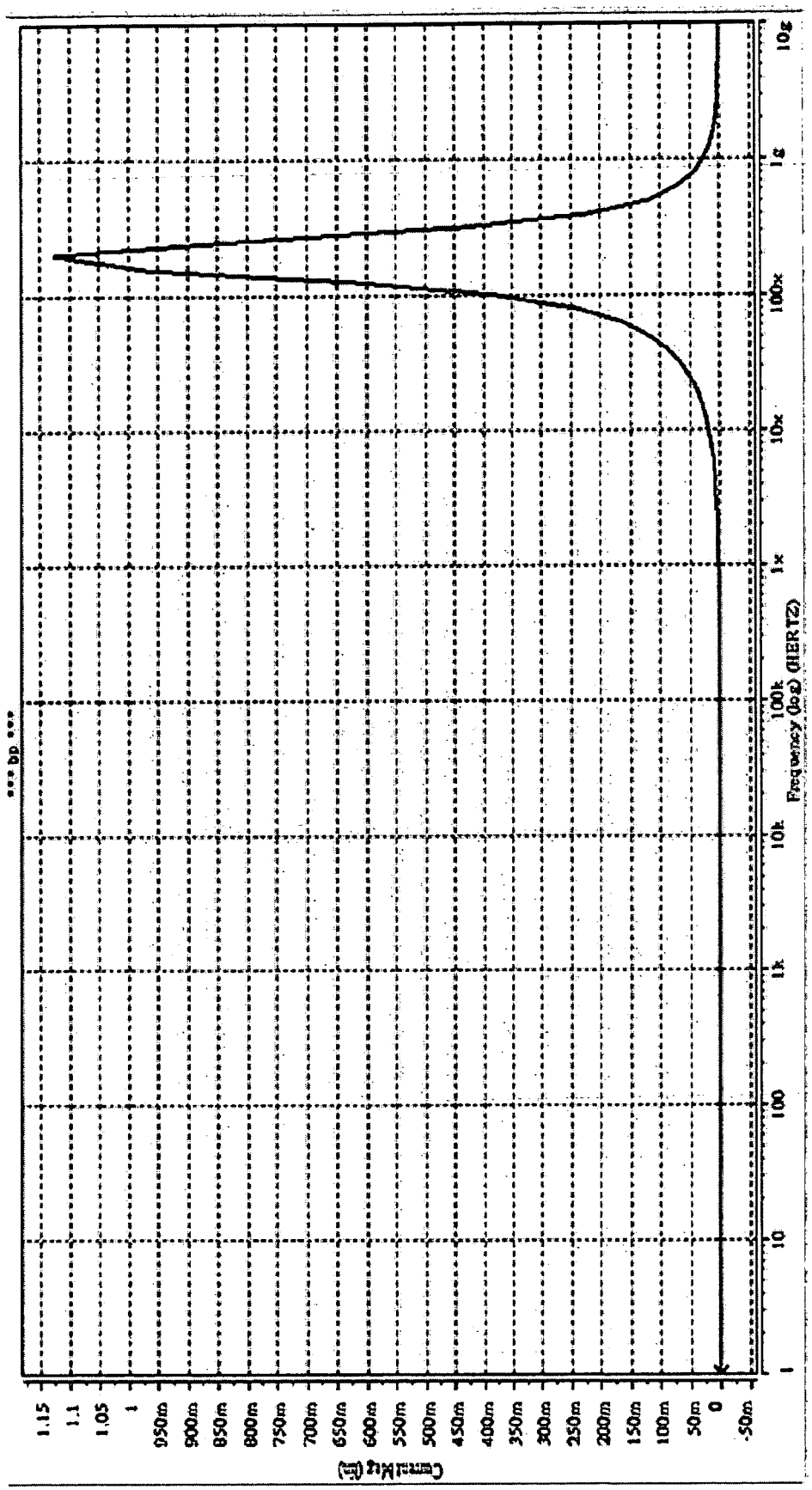
Figures 1, 2, 2C:
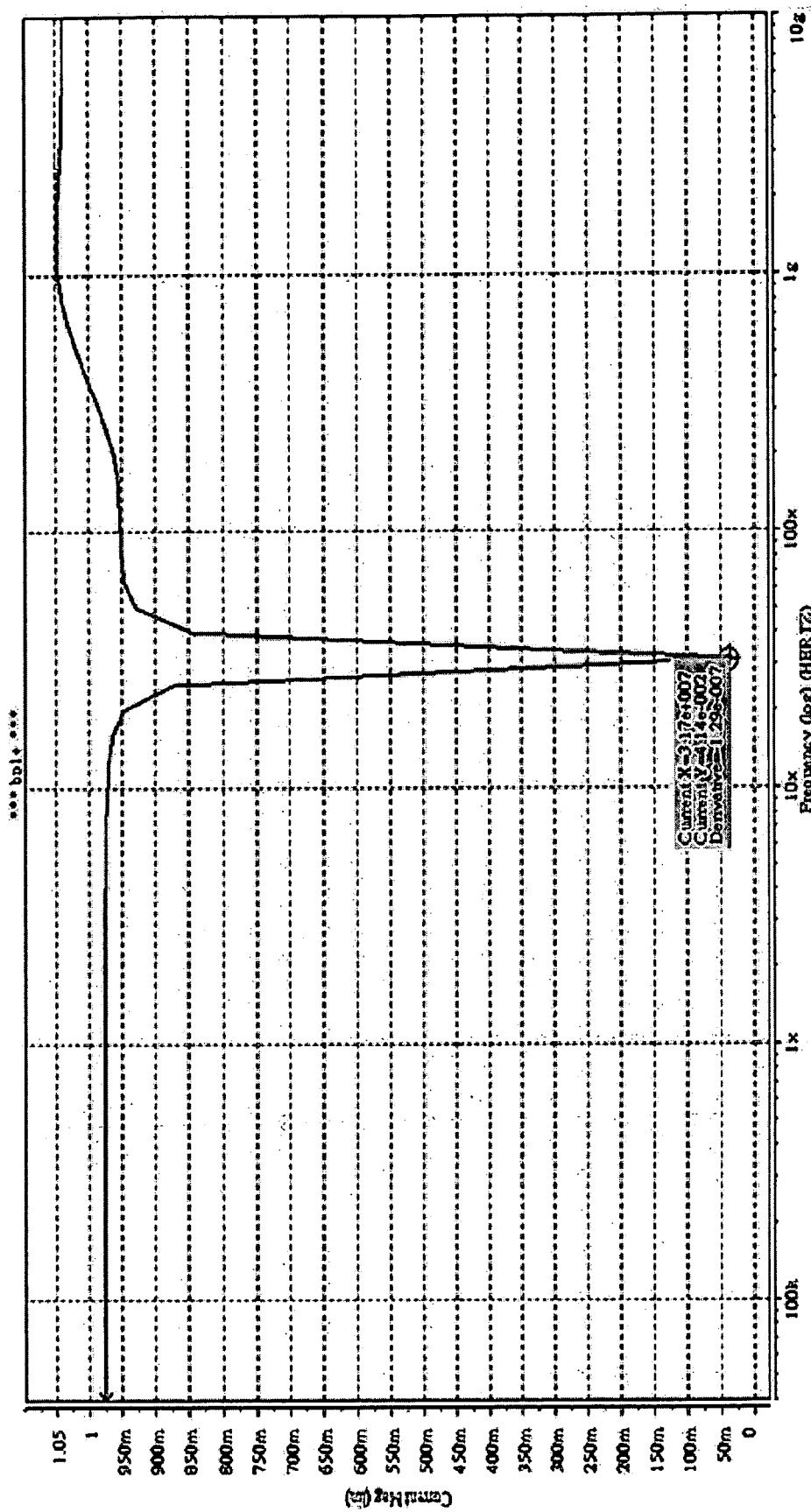
Figures 1, 2, 2D:
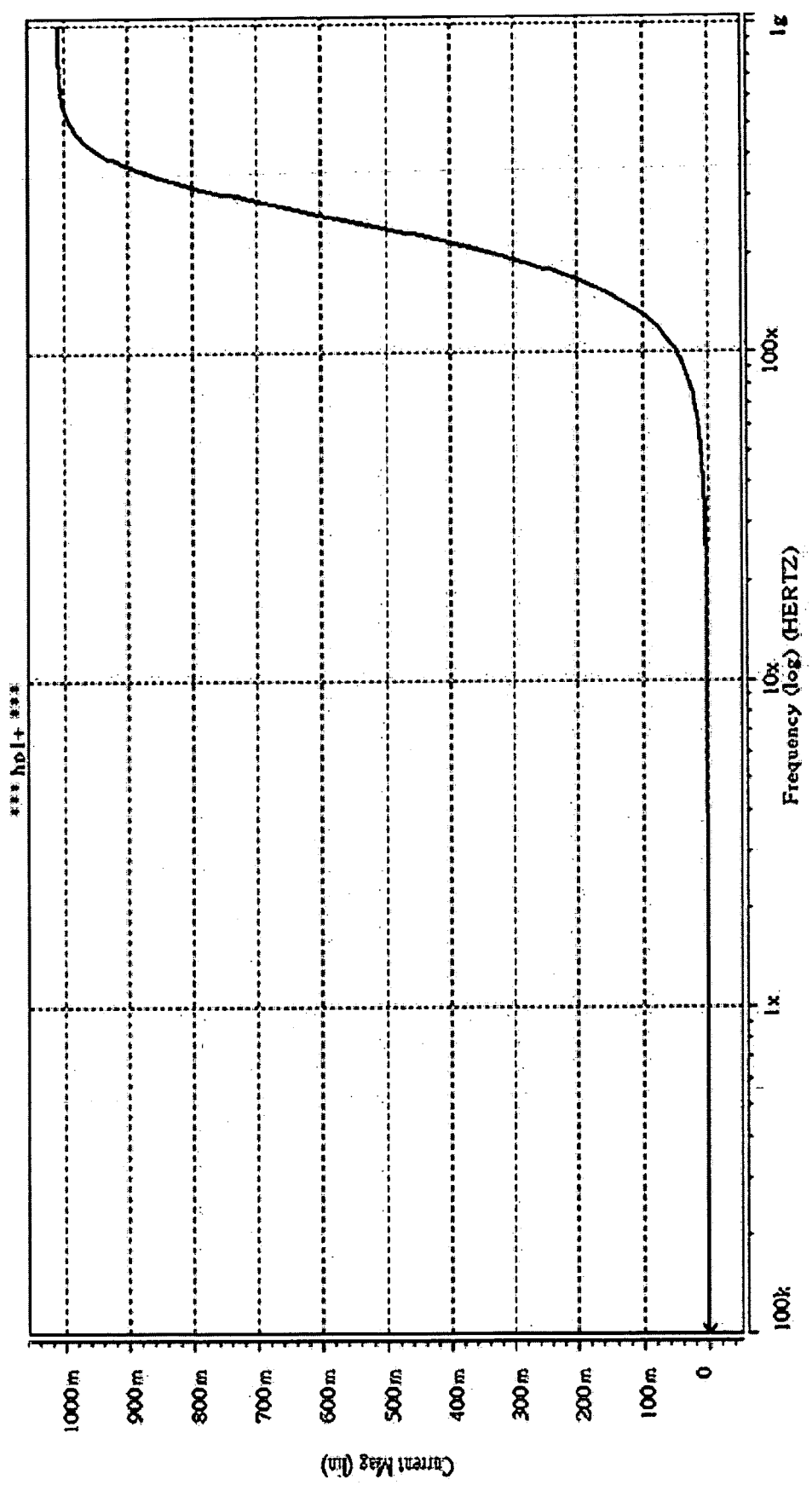
Figures 1, 2, 2E:
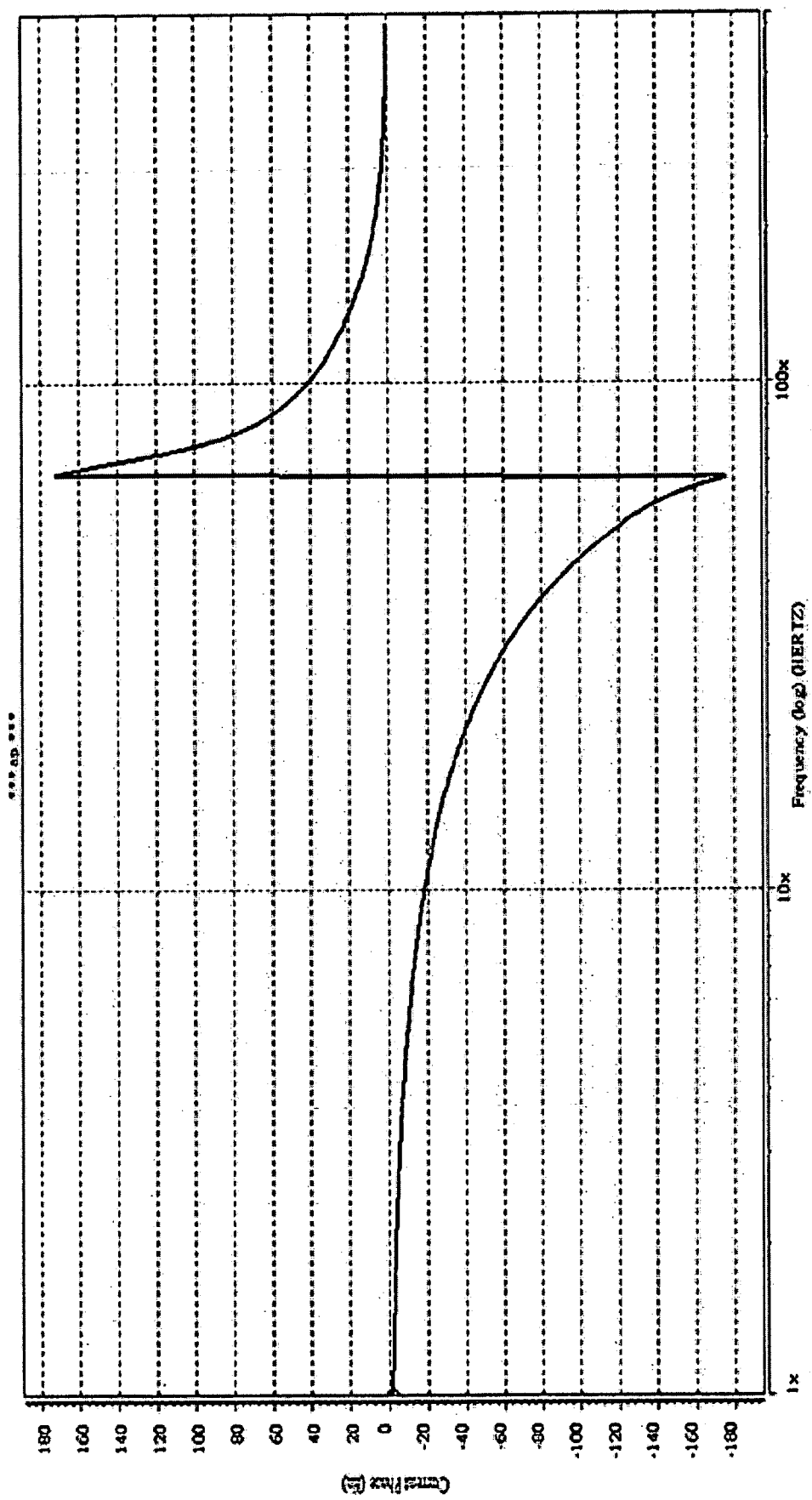
Figures 1, 2:
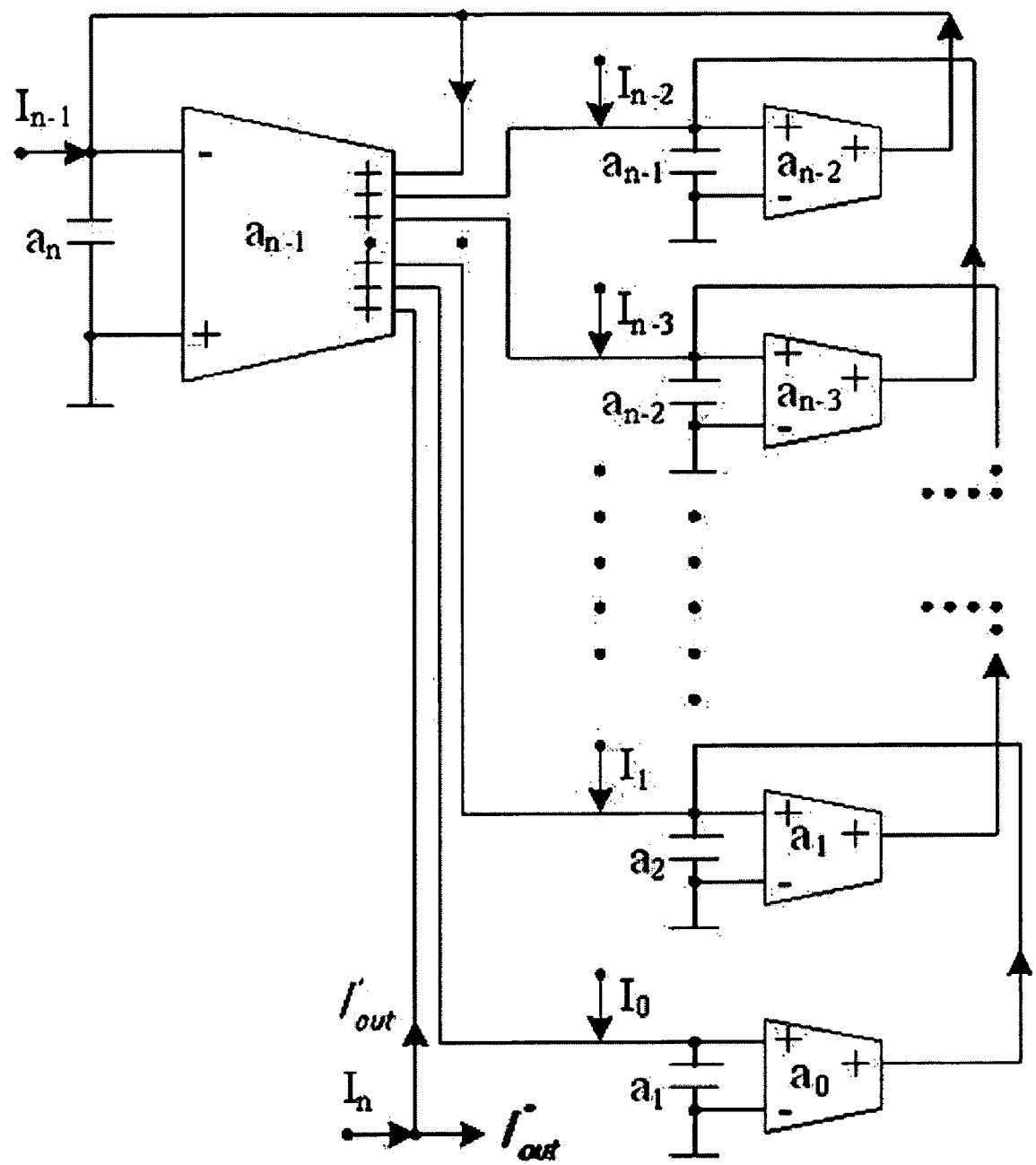
Figures 1A, 2:
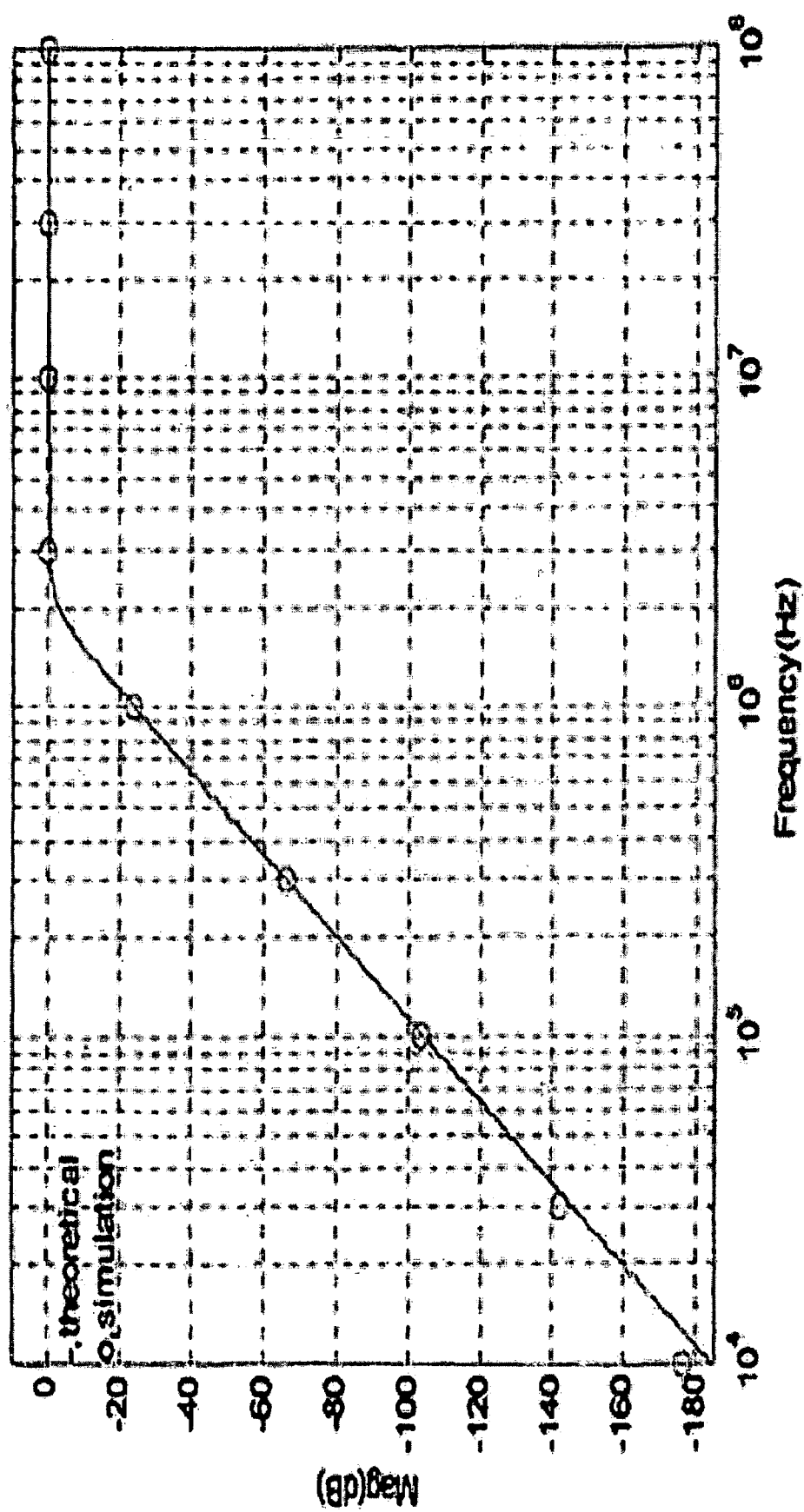
Figures 1B, 2:
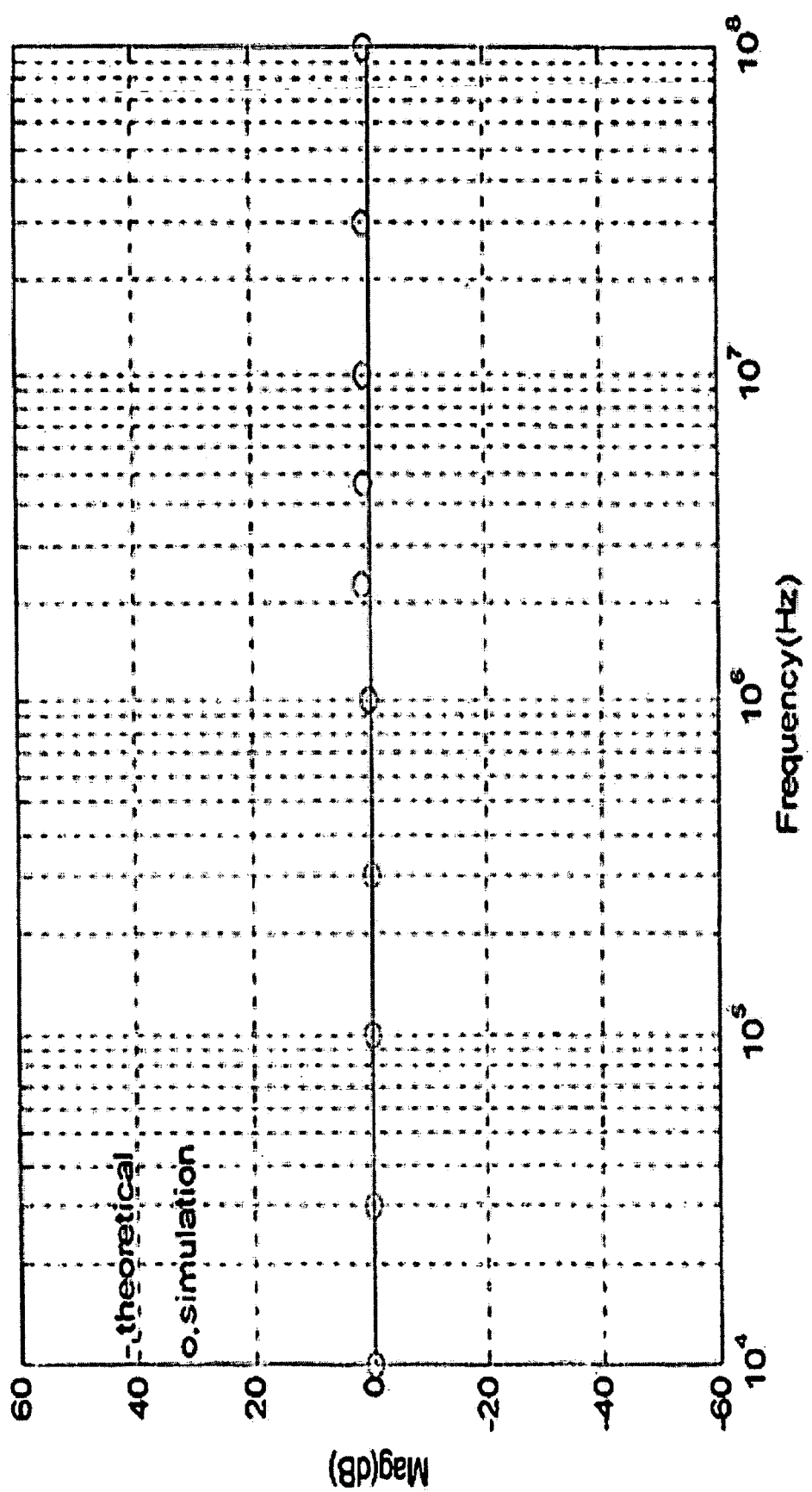
Figures 1C, 2:
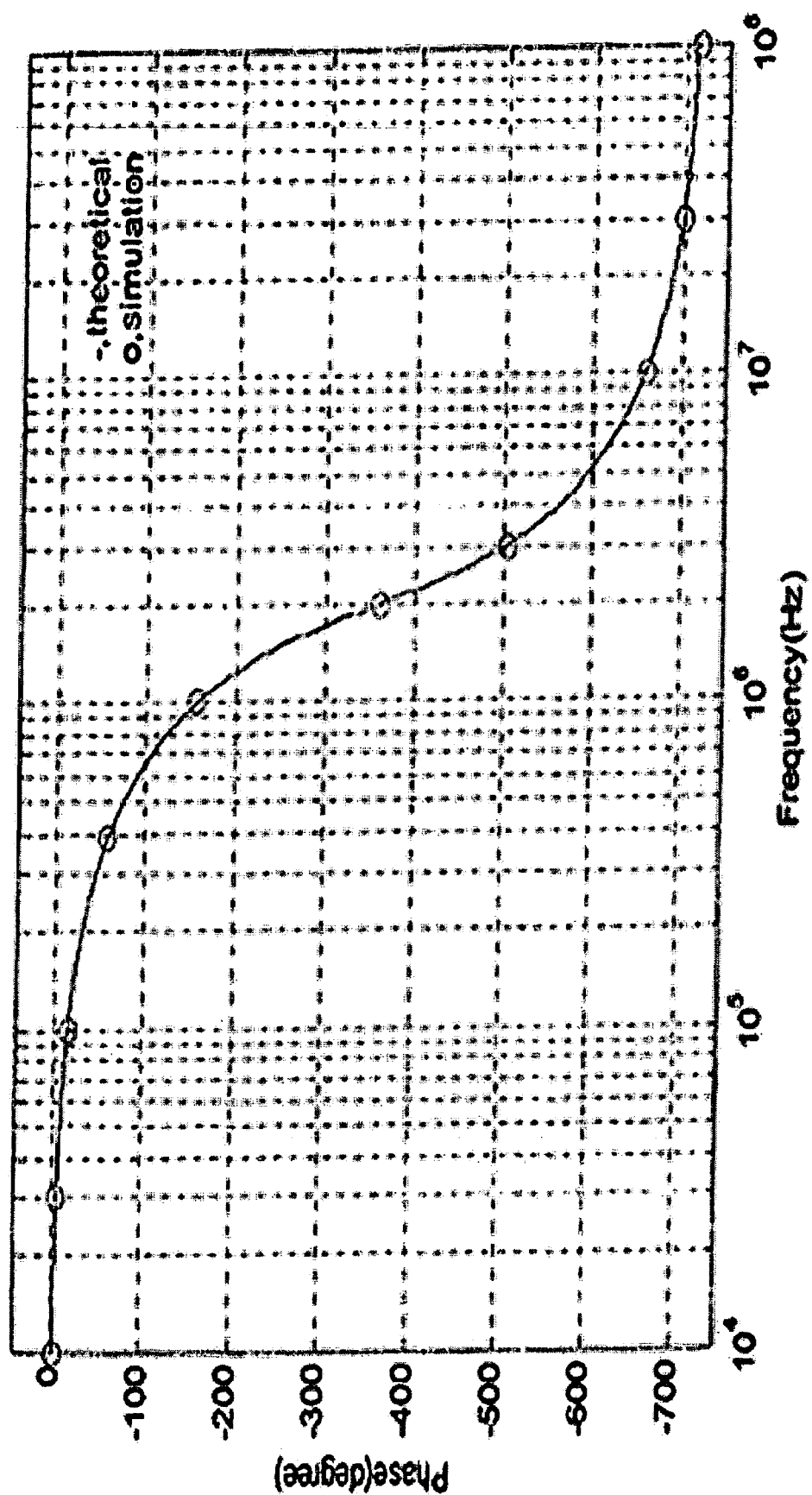
Figure 2:
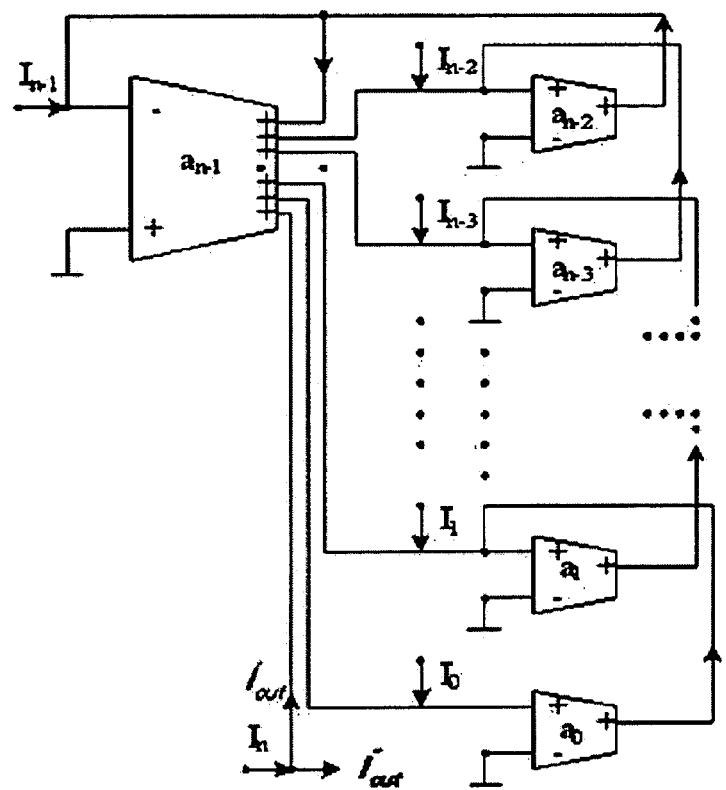
Figures 2, 2A:
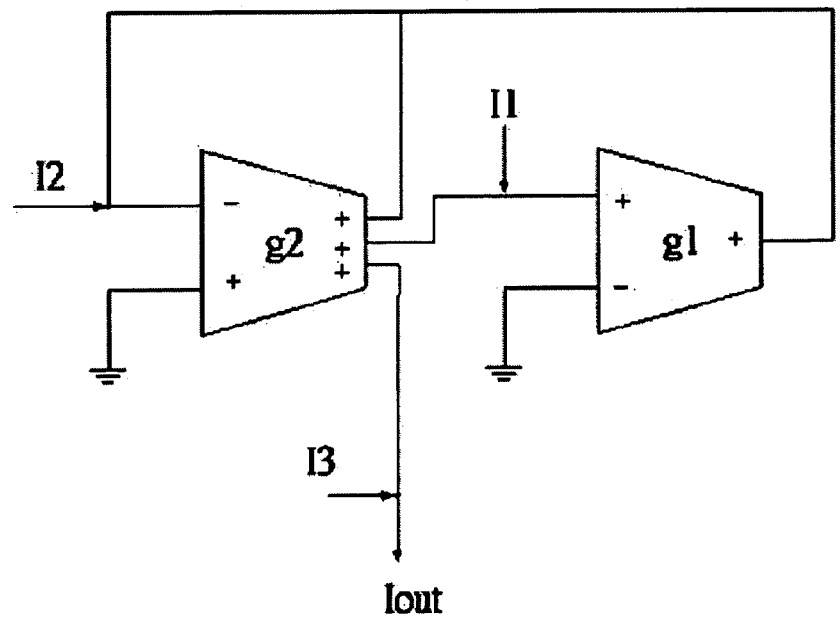
Figures 2, 2B:
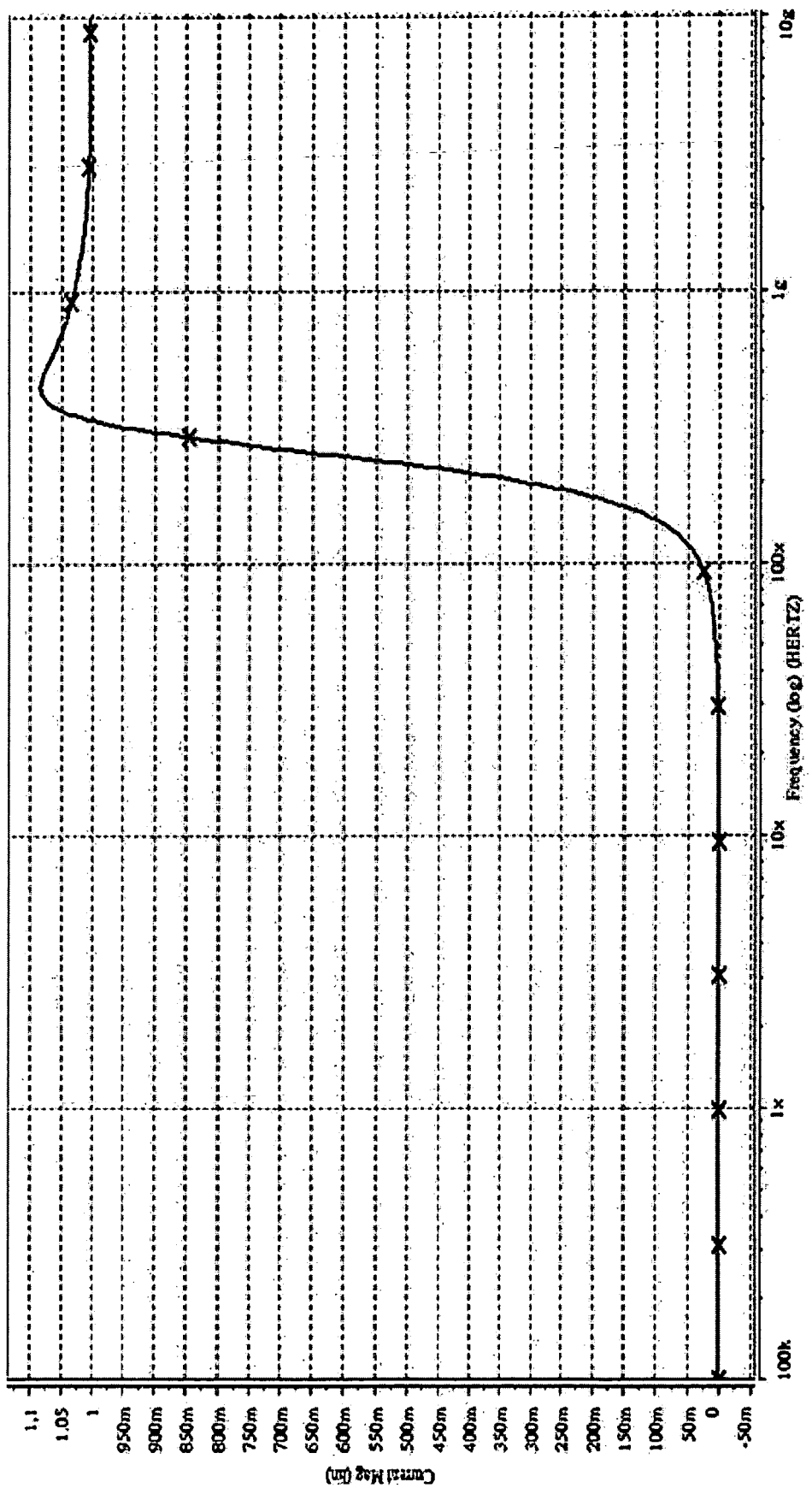
Figures 2, 2C:
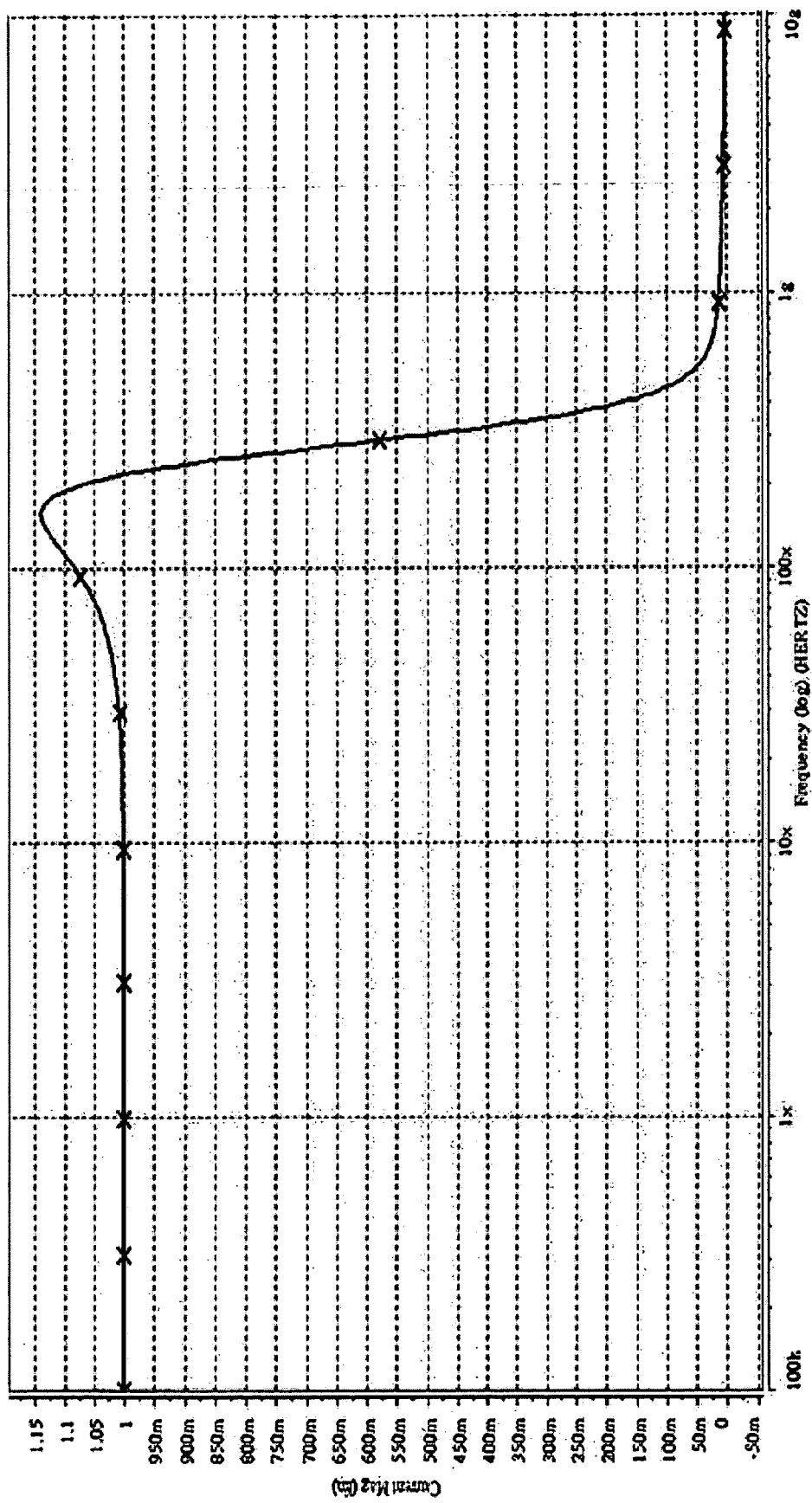
Figures 2, 2D:
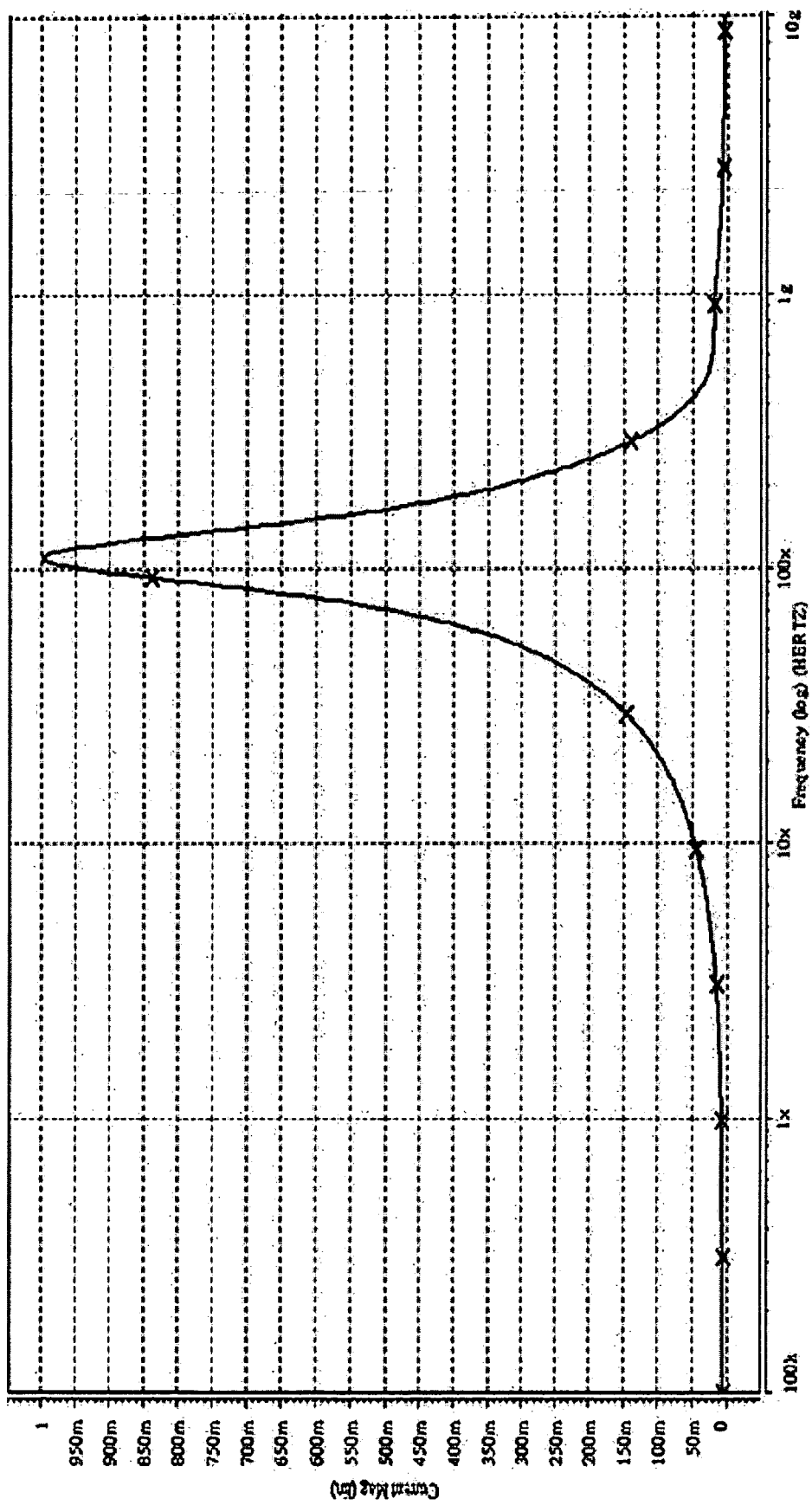
Figures 2, 2E:
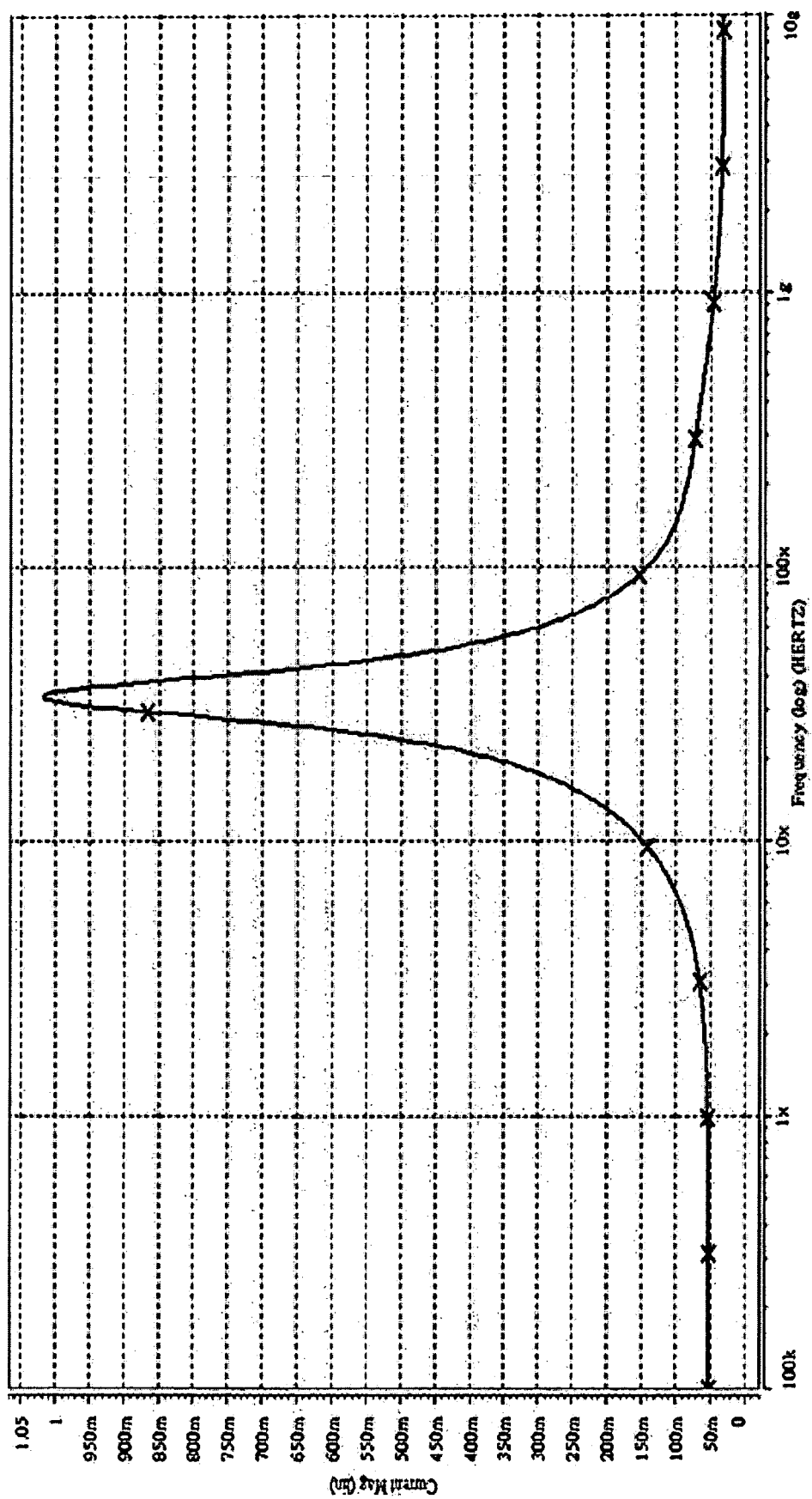
Figures 2, 2F:
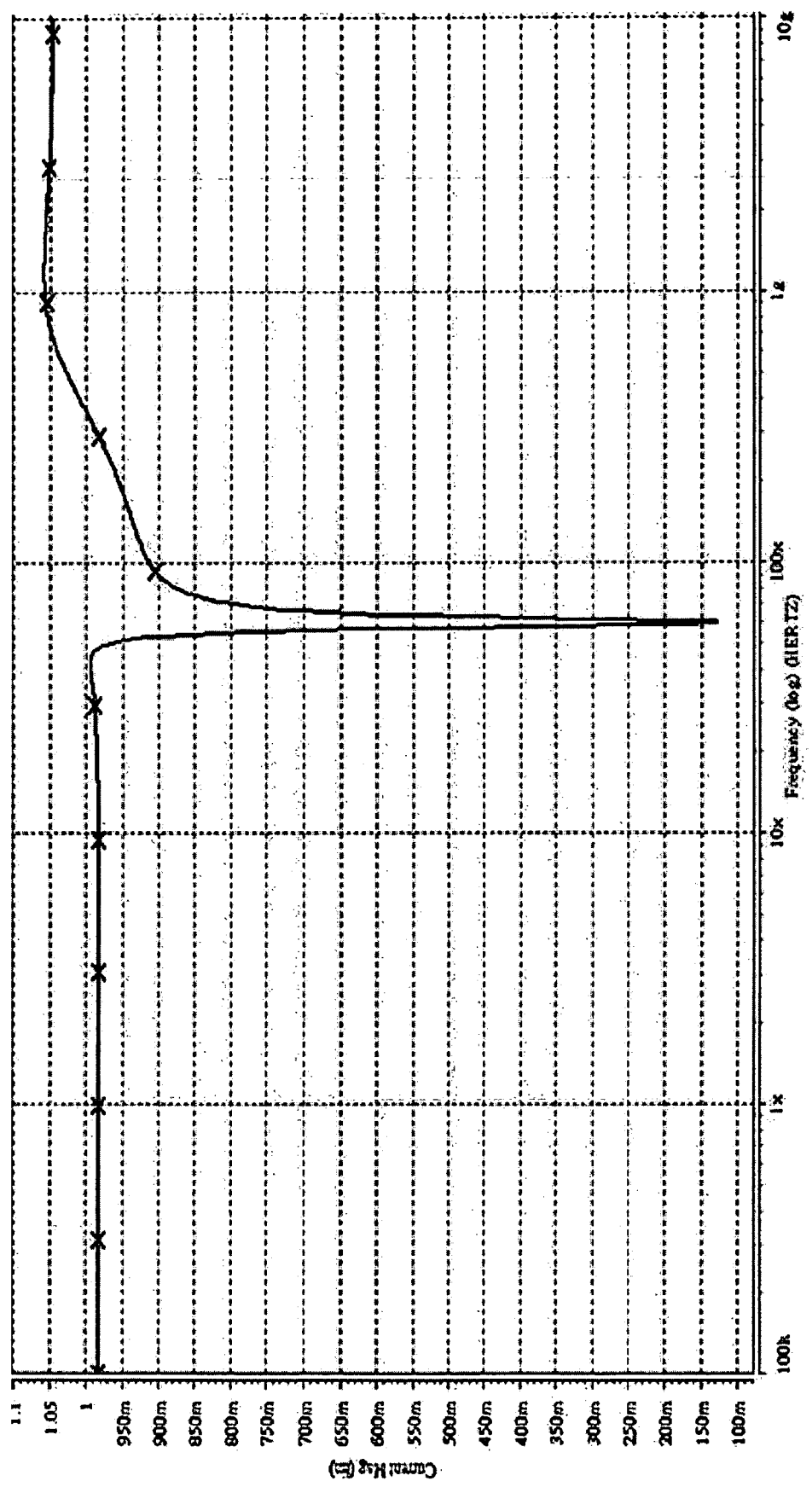
Figures 2, 2G:
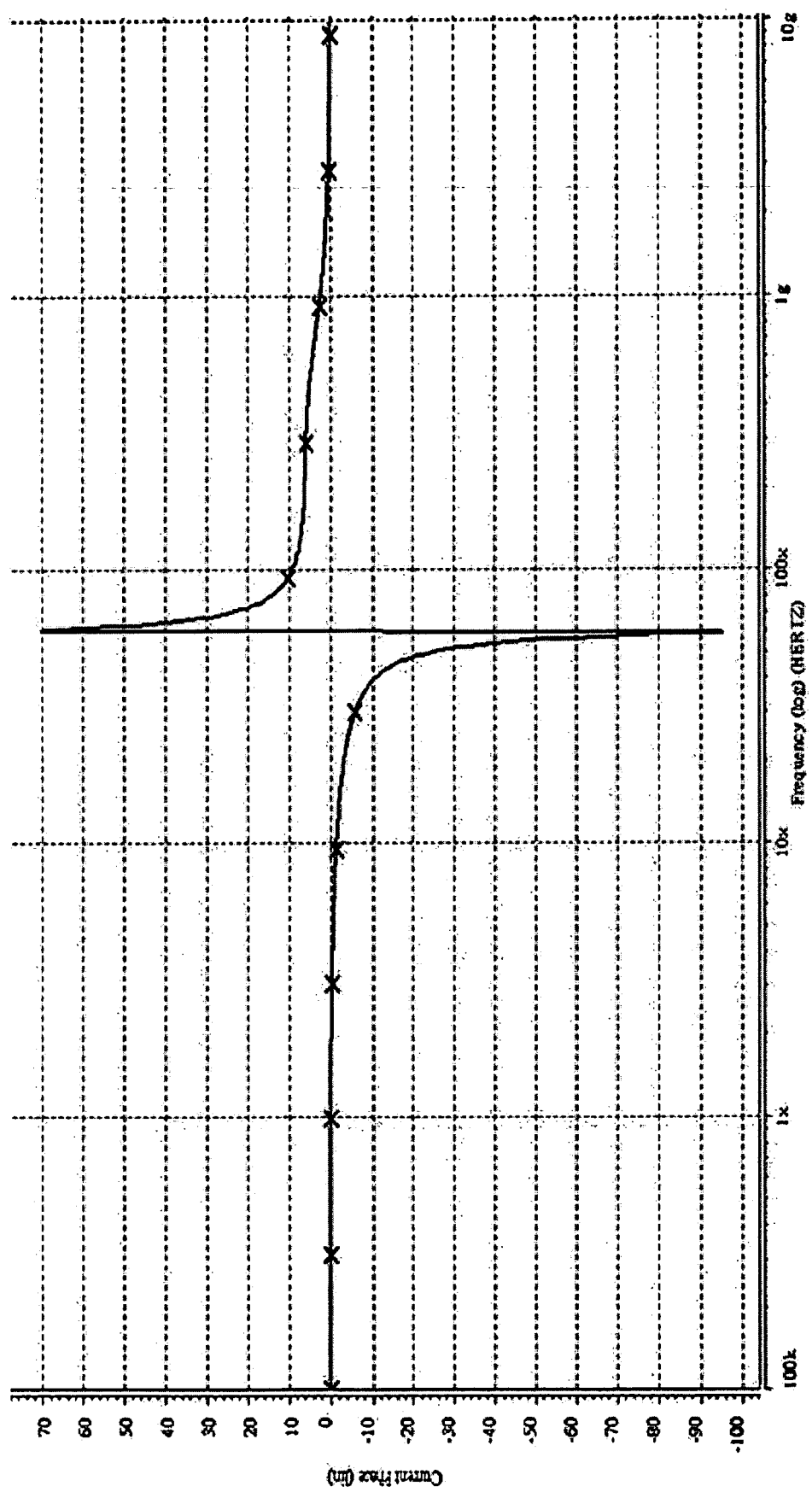
Figures 2, 2H:
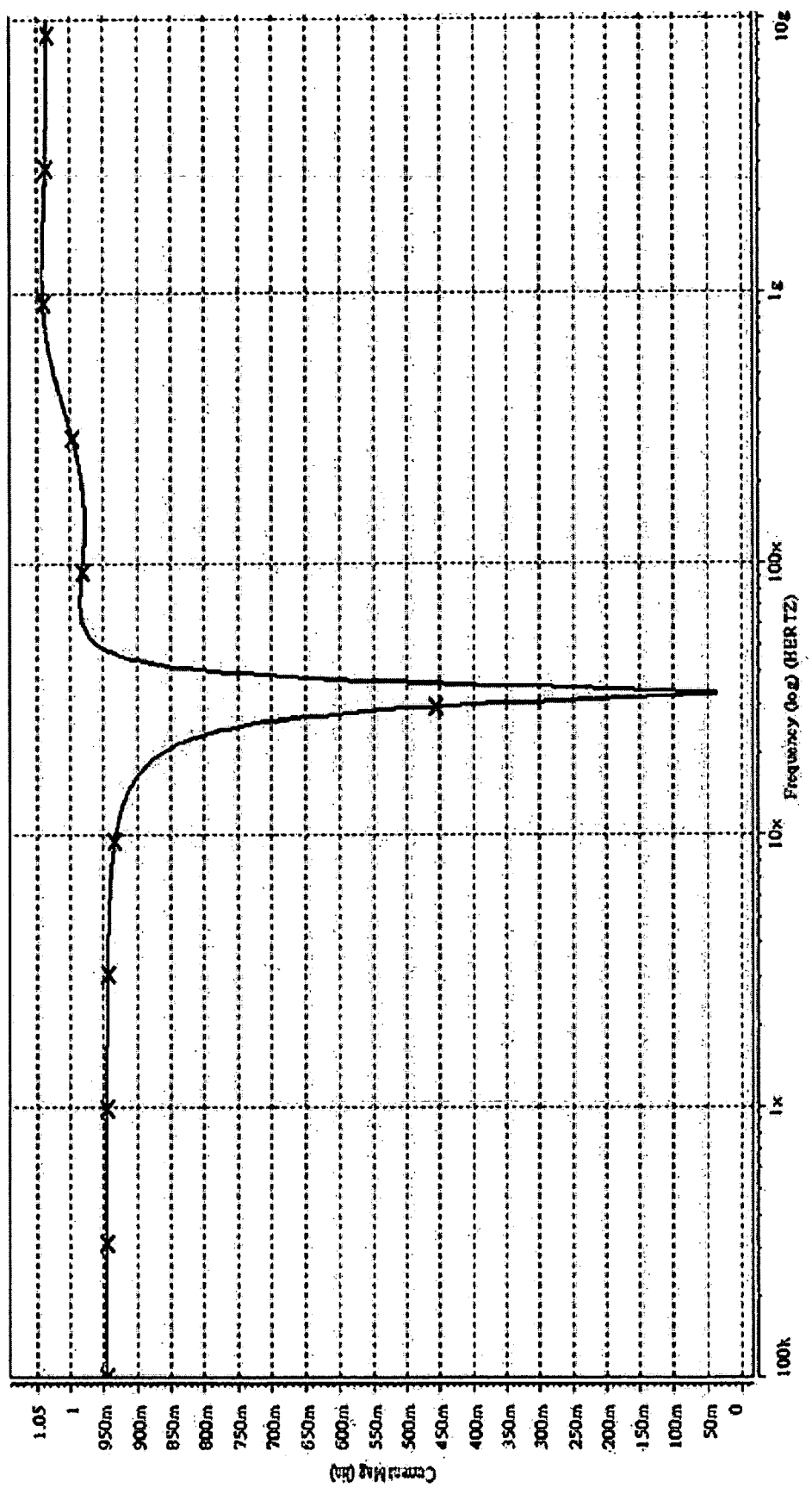
Figures 2, 2I:
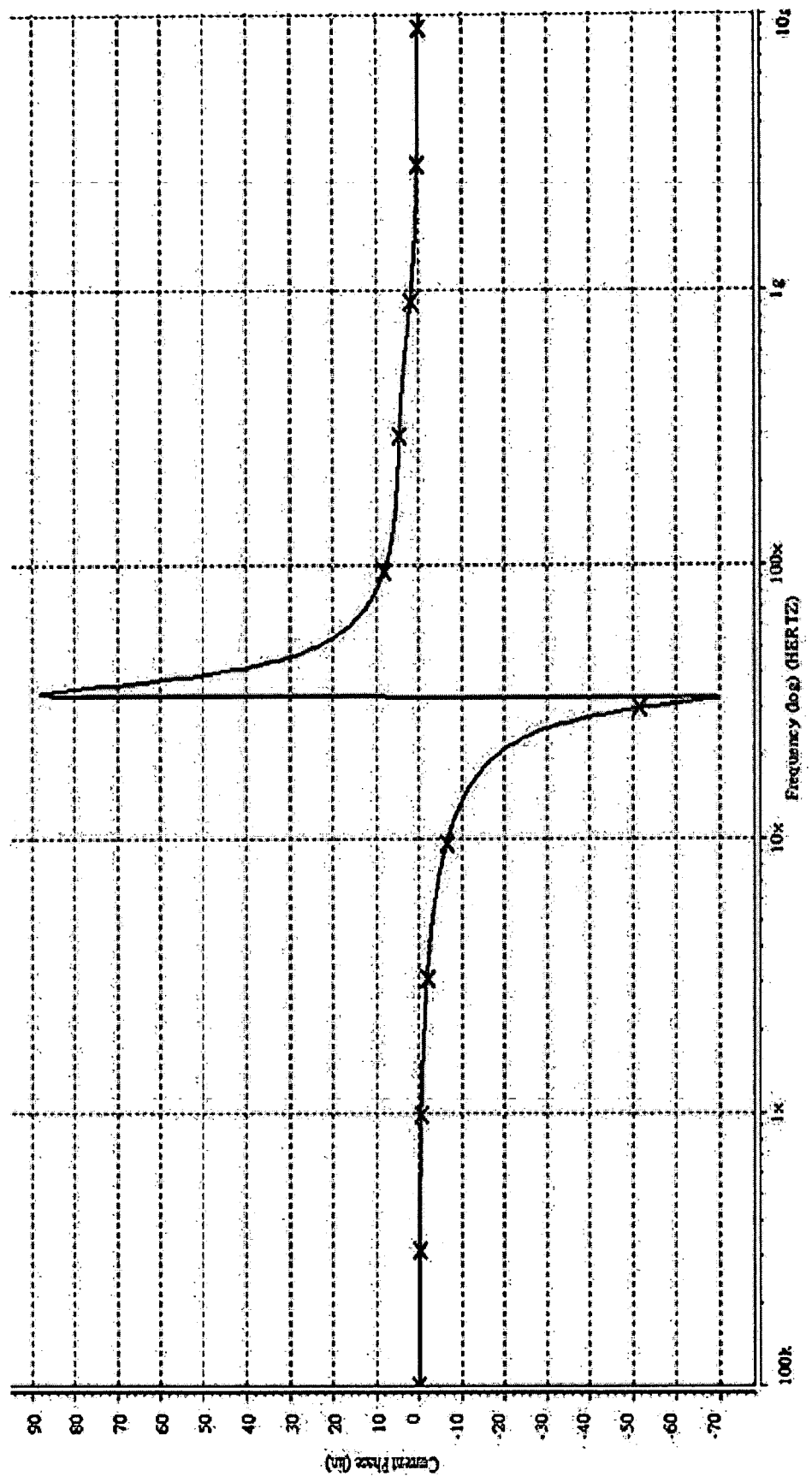
Figures 2, 2J:
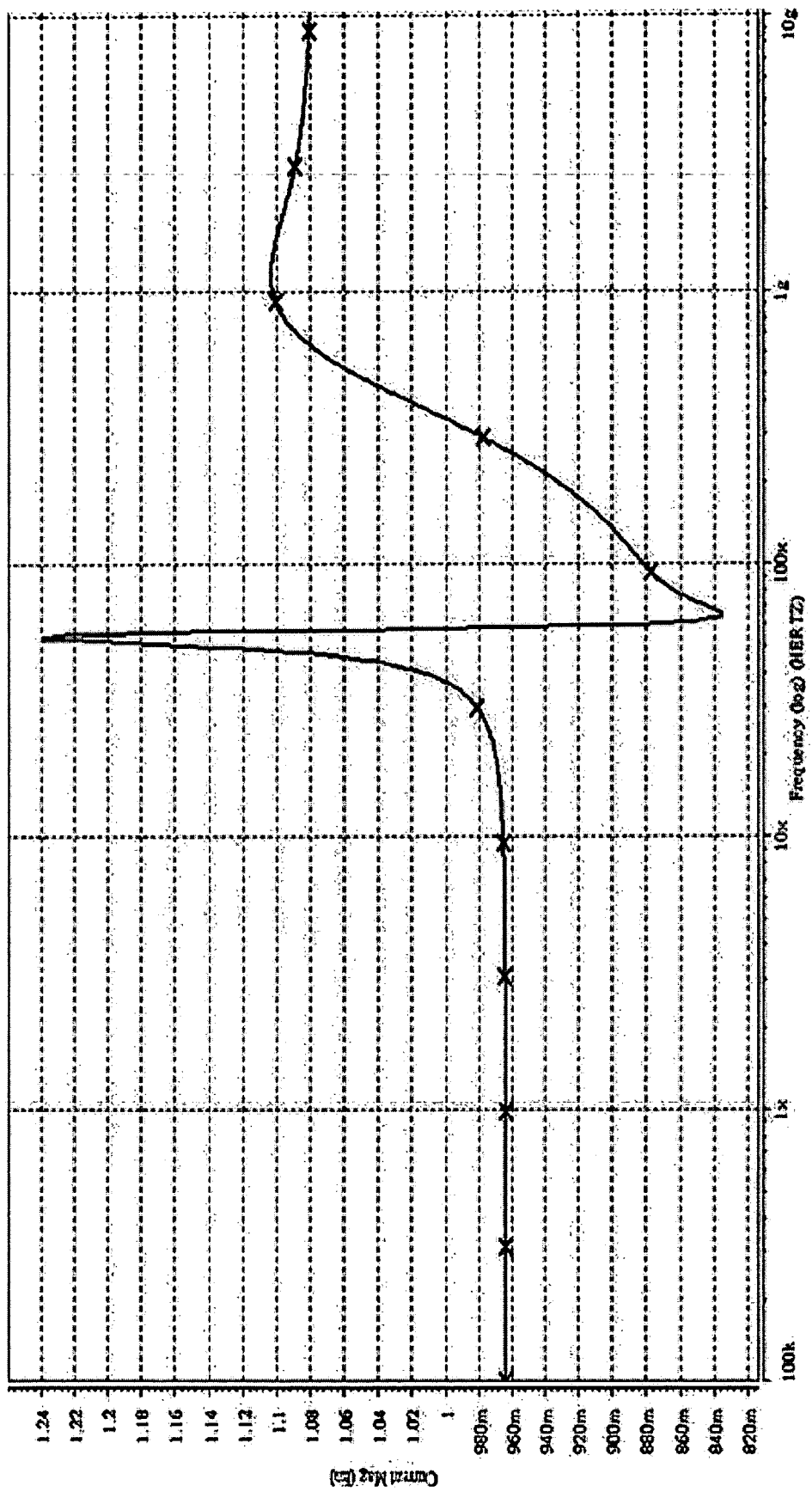
Figures 2, 2K:
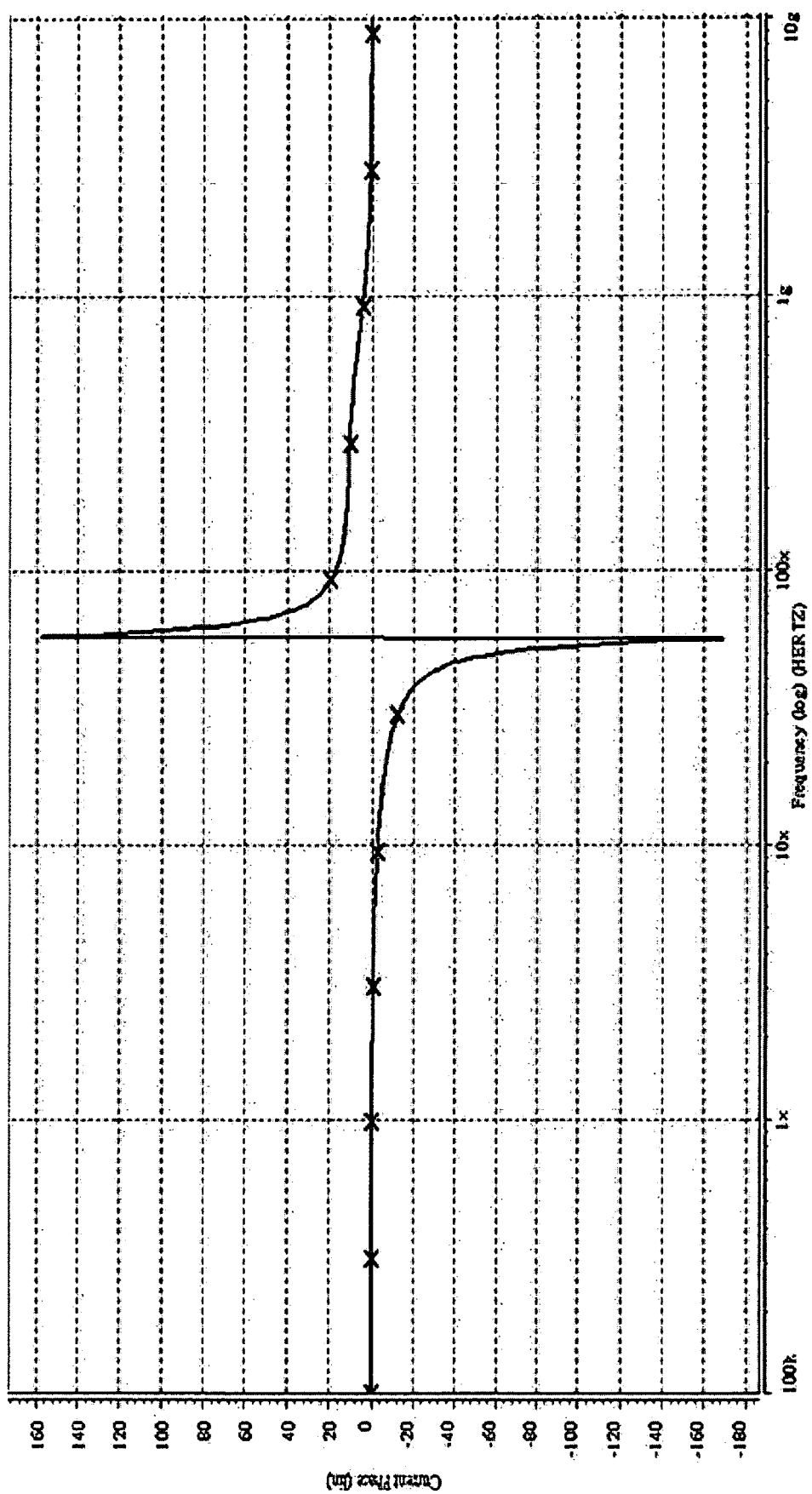
Figures 2, 2L:
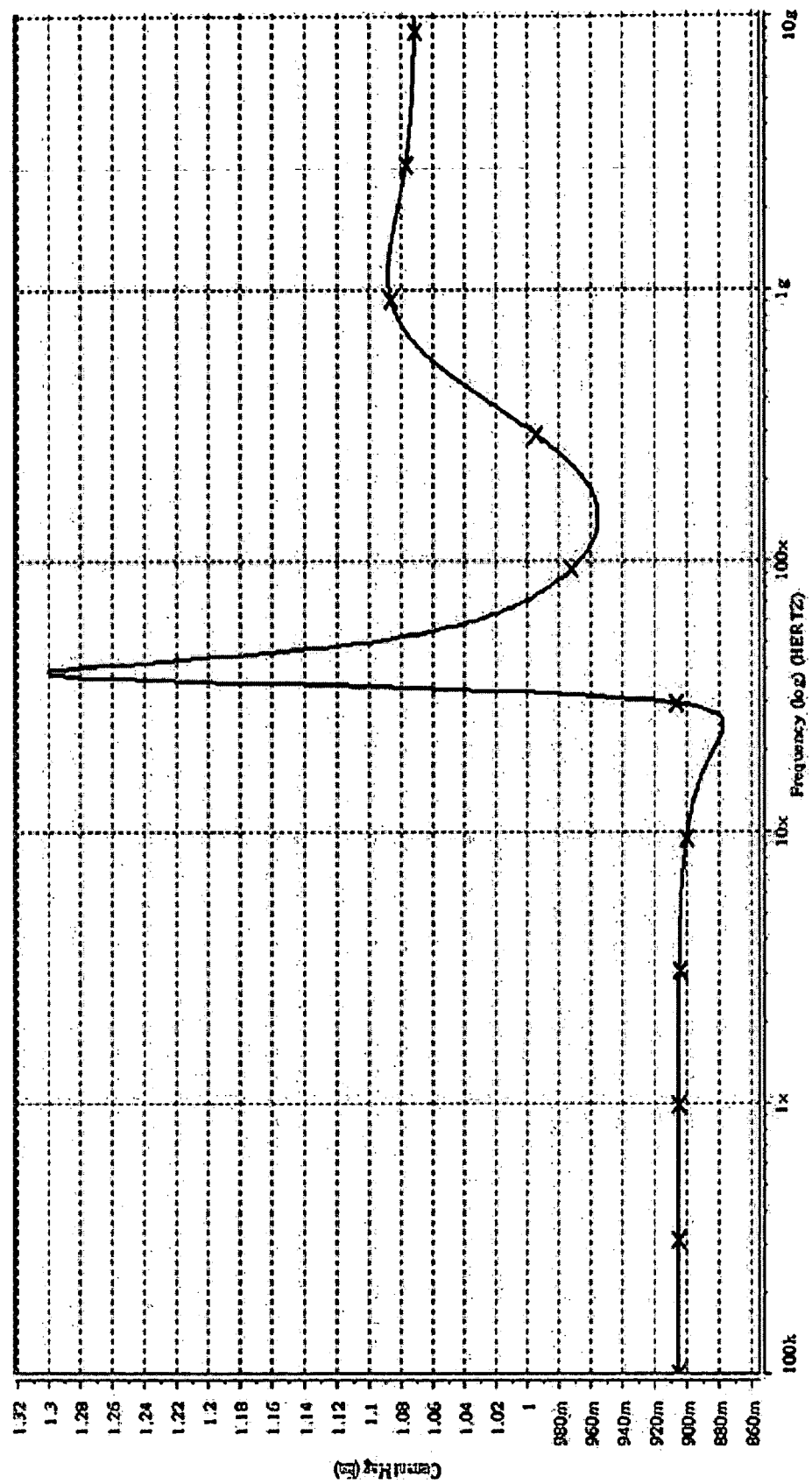
Figures 2, 2M:
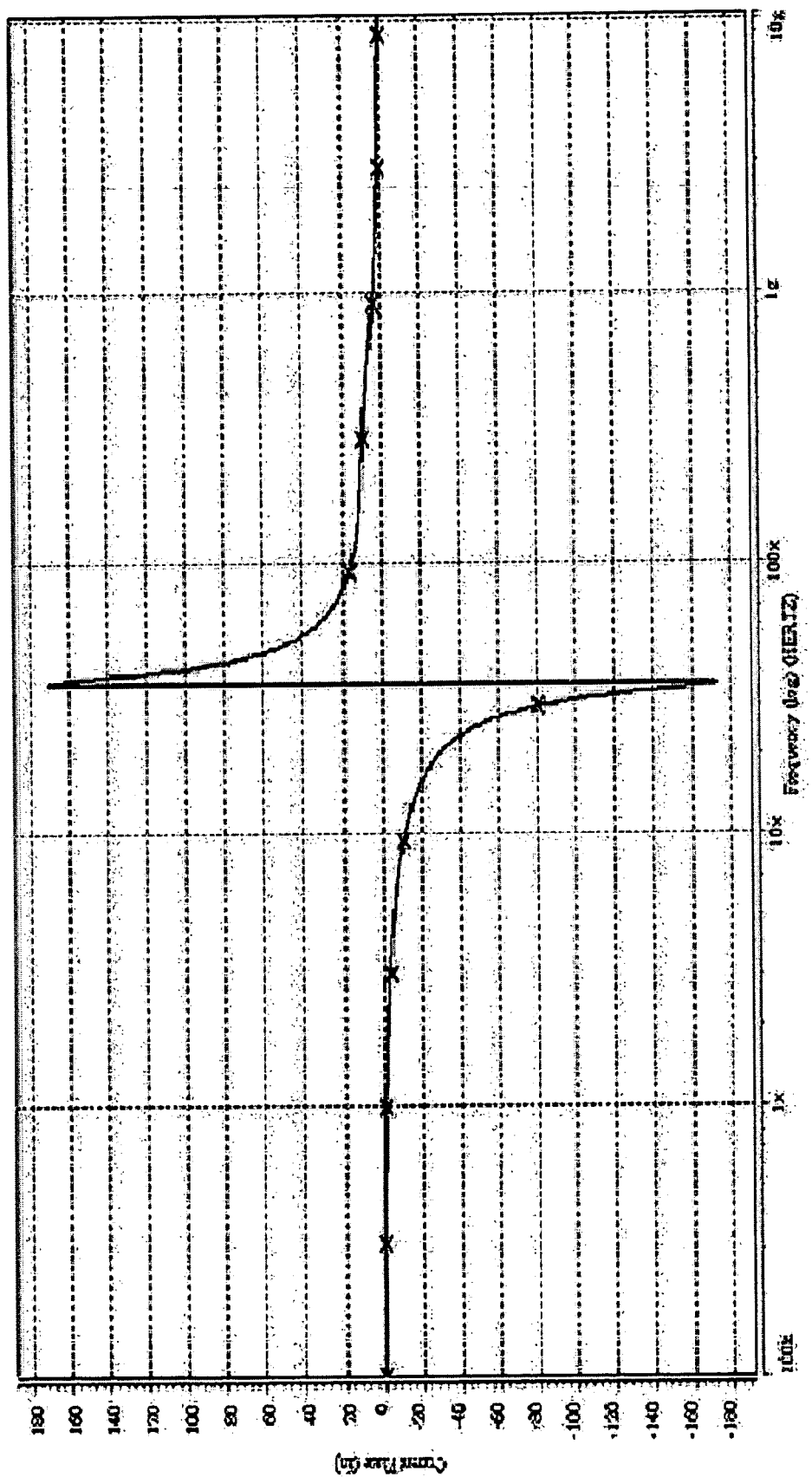

0.35 μm process H-spice simulations are used to validate the theoretical predictions as follows. We use the CMOS implementation of a transconductor [16] with ±1.65 V supply voltages and W/L=5μ/1μ and 10μ/1μ for NMOS and PMOS transistors, respectively. The component values are given by $C_1=C_2=C_3=C_4=7.76365816$ pF, $g_0=26.4803$ μS ($I_{abc}=2.52$ μA), $g_1=35.9756$ μS ($I_{abc}=3.66$ μA), $g_2=87.216$ μS ($I_{abc}=11.9$ μA), $g_3=68.15$ μS ($I_{abc}=8.38$ μA), $g_4=191.4$ μS ($I_{abc}=53.1$ μA), $g^*_4=3.1256$ μS ($I_{abc}=0.266$ μA), $g^*_2=25.8896$ μS ($I_{abc}=2.46$ μA), $g^*_0=191.643$ μS ($I_{abc}=53.1$ μA)). FIG. 10-1(d) shows the amplitude-frequency response of the fourth-order OTA-C elliptic filter shown in FIG. 10-1(c). As it can be seen there is a close agreement between theory and simulation.

10-2 Voltage-Mode Even-Nth-Order OTA-Only-Without-C Arbitrary or Elliptic Filter Structure Note that the voltage-mode even-nth-order OTA-C arbitrary or elliptic filter structures shown in FIGS. 10-1 and 10-1(a) achieve the three important criteria for the design of filters: (i) use of 2n+2 and (3n+4)/2 single-ended-input OTAs, (ii) use of n grounded capacitors, and (iii) the least active and passive component count when compared with the previous work. Especially, two requirements, (i) only n internal nodes except the output node in the filter structure, and (ii) one grounded capacitor at each internal node except the output node and no extra capacitors used in the synthesized filter structure, are part of the criteria The main goal of the present invention is to form a high-frequency (about 5 MHz to 5 GHz) circuit when removing all of the capacitors from the synthesized OTA-C filter structure. The collateral OTA-only-without-C filter structure is shown in FIGS. 10-2 and 10-2(a). FIG. 10-2(b) is the fourth-order case of FIG. 10-2(a).

0.35 μm process H-spice simulations are used to validate the theoretical predictions as follows. We use the CMOS implementation of a transconductor [16] with ±1.65 V supply voltages and W/L=5μ/1μ and 10μ/1μ for NMOS and PMOS transistors, respectively. The component values are (i) $g_0=141.9$ μS ($I_{abc}=64$ μA), $g_1=141.9$ μS ($I_{abc}=64$ μA), $g_2=64.07$ μS ($I_{abc}=100$ μA), $g_3=44.6$ μS ($I_{abc}=120$ μA), $g_4=66.31$ μS ($I_{abc}=98.5$ μA), $g^*_4=g^*_2=64.07$ μS ($I_{abc}=100$ μA), $g^*_0=22.44$ μS ($I_{abc}=185$ μA)), and (ii) $g_0=g_3=56.58$ μS ($I_{abc}=10$ μA), $g_1=32.6$ μS ($I_{abc}=6$ μA), $g_2=2.274$ μS ($I_{abc}=1$ μA), $g_4=g^*_4=184.2$ μS ($I_{abc}=62$ μA), $g^*_2=32.6$ μS ($I_{abc}=6$ μA), $g^*_0=2.274$ μS ($I_{abc}=1$ μA). FIGS. 10-2(c) and (d) show the amplitude-frequency responses of the above two sets of component values with $f_0=134$ MHz and 49.7 MHz, respectively, of the voltage-mode fourth-order OTA-only-without-C elliptic filter shown in FIG. 10-2(b).

11-1 Current-Mode Even-Nth-Order OTA-C Arbitrary and Elliptic Filter Structure

The current-mode even-nth-order OTA-C arbitrary filter structure which can realize all kinds of analog current-mode circuits is shown in FIG. 11-1. The filter has one input, $I_{in}$, and one output, $I_{out}$, which is the summation of n+1 multiple output currents: $I_{out(n)}$, $I_{out(n-1)}$, ..., $I_{out(1)}$, and $I_{out(0)}$. The transfer function of the arbitrary filter structure shown in FIG. 11-1 is $$\frac{I_{out}}{I_{in}} = \frac{b_n s^n + b_{n-1} s^{n-1} + b_{n-2} s^{n-2} + \ldots + b_2 s^2 + b_1 s + a_0}{a_n s^n + a_{n-1} s^{n-1} + a_{n-2} s^{n-2} + \ldots + a_2 s^2 + a_1 s + a_0} \quad (11\text{-}1)$$

Cross multiply Eq. (11-1) and decompose it into n+1 terms such as $$\begin{aligned} I_{out} &= \sum_{i=0}^{i=n} I_{out(i)} \\ &= I_{out(n)} + I_{out(n-1)} + I_{out(n-2)} + \ldots + I_{out(2)} + I_{out(1)} + I_{out(0)} \\ &= \frac{b_n I_{in} s^n + b_{n-1} I_{in} s^{n-1} + b_{n-2} I_{in} s^{n-2} + \ldots + b_2 I_{in} s^2 + b_1 I_{in} s + a_0 I_{in}}{a_n s^n + a_{n-1} s^{n-1} + a_{n-2} s^{n-2} + \ldots + a_2 s^2 + a_1 s + a_0} \\ &= \sum_{i=1}^{i=n} \frac{b_i I_{in} s^i}{\Delta} + \frac{a_0 I_{in}}{\Delta} \end{aligned} \quad (11\text{-}2)$$

where $$\Delta = a_n s^n + a_{n-1} s^{n-1} + a_{n-2} s^{n-2} + a_{n-3} s^{n-3} + \ldots + a_3 s^3 + a_2 s^1 + a_1 s + a_0$$

An even-nth-order elliptic filter structure has the following transfer function $$\frac{I_{out}}{I_{in}} = \frac{b_n s^n + b_{n-2} s^{n-2} + b_{n-4} s^{n-4} + \ldots + b_4 s^4 + b_2 s^2 + a_0}{a_n s^n + a_{n-1} s^{n-1} + a_{n-2} s^{n-2} + a_{n-3} s^{n-3} + \ldots + a_3 s^3 + a_2 s^2 + a_1 s + a_0} \quad (11\text{-}3)$$

where n is a positive even integer. Referring to the above OTA-C arbitrary filter structure, the output current of Eq. (11-2), $I_{out}$, is only the linear combination of the following multiple output currents: $I_{out(n)}$, $I_{out(n-2)}$, $I_{out(n-4)}$ ... $I_{out(4)}$, $I_{out(2)}$, and $I_{out(0)}$, and is not relevant to $I_{out(n-1)}$, $I_{out(n-3)}$, $I_{out(n-5)}$ ... $I_{out(5)}$, $I_{out(3)}$, and $I_{out(1)}$. Then, we can realize the following filter transfer function of FIG. 11-1(a) and let $I_{out}=I_{out(n)}+I_{out(n-2)}+I_{out(n-4)}+\ldots+I_{out(4)}+I_{out(2)}+I_{out(0)}$.

$$I_{out} = \sum_{i=0}^{n} I_{out(i)} \quad (11\text{-}4)$$

-continued $$= \frac{b_n I_{in} s^n + a_{n-1} I_{in} s^{n-1} + b_{n-2} I_{in} s^{n-2} + a_{n-3} I_{in} s^{n-3} + \ldots + b_2 I_{in} s^2 + a_1 I_{in} s + a_0 I_{in}}{a_n s^n + a_{n-1} s^{n-1} + a_{n-2} s^{n-2} + a_{n-3} s^{n-3} + \ldots + a_2 s^2 + a_1 s + a_0}$$ 5 where n is a positive even integer. Eq. (11-4) can be re-written as:

$$I_{out(0)} = \frac{a_0 I_{in}}{\Delta};$$ (11-5)

$$I_{out(i)} = \frac{a_i I_{in} s^i}{\Delta} \text{ for } i = 1, 3, 5, \ldots, n-3 \cdot n-1;$$

$$I_{out(i)} = \frac{b_i I_{in} s^i}{\Delta} \text{ for } i = 2, 4, 6, \ldots, n-2, n;$$

where $$\Delta = a_n s^n + a_{n-1} s^{n-1} + a_{n-2} s^{n-2} + \ldots + a_2 s^2 + a_1 s + a_0$$

Letting n=4 for FIG. 11-1(*a*), a fourth-order elliptic filter shown in FIG. 11-1(*b*) whose transfer function is $$\frac{I_{out}}{I_{in}} = \frac{s^4 b_4 + s^2 b_2 + a_0}{s^4 a_4 + s^3 a_3 + s^2 a_2 + s a_1 + a_0}$$ (11-6)

From Equations (11-1) and (11-3), the sensitivities of the fourth-order arbitrary and elliptic filter transfer functions to individual capacitance and trans-conductance are $$S_{C_1}^H = \left( \frac{s^4 b_4 + s^3 b_3 + s^2 b_2 + sb}{s^4 b_4 + s^3 b_3 + s^2 b_2 + sb_1 + a_0} \right) - \left( \frac{s^4 a_4 + s^3 a_3 + s^2 a_2 + sa_1}{s^4 a_4 + s^3 a_3 + s^2 a_2 + sa_1 + a_0} \right)$$ (11-7)

$$S_{C_2}^H = \left( \frac{s^4 b_4 + s^3 b_3 + s^2 b_2}{s^4 b_4 + s^3 b_3 + s^2 b_2 + sb_1 + a_0} \right) - \left( \frac{s^4 a_4 + s^3 a_3 + s^2 a_2}{s^4 a_4 + s^3 a_3 + s^2 a_2 + sa_1 + a_0} \right)$$

$$S_{C_3}^H = \left( \frac{s^4 b_4 + s^3 b_3}{s^4 b_4 + s^3 b_3 + s^2 b_2 + sb_1 + a_0} \right) - \left( \frac{s^4 a_4 + s^3 a_3}{s^4 a_4 + s^3 a_3 + s^2 a_2 + sa_1 + a_0} \right)$$

$$S_{C_4}^H = \left( \frac{s^4 b_4}{s^4 b_4 + s^3 b_3 + s^2 b_2 + sb_1 + a_0} \right) - \left( \frac{s^4 a_4}{s^4 a_4 + s^3 a_3 + s^2 a_2 + sa_1 + a_0} \right)$$

$$S_{ga4}^H = -\left( \frac{s^4 a_4}{s^4 a_4 + s^3 a_3 + s^2 a_2 + sa_1 + a_0} \right)$$

$$S_{ga3}^H = -\left( \frac{s^3 a_3}{s^4 a_4 + s^3 a_3 + s^2 a_2 + sa_1 + a_0} \right)$$

$$S_{ga2}^H = -\left( \frac{s^2 a_2}{s^4 a_4 + s^3 a_3 + s^2 a_2 + sa_1 + a_0} \right)$$

$$S_{ga1}^H = -\left( \frac{sa_1}{s^4 a_4 + s^3 a_3 + s^2 a_2 + sa_1 + a_0} \right)$$

$$S_{ga0}^H = \left( \frac{a_0}{s^4 b_4 + s^3 b_3 + s^2 b_2 + sb_1 + a_0} \right) - \left( \frac{a_0}{s^4 a_4 + s^3 a_3 + s^2 a_2 + sa_1 + a_0} \right)$$

$$S_{gb4}^H = 1 - \left( \frac{s^3 a_3 + s^2 a_2 + sa_1 + a_0}{s^4 a_4 + s^3 a_3 + s^2 a_2 + sa_1 + a_0} \right)$$

$$S_{gb3}^H = \left( \frac{s^3 b_3 + s^2 b_2 + sb_1 + a_0}{s^4 b_4 + s^3 b_3 + s^2 b_2 + sb_1 + a_0} \right) - \left( \frac{s^2 a_2 + sa_1 + a_0}{s^4 a_4 + s^3 a_3 + s^2 a_2 + sa_1 + a_0} \right)$$

$$S_{gb2}^H = \left( \frac{s^2 b_2 + sb_1 + a_0}{s^4 b_4 + s^3 b_3 + s^2 b_2 + sb_1 + a_0} \right) - \left( \frac{sa_1 + a_0}{s^4 a_4 + s^3 a_3 + s^2 a_2 + sa_1 + a_0} \right)$$

$$S_{gb1}^H = \left( \frac{sb_1 + a_0}{s^4 b_4 + s^3 b_3 + s^2 b_2 + sb_1 + a_0} \right) - \left( \frac{a_0}{s^4 a_4 + s^3 a_3 + s^2 a_2 + sa_1 + a_0} \right) \text{ and}$$

$$S_{C_1}^H = \left( \frac{s^4 b_4 + s^2 b_2}{s^4 b_4 + s^2 b_2 + a_0} \right) - \left( \frac{s^4 a_4 + s^3 a_3 + s^2 a_2 + sa_1}{s^4 a_4 + s^3 a_3 + s^2 a_2 + sa_1 + a_0} \right)$$ (11-8)

$$S_{C_2}^H = \left( \frac{s^4 b_4 + s^2 b_2}{s^4 b_4 + s^2 b_2 + a_0} \right) - \left( \frac{s^4 a_4 + s^3 a_3 + s^2 a_2}{s^4 a_4 + s^3 a_3 + s^2 a_2 + sa_1 + a_0} \right)$$

$$S_{C_3}^H = \left( \frac{s^4 b_4}{s^4 b_4 + s^2 b_2 + a_0} \right) - \left( \frac{s^4 a_4 + s^3 a_3}{s^4 a_4 + s^3 a_3 + s^2 a_2 + sa_1 + a_0} \right)$$

$$S_{C_4}^H = \left( \frac{s^4 b_4}{s^4 b_4 + s^2 b_2 + a_0} \right) - \left( \frac{s^4 a_4}{s^4 a_4 + s^3 a_3 + s^2 a_2 + sa_1 + a_0} \right)$$

$$S_{ga4}^H = -\left( \frac{s^4 a_4}{s^4 a_4 + s^3 a_3 + s^2 a_2 + sa_1 + a_0} \right)$$

$$S_{gb4}^H = 1 - \left( \frac{s^3 a_3 + s^2 a_2 + sa_1 + a_0}{s^4 a_4 + s^3 a_3 + s^2 a_2 + sa_1 + a_0} \right)$$

$$S_{ga3}^H = \left( \frac{s^2 b_2 + a_0}{s^4 b_4 + s^2 b_2 + a_0} \right) - \left( \frac{s^3 a_3 + s^2 a_2 + sa_1 + a_0}{s^4 a_4 + s^3 a_3 + s^2 a_2 + sa_1 + a_0} \right)$$

$$S_{ga2}^H = -\left( \frac{s^2 a_2}{s^4 a_4 + s^3 a_3 + s^2 a_2 + sa_1 + a_0} \right)$$

$$S_{gb2}^H = \left( \frac{s^2 b_2 + a_0}{s^4 b_4 + s^2 b_2 + a_0} \right) - \left( \frac{sa_1 + a_0}{s^4 a_4 + s^3 a_3 + s^2 a_2 + sa_1 + a_0} \right)$$

-continued $$S_{ga1}^H = \left(\frac{a_0}{s^4 b_4 + s^2 b_2 + a_0}\right) - \left(\frac{sa_1 + a_0}{s^4 a_4 + s^3 a_3 + s^2 a_2 + sa_1 + a_0}\right)$$

$$S_{ga0}^H = \left(\frac{a_0}{s^4 b_4 + s^2 b_2 + a_0}\right) - \left(\frac{a_0}{s^4 a_4 + s^3 a_3 + s^2 a_2 + sa_1 + a_0}\right)$$

respectively. Obviously, all sensitivities of the transfer function to each individual capacitance and transconductance have the absolute value smaller than unity and are very low. Moreover, we can find that in Eq. (11-7), $$S_{C_1}^H + S_{g_{a0}}^H = 0, S_{C_2}^H + S_{g_{a1}}^H + S_{g_{b1}}^H = 0, S_{g_{b1}}^H = 0, S_{C_3}^H + S_{g_{a2}}^H + S_{g_{a2}}^H + S_{g_{b2}}^H = 0,$$

$$S_{C_4}^H + S_{g_{a3}}^H + S_{g_{b3}}^H = 0, S_{g_{b4}}^H + S_{g_{a4}}^H = 0,$$

$$S_{C_1}^H + S_{C_2}^H + S_{C_3}^H + S_{C_4}^H + S_{g_{b1}}^H + S_{g_{b2}}^H + S_{g_{b3}}^H + S_{g_{b4}}^H + S_{g_{a4}}^H + S_{g_{a3}}^H + S_{g_{a2}}^H + S_{g_{a1}}^H + S_{g_{a0}}^H = 0. \quad (11-9)$$

And in Eq. (11-8), $$S_{C_1}^H + S_{g_{a0}}^H = 0, S_{C_2}^H + S_{g_{a1}}^H = 0, S_{C_3}^H + S_{g_{a2}}^H + S_{g_{b2}}^H = 0, S_{C_4}^H + S_{g_{a3}}^H = 0, S_{g_{b4}}^H + S_{g_{a4}}^H = 0,$$

$$S_{C_1}^H + S_{C_2}^H + S_{C_3}^H + S_{C_4}^H + S_{g_{b2}}^H + S_{g_{b4}}^H + S_{g_{a4}}^H + S_{g_{a3}}^H + S_{g_{a2}}^H + S_{g_{a1}}^H + S_{g_{a0}}^H = 0. \quad (11-10)$$

Both Eqs. (11-9) and (11-10) mean that, in addition to the null sum of sensitivities of each group such as Parts I, II, III, IV and V, in FIG. 11-1(*b*), the total of all sensitivities is also zero. In other words, if some group components have the same variation increment, the total of those incorporated sensitivities vanishes. Both very low individual sensitivities and null group sensitivities lead to the merit of low sensitivity performance which has been achieved by the well-known doubly terminated LC ladder networks.

0.35 μm process H-spice simulations are used to validate the theoretical predictions as follows. We use the CMOS implementation of a transconductor [16] with ±1.65V supply voltages and W/L=5μ/1μ and 10μ/1μ for NMOS and PMOS transistors, respectively. The component values shown in the fourth-order elliptic filter transfer function of Eq. (11-6) with the coefficients $a_4=1$, $a_3=1.027668$, $a_2=1.799331$, $a_1=1.014238$, $a_0=0.681768$, $b_4=0.121410$, and $b_2=0.684853$, are given by $C_1=25$ pF, $C_2=17$ pF, $C_3=17$ pF, $C_4=3.5$ pF and $g_{b_4}=15$ μS, $g_{b_2}=71.1464274796$ μS, $g_{a_4}=123.548775$ μS, $g_{a_3}=186.049157$ μS, $g_{a_2}=186.924704$ μS, $g_{a_1}=158.106928$ μS, and $g_{a_0}=105.535052$ μS. The simulated amplitude-frequency response with $f_{3db}=1.05324$ MHz has shown in FIG. 11-1© validating theoretical prediction very well. Moreover, the sensitivity simulations with +0.5% $g_{b_4}$, +0.5% $g_{a_4}$, and both +0.5% $g_{b_4}$ and +0.5% $g_{a_4}$ tolerances have $f_{3db}=1.050709$ MHz with −0.240401% error, $f_{3db}=1.055695$ MHz with 0.232995% error, $f_{3db}=1.05335$ MHz with 0.011014% error, respectively, shown in FIG. 11-1(*d*), which verify the very low individual and null group sensitivities.

11-2 Current-Mode Even-Nth-Order OTA-Only-Without-C Arbitrary and Elliptic Filter Structure Note that the current-mode even-nth-order OTA-C arbitrary filter structure shown in FIGS. 11-1 and 11-1(*a*) achieve the three important criteria for the design of OTA-C filters: (i) use of 2n+1 and (3n+2)/2 single-ended-input OTAs, (ii) use of n grounded capacitors, and (iii) the least active and passive component count when compared with the previous work. Especially, two requirements, (i) only n internal nodes except the input node in the filter structure, and (ii) one grounded capacitor at each internal node except the input node and no extra capacitors used in the synthesized filter structure, are part of the criteria. The main goal of the present invention, to form a high-frequency (about 5 MHz to 5 GHz) circuit when removing all of the capacitors from the synthesized OTA-C filter structure. The collateral OTA-only-without-C filter structures are shown in FIGS. 11-2 and 11-2(*a*). FIG. 11-2(*b*) is the fourth-order one of FIG. 11-2(*a*).

0.35 μm process H-spice simulations are used to validate the theoretical predictions as follows. We use the CMOS implementation of a transconductor [16] with +1.65V supply voltages and W/L=5μ/1μ and 10μ/1μ for NMOS and PMOS transistors, respectively. The component values of the fourth-order elliptic filter shown in FIG. 11-2© are given by (*i*) $g_0=0.3197$ μS ($I_{abc}=0.2$ μA), $g_1=116.5$ μS ($I_{abc}=21$ μA), $g_2=3.697$ μS ($I_{abc}=1$ μA), $g_3=73.25$ μS ($I_{abc}=11$ μA), $g_4=24.9$ μS ($I_{abc}=3.5$ μA), $g_5=42.79$ μS ($I_{abc}=6$ μA), $g_6=105.3$ μS ($I_{abc}=18$ μA); and (ii) $g_0=23.68$ μS ($I_{abc}=10$ μA), $g_1=61.503$ μS ($I_{abc}=21$ μA), $g_2=23.68$ μS ($I_{abc}=10$ μA), $g_3=3.5045$ μS ($I_{abc}=2$ μA), $g_4=143.4$ μS ($I_{abc}=60$ μA), $g_5=114.23$ μS ($I_{abc}=6$ μA), $g_6=57.814$ μS ($I_{abc}=20$ μA). The simulated amplitude-frequency responses with $f_{3db}=30.5$ MHz and 129 MHz have shown in FIGS. 11-2(*d*) and (*e*) validating theoretical prediction.

12.1 Current-Mode Even-Nth-Order OTA-C Elliptic Filter Structure with the Minimum Components To observe the minimum variables required in the synthesis, let us give insight into the following fourth-order elliptic filter transfer function.

$$\frac{I_{out}}{I_{in}} = \frac{b_4 s^4 + b_2 s^2 + b_0}{s^4 + a_3 s^3 + a_2 s^2 + a_1 s + a_0} \quad (21-1)$$

We can do the derivations from Eq. (12-1) as either $$\frac{(b_0/a_0)(b_4 s^4 + b_2 s^2 + b_0)}{(b_0/a_0)s^4 + (b_0 a_3/a_0)s^3 + (b_0 a_2/a_0)s^2 + (b_0 a_1/a_0)s + b_0} \quad \text{or} \quad (12-2)$$

$$\frac{b_4[s^4 + (b_2/b_4)s^2 + (b_0/b_4)]}{s^4 + a_3 s^3 + a_2 s^2 + a_1 s + a_0} \quad (12-3)$$

If we neglect the gains, $b_o/a_o$ and $b_4$, in the numerators, and taking into account the dimension, it seems Eq. (12-3) may enable the use of one fewer transconductor than Eq. (12-2). The analytical synthesis of Eq. (12-3) only requires six transconductances plus four capacitors. This component count may become the minimum. Thus we prefer to adopt Eq. (12-3) as the realized transfer function for the current-mode fourth-order elliptic filter. Practically realizing the Eq. (12-3) with the minimum components is a rather difficulty. However, as we can use the easy subtraction of current-mode signals, the realization for Eq. (12-3) without the gain, $b_4$, may be obtained by the following operation:

$$1 - \frac{a_3 s^3 + b_2 s^2 + a_1 s + b_0}{s^4 + a_3 s^3 + a_2 s^2 + a_1 s + a_0} \quad (12-4)$$

$$= \frac{s^4 + (a_2 - b_2)s^2 + (a_0 - b_0)}{s^4 + a_3 s^3 + a_2 s^2 + a_1 s + a_0}$$

$$= \frac{s^4 + b_2' s^2 + b_0'}{s^4 + a_3 s^3 + a_2 s^2 + a_1 s + a_0}$$

Therefore, in our analytical synthesis method, we first synthesize the following transfer function:

$$\frac{I_{out}}{I_{in}} = \frac{a_3 s^3 + b_2 s^2 + a_1 s + b_0}{s^4 + a_3 s^3 + a_2 s^2 + a_1 s + a_0} \quad (12\text{-}5)$$

Followed by the current subtraction shown in Eq. (12-4), we make $I_{in} - I_{out}$ be equal to $I^*_{out}$, which becomes our desired output, namely, $$I'_{out} = I_{in} - I_{out} = I_{in} - \frac{a_3 s^3 + b_2 s^2 + a_1 s + b_0}{s^4 + a_3 s^3 + a_2 s^2 + a_1 s + a_0} I_{in} \quad (12\text{-}6)$$

The realized fourth-order elliptic filter presented in this paper, using both this advantage of current-mode signals and the effective Analytical Synthesis method employs six single-value and single-ended-input OTAs (equivalent to only four multiple-transconductance-value and single-ended-input OTAs) plus four grounded capacitors, that is, the minimum active and passive components. Since it is desired for designers to realize not only 4th-order but high-order elliptic filters, the synthesis of high-order OTA-C elliptic filter structure is primarily presented with an equal capacitance form good for the precise fabrication of integrated circuits. Based upon the explanation from Eq. (12-1) to Eq. (12-6), the succession of innovative algebraic manipulations shown in this section begins with the following transfer function $$\frac{I_{out}}{I_{in}} = \frac{\begin{array}{c} a_{n-1} s^{n-1} + b_{n-2} s^{n-2} + a_{n-3} s^{n-3} + b_{n-4} s^{n-4} + \ldots + \\ b_2 s^2 + a_1 s + b_0 \end{array}}{\begin{array}{c} s^{n-1} + a_{n-2} s^{n-2} + a_{n-3} s^{n-3} + a_{n-4} s^{n-4} + \ldots + \\ a_2 s^2 + a_1 s + a_0 \end{array}} \quad (12\text{-}7)$$

where n is an even integer.

We divide it into n parts as below.

$$I_{out} = I_{out(n-1)} + I_{out(n-2)} + I_{out(n-3)} + \ldots + \quad (12\text{-}8)$$
$$I_{out(2)} + I_{out(1)} + I_{out(0)}$$

$$= \frac{\begin{array}{c} a_{n-1} I_{in} s^{n-1} + b_{n-2} I_{in} s^{n-2} + a_{n-3} I_{in} s^{n-3} + \\ b_{n-4} I_{in} s^{n-4} + \ldots + b_2 I_{in} s^2 + a_1 I_{in} s + b_0 I_{in} \end{array}}{\begin{array}{c} s^n + a_{n-1} s^{n-1} + a_{n-2} s^{n-2} + \\ a_{n-3} s^{n-3} + \ldots + a_2 s^2 + a_1 s + a_0 \end{array}} \text{ where}$$

$$I_{out(i)} = \frac{a_i I_{in} s^i}{\Delta} \text{ for } i = 1, 3, 5, \ldots, n-3, n-1; \quad (12\text{-}9a)$$

$$I_{out(i)} = \frac{b_i I_{in} s^i}{\Delta} \text{ for } i = 0, 2, 4, 6, \ldots, n-4, n-2; \text{ and} \quad (12\text{-}9b)$$

$$\Delta = s^n + a_{n-1} s^{n-1} + a_{n-2} s^{n-2} + a_{n-3} s^{n-3} + \ldots + a_1 s + a_0$$

Note that the real output current $$I'_{out} = I_{in} - I_{out(n-1)} - I_{out(n-2)} - \ldots - I_{out(2)} - I_{out(1)} - I_{out(0)} \quad (12\text{-}10)$$

Cross multiplying Eq. (12-9b) as i=0, and re-arranging, we obtain $$I_{out(0)} s^n = \left[ I_{in} - I_{out(0)} \sum_{i=0}^{i=n-1} \frac{a_i s^i}{b_0} \right] b_0 \quad (12\text{-}11)$$

From eq. (12-9a) to (12-9c), we have $$I_{out(0)} = \frac{b_0 I_{in}}{\Delta} \quad (12\text{-}12a)$$

$$I_{out(1)} = \frac{a_1 I_{in} s}{\Delta} \quad (12\text{-}12b)$$

$$I_{out(2)} = \frac{b_2 I_{in} s^2}{\Delta} \quad (12\text{-}12c)$$

$$I_{out(3)} = \frac{a_3 I_{in} s^3}{\Delta} \quad (12\text{-}12d)$$

Subsequent to Eqs. (12-12a), (12-12b), (12-12c), (12-12d) . . . , we make Eq. (12-12a) a divisor and each of the rest equations, (12-12b), (12-12c), (12-12d), . . . , a dividend. Then we conclude with $$I_{out(i)} = I_{out(0)} \frac{a_i s^i}{b_0} \text{ for } i = 1, 3, 5, \ldots, n-3, n-1; \quad (12\text{-}13)$$

$$I_{out(i)} = I_{out(0)} \frac{b_i s^i}{b_0} \text{ for } i = 0, 2, 4, 6, \ldots, n-4, n-2.$$

Substituting Eq. (12-13) into Eq. (12-11) gives $$I_{out(0)} s^n = \left[ \begin{array}{c} I_{in} - I_{out(0)} \left( \frac{a_0}{b_0} \right) - I_{out(1)} - I_{out(2)} \left( \frac{a_2}{b_2} \right) - \\ I_{out(3)} - \ldots - I_{out(n-2)} \left( \frac{a_{n-2}}{b_{n-2}} \right) - I_{out(n-1)} \end{array} \right] b_0 \quad (12\text{-}14)$$

From eq. (12-13), we also gain $$I_{out(n-1)} = I_{out(0)} \frac{a_{n-1} s^{n-1}}{b_0} \text{ or } I_{out(0)} = I_{out(n-1)} \frac{b_0}{a_{n-1} s^{n-1}} \quad (12\text{-}15)$$

Making Eq. (12-15) some replacement at the left side of Eq. (12-11) gives the following constraint equation.

$$I_{in} = I_{out(0)} \left( \frac{a_0}{b_0} \right) + I_{out(1)} + I_{out(2)} \left( \frac{a_2}{b_2} \right) + I_{out(3)} + I_{out(4)} \left( \frac{a_4}{b_4} \right) + \quad (12\text{-}16)$$
$$\ldots + I_{out(n-2)} \left( \frac{a_{n-2}}{b_{n-2}} \right) + I_{out(n-1)} + I_{out(n-1)} \left( \frac{s}{a_{n-1}} \right)$$

Eq. (12-16) means that the input current, $I_{in}$, is the summation of the n output currents $$I_{out(0)}\left(\frac{a_0}{b_0}\right), I_{out(1)}, I_{out(2)}\left(\frac{a_2}{b_2}\right), I_{out(3)},$$

$$I_{out(4)}\left(\frac{a_4}{b_4}\right), \ldots, I_{out(n-2)}\left(\frac{a_{n-2}}{b_{n-2}}\right), I_{out(n-1)},$$

and $$I_{out(n-1)}\left(\frac{s}{a_{n-1}}\right),$$

in which the current $$I_{out(i)}\left(\frac{a_i}{b_i}\right)$$

is realized by two OTAs with transconductances, $a_i$ and $b_i$, and the current $$I_{out(n-1)}\left(\frac{s}{a_{n-1}}\right)$$

is realized by an OTA with the transconductance $a_{n-1}$ and a grounded capacitor with capacitance 1.

In order to make the connection between the n output currents, we now look back to Eqs. (12-12a) to (12-12d) . . . , etc. In those equations, we start making each equation, (e.g. Eq. (12-12a)), divide its next equation, (e.g. Eq. (12-12b), so as to obtain Eq. (12-17) and the general form, Eq. (12-18). The realization of each equation in Eq. (12-18) is an integrator. Eq. (12-17) is realized as the first integrator constructed by the OTA with transconductance $(b_0/a_1)$ and the grounded capacitor with unity capacitance.

$$I_{out(0)} = I_{out(1)}\frac{b_0}{a_1 s} = I_{out(1)}\frac{(b_0/a_1)}{s} \quad (12\text{-}17)$$

$$I_{out(i)} = I_{out(i+1)}\frac{(b_i/a_{i+1})}{s} \text{ for } i = 0, \quad (12\text{-}18)$$

$2, 4, 6, \ldots, n-4, n-2;$ $$I_{out(i)} = I_{out(i+1)}\frac{(a_i/b_{i+1})}{s} \text{ for } i = 1,$$

$3, 5, \ldots, n-5, n-3.$

The similar construction for each one in Eq. (12-18) to that for Eq. (12-17) may form the successive n–1 integrators of the low part of FIG. 12-1 starting from right to left. The linkage of these blocks generated from Eqs. (12-16), (12-17), (12-18) is shown in FIG. 12-1, in which the real output current I'$_{out}$ is the sum of the input current and the inverse multiple output currents, i.e., $I_{in}$, $-I_{out(n-1)}$, $-I_{out(n-2)}$, . . . , $-I_{out(1)}$, and $-I_{out(0)}$.

Figures 1, 12:
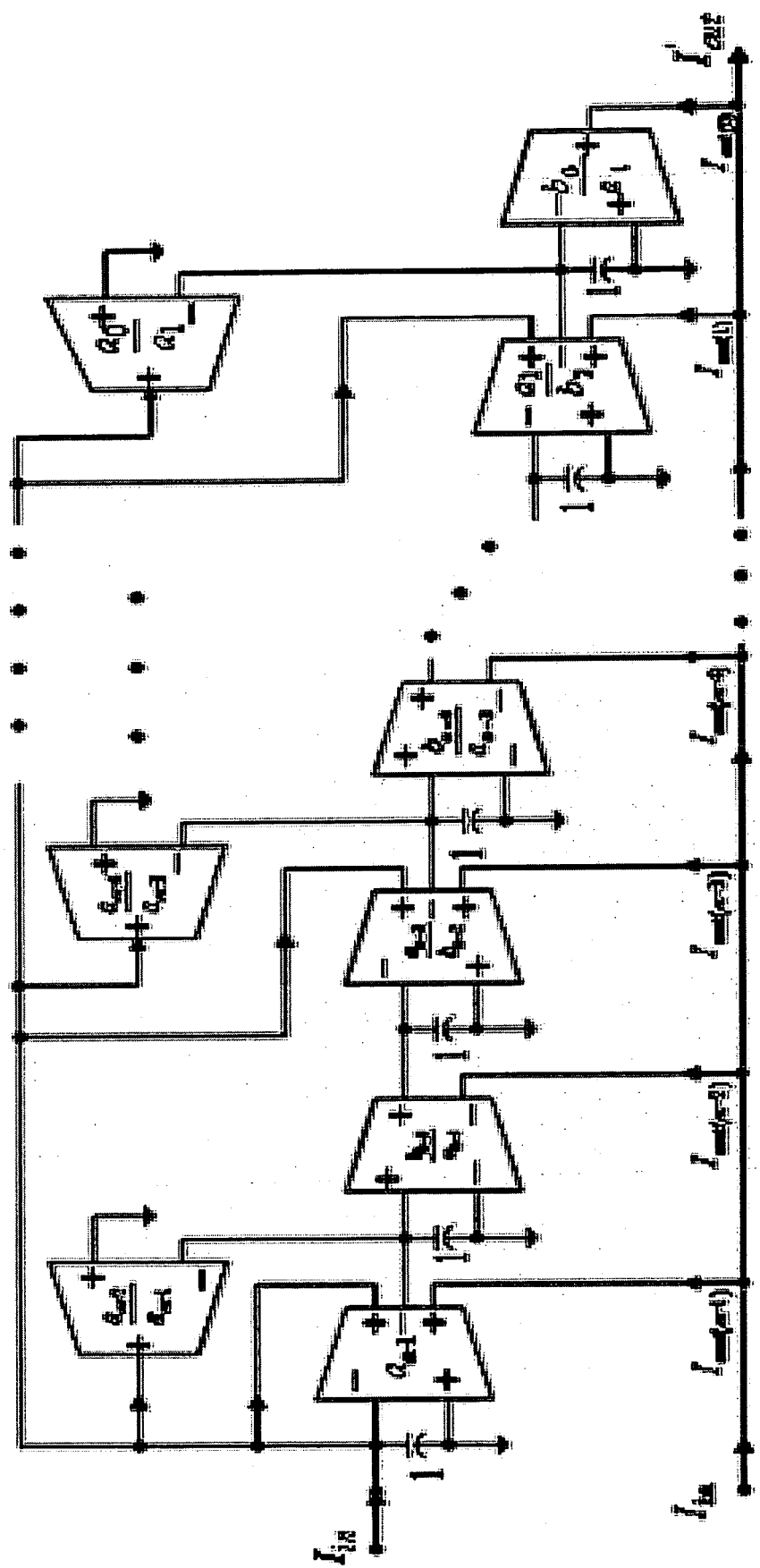
Figures 1A, 12:
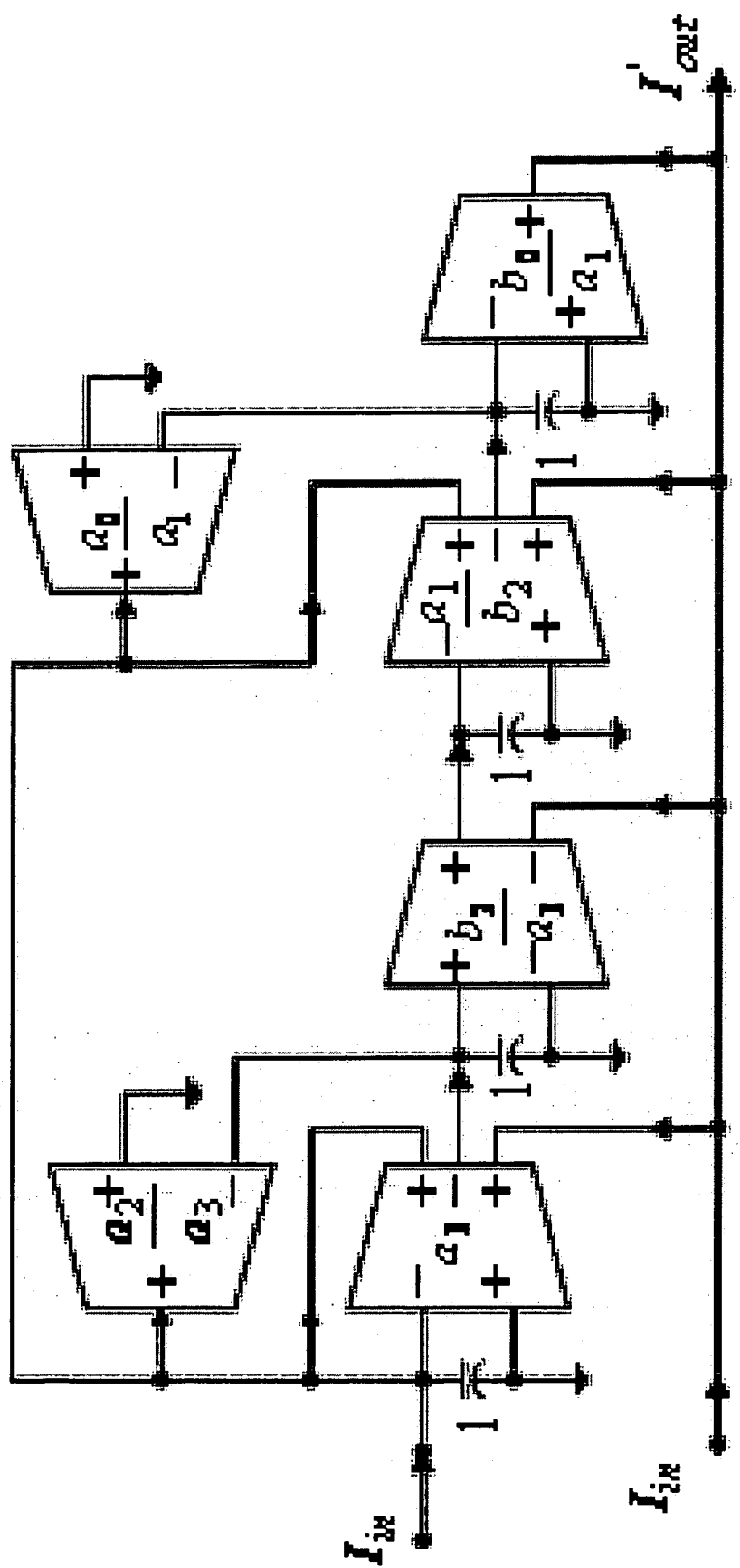
Figures 1B, 12:
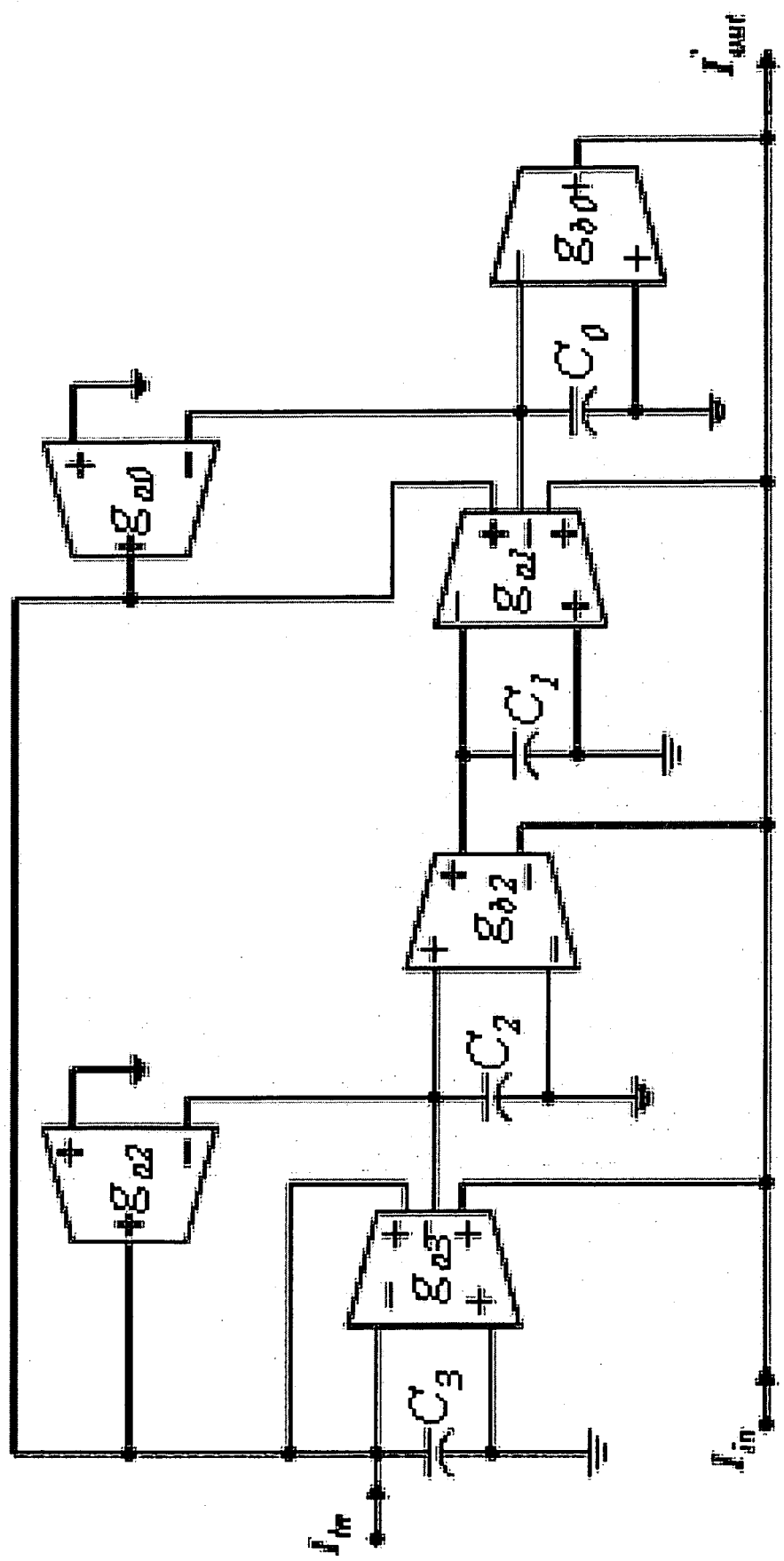
Figures 1C, 12:
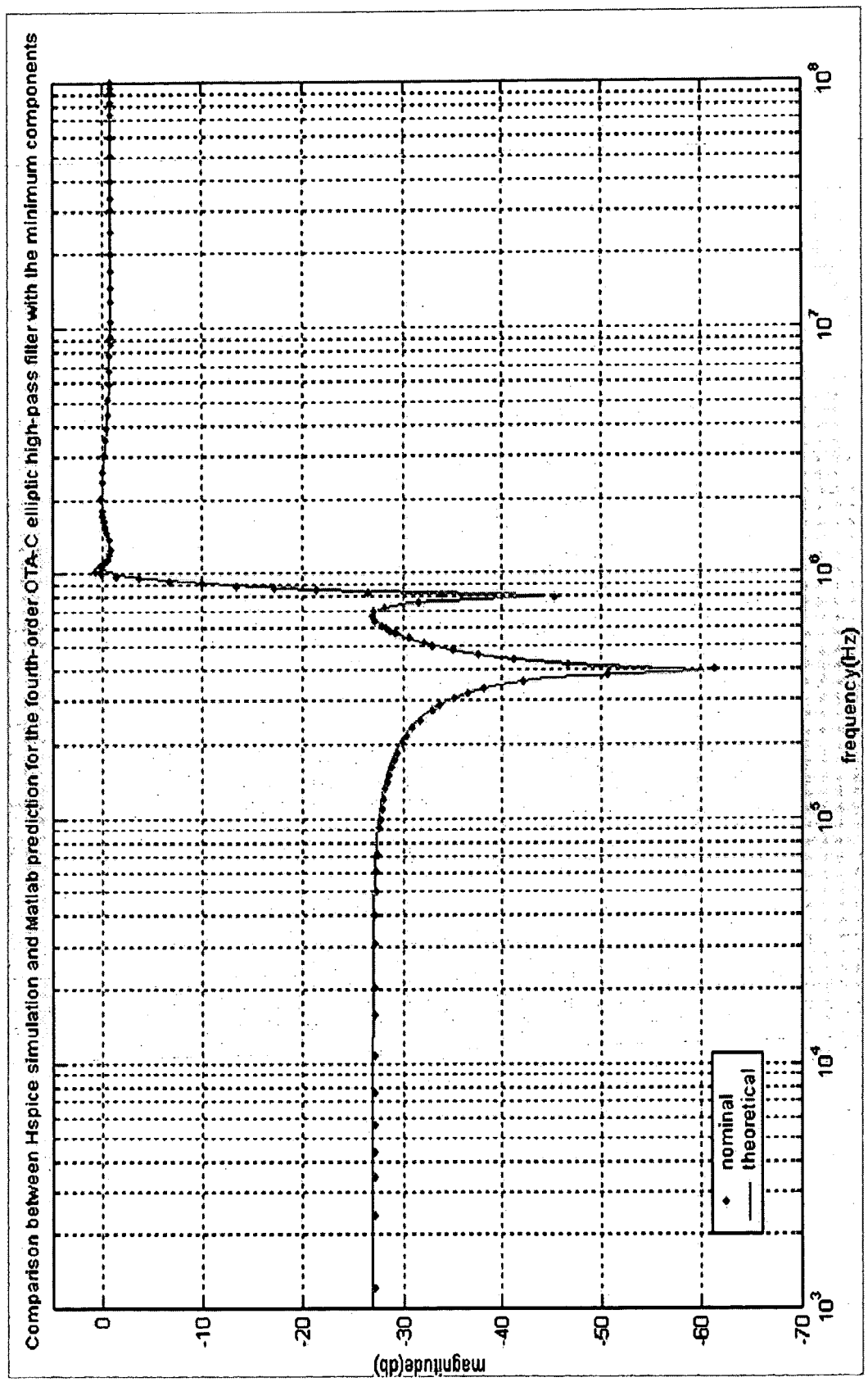
Figures 1D, 12:
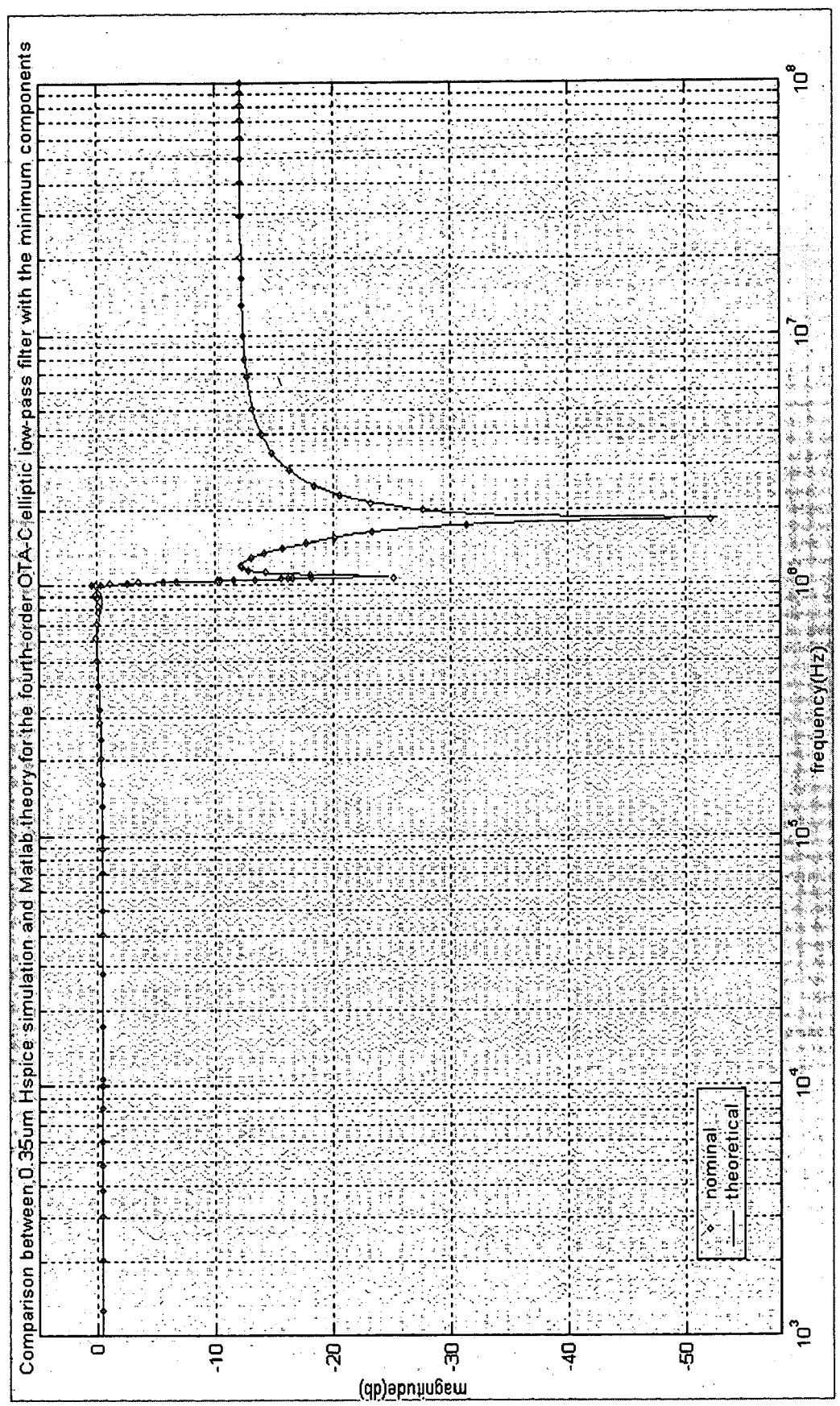
Figures 2, 12:
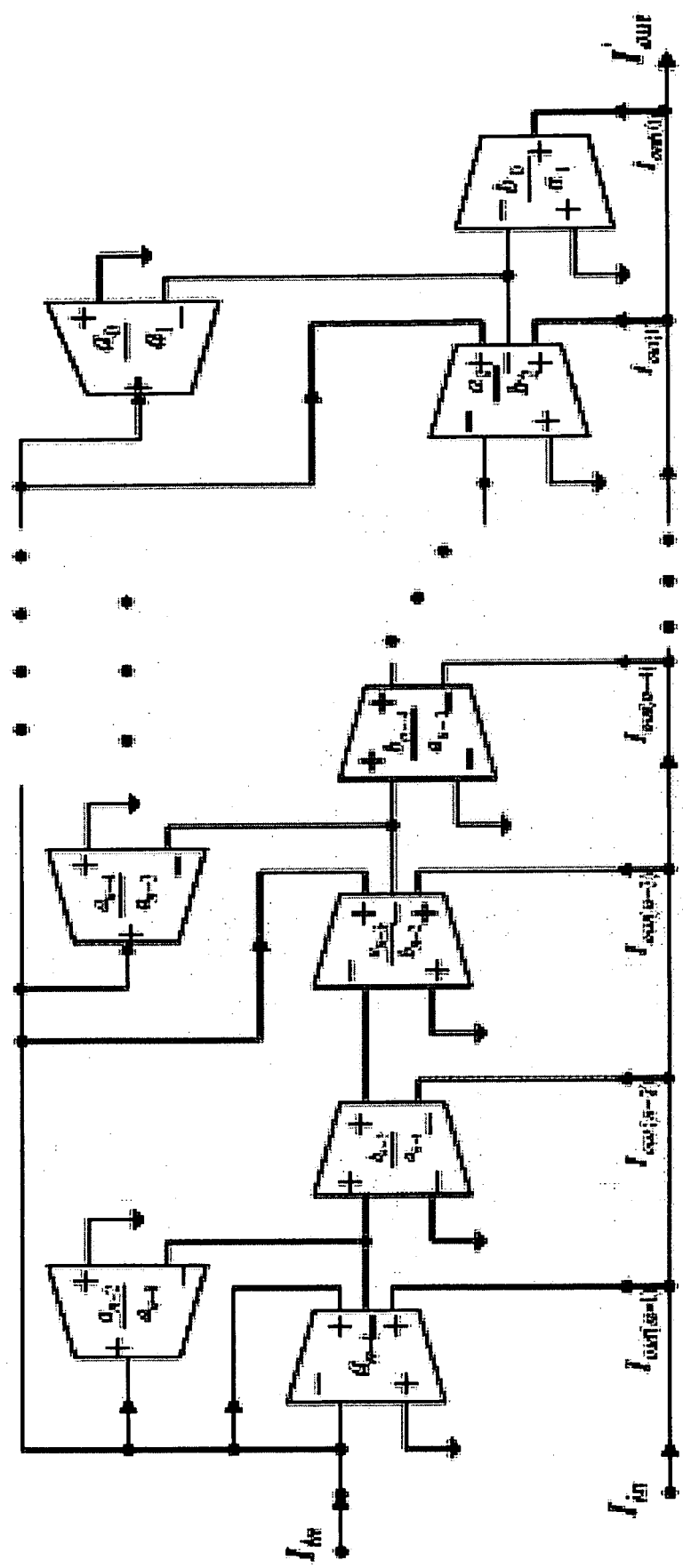
Figures 2A, 12:
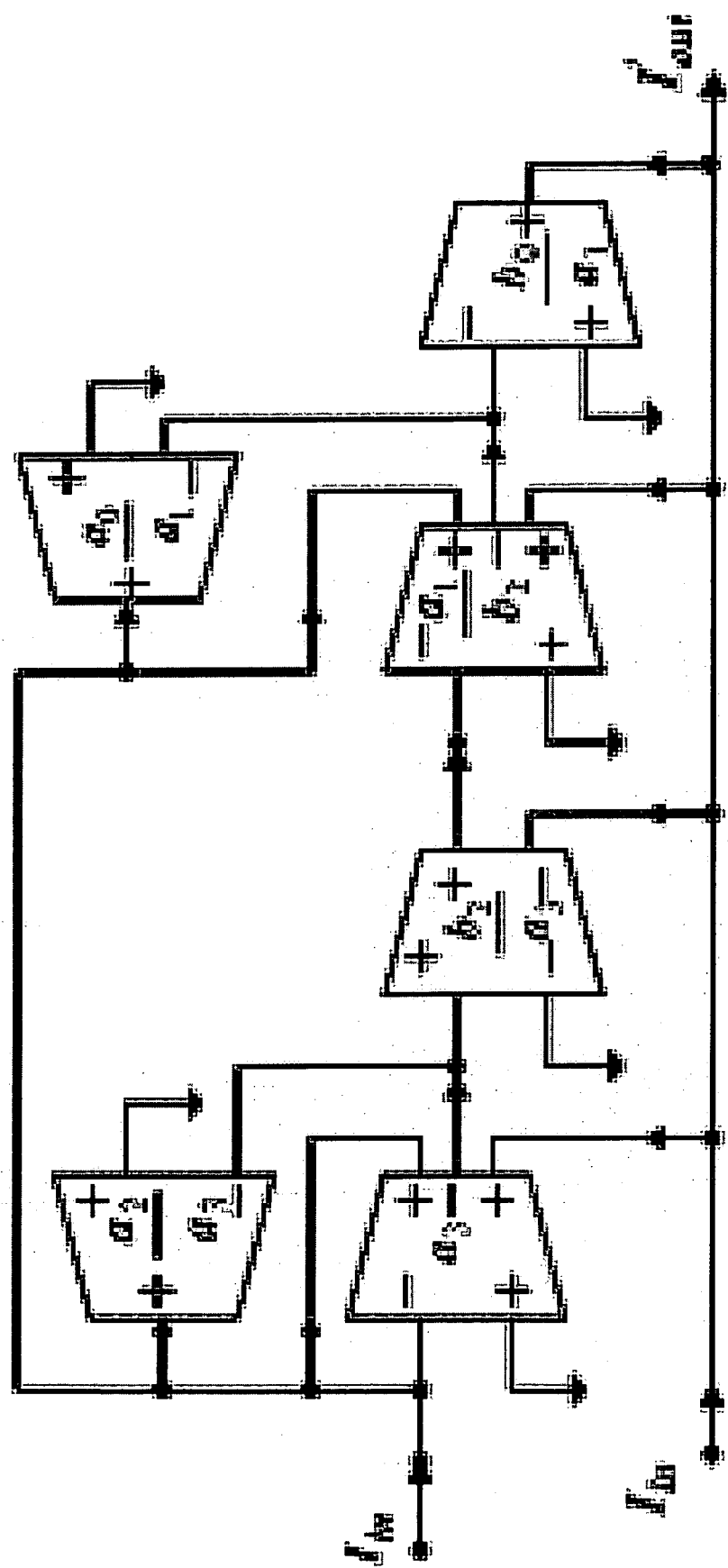
Figures 2B, 12:
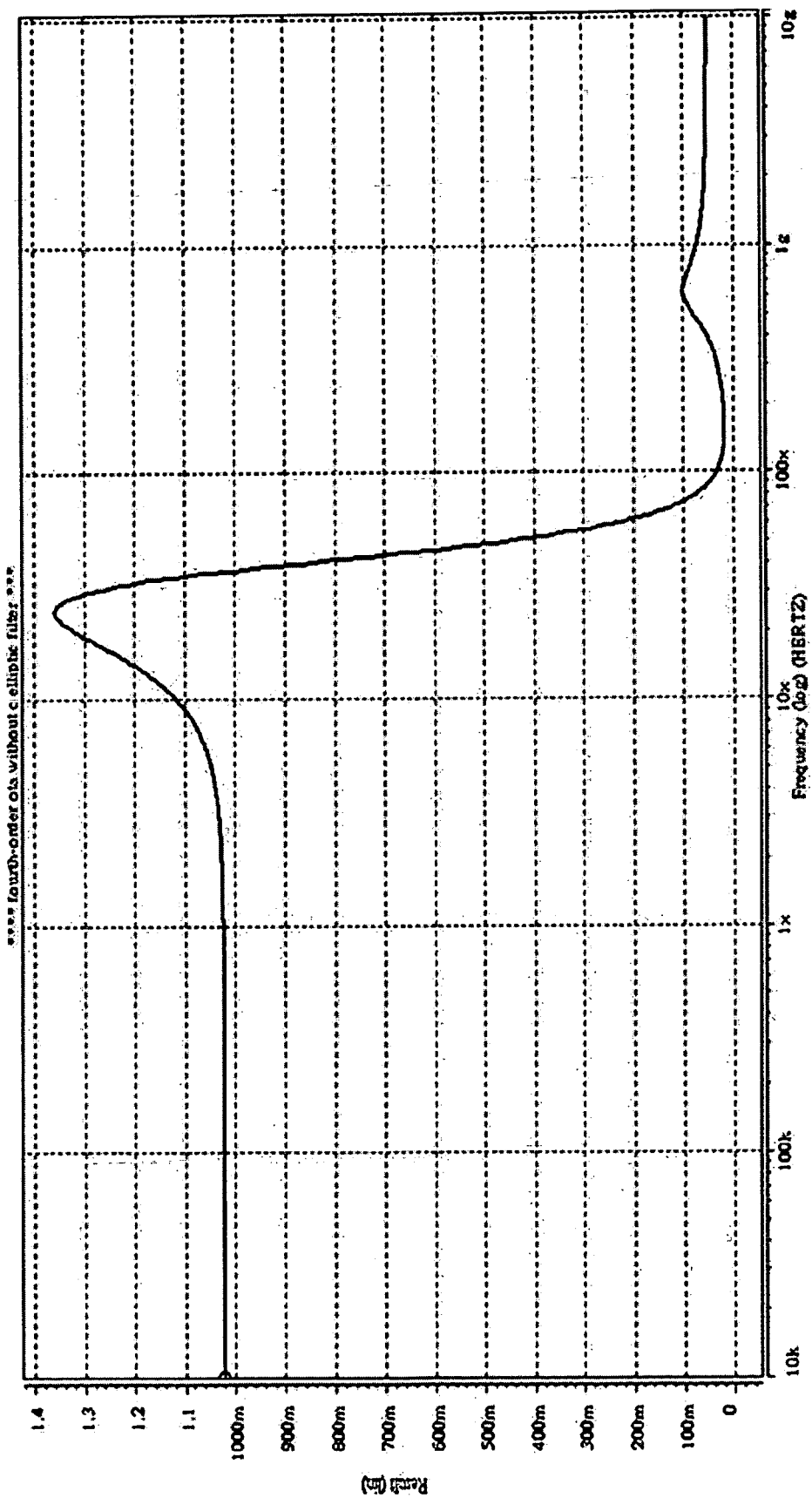

Note that the filter structure shown in FIG. 12-1 uses all single-ended-input OTAs, all grounded capacitors, and the minimum active and passive component count. Moreover, the equal capacitance value avoids the difficulty of fabricating capacitors with different and non-ratio capacitances in the IC.

To illustrate the synthesis method, consider the structure generation of a fourth-order elliptic filter. For n=4, the method uses five equations, (12-10), (12-16), (12-17), and (12-18) show as follows.

$$I'_{out} = I_{in} - I_{out(3)} - I_{out(2)} - I_{out(1)} - I_{out(0)};$$

$$I_{in} = I_{out(0)}\left(\frac{a_0}{b_0}\right) + I_{out(1)} + I_{out(2)}\left(\frac{a_2}{b_2}\right) + I_{out(3)}\left(\frac{s}{a_3}\right)$$

$$I_{out(0)} = I_{out(1)}\frac{(b_0/a_1)}{s}; I_{out(1)} = I_{out(2)}\frac{(a_1/b_2)}{s};$$

$$I_{out(2)} = I_{out(3)}\frac{(b_2/a_3)}{s}$$

Implementing the above equations using six single-value and single-ended-input OTAs and four grounded capacitors, the fourth-order OTA-C elliptic filter is shown in FIG. 12-1(a) with the following transfer function.

$$\frac{I'_{out}}{I_{in}} = \frac{s^4 + (a_2 - b_2)s^2 + (a_0 - b_0)}{s^4 + a_3 s^3 + a_2 s^2 + a_1 s + a_0} \quad (12\text{-}19)$$

Note that the current-mode even-nth-order OTA-C elliptic filter structure shown in FIG. 12-1 achieves the three important criteria for the design of OTA-C filters: (i) use of (3n/2) single-ended-input OTAs, (ii) use of n grounded capacitors, and (iii) the least active and passive component count when compared with the previous work. Especially, two requirements, (i) only n internal nodes except the output node in the filter structure and (ii) one grounded capacitor at each internal node except the output node and no extra capacitors used in the synthesized filter structure, are part of the criteria The main goal of the present invention is to form a high-frequency (about 5 MHz to 5 GHz) circuit when removing all of the capacitors from the synthesized OTA-C filter structure. The collateral OTA-only-without-C filter structure is shown in FIG. 12-2. FIG. 12-2(a) is the fourth-order one of FIG. 12-2.

By the way, the filter structure can be proved to enjoy low sensitivity merit like that in Section 11-1.

H-spice simulator with 0.35 µm process is used to validate the theoretical prediction as follows. With the CMOS implementation of the transconductor [16] and ±1.65 V supply voltages, we apply W/L=10µ/0.5µ to NMOS and W/L=5µ/0.5µ to NMOS transistors for high-pass filter simulation and W/L=10µ/0.35µ to PMOS and 5µ/0.35µ to PMOS transistors for low-pass one. The component values for realizing the fourth-order elliptic high-pass and low-pass filter functions, $$\frac{I'_{out}}{I_{in}} = \frac{s^4 + 0.796633s^2 + 0.102177}{s^4 + 1.818459s^3 + 3.327436s^2 + 1.965233s + 2.059454}$$

$$\frac{I'_{out}}{I_{in}} = \frac{s^4 + 4.466000s^2 + 3.821228}{s^4 + 1.087817s^3 = 2.071689s^2 + 1.124340s + 0.987471},$$

respectively, are shown in Table 12-I (referring to FIG. 12-1(b)). Note the realized filters also fit the capacitances with the fixed ratio such as 25 pF:40 pF=5:8 given in the low-pass case. The simulated high-pass and low-pass amplitude-frequency responses are shown in FIG. 12-1(c) and (d), respectively, with a very close agreement with the theoretical requirements. The simulated nominal and theoretical data for $f_p$, $f_s$, the maximum attenuation in the pass-band $A_1$, the minimum attenuation in the stop-band $A_2$, and the peak value $P_k$ are shown in Table 12-II.

TABLE 12-I

Component values for the high-pass and low-pass filtering simulations

| Component values for the high-pass simulation | Component values for the low-pass simulation |
|---|---|
| $C_0 = C_1 = C_2 = C_3 = 30$ pF (Equal C) | $C_0 = C_2 = 25$ pF, $C_1 = C_3 = 40$ pF (Fixed-ratio C) |
| $g_{a3} = 342.77$ uS ($I_b = 85.53$ uA) | $g_{a3} = 273.40$ uS ($I_b = 38.98$ uA) |
| $g_{a2} = 344.91$ uS ($I_b = 87.21$ uA) | $g_{a2} = 299.15$ uS ($I_b = 45.43$ uA) |
| $g_{a1} = 146.37$ uS ($I_b = 17.66$ uA) | $g_{a1} = 118.02$ uS ($I_b = 11.94$ uA) |
| $g_{a0} = 197.53$ uS ($I_b = 27.83$ uA) | $g_{a0} = 137.96$ uS ($I_b = 14.56$ uA) |
| $g_{b2} = 262.33$ uS ($I_b = 45.98$ uA) | $g_{b2} = 345.74$ uS ($I_b = 59.45$ uA) |
| $g_{b0} = 187.73$ uS ($I_b = 25.67$ uA) | $g_{b0} = 395.90$ uS ($I_b = 79.30$ uA) |

TABLE 12-II

Comparison between the theoretical and simulated high-pass and low-pass parameter data

| Case | $f_p$(MHz) | $f_s$(MHz) | $A_1$ | $A_2$ | $P_k$ |
|---|---|---|---|---|---|
| Theoretical high-pass | 1.00 | 0.8333 | 0.90 | 0.044651 | 1.00 |
| Simulated high-pass | 0.9830 | 0.8312 | 0.914 | 0.045667 | 1.08 |
| Theoretical low-pass | 1.00 | 1.05 | 0.95 | 0.245492 | 1.00 |
| Simulated low-pass | 1.0087 | 1.0518 | 0.988 | 0.242430 | 1.11 |

Note that the current-mode even-nth-order OTA-C elliptic filter structure shown in FIG. 12-1 achieves the three important criteria for the design of OTA-C filters: (i) use of (3n/2) single-ended-input OTAs, (ii) use of n grounded capacitors, and (iii) the least active and passive component count when compared with the previous work. Especially, two requirements, (i) only n internal nodes except the output node in the filter structure, and (ii) one grounded capacitor at each internal node except the output node and no extra capacitors used in the synthesized filter structure, are part of the criteria. The main goal of the present invention is to form a high-frequency (about 5 MHz to 5 GHz) circuit when removing all of the capacitors from the synthesized OTA-C filter structure. The collateral OTA-only-without-C filter structure is shown in FIG. 12-2. FIG. 12-2(*a*) is the fourth-order one of FIG. 12-2.

0.5 μm process H-spice simulations are used to validate the theoretical predictions as follows. We use the CMOS implementation of a transconductor [16] with ±2.5V supply voltages and W/L=5μ/0.5μ and 10μ/0.5μ for NMOS and PMOS transistors, respectively. The component values are given by $g_1$=340.8 μS ($I_{abc}$=215 μA), $g_2$=1.12 μS ($I_{abc}$=0.5 μA), $g_3$=16.79 μS ($I_{abc}$=2.774 μA), $g_4$=10.34 μS ($I_{abc}$=2 μA), $g_5$=0.1327 μS ($I_{abc}$=0.1 μA), $g_6$=341.4 μS ($I_{abc}$=220 μA). The simulated amplitude-frequency response of the current-mode fourth-order OTA-only-without-C filter shown in FIG. 12-2 (*a*) has shown in FIG. 12-2(*b*) with $f_{3db}$=43.3 MHz validating the theoretical prediction.

13 Tuning Technique for the filtering parameters by using the sensitivity simulation results:

This method can be applied to all analog circuits. A demonstration is shown as follows.

I. Non-Ideal Parasitic Analysis

The error between the simulated and theoretical curves shown in FIG. 8-1(*b*) is due to the non-ideal effects of the third-order OTA-C elliptic filter. Consider its non-ideal effects [9]: (i) the frequency dependent trans-conductance $G_j(s)(=g_j(1-sT_j)$ instead of the trans-conductance g, (ii) input parasitic capacitance $C_{ip}$ of an OTA, (iii) output parasitic capacitance $C_{op}$ of an OTA, (iv) output parasitic conductance $G_{op}$ of an OTA, and (v) nodal parasitic capacitance $C_{np}$ at each inner node of an OTA-C circuit, replace the capacitances $a_3$, $b_2$, and $a_1$ by $C_3$, $C_2$, and $C_1$, and insert the parasitic conductances $G_3$, $G_2$, and $G_1$ to be in parallel with $C_3$, $C_2$, and $C_1$, respectively, in which $$C_3 = C_{opa2} + C_{opa1} + C_{opa0} + C_{ipb2} + C_{ipa} + C_{np3} + C_{30},$$

$$C_2 = C_{opb2} + C_{ipa1} + C_{np2} + C_{20}, \; C_1 = C_{opa1} + C_{ipa0} + C_{np1} + C_{10},$$

$$G_3 = G_{opa2} + G_{opa1} + G_{opa0}, \; G_2 = G_{opb2}, \; G_1 = G_{opa1},$$

where $C_{30}$, $C_{20}$, and $C_{10}$ are the three given capacitances. Thus $$\frac{I_{out}}{I_{in}} = \frac{n_2 s^2 + n_0 s^0}{d_3 s^3 + d_2 s^2 + d_1 s^1 + d_0 s^0} \quad (13\text{-}1)$$

where $$d_3 = s^3 C_1 C_2 C_3 + s_2 C_1 C_3 G_2 + s^2 C_2 C_3 G_1 + s^2 C_1 C_2 G_3 + sC_3 G_1 G_2 + sC_1 G_2 G_3 + sC_2 G_1 G_3 + G_1 G_2 G_3,$$

$$d_2 = -s^3 C_1 C_2 g_{a2} T_{a2} + s^2 C_1 C_2 g_{a2} - s2 C_1 g_{a2} T_{a2} G_2 - s^2 C_{2} g_{a2} T_{a2} G_1 + sC_1 C_2 g_{a2} sC_2 g_{a2} G_1 - s g_{a2} T_{a2} G_1 G_2 + g_{a2} G_1 G_2,$$

$$d_1 = s^3 C_1 g_{a1} g_{b2} T_{a1} T_{b2} - s^2 C_1 g_{a1} g_{b2} T_{a1} - s^2 C_1 g_{a1} g_{b2} T_{b2} + s^2 g_{a1} g_{b2} T_{a1} T_{b2} G_1 + sC_1 g_{a1} g_{a2} - sg_{a1} g_{b2} T_{a1} G_1 - s g_{a1} g_{b2} T_{b2} G_1 + g_{a1} g_{a2} G_1,$$

$$d_0 = s_3 g_{a1} g_{g2} g_{a0} T_{a1} T_{b2} T_{a0} + s^2 g_{a1} g_{b2} g_{a0} T_{a1} T_{b2} + s_2 g_{a1} g_{b2} g_{a0} T_{a1} T_{a0} + s^2 g_{a1} g_{b2} g_{a0} T_{b2} T_{a0} - s g_{a1} g_{b2} g_{a0} T_{a1} - s g_{a1} g_{b2} g_{a0} T_{b2} - s g_{a1} g_{b2} g_{a0} T_{a0} + g_{a1} g_{b2} g_{a0},$$

$$n_2 = s_3 C_1 C_2 g_{b2} T_{b2} + s^2 C_1 C_2 g_{b2} - s^2 C_1 g_{b2} T_{b2} G_2 - s^2 C_2 g_{b2} T_{b2} G_1 + sC_1 C_2 g_{b2} + sC_2 g_{b2} G_1 - s g_{b2} T_{b2} G_1 G_2 + g_{b2} G_1 G_2.$$

Observing the above equation, we notice that the parasitic capacitance and the frequency dependent trans-conductance affect high-frequency responses and the parasitic conductance varies low-frequency output signals.

II. Precise Parameter Tunings

The sensitivity simulation, part of which is shown in FIG. 8-1© (Note that we use the CMOS implementation of a transconductor [14] with ±1.65 V supply voltages and W/L=5μ/1μ and 10μ/1μ for NMOS and PMOS transistors, respectively.), tells us that the tuning of the trans-conductances and the capacitances may be possible for the precision improvement of the elliptic filtering parameters such as $A_1$, the minimum desired magnitude in the pass-band with equal ripple, the peak value $P_k$ at the pass-band corner, $f_p$, the maximum frequency in the pass-band at which the magnitude is equal, to $A_1$, $A_2$, the maximum desired magnitude in the stop-band, and $f_s$, the minimum frequency in the stop-band at which the magnitude is equal to $A_2$. In this patent, we try to fix the three given capacitances, 24 pF, 8 pF, and 24 pF, whose ratio is 3:1:3 consistent with the precision requirement in integrated circuit_fabrication, and then lightly vary the four trans-conductances, $g_{b2}$, $g_{a2}$, $g_{a1}$, and $g_{a0}$, by their individual bias currents to do the elliptic filtering parameter tunings.

The variation relationships between the four transconductances, $g_{b2}$, $g_{a2}$, $g_{a1}$, and $g_{a0}$, and the four filtering parameters, $A_1$, $P_k$, $f_p$, and $A_2$ are shown in Table 13-I. Note that the parameter $A_2$ need accompany with the parameter $f_s$ to meet a sharp transition band. And note that since each parameter in Table 13-I has two different kinds of tendencies, i.e., increment and decrement, it becomes possible to secure the four desired parameter values after tuning these four trans-conductances in some special order.

TABLE 13-I

Variation between transconductances and parameters

| Transconductances | Parameters | | | |
|---|---|---|---|---|
| | $A_1$ | $P_k$ | $f_p$ | $A_2$ |
| Increasing $g_{b2}$ | − | − | + | + |
| Increasing $g_{a2}$ | + | − | − | − |
| Increasing $g_{a1}$ | − | − | + | − |
| Increasing $g_{a0}$ | + | + | + | − |

Figure 13A:
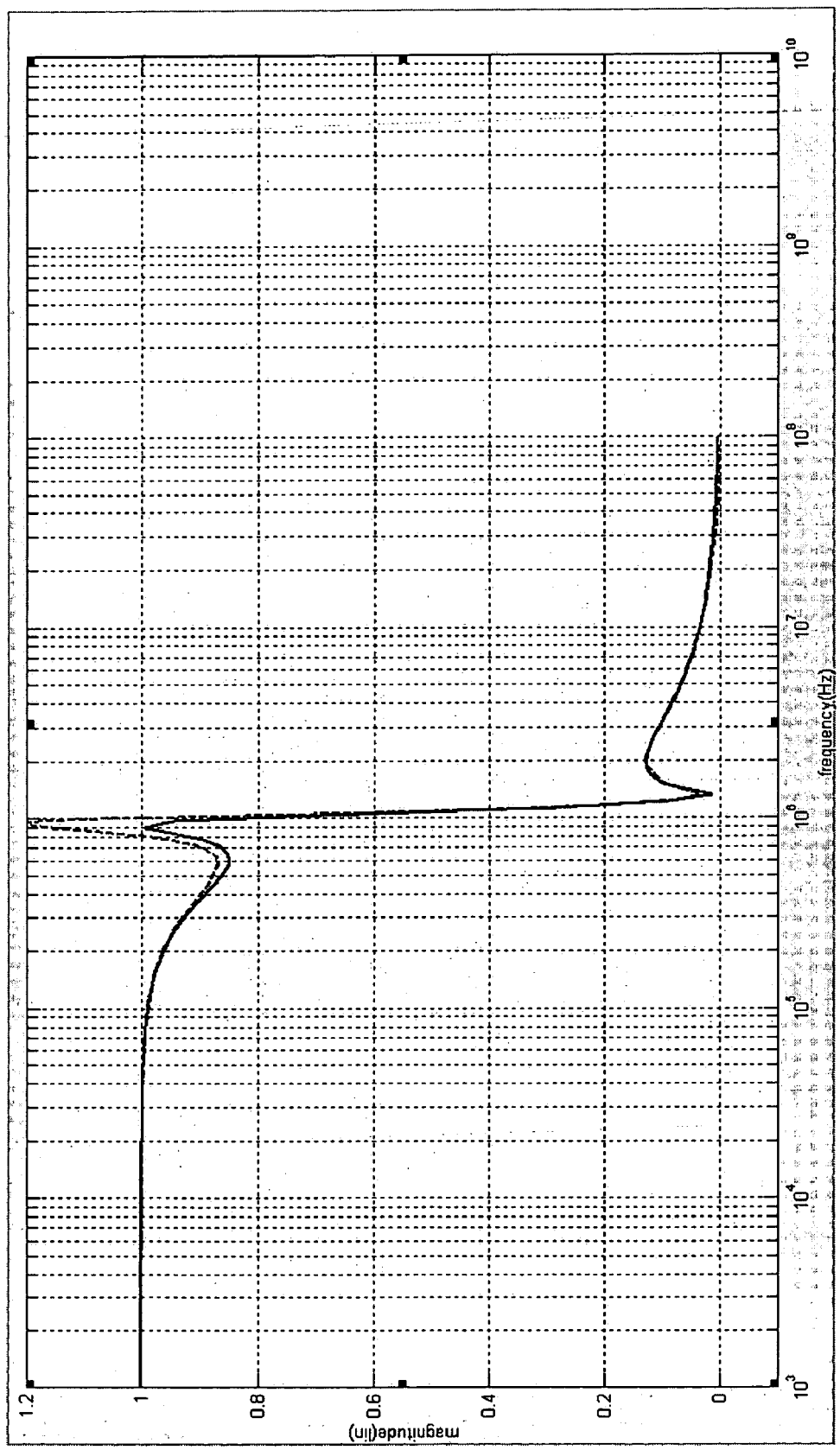
FIGS. 13(a) and (b) show the amplitude-frequency responses and the poles and zeros before and after tunings for the filter shown in FIG. 8-1(a).

Based upon the variations shown in Table 13-I, and the ideal desired parameter values of the given third-order elliptic low-pass filtering transfer function used to do the simulation, i.e., $A_1$=0.85, $P_k$=1, $f_p$=1 MHz, and $A_2$=0.1275320 at $f_s$=1.2 MHz, lightly tuning the four trans-conductances can reach the above four ideal desired parameters from a little bit higher simulated parameter values, i.e., $A_1$=0.8653700, $P_k$=1.222100, $f_p$=1.035159 MHz, and $A_2$=0.1378354 at $f_s$=1.2 MHz, to the ideal parameter values, i.e., $A_1$=0.8503200, $P_k$=1.006800, $f_p$=1.001553 MHz, and $A_2$=0.1271502 at $f_s$=1.2 MHz. The two simulated amplitude-frequency responses with parameter values before and after tunings are shown in FIG. 13(a).

Figure 13B:
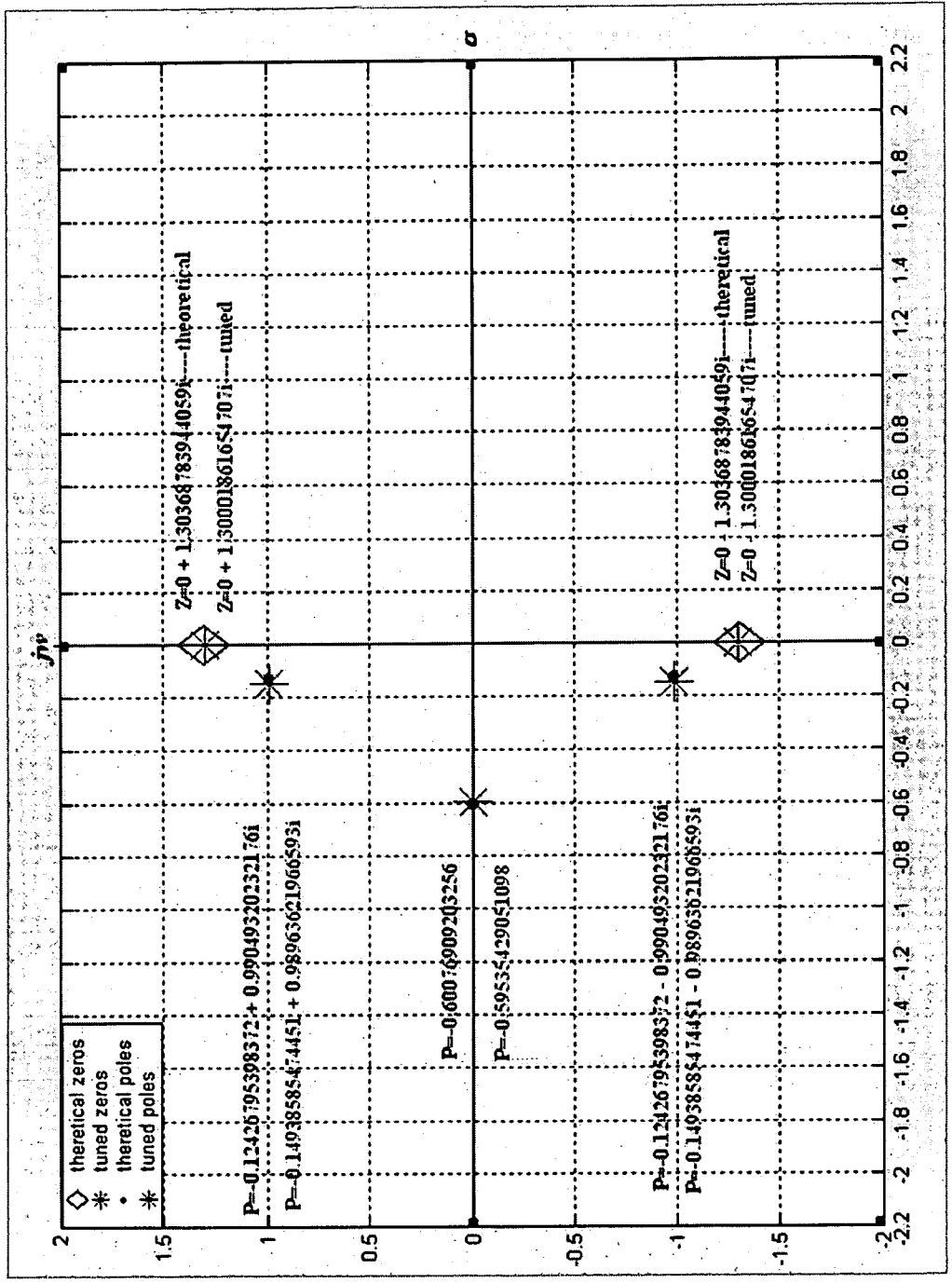

The transconductances after Hspice simulation tunings for absorbing the non-ideal parasitic effects are $g_{b2}$=53.211262 μS ($I_b$=6 μA), $g_{a2}$=134.830853 μS ($I_b$24.5 μA), $g_{a1}$=168.027605 μS ($I_b$=38 μA), and $g_{a0}$=76.239139 μS ($I_b$=9.8 μA), all of which and the given three fixed capacitances lead to the non-ideal transfer function having the same form as Eq. (8-4) but with $a_3$=1, $a_2$=0.894126, $a_1$=1.179571, $a_0$=0.596360, and $b_2$=0.352868. Hence, the non-ideal zeros are located at ±j1.3000186 nearly equal to the ideal zeros ±j1.3036878, the non-ideal real pole −0.5953543 is nearer the origin of the coordinate than the ideal real pole at −0.6007691, and the non-ideal conjugate poles −0.1493858±j0.9896362 are a little bit farther away from the imaginary axis than the ideal conjugate poles −0.1242679±j0.9904932. The non-ideal and ideal poles and zeros are shown in FIG. 13(b) from which we can see the variation between them on the complex plane due to non-ideal parasitic effects.

Note that the proposed filter structure shown in FIG. 8-1 has the lowest non-ideal parasitic effects due to the satisfactory with the three aforementioned important features. Note that the above tuning technique can be applied to any relative cases if necessary.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A modified analytical synthesis method of designing an Operational Transconductance Amplifiers and Capacitors (OTA-C) nth-order filter from 5 MHz to 5 GHz, comprising:
    a. generating an equal number of internal nodes, except input and output nodes, to that of an order of a transfer function of a synthesized circuit;
    b. giving each of all internal nodes, except the input and output nodes, a grounded capacitor and providing no extra capacitors in the circuit while all grounded capacitors are used for absorbing a shunt parasitic capacitance;
    c. generating only single-ended-input OTAs for overcoming a feed-through effect; and
    d. generating a least/minimum number of active and passive components for reducing power consumption, chip area, and noise.

2. The method of designing OTA-C filer as claimed in claim 1, wherein when said filter is designed having a minimum components count of three OTAs and two grounded capacitors, said filter is a current-mode OTA-C low-pass, band-pass, high-pass, band-reject, and all-pass biquad filter.

3. The method of designing OTA-C filer as claimed in claim 1, wherein when said filter is designed having n single-ended-input OTAs and n grounded capacitors, a minimum active and passive components, said filter is a current-mode nth-order OTA-C low-pass, band-pass, high-pass, band-reject, and all-pass filter.

4. The method of designing OTA-C filer as claimed in claim 1, wherein when said filter is designed having only n+1 single-ended-input OTAs and n grounded capacitors, said filter is a voltage-mode nth-order OTA-C low-pass and band-pass filter.

5. The method of designing OTA-C filer as claimed in claim 1, wherein when said filter is designed having n+2 single-ended-input OTAs and n grounded capacitors, said filter is a voltage-mode nth-order OTA-C low-pass, band-pass, and high-pass filter.

6. The method of designing OTA-C filer as claimed in claim 1, wherein when said filter is designed having 2n+4 single-ended-input OTAs and n grounded capacitors, said filter is a voltage-mode nth-order OTA-C arbitrary filter.

7. The method of designing OTA-C filer as claimed in claim 1, wherein when said filter is designed having 2n+2 single-ended-input OTAs and n grounded capacitors, said filter is a voltage-mode nth-order OTA-C universal filter.

8. The method of designing OTA-C filer as claimed in claim 1, wherein when said filter is designed having 2n−1 single-ended-input OTAs and n grounded capacitors, said filter is a current-mode odd-nth-order OTA-C arbitrary or elliptic filter.

9. The method of designing OTA-C filer as claimed in claim 1, wherein when said filter is designed having (3n−1)/2 single-ended-input OTAs and n grounded capacitors, said filter is a current-mode odd-nth-order OTA-C elliptic filter with a minimum components.

10. The method of designing OTA-C filer as claimed in claim 1, wherein when said filter is designed having 2n and (3n+1)/2 single-ended-input OTAs and n grounded capacitors, said filter is voltage-mode odd-nth-order OTA-C arbitrary or elliptic filter.

11. The method of designing OTA-C filer as claimed in claim 1, wherein when said filter is designed having 2n+2 and (3n+4)/2 single-ended-input OTAs and n grounded capacitors, said filter is a voltage-mode even-nth-order OTA-C arbitrary or elliptic filter.

12. The method of designing OTA-C filer as claimed in claim 1, wherein when said filter is designed having 2n+1 and (3n+2)/2 single-ended-input OTAs and n grounded capacitors, said filter is a current-mode even-nth-order OTA-C arbitrary or elliptic filter.

13. The method of designing OTA-C filer as claimed in claim 1, wherein when said filter is designed having (3n/2) single-ended-input OTAs and n grounded capacitors, said filter is a current-mode even-nth-order OTA-C elliptic filter with a minimum components.

14. A modified analytical synthesis method of designing an OTA-only-without-C high-order filter from 5 MHz to 5 GHz comprising:
  e. having a number of internal nodes, except input and output nodes, being equal to that of a order of a transfer function of a synthesized circuit;
  f. generating grounded parasitic capacitances but no resistors and capacitors at all internal nodes and the input and output nodes;
  g. generating only and a least/minimum number of single-ended-input OTAs for overcoming a feed-through effect; and
  h. generating a least/minimum number of active and passive components for reducing power consumption, chip area, and noise.

15. The method of designing OTA-only-without-C filer as claimed in claim 14, wherein when said filter is designed having a minimum components count of three OTAs, said filter is a current-mode OTA-only-without-C, band-pass, high-pass, band-reject, and all-pass biquad filter.

16. The method of designing OTA-only-without-C filer as claimed in claim 14, wherein when said filter is designed having n single-ended-input OTAs, said filter is a current-mode nth-order OTA-only-without-C low-pass, band-pass, high-pass, band-reject, and all-pass filter.

17. The method of designing OTA-only-without-C filer as claimed in claim 14, wherein when said filter is designed having n+1 single-ended-input OTAs, said filter is a voltage-mode nth-order OTA-only-without-C low-pass and band-pass filter.

18. The method of designing OTA-only-without-C filer as claimed in claim 14, wherein when said filter is designed having n+2 single-ended-input OTAs, said filter is a voltage-mode nth-order OTA-only-without-C low-pass, band-pass and high-pass filter.

19. The method of designing OTA-only-without-C filer as claimed in claim 14, wherein when said filter is designed having 2n+4 single-ended-input OTAs, said filter is a voltage-mode nth-order OTA-only-without-C arbitrary filter.

20. The method of designing OTA-only-without-C filer as claimed in claim 14, wherein when said filter is designed having 2n+2 single-ended-input OTAs, said filter is a voltage-mode nth-order OTA-only-without-C universal filter.

21. The method of designing OTA-only-without-C filer as claimed in claim 14, wherein when said filter is designed having 2n−1 single-ended-input OTAs, said filter is a current-mode odd-nth-order OTA-only-without-C arbitrary or elliptic filter.

22. The method of designing OTA-only-without-C filer as claimed in claim 14, wherein when said filter is designed having (3n−1)/2 single-ended-input OTAs, said filter is a current-mode odd-nth-order OTA-only-without-C elliptic filter with minimum components.

23. The method of designing OTA-only-without-C filer as claimed in claim 14, wherein when said filter is designed having 2n and (3n+1)/2 single-ended-input OTAs, said filter is a voltage-mode odd-nth-order OTA-only-without-C arbitrary or elliptic filter.

24. The method of designing OTA-only-without-C filer as claimed in claim 14, wherein when said filter is designed having 2n+2 and (3n+4)/2 single-ended-input OTAs, said filter is a voltage-mode even-nth-order OTA-only-without-C arbitrary or elliptic filter.

25. The method of designing OTA-only-without-C filer as claimed in claim 14, wherein when said filter is designed having 2n+1 and (3n+2)/2 single-ended-input OTAs, said filter is a current-mode even-nth-order OTA-only-without-C arbitrary or elliptic filter.

26. The method of designing OTA-only-without-C filer as claimed in claim 14, wherein when said filter is designed having (3n/2) single-ended-input OTAs, said filter is a current-mode even-nth-order OTA-only-without-C elliptic filter with minimum components.

* * * * *